(12) United States Patent
Matsui et al.

(10) Patent No.: US 6,191,007 B1
(45) Date of Patent: Feb. 20, 2001

(54) METHOD FOR MANUFACTURING A SEMICONDUCTOR SUBSTRATE

(75) Inventors: Masaki Matsui, Nagoya; Shoichi Yamauchi; Hisayoshi Ohshima, both of Obu; Kunihiro Onoda, Nagoya; Akiyoshi Asai, Aichi-gun; Takanari Sasaya, Kariya; Takeshi Enya, Nagoya; Jun Sakakibara, Anjo, all of (JP)

(73) Assignee: Denso Corporation, Kariya (JP)

( * ) Notice: Under 35 U.S.C. 154(b), the term of this patent shall be extended for 0 days.

(21) Appl. No.: 09/066,971

(22) Filed: Apr. 28, 1998

(30) Foreign Application Priority Data

| | | |
|---|---|---|
| Apr. 28, 1997 | (JP) | 9-111284 |
| May 8, 1997 | (JP) | 9-117780 |
| May 16, 1997 | (JP) | 9-126738 |
| May 29, 1997 | (JP) | 9-139890 |
| Jul. 10, 1997 | (JP) | 9-185022 |
| Jul. 15, 1997 | (JP) | 9-189745 |
| Aug. 5, 1997 | (JP) | 9-224280 |
| Sep. 17, 1997 | (JP) | 9-251944 |
| Sep. 25, 1997 | (JP) | 9-260592 |
| Oct. 1, 1997 | (JP) | 9-268688 |
| Dec. 18, 1997 | (JP) | 9-349151 |

(51) Int. Cl.$^7$ ............................................. H01L 21/331
(52) U.S. Cl. .......................... 438/459; 438/455; 438/458
(58) Field of Search .................................. 438/162, 406, 438/407, 262, 455, 459, 158, 155, 458

(56) References Cited

U.S. PATENT DOCUMENTS 4,983,251 * 1/1991 Haisma et al. ............................ 438/3

5,260,233 * 11/1993 Buti et al. ............................ 438/165

(List continued on next page.)

FOREIGN PATENT DOCUMENTS

| | | |
|---|---|---|
| 767486 | 4/1997 | (EP) . |
| 1-302837 | 12/1989 | (JP) . |
| 5-211128 | 8/1993 | (JP) . |
| 7-94741 | 4/1995 | (JP) . |
| 7-302889 | 11/1995 | (JP) . |
| 9-181011 | 7/1997 | (JP) . |
| 9-213594 | 8/1997 | (JP) . |

OTHER PUBLICATIONS

Nakajima et al, "Behavior of blister formation in helium and hydrogen 2 step implanted silicon wafers", Applied Physics Academy Symposium Preliminary Reports, Oct. 1997, 3p–PB–2, p. 818.

(List continued on next page.)

Primary Examiner—John F. Niebling
Assistant Examiner—Christopher Lattin
(74) Attorney, Agent, or Firm—Pillsbury Madison & Sutro LLP

(57) ABSTRACT

Methods for manufacturing semiconductor substrates in which a semiconductor layer for forming semiconductor device therein is formed on a supporting substrate with an insulating film interposed between, with which in forming the semiconductor layer on a substrate on which a buried pattern structure has been formed it is possible to greatly increase the film thickness uniformity of the semiconductor layer and the film thickness controllability, particularly when the semiconductor layer is being formed as an extremely thin film. As a result, it is possible to achieve improved quality and characteristics of the semiconductor substrates and make possible the deployment of such semiconductor substrates to various uses.

50 Claims, 115 Drawing Sheets

U.S. PATENT DOCUMENTS

| | | | | |
|---|---|---|---|---|
| 5,374,564 | * | 12/1994 | Bruel | 438/455 |
| 5,466,631 | * | 11/1995 | Ichikawa et al. | 438/406 |
| 5,494,835 | | 2/1996 | Bruel . | |
| 5,506,163 | * | 4/1996 | Moriya | 438/155 |
| 5,559,043 | | 9/1996 | Bruel . | |
| 5,602,551 | * | 2/1997 | Fukumoto et al. | 341/136 |
| 5,714,395 | * | 2/1998 | Bruel | 438/528 |
| 5,719,078 | * | 2/1998 | Kim | 438/158 |
| 5,776,789 | * | 7/1998 | Nakamura | 438/155 |
| 5,807,783 | * | 9/1999 | Gaul et al. | 438/406 |
| 5,854,123 | * | 12/1998 | Sato et al. | 438/507 |
| 5,882,987 | * | 3/1999 | Srikrishnan | 438/458 |
| 5,952,694 | * | 9/1999 | Miyawaki et al. | 257/347 |
| 6,060,344 | * | 5/2000 | Matsui et al. | 438/464 |

OTHER PUBLICATIONS

Takada et al, "In–situ observation of "Smart–Cut®" by Thermal Desorption Spectroscopy (2)–dose dependence of splitting temperature–", Applied Physics Academy Symposium Preliminary Reports, Oct. 1997, 3p–PB–3, p. 819.

Takada et al, "In–situ observation of "Smart–Cut" by Thermal Desorption Spectroscopy [Experimental Method]", Applied Physics Academy Symposium Preliminary Reports, Mar. 1997, 29p–G–11, p. 739, Oct. 1996, pp. 150–151.

Hara et al, "H+ Implantation in Si for The Void Cut SOI Manufacturing", IEEE, 1997, pp. 45–48.

Lee et al, "A Novel Pattern Transfer Process for Bonded SOI Giga–bit DRAMs", IEEE International SOI Conference, Oct. 1996, pp. 114–115.

Bruel et al, "Smart–Cut: A New Silicon On Insulator Material Technology Based on Hydrogen Implantation and Wafer Bonding", Japanese Journal of Applied Physics, vol. 36, Mar. 1997, pp. 1636–1641.

Liu et al, "Effect of Total Dose Radiation on FETs Fabricated in UNIBOND™ SOI Material", Proceedings 1996 IEEE International SOI Conference, Oct. 1996, pp. 94–95.

Kuehne et al, "Deep Sub–Micron SOI MOSFET With Buried Body Strap", Proceedings 1996 IEEE International SOI Conference, Oct. 1996, pp. 96–97.

Yang et al, "Silicon–on–Insulator–with–Active–Substrate (SOIAS) Technology", Proceedings 1996 IEEE International SOI Conference, Oct. 1996, pp. 106–107.

Weldon et al, "Mechanistic Studies of Hydrophilic Wafer Bonding and Si Exfoliation for SOI Fabrication", Proceedings 1996 IEEE International SoI Conference, Oct. 1996, pp. 150–151.

Moriceau et al, "Cleaning and Polishing As Key Steps For Smart–Cut® SOI Process", Proceedings 1996 IEEE International SOI Conference, Oct. 1996, pp. 152–153.

Conley Jr. et al, "Electron Spin Resonance Characterization of Unibond® Material", Proceedings 1996 IEEE International SOI Conference, Oct. 1996, pp. 164–165.

Aspar et al, "Transfer of structured and patterned thin silicon films using the Smart–Cut® process", Electronics Letters, vol. 32, No. 21, Oct. 10, 1996, pp. 1985–1986.

Hara et al, "Ion Implantation and Annealing Conditions for Delamination of Silicon Layers by Hydrogen Ion Implantation", Journal of the Electrochemical Society, vol. 144, No. 4, Apr. 1997, pp. L78–L81.

Tong et al, "Layer splitting process in hydrogen–implanted Si,Ge, SiC, and diamond substrates", Applied Physics Letters, vol. 70, No. 11, Mar. 17, 1997, pp. 1390–1392.

Auberton–Herve and Hyodo, "Unibord SOI wafer due to Smart Cut", Electronic Material, Jun. 1997, pp. 29–33.

Bruel et al, "®"Smart Cut: A Promising New SOI Material Technology, Proceedings 1995 IEEE International SOI Conference, Oct. 1995, pp. 178–179.

M. Bruel, "Silicon on insulator material technology", Electronics Letters, vol. 31, No. 14, Jul. 6, 1995, pp. 1201–1202.

Aspar et al, "Basic mechanisms involved in the Smart–Cut® process", Microelectronic Engineering 36, (1997), pp. 233–240.

Bruel et al, "Unibond® SOI Wafers Achieved by Smart–Cut® Process", (name of article, date, page number: not available).

Ohmi, Tadahiro, "Future of Semiconductor Technology", J. IEE Japan, vol. 117, No. 2, pp. 88–93.

Maleville et al, "Wafer bonding and H–implantation mechanisms involved in the Smart–Cut® technology", Materials Science & Engineering B46, 1997, pp. 14–19.

Hara et al, "Delaminations of Thin Layers by High Dose Hydrogen Ion Implantation in Silicon", Journal of The Electrochemical Society, vol. 143, No. 8, Aug. 1996, pp. L–166–L168.

M. Bruel, "Silicon on insulator material technology", IEE, 1995, May 24, 1995.

Auberton–Herve et al, "A New SOI Material : Smart–Cut®", (name of article, date, page number: not available).

Aspar et al, "Smart–Cut®: The basic fabrication process for Unibond® SOI Wafers", (name of article, date, page number: not available).

Bruel et al, "Smart–Cut: A New S.O.I. Material Technology Based on Hydrogen Implantation and Wafer Bonding", Extended Abstracts of the 1996 International Conference on Solid State Devices and Materials, Yokohama, 1996, pp. 458–460.

Auberton–Herve et al, "SOI Materials for ULSI Applications", (name of article, date, page number: not available).

Wolf, S.; Silicon Processing for the VLSI Era vol. 2: Process Integration, Sunset Beach, CA, p.p.*

Aspar, B et al. ; New Semiconductor Hetero–Substrates for High Temperature Applications Using The Smart Cut Technology; High Temperature Electronics, 1999. HITEN 99. The Third European Conference, 1999, pp. 67–73.*

Auberton–Herve, A.J.; SOI: materials to systems; Electron Device Meeting, 1996., International, 1996, pp. 3–10.*

* cited by examiner

FIG. 26
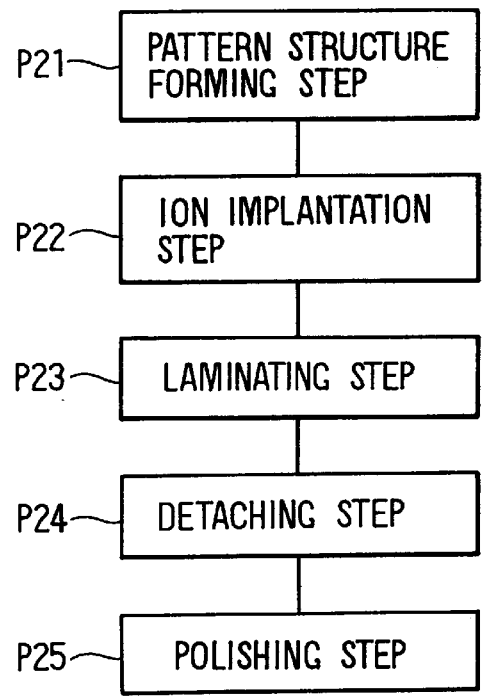
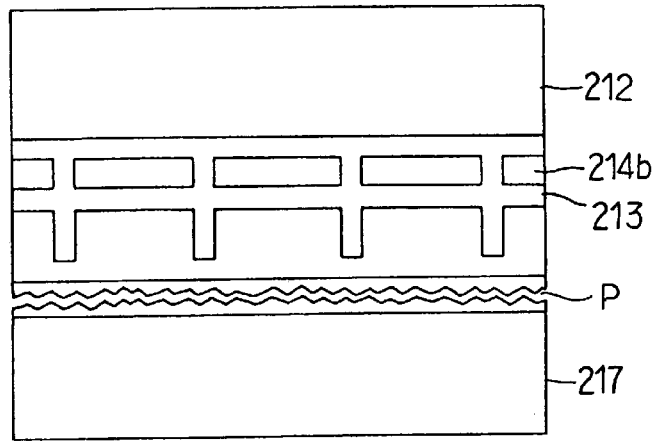
FIG. 32A
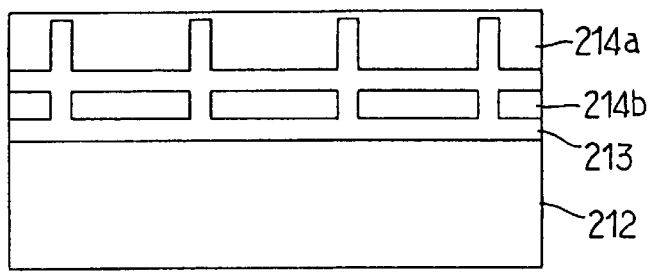
FIG. 32B

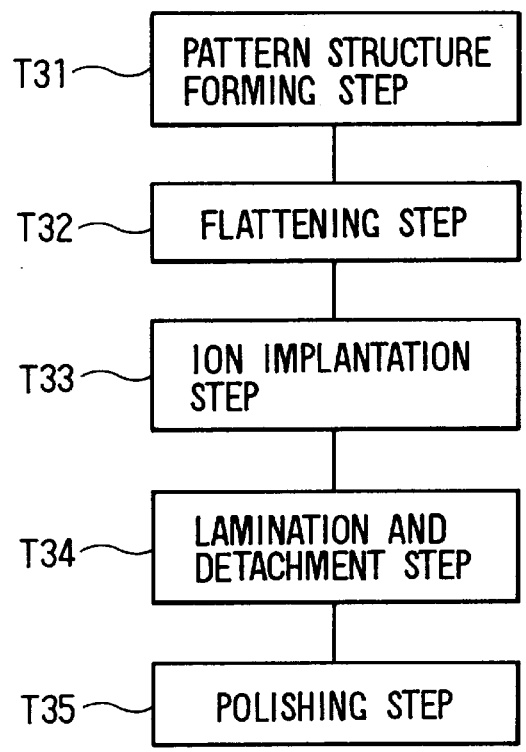
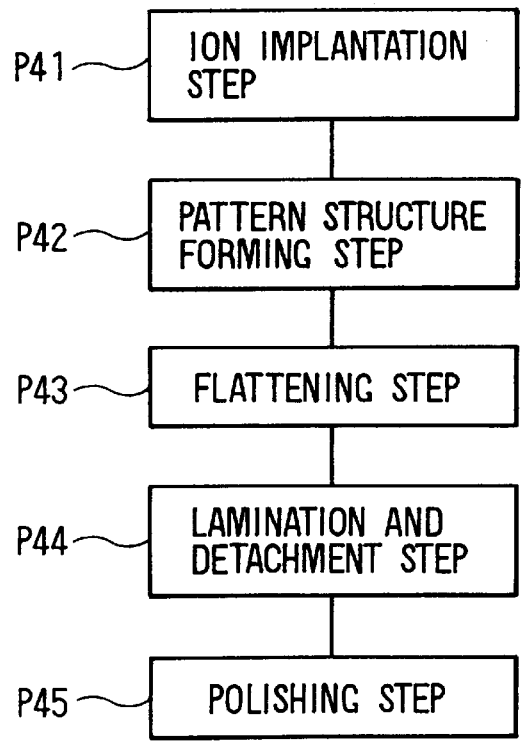

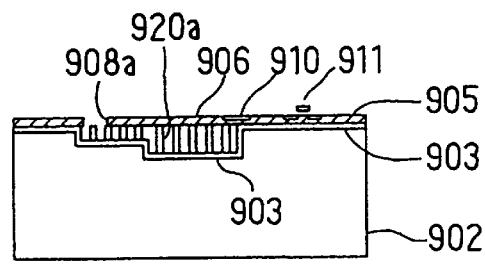
FIG. 131A
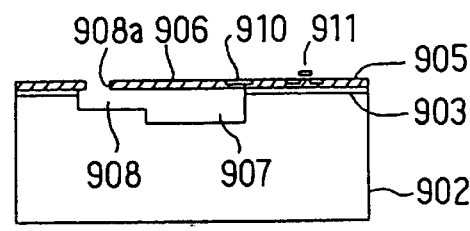
FIG. 131B
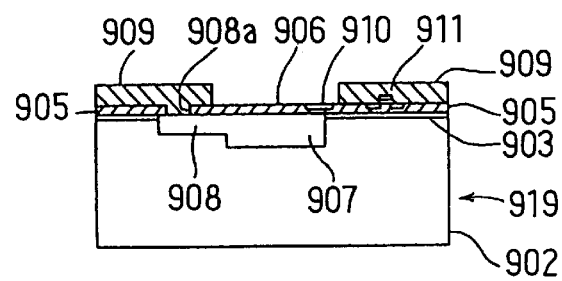
FIG. 131C
FIG. 132
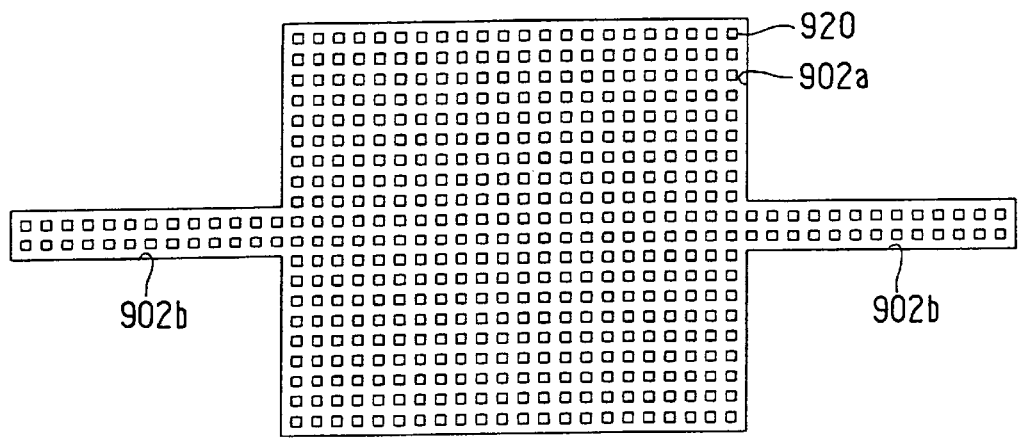

METHOD FOR MANUFACTURING A SEMICONDUCTOR SUBSTRATE

CROSS REFERENCE TO RELATED APPLICATION

This application is based upon and claims the benefit of priority from Japanese Patent Applications No. H. 9-111284 filed on Apr. 28, 1997, No. H. 9-117780 filed on May 8, 1997, No. H. 9-126738 filed on May 16, 1997, No. H. 9-139890 filed on May 29, 1997, No. H. 9-185022 filed on Jul. 10, 1997, NO. H. 9-189745 filed on Jul. 15, 1997, No. H. 9-224280, filed on Aug. 5, 1997, No. H. 9-251944 filed on Sep. 17, 1997, No. H. 9-260592 filed on Sep. 25, 1997, No. H. 9-268688 filed on Oct. 1, 1997, and No. H. 9-349151 filed on Dec. 18, 1997, the contents of which are incorporated herein by reference.

BACKGROUND OF THE INVENTION

1. Field of the Invention

This invention relates to a method for manufacturing a semiconductor substrate having a semiconductor layer, in which a semiconductor element is formed, on a supporting substrate with an insulating film interposed therebetween, and particularly to a method for manufacturing a semiconductor substrate having a patterned structure for a buried electrode below the semiconductor layer.

2. Description of the Related Art

As a semiconductor substrate provided with a semiconductor layer for forming a semiconductor element therein on a supporting substrate interposing an insulating film therebetween, there is for example a SOI (Silicon On Insulator) substrate. The SOI substrate is made by forming an oxide film as an insulating film on a silicon substrate serving as a supporting substrate and forming a monocrystalline silicon thin film on the oxide film. When this kind of semiconductor substrate is used, not only does it become unnecessary to provide a separate step for insulating the semiconductor layer from the substrate but also the insulation performance is good and it is possible to form semiconductor elements on the monocrystalline silicon thin film with a high density to make integrated circuits.

In a semiconductor substrate having this kind of SOI structure, to form an element such as a double gate MOSFET, the idea of forming on the lower face of the oxide film or in the oxide film a buried electrode pattern to constitute a back gate or interconnection pattern has been being considered. However, in a conventional semiconductor substrate having a pattern structure for a buried electrode of this kind, manufacturing technology for sharply increasing the film thickness uniformity of the SOI layer (the monocrystalline silicon thin film) and greatly enhancing the film thickness controllability of when this SOI layer is formed as an extremely thin film has not been completed, and the development of this kind of manufacturing technology has been being awaited.

SUMMARY OF THE INVENTION

It is therefore an object of the present invention to provide a method for manufacturing a semiconductor substrate having a semiconductor layer for forming a semiconductor element therein on a supporting substrate with an insulating film therebetween and a pattern structure for a buried electrode, with which it is possible to sharply increase the film thickness uniformity of the semiconductor layer and it is possible to greatly enhance the film thickness controllability of when this semiconductor layer is formed as an extremely thin film. As a result, improvements in quality and characteristics of the semiconductor layer can be achieved and the deployment of such semiconductor substrates to various uses is made possible.

To achieve this object and other objects, the invention provides a manufacturing method wherein, after an insulating film forming step of forming on a first semiconductor substrate an insulating film eventually to provide insulation between a supporting substrate and a semiconductor layer is carried out, an electrode pattern forming step of forming, in a predetermined region on the insulating film, an electrode pattern eventually to become a buried electrode is performed. Also, an insulating material depositing step of depositing an insulating material on the insulating film in such a state that it covers the electrode pattern as well as the insulating film, a flattening process material depositing step of depositing a flattening process material on the insulating material in such a state that it covers the same, and a flattening step of flattening the surface of this flattening process material are carried out in order. Thereafter, a first laminating step of laminating the first semiconductor substrate to the supporting substrate with the flattening process film therebetween is performed.

After that, in a substrate forming step, the first semiconductor substrate laminated to the supporting substrate is removed to expose the entire surface of the insulating film. As a result, a buried electrode substrate including the supporting substrate and the electrode pattern on the under face of the insulating film exposed at its surface is thereby formed. That is, in a buried electrode substrate formed in this way, a flattening process material, an insulating material, an electrode pattern and an insulating film are disposed in this order on the supporting substrate.

Meanwhile, separately from the formation of this buried electrode substrate, an ion implantation step of forming an ion-implanted layer for detachment use by implanting ions to a predetermined depth is carried out on a second semiconductor substrate. Following to the ion implantation step, a second laminating step of laminating the ion implantation side face of the second semiconductor substrate to the insulating film on the buried electrode substrate is carried out.

After that, a detaching step of performing heat treatment on the buried electrode substrate and the second semiconductor substrate thus laminated together in the second laminating step and thereby detaching the second semiconductor substrate from the buried electrode substrate at a defective layer part formed by the ion-implanted layer is carried out. At the time of this heat treatment, in the second semiconductor substrate, microbubbles coalesce in the defective layer region to form macrobubbles. This causes detachment of the second semiconductor substrate along the defective layer.

By executing the steps described above it is possible to manufacture a semiconductor substrate having a basic structure wherein a semiconductor layer is formed on a supporting substrate interposing an insulating film therebetween (equivalent to an SOI structure) and also having an electrode pattern for a buried electrode formed on the underside of the insulating film.

With this manufacturing method, the film thickness of the semiconductor layer formed on the supporting substrate interposing the insulating film therebetween is determined by the depth of the ion-implanted layer formed in the second semiconductor substrate in the ion implantation step. This depth can be accurately set by controlling the ion implantation energy of that ion implantation step. Therefore, even when the semiconductor layer is to be formed as an extremely thin film, it is possible to greatly increase its film thickness controllability and it is possible to easily manufacture a semiconductor substrate having the film thickness of the semiconductor layer set to a desired dimension. Hence, the semiconductor substrate can be deployed to various applications.

Because the face of the second semiconductor substrate from which the ion implantation is carried out can be flattened in advance extremely easily, by carrying out the ion implantation step with this face so flattened it is possible to form the ion-implanted layer exactly parallel with the insulating film. As a result, the film thickness uniformity of the semiconductor layer can be greatly increased and it is possible to realize improvements in the quality and characteristics of the semiconductor substrate finally obtained.

Furthermore, since the second semiconductor substrate is only consumed by an amount corresponding to the film thickness of the part thereof left on the supporting substrate side each time the detaching step is carried out, and can be repeatedly reused, it becomes possible to realize reductions in overall manufacturing cost.

Also, in the manufacturing process of the semiconductor substrate, because an insulating film, an electrode pattern, an insulating material and a flattening process material successively formed on the first semiconductor substrate are transferred to the supporting substrate side by means of the first laminating step and the substrate forming step, that is, because a buried electrode substrate composed of a flattening process material, an insulating material, an electrode pattern and an insulating film disposed in this order on a supporting substrate is formed, particularly with respect to the method of formation of the insulating film it is possible to broaden the range of selection alternatives. For example, if the insulating film is formed by a method providing high film thickness controllability (such as thermal oxidation of the first semiconductor substrate), stabilization of its characteristics can be achieved.

Also, in the flattening step it is only necessary to carry out flattening on the flattening process material, and it becomes unnecessary to remove the insulating material. Consequently, the thickness of the insulating material can be kept unchanged at the original thickness reached in the insulating material depositing step, and variation in this thickness dimension can be minimized. As a result, if consideration is given to the selection of the flattening process material, it becomes possible to suppress fluctuation of rear side electrode or rear side interconnection static capacitance with the film thickness of the insulating material. Therefore, it is possible to contribute to the characteristics stability of the semiconductor substrate finally obtained.

In the heat treatment step, the bonding strength of the lamination face between the buried electrode substrate and the second semiconductor substrate, i.e. the lamination face between the insulating film and the semiconductor layer, may be increased by carrying out heat treatment at a temperature higher than that of the heat treatment in the detaching step. By this means it is possible to increase the reliability of the semiconductor substrate finally obtained.

When, after the execution of the detaching step, a supplementary heat treatment step is carried out in an oxidizing atmosphere, an oxide layer is formed at the interface with the insulating film in the second semiconductor substrate (the semiconductor layer) remaining on the buried electrode substrate side. In this case, the interface between the semiconductor layer and the insulating film constituting a rear side gate oxide film becomes not the lamination face but rather an interface with an oxide layer formed by the semiconductor layer being thermally oxidized in the supplementary heat treatment step. As a result, because there are fewer defects and fixed charges at the interface there cease to be problems of insulation breakdown of the gate oxide film and fluctuation of threshold value. Therefore, it becomes possible to improve the characteristics of the SOI structure semiconductor substrate.

When the insulating film is formed by oxidizing the surface of the first semiconductor substrate, the insulating film (equivalent to a gate oxide film of a buried electrode) can be formed densely and to a required film thickness. Consequently it is possible to achieve improvements in its film thickness uniformity and stabilization of characteristics accompanying this.

The substrate forming step for removing the first semiconductor substrate laminated to the supporting substrate and exposing the entire surface of the insulating film is preferably carried out by the following kind of procedure.

That is, at a stage before the execution of the fist laminating step of laminating together the first semiconductor substrate and the supporting substrate with the flattening process material deposited on the first semiconductor substrate therebetween, in a first semiconductor substrate ion implantation step, by ions being implanted to a predetermined depth into the first semiconductor substrate through the insulating film side face thereof, an ion-implanted layer for detachment use is formed. Then, after the fist laminating step is carried out, in a first semiconductor substrate detaching step, by heat treatment being carried out on the first semiconductor substrate and the supporting substrate thus laminated together, the first semiconductor substrate is detached at a defective layer part formed by the ion-implanted layer. After that, in a removing step a part of the first semiconductor substrate remaining on the supporting substrate side is removed so that the entire surface of the insulating film is exposed.

In this case, since the first semiconductor substrate is only consumed by an amount corresponding to the film thickness of the part left on the supporting substrate side each time the first semiconductor substrate detaching step is carried out, and this can be repeatedly reused, from this point of view also it becomes possible to realize reductions in manufacturing cost.

In the removing step carried out in the course of the substrate forming step, if the part of the first semiconductor substrate remaining on the supporting substrate side is removed by selective polishing or selective etching with the insulating film being made to function as a stopper, the operation of exposing the surface of the insulating film can be carried out simply and certainly.

When this removing step is carried out by means of selective etching with the insulating film being made to function as a stopper, this etching can be carried out by means of wet etching using aqueous tetra methyl ammonium hydroxide (TMAH), aqueous sodium hydroxide (NaOH), or aqueous potassium hydroxide (KOH). In experiments conducted by the present inventors it has been found that when this kind of wet etching is carried out, the surface uniformity of the final lamination face (the lamination face between the insulating film and the second semiconductor substrate) is good and it is possible to realize an improvement in the reliability of the lamination.

When the substrate forming step for removing the first semiconductor substrate laminated to the supporting substrate and exposing the surface of the insulating film is carried out by means of a grinding step and a polishing step, or when it is carried out by means of a grinding step and an etching step, it is possible to reduce the number of types of step required. In this case, when the etching step is carried out by means of wet etching using aqueous tetra methyl ammonium hydroxide (TMAH), aqueous sodium hydroxide (NaOH), or aqueous potassium hydroxide (KOH) as mentioned above, the surface uniformity of the final lamination face is good and it is possible to realize an improvement in the reliability of the lamination.

In another manufacturing method provided by the invention, after an insulating film forming step of forming an insulating film on a first semiconductor substrate, an electrode pattern forming step of forming an electrode pattern in a predetermined region on the insulating film, and an insulating material depositing step of depositing an insulating material on the insulating film in such a state that it covers the electrode pattern as well as the insulating film are successively carried out, a flattening step is performed. After the surface of the insulating material is flattened in the flattening step, a first laminating step of laminating the first semiconductor substrate to the supporting substrate with the insulating material therebetween is carried out.

After that, in a substrate forming step, the first semiconductor substrate laminated to the supporting substrate is removed and the entire surface of the insulating film is thereby exposed to form a buried electrode substrate having a supporting substrate and an electrode pattern on the underside of the insulating film exposed at its surface. That is, in a buried electrode substrate formed in this way, an insulating material, an electrode pattern and an insulating film are disposed in this order on the supporting substrate.

Meanwhile, separately from the formation of this buried electrode substrate, an ion implantation step of forming an ion-implanted layer for detachment use by implanting ions to a predetermined depth is carried out on a second semiconductor substrate. After that, a second laminating step of laminating the ion implantation side face of the second semiconductor substrate to the insulating film on the buried electrode substrate is carried out.

Following to that, a detaching step of performing heat treatment on the buried electrode substrate and the second semiconductor substrate thus laminated together in the second laminating step is carried out. As a result, the second semiconductor substrate is detached from the buried electrode substrate at a defective layer part formed by the ion-implanted layer.

By executing the steps described above it is possible to manufacture a semiconductor substrate having a basic structure wherein a semiconductor layer is formed on a supporting substrate interposing an insulating film therebetween (equivalent to an SOI structure) and also having an electrode pattern for a buried electrode formed on the underside of the insulating film. By this manufacturing method also it is possible to obtain substantially the same effects as those of the manufacturing method described previously.

BRIEF DESCRIPTION OF THE DRAWINGS

Other features and advantages of the present invention will be appreciated, as well as method of operation and the function of the related parts, from a study of the following detailed description, appended claims, and the drawings, all of which form a part of this application. In the drawings:

FIG. 26 is a process diagram of the eleventh preferred embodiment;

FIGS. 32A and 32B are schematic sectional views illustrating steps for manufacturing a SOI substrate continuing from FIG. 31C;

FIG. 45 is an outline process diagram of the seventeenth preferred embodiment;

FIG. 51 is an outline process diagram of the nineteenth preferred embodiment;

FIGS. 119A and 119B are schematic sectional and plan views of a second substrate after a concavity forming step according to a forty-fourth preferred embodiment;

FIG. 120 is a block diagram of a manufacturing process according to a forty-fifth preferred embodiment;

FIGS. 121A through 121E are schematic sectional views of steps following a detaching step;

FIGS. 122A and 122B are schematic sectional and plan views of a second substrate after semiconductor layer removing step;

FIG. 123 is a block diagram of a manufacturing process according to a forty-sixth preferred embodiment;

FIGS. 124A and 124B are schematic sectional and plan views of a second substrate after a concavity forming step;

FIGS. 125A through 125E are schematic sectional views of steps following a laminating step;

FIG. 126 is a block diagram of a manufacturing process according to a forty-seventh preferred embodiment;

FIGS. 127A through 127E are schematic sectional views of steps following a detaching step;

FIG. 128 is a block diagram of a manufacturing process according to a forty-eighth preferred embodiment;

FIGS. 129A through 129C are schematic sectional views of manufacturing steps of the process;

FIGS. 130A through 130C are further schematic sectional views of manufacturing steps continuing from FIG. 129C;

Figure 130A:
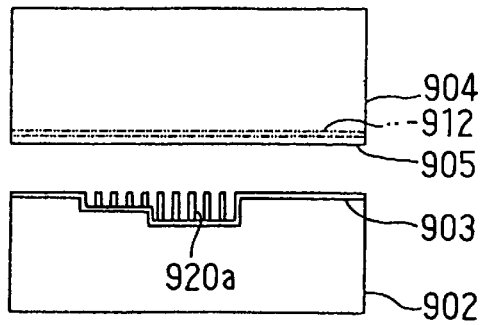
Figure 130B:
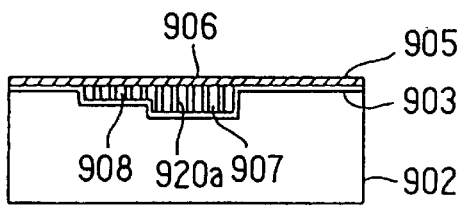
Figure 130C:
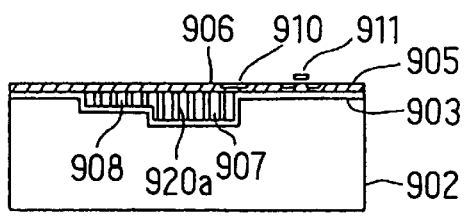
Figure 133:
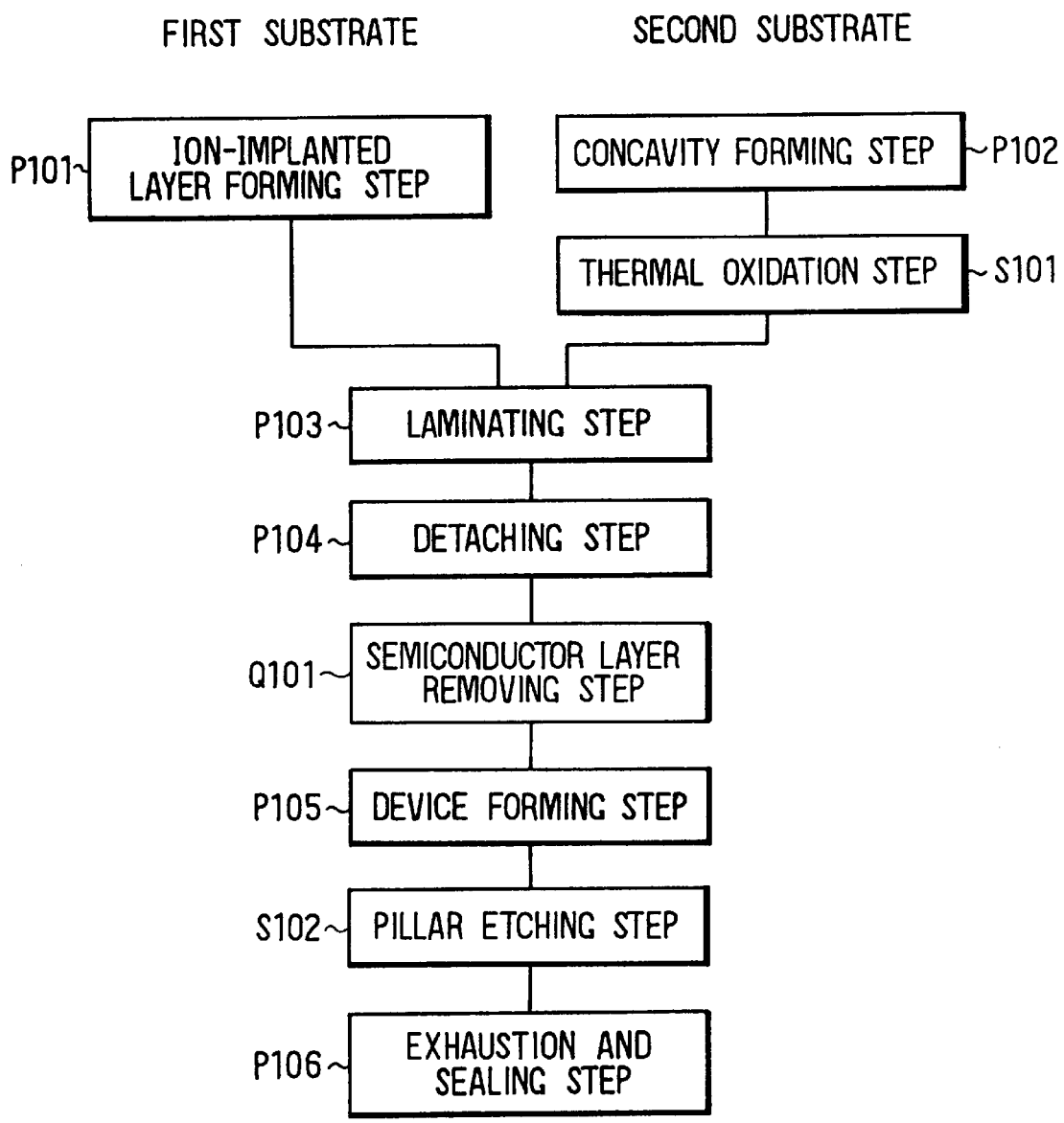
Figure 135:
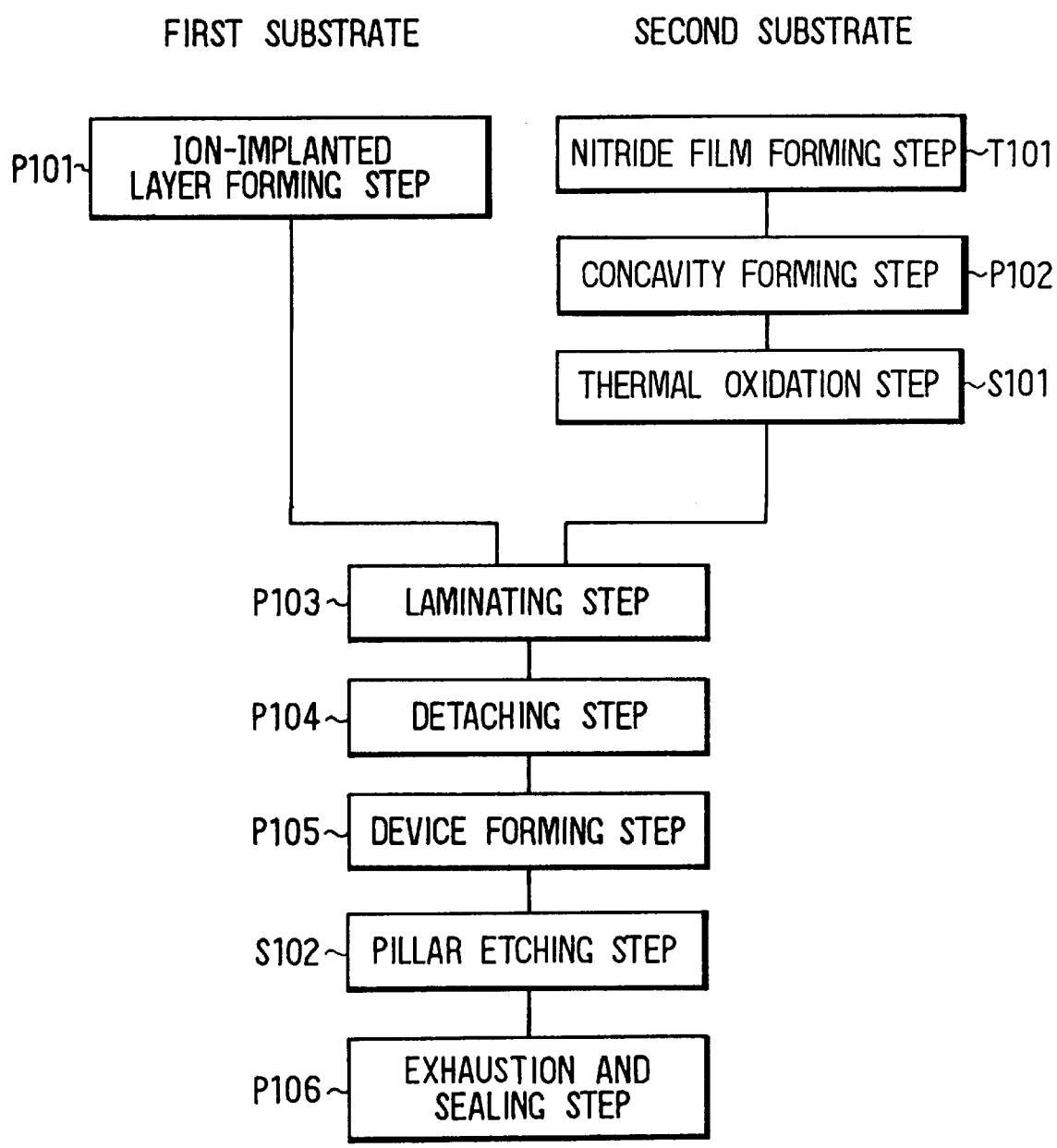
Figure 136A:
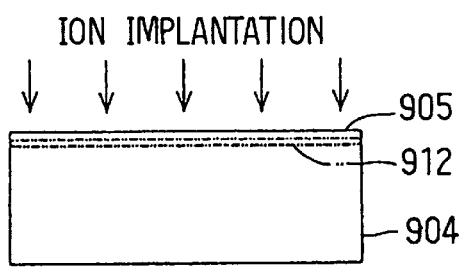
Figure 137A:
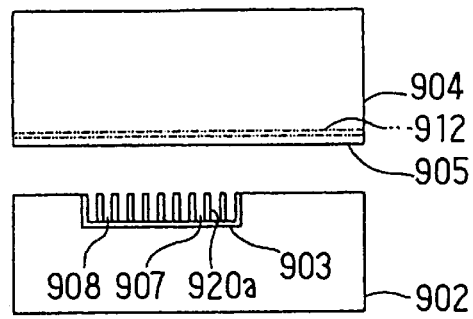
Figure 136B:
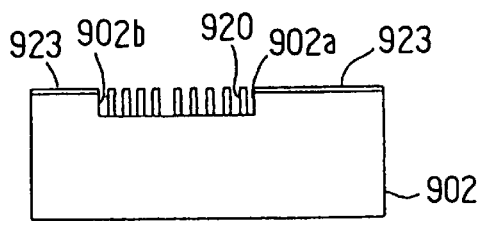
Figure 137B:
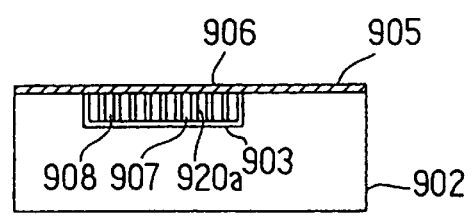
Figure 136C:
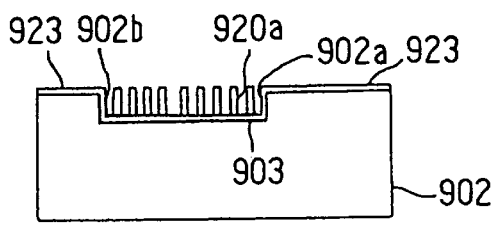
Figure 137C:
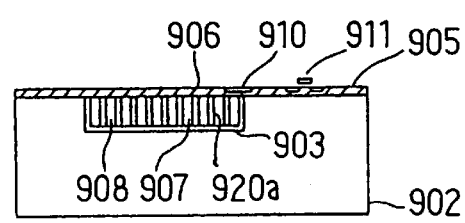
Figure 138A:
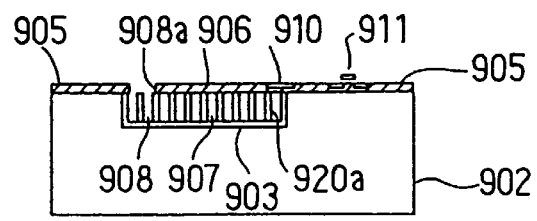
Figure 138B:
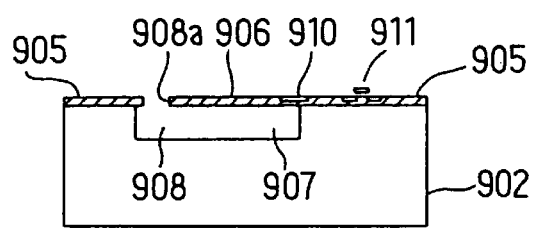
Figure 138C:
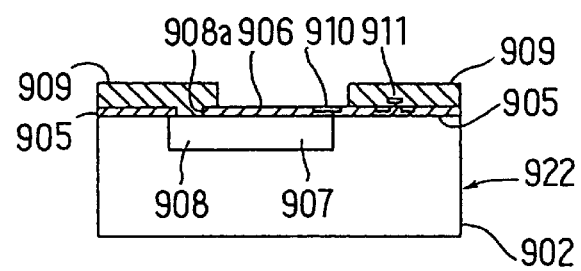
Figure 140:
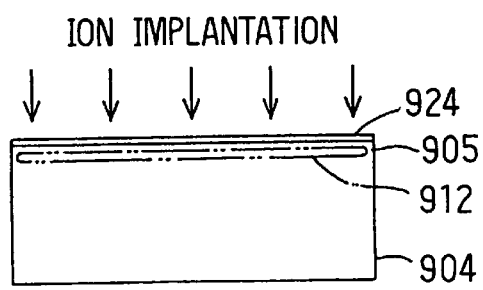
Figure 141:
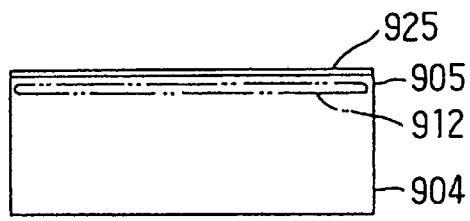
Figure 139:
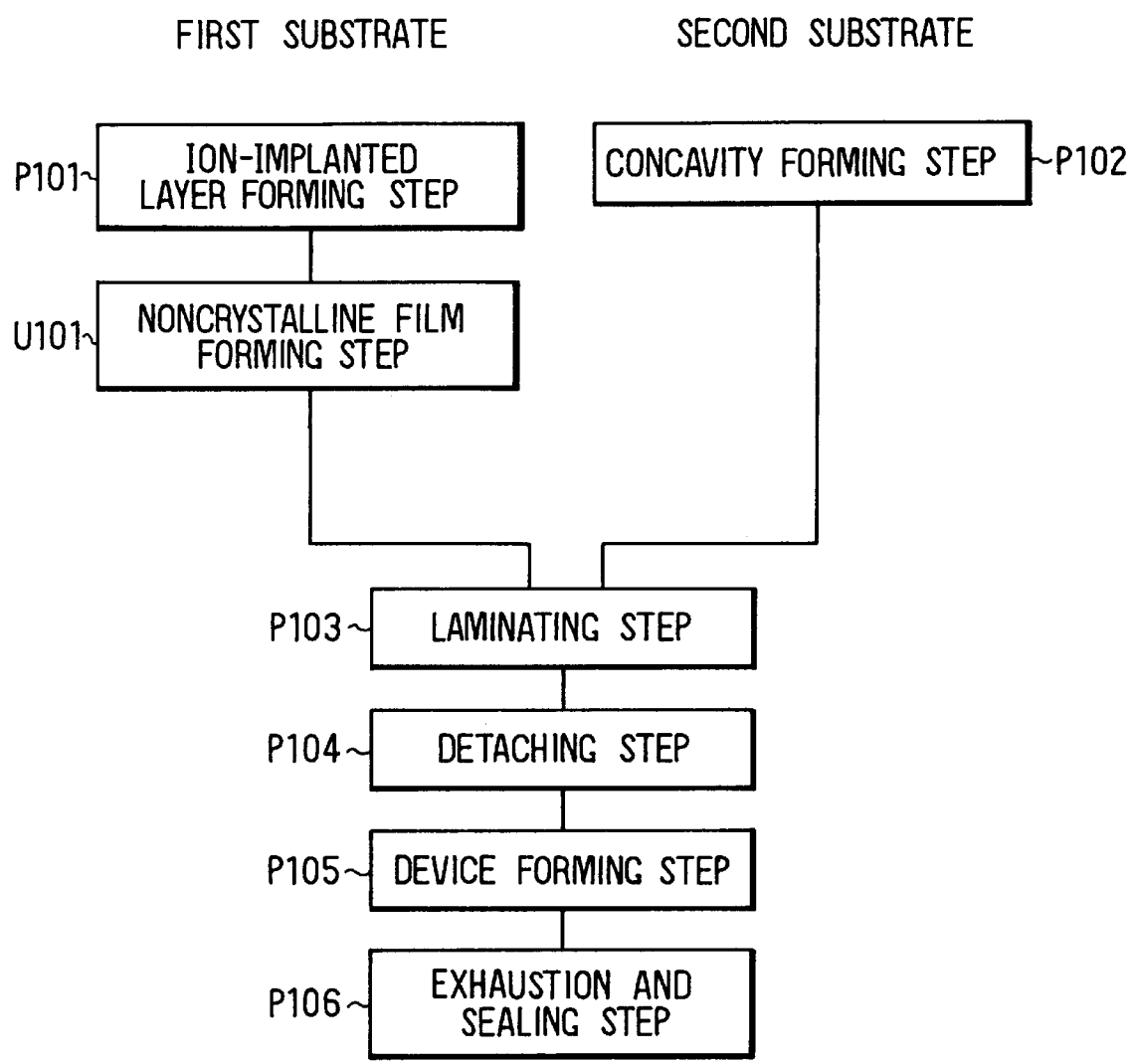
Figure 142A:
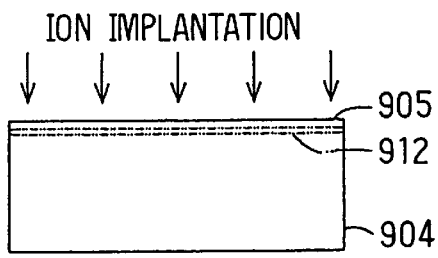
Figure 142B:
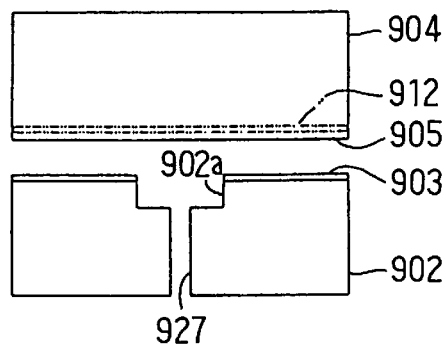
Figure 142C:
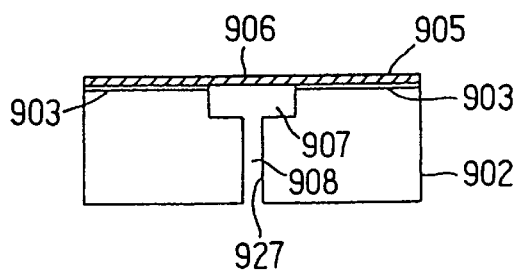
Figure 143A:
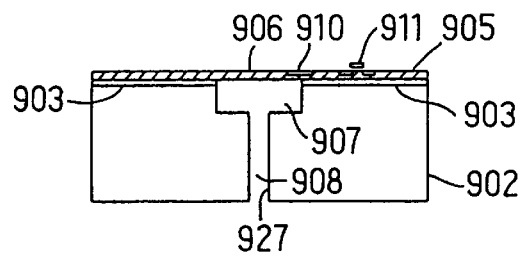
Figure 143B:
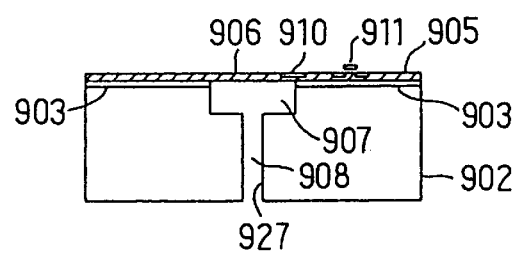
Figure 143C:
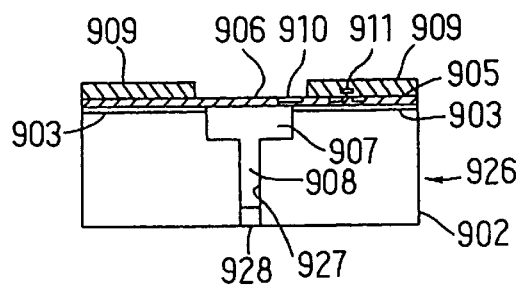
Figure 145A:
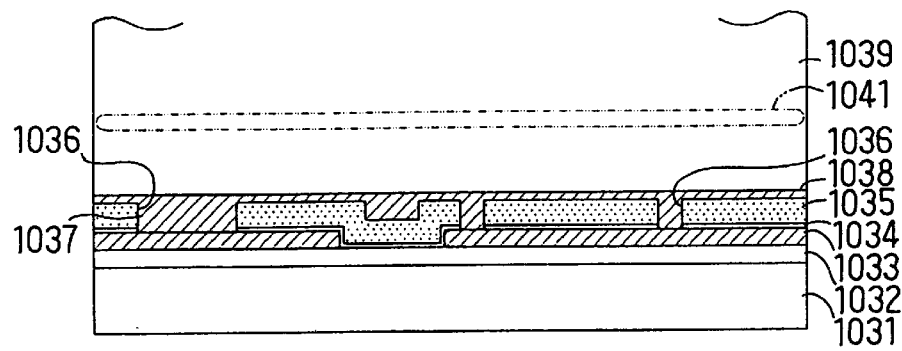
Figure 145B:
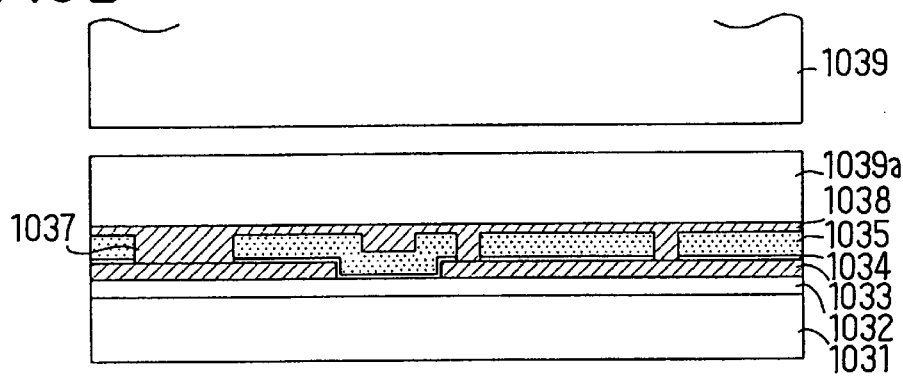
Figure 145C:
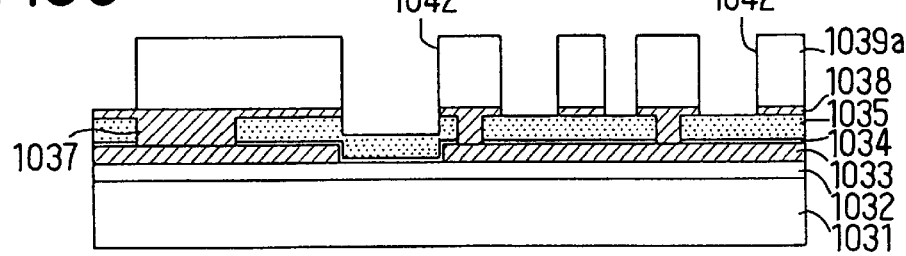
Figure 146A:
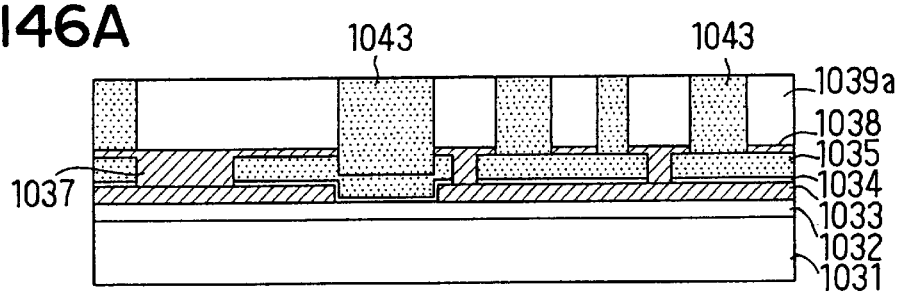
Figure 146B:
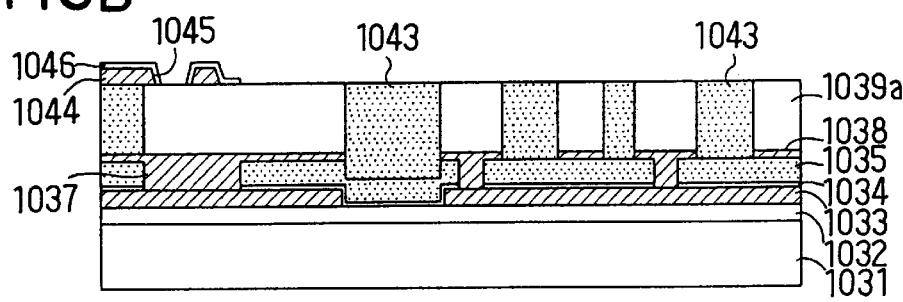
Figure 146C:
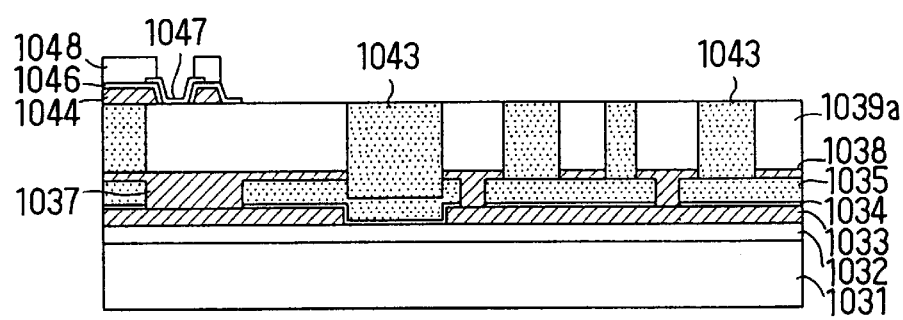
Figure 148:
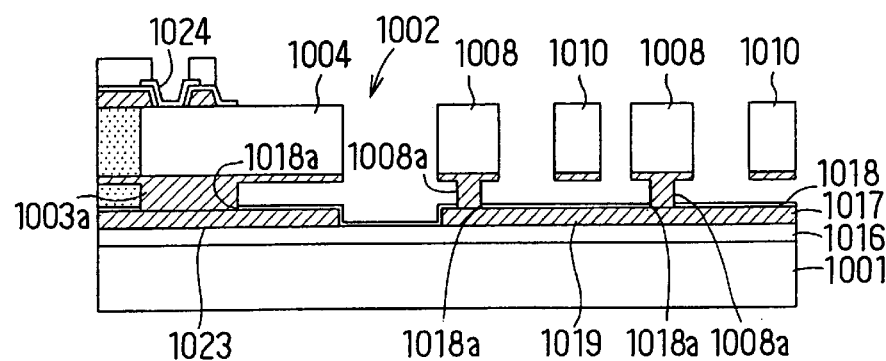
Figure 147:
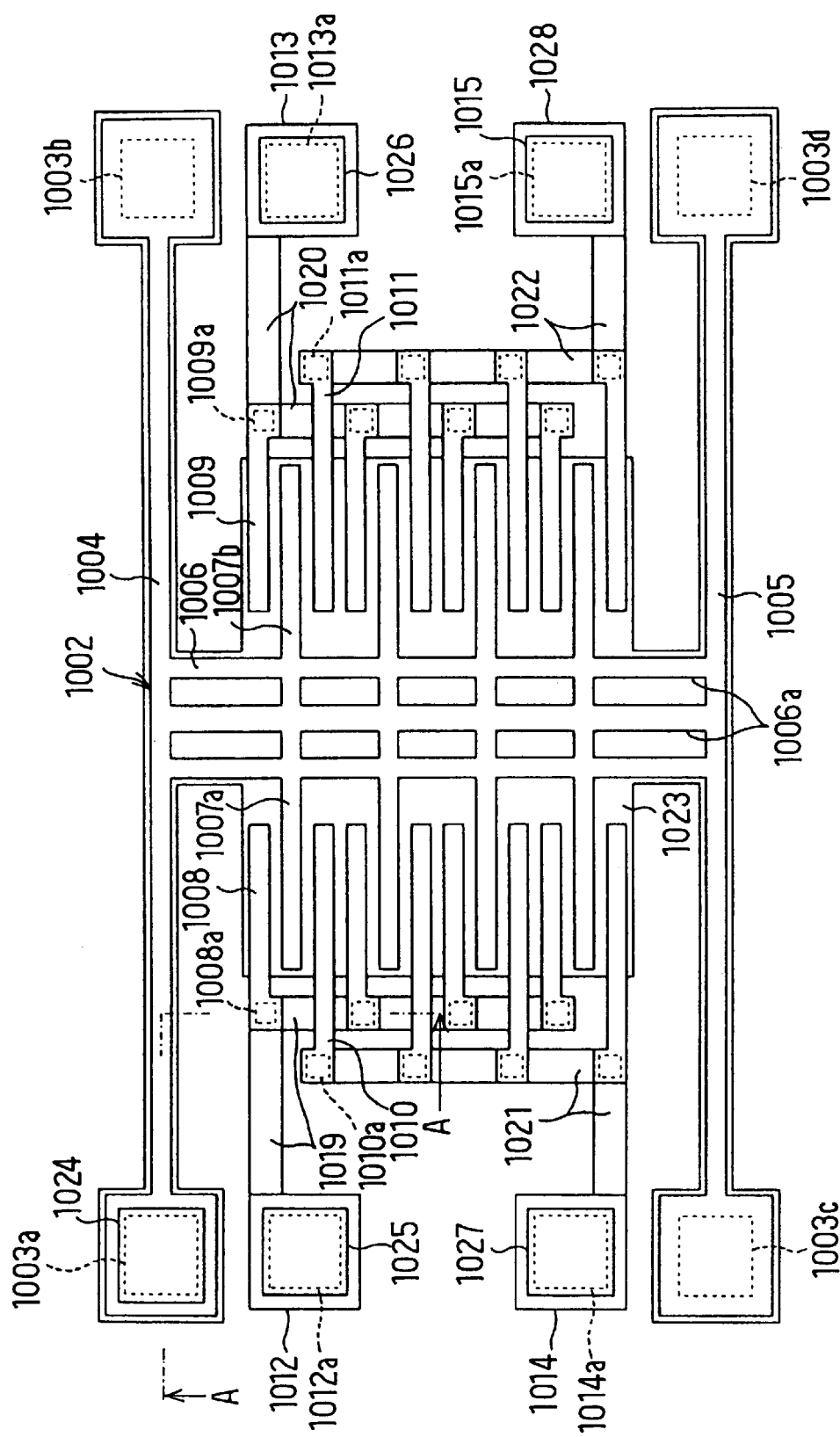
Figure 150A:
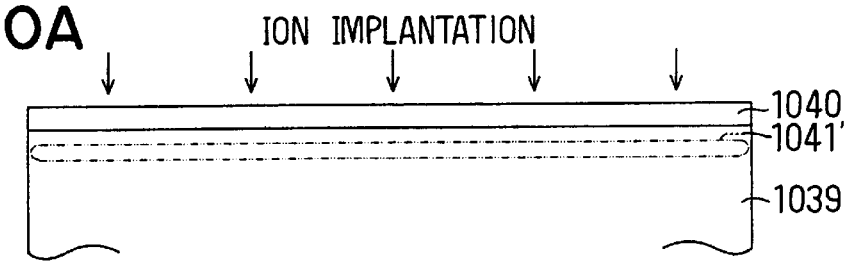
Figure 150B:
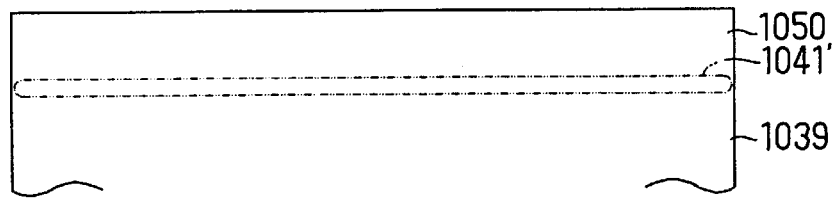
Figure 150C:
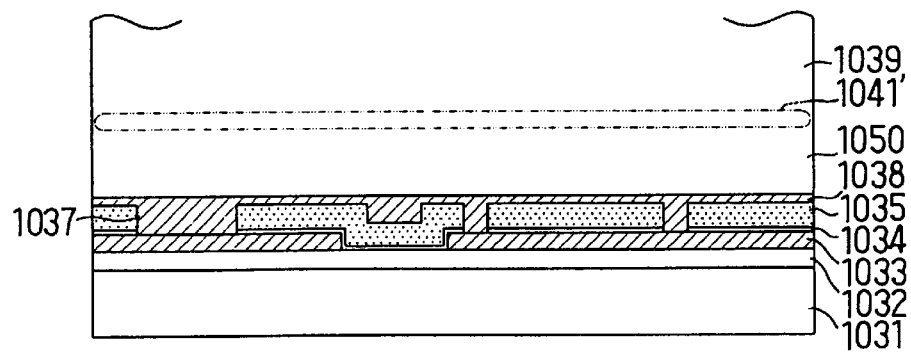
Figure 151A:
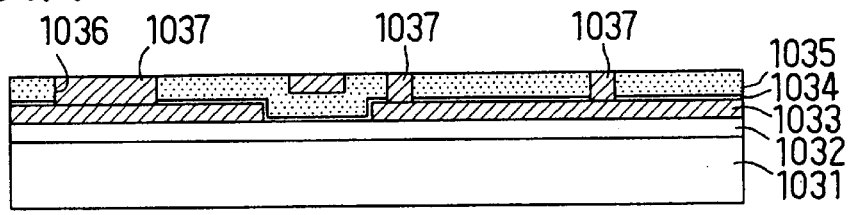
Figure 151B:
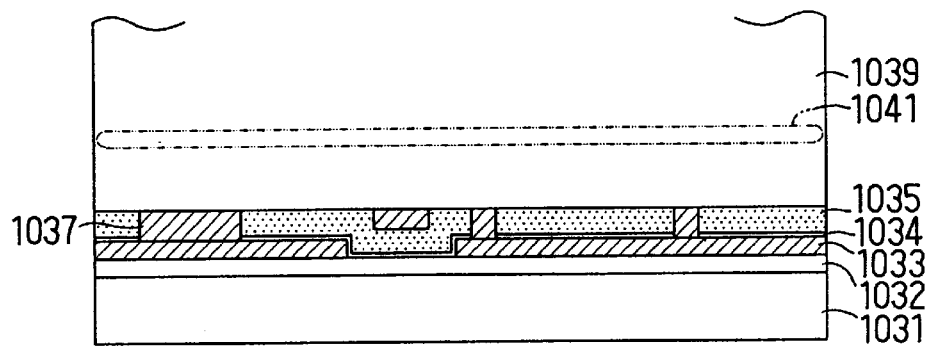
Figure 151C:
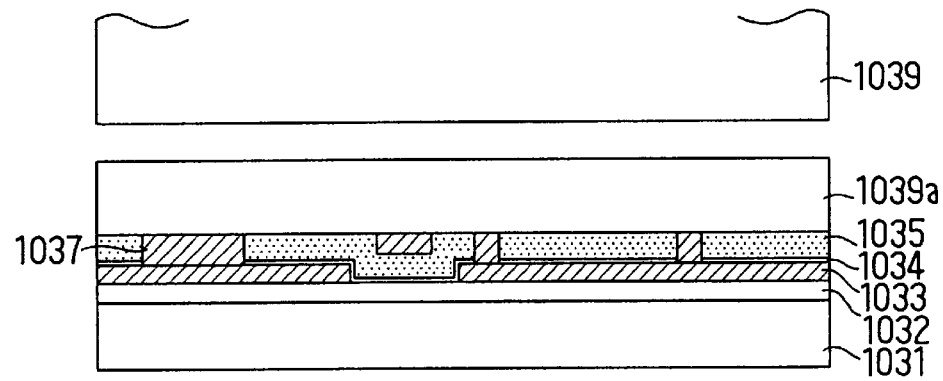
Figure 152:
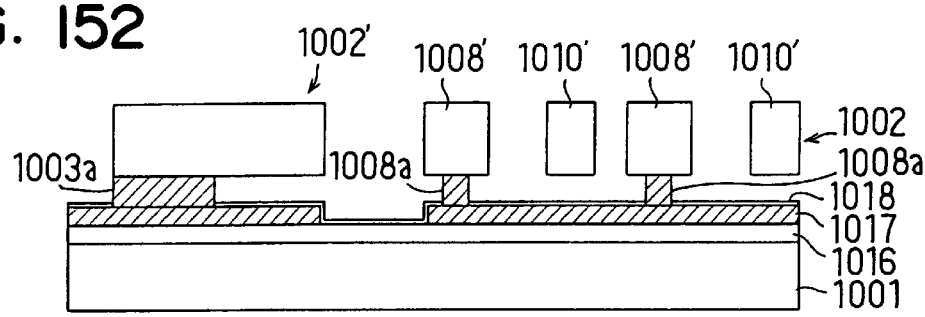
Figure 154A:
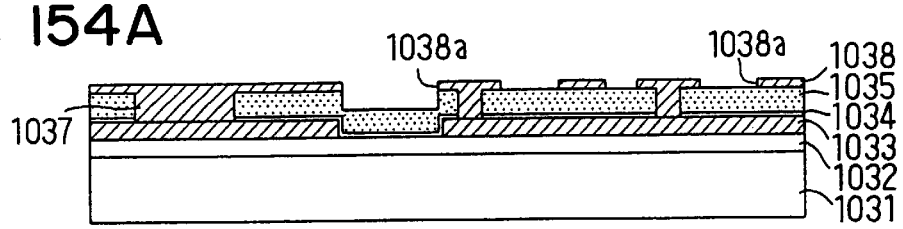
Figure 154B:
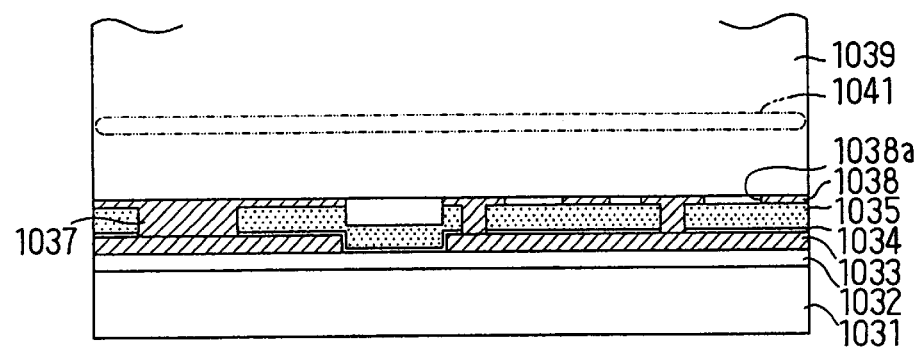
Figure 154C:
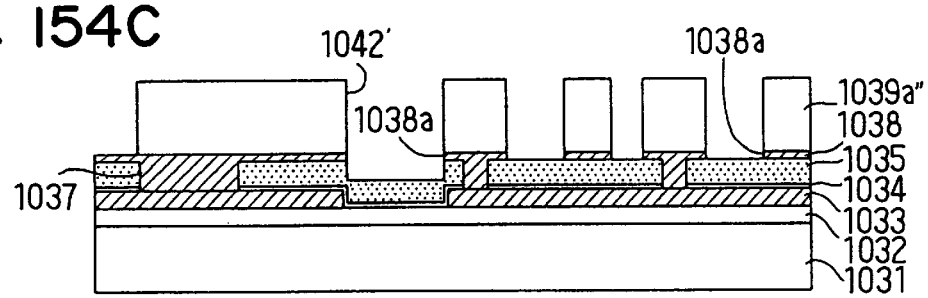

FIGS. 131A through 131C are further schematic sectional views of manufacturing steps continuing from FIG. 130C;

FIG. 132 is a plan view showing the disposition of pillars formed in a recess;

FIG. 133 is a block diagram of a manufacturing process according to a forty-ninth preferred embodiment;

FIGS. 134A through 134F are schematic sectional views of steps following a detaching step;

FIG. 135 is a block diagram of a manufacturing process according to a fiftieth preferred embodiment;

FIGS. 136A through 136C are schematic sectional views of steps of the manufacturing process;

FIGS. 137A through 137C are further schematic sectional views of steps of the manufacturing process continuing from FIG. 136C;

FIGS. 138A through 138C are further schematic sectional views of steps of the manufacturing process continuing from FIG. 137C;

FIG. 139 is a block diagram of a manufacturing process according to a fifty-first preferred embodiment;

FIG. 140 is a schematic sectional view illustrating an amorphous film forming step;

FIG. 141 is a schematic sectional view illustrating an amorphous film forming step of a fifty-second preferred embodiment;

FIGS. 142A through 142C are schematic sectional views of steps of a manufacturing process according to a fifty-third preferred embodiment;

FIGS. 143A through 143C are schematic sectional views of further steps of the process continuing from FIG. 142C;

FIGS. 144A through 144E are schematic sectional views illustrating steps of a manufacturing process according to a fifty-fourth preferred embodiment;

FIGS. 145A through 145C are schematic sectional views illustrating further steps of the manufacturing process;

FIGS. 146A through 146C are schematic sectional views illustrating further steps of the manufacturing process;

FIG. 147 is a plan view of a main part of a semiconductor acceleration sensor;

FIG. 148 is a sectional view on the line A—A in FIG. 147;

FIGS. 149A through 149D are sectional views schematically illustrating steps of a manufacturing process according to a fifty-fifth preferred embodiment;

FIGS. 150A through 150C are sectional views schematically illustrating steps of a manufacturing process according to a fifty-sixth preferred embodiment;

FIGS. 151A through 151C are sectional views schematically illustrating steps of a manufacturing process according to a fifty-seventh preferred embodiment;

FIG. 152 is a sectional view showing the basic structure of a semiconductor acceleration sensor;

FIGS. 153A through 153D are sectional views schematically showing steps of a manufacturing process according to a fifty-eighth preferred embodiment;

FIGS. 154A through 154C are sectional views schematically showing steps of a manufacturing process according to a fifty-ninth preferred embodiment; and FIGS. 155A through 155E are sectional views schematically showing steps of a manufacturing process according to a sixtieth preferred embodiment.

DETAILED DESCRIPTION OF THE PREFERRED EMBODIMENTS (First Preferred Embodiment)

A first preferred embodiment of the invention applied to a manufacturing process for a SOI substrate will now be described with reference to FIGS. 1A to 1E through FIGS. 3A to 3D, which illustrate steps of the manufacturing process by means of schematic sectional views.

Figure 1A:
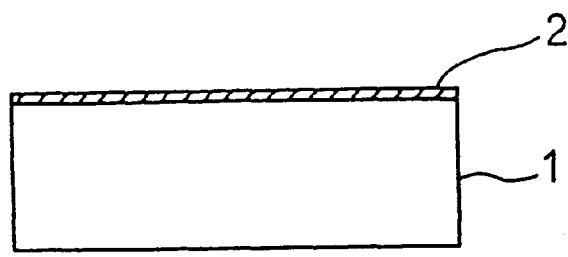
FIGS. 1A through 1E are schematic sectional views illustrating manufacturing steps according to a first preferred embodiment of the invention.

In an insulating film forming step illustrated in FIG. 1A, a first semiconductor substrate 1 consisting of a monocrystalline silicon wafer is prepared, and on the surface of this first semiconductor substrate 1 a silicon oxide film 2 of a uniform thickness is formed as an insulating film by, for example, thermal oxidation. The thickness of the silicon oxide film 2 is set in a range of, for example, 10 nm to 500 nm. Part or all of this silicon oxide film 2 functions as a gate oxide film for a buried electrode.

After that, in an electrode pattern forming step illustrated in FIG. 1B, by going through the procedure described below, an electrode pattern 3 consisting of impurities-doped polycrystalline silicon is formed on the silicon oxide film 2. This electrode pattern 3 is eventually to become a buried electrode.

Figure 1B:
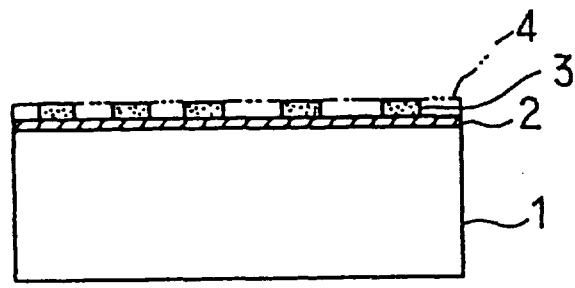

In this electrode pattern forming step, first, as shown with a double-dashed line in FIG. 1B, a homogeneous polycrystalline silicon film 4 is deposited on the entire surface of the silicon oxide film 2 by, for example, LPCVD. Impurities are added to this polycrystalline silicon film 4 by ion implantation or diffusion or the like. The thickness of the polycrystalline silicon film 4 is set in a range of, for example, 0.1 $\mu$m to several micrometers. Then, an electrode pattern 3 is formed by carrying out patterning on the polycrystalline silicon film 4 using photolithography or the like.

The impurities added to the polycrystalline silicon film 4 may be either P-type or N-type, according to the application, and may alternatively be added by employing a method wherein polycrystalline silicon is deposited in an atmosphere containing the impurities. Also, it is not necessary for the impurities to be added to the whole of the polycrystalline silicon film 4, and alternatively a two-layer structure having a lower polysilicon film to which impurities have been added by the kind of method mentioned above and an upper polysilicon film to which the impurities have not been added may be adopted.

Figure 1C:
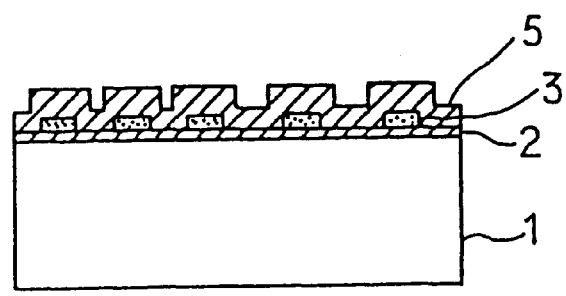

Next, in an insulating material depositing step illustrated in FIG. 1C, a silicon oxide film 5, which is an insulating material, is deposited on the silicon oxide film 2 and the electrode pattern 3 by CVD. The thickness of the silicon oxide film 5 is set in a range of, for example, 0.5 $\mu$m to 5 $\mu$m.

Figure 1D:
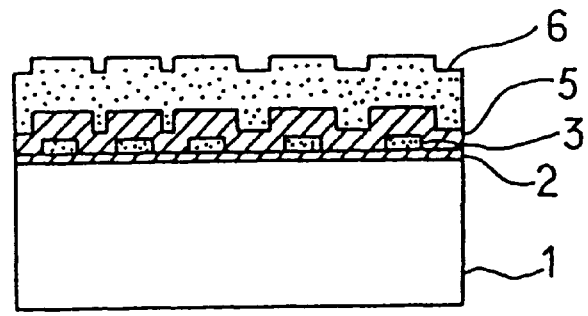
Figure 1E:
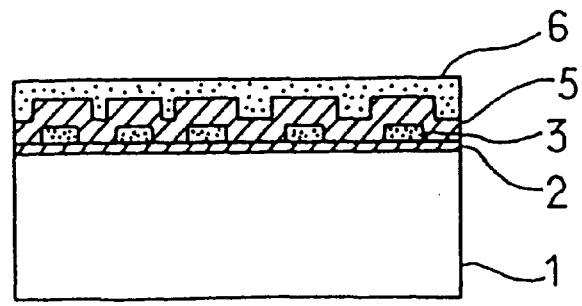

Then, in a flattening process material depositing step illustrated in FIG. 1D, a polysilicon film 6 of thickness 1 $\mu$m to 10 $\mu$m is deposited on the silicon oxide film 5 as a flattening process material by, for example, LPCVD. Then, in a flattening step illustrated in FIG. 1E, by, for example, chemical mechanical polishing (CMP) being carried out on the polysilicon film 6, its film thickness is reduced and its surface is flattened and smoothed.

Figure 2A:
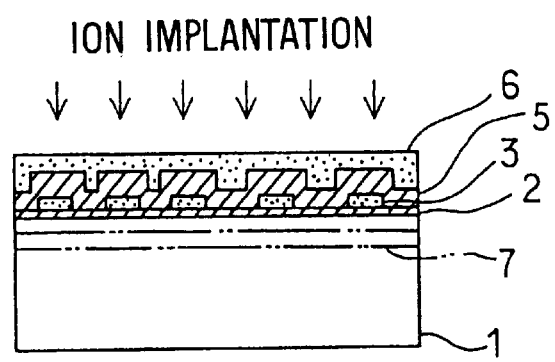
FIGS. 2A through 2D are schematic sectional views illustrating manufacturing steps continuing from FIG. 1E.

From this state, a first semiconductor substrate ion implantation step illustrated in FIG. 2A is carried out. In this first semiconductor substrate ion implantation step, by hydrogen ions being implanted into the first semiconductor substrate 1 from its insulating film 2 side face as shown with arrows in the figure, a hydrogen high-concentration layer 7 (equivalent to the ion-implanted layer referred to in the present invention) parallel with the surface of the first semiconductor substrate 1 is formed. Here, the dose of hydrogen ions is set to at least $1 \times 10^{16}$ atoms/cm$^2$ and preferably at least $5 \times 10^{16}$ atoms/cm$^2$. The ion implantation energy (corresponding to the ion acceleration voltage) is set according to the thicknesses of the polysilicon film 6 and the silicon oxide films 2 and 5 and the depth at which the hydrogen high-concentration layer 7 is to be formed.

After this first semiconductor substrate ion implantation step is carried out, if necessary, a secondary flattening step (not shown) for removing surface roughness caused by the ion implantation may be carried out by chemical mechanical polishing being performed on the surface of the polysilicon film 6, and its surface thereby smoothed (mirrorized).

The first semiconductor substrate ion implantation step may alternatively be carried out immediately after the execution of the above-mentioned flattening process material depositing step (see FIG. 1D). In this case, it is possible for the flattening step (see FIG. 1E) and a secondary flattening step (not shown) to be carried out as a single step (although the ion implantation energy required in the ion implantation step increases). Also, after the polysilicon film 6 is mirror-polished in the flattening step, a silicon oxide film of a uniform film thickness may be formed on its surface (the mirror-polished surface) by thermal oxidation or the like, and the ion implantation step then carried out with this silicon oxide film being made to function as a contamination protection film. When a contamination protection film is formed like this, the process can proceed to a first laminating step, to be discussed hereinafter, without the secondary flattening step being carried out, or alternatively part or all of the contamination protection film may be removed by chemical etching (wet etching or dry etching) or the like before the process proceeds to a first laminating step.

Figure 2B:
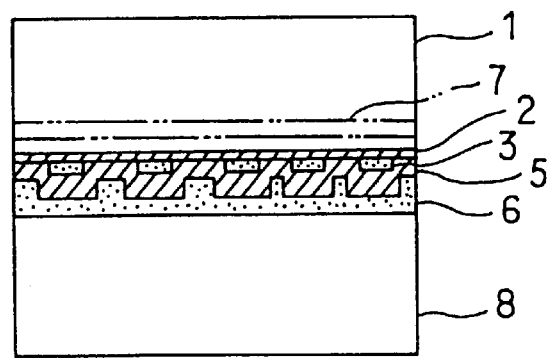

After the first semiconductor substrate ion implantation step is carried out, a first laminating step illustrated in FIG. 2B is performed. In this first laminating step, first, a supporting substrate 8 (see FIG. 2B) consisting of a monocrystalline silicon wafer whose face on at least one side is a mirror face is prepared, and hydrophilicizing treatment for imparting hydrophilicity is carried out on the surface (the mirror face) of this supporting substrate 8 and on the surface of the polysilicon film 6 of the first semiconductor substrate 1.

Specifically, as this hydrophilicizing treatment, by means such as immersing the first semiconductor substrate 1 and the supporting substrate 8 in an acidic solution such as a mixed solution of sulfuric acid and hydrogen peroxide water (for example $H_2SO_4:H_2O_2=4:1$) held at a temperature of about 90° C. to 120° C., or oxygen plasma irradiation, an oxide layer is formed on the surface of the first semiconductor substrate 1 (the surface of the polysilicon film 6) and on the surface of the supporting substrate 8 to impart hydrophilicity, after which they are washed with flowing ultrapure water. Then, drying by means of a spin dryer or the like is carried out to control the amount of water adsorbed onto the surfaces of the first semiconductor substrate 1 and the supporting substrate 8.

After that, the surface of the first semiconductor substrate 1 (the surface of the polysilicon film 6) and the surface of the supporting substrate 8 are brought together. As a result, the substrates 1 and 8 are directly bonded to each other due to hydrogen bonding of silanol radicals formed on their surfaces.

A silicon oxide film of a uniform film thickness (about 100 nm to 1000 nm) may be formed on the surface (the mirror face) of the supporting substrate 8 in advance by, for example, thermal oxidation. Hydrophilicizing may be carried out on the surface of this silicon oxide film before a first laminating step of the kind mentioned above is performed.

Figure 2C:
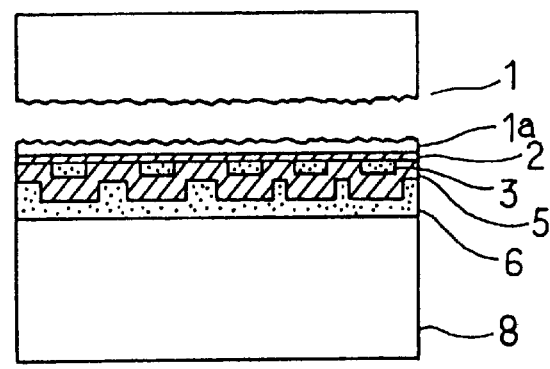

After that, in a first semiconductor substrate detaching step illustrated in FIG. 2C, by heat treatment being carried out in an inert gas atmosphere of, for example, nitrogen on the first semiconductor substrate 1 and the supporting substrate 8 thus laminated together, the first semiconductor substrate 1 is detached at a defective layer region formed by the hydrogen high-concentration layer 7. As a result, residual silicon 1a consisting of a monocrystalline silicon thin film is left on the silicon oxide film 2 serving as an insulating film on the supporting substrate 8.

In this first semiconductor substrate detaching step, the heat treatment preferably is carried out at about 400° C. to 600° C. Due to this heat treatment, microbubbles coalesce in the defective layer region formed by the hydrogen high-concentration layer 7 and form macrobubbles. As a result, detachment of the first semiconductor substrate 1 at the defective layer region occurs.

It is desirable that the film thickness of the residual silicon 1a be extremely small. In the first semiconductor substrate ion implantation step mentioned above, the ion implantation depth (the depth position of the hydrogen high-concentration layer 7) is set so that this kind of film thickness can be obtained. The first semiconductor substrate 1 from which the residual silicon 1a part has been cut off in the first semiconductor substrate detaching step can have its detachment surface flattened by chemical mechanical polishing and be reused.

After the residual silicon 1a is detached from the first semiconductor substrate 1 in the first semiconductor substrate detaching step, although it is not specifically illustrated in the drawings, a heat treatment step is then carried out. In this heat treatment step, in an inert gas atmosphere such as nitrogen or in an oxidizing atmosphere, heat treatment at a higher temperature (preferably over 1000° C. to 1300° C.) than the heat treatment temperature in the first semiconductor substrate detaching step is carried out for one hour or more, and the strength with which the laminated surfaces of the polysilicon film 6 and the supporting substrate 8 are bonded is thereby increased.

Figure 2D:
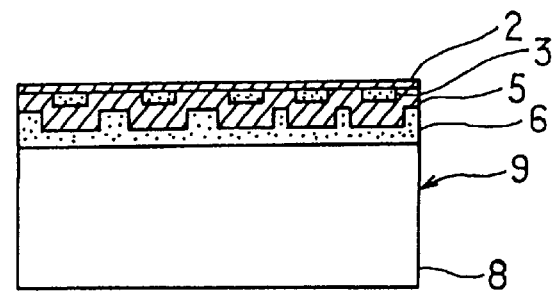

Next, as illustrated in FIG. 2D, a removing step is carried out to remove the residual silicon 1a on the silicon oxide film 2. As a result, a buried electrode substrate 9 having the silicon oxide film 2 exposed over its entire surface is formed. Specifically, in this removing step, the residual silicon 1a can be removed by wet etching being carried out with the silicon oxide film 2 being made to function as a stopper. As the etching solvent in this case, aqueous tetra methyl ammonium hydroxide (TMAH), aqueous sodium hydroxide (NaOH), aqueous potassium hydroxide (KOH) or a hydrofluoric acid—nitric acid etching solvent or the like can be used.

The removal of the residual silicon 1a may alternatively be carried out by selective polishing or dry etching with the silicon oxide film 2 being made to function as a stopper, but whichever removal method is employed it is desirable that variation in the thickness of the silicon oxide film 2 be suppressed by conditions such that the silicon oxide film 2 is not easily etched or polished (conditions such that the selectivity of monocrystalline silicon to silicon oxide film is large) being selected.

Of the steps for forming the buried electrode substrate 9 as described above, the first semiconductor substrate ion implantation step, the first semiconductor substrate detaching step and the removing step are equivalent to the substrate forming step referred to in the present invention. As well as a buried electrode substrate 9 being formed in this way, a second semiconductor substrate 10 consisting of a monocrystalline silicon wafer whose face on at least one side is a mirror face is prepared. A hydrogen high-concentration layer substrate 11 is formed using this second semiconductor substrate 10, as illustrated in FIG. 3A.

Figure 3A:
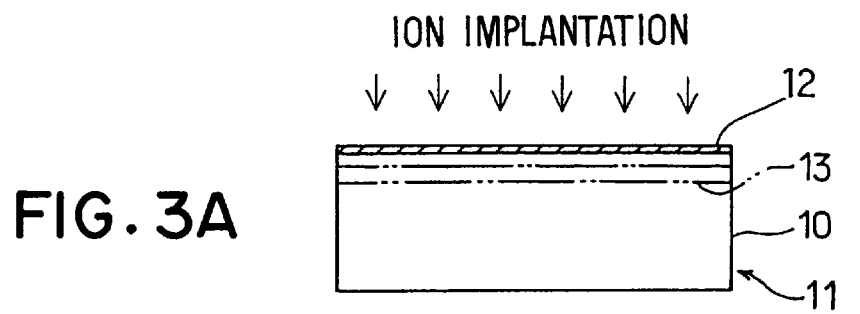
FIGS. 3A through 3D are schematic sectional views illustrating manufacturing steps continuing from FIG. 2D.

FIG. 3A illustrates an ion implantation step, and before this step is executed a silicon oxide film 12 (of film thickness 50 nm to 100 nm) to function as a contamination protection film is formed by thermal oxidation or CVD on the surface (the mirror face) of the second semiconductor substrate 10. In the ion implantation step, hydrogen ions are implanted into the second semiconductor substrate 10 from the silicon oxide film 12 side as shown with arrows in the figure. As a result, a hydrogen high-concentration layer 13 (corresponding to the ion-implanted layer referred to in the present invention) parallel with the surface of the second semiconductor substrate 10 is formed to complete a hydrogen high-concentration layer substrate 11.

In this case, in this preferred embodiment, the hydrogen high-concentration layer 13 is formed at a depth of about 0.1 $\mu$m to 2 $\mu$m from the surface of the second semiconductor substrate 10. In this ion implantation step also, as in the first semiconductor substrate ion implantation step (see FIG. 2A), the dose of hydrogen ions is set to at least $1\times10^{16}$ atoms/cm$^2$ and preferably at least $5\times10^{16}$ atoms/cm$^2$, and the ion implantation energy is set according to the thickness of the silicon oxide film 12 and the depth at which the hydrogen high-concentration layer 13 is to be formed.

In this preferred embodiment, after the execution of this ion implantation step, the silicon oxide film 12 is completely removed by wet etching (using, for example, aqueous fluoric acid) or dry etching before subsequent steps from a second laminating step onward to be described hereinafter are carried out. However, the second laminating step and subsequent steps may be alternatively carried out with the silicon oxide film 12 left as it is or having had only a surface part removed.

Figure 3B:
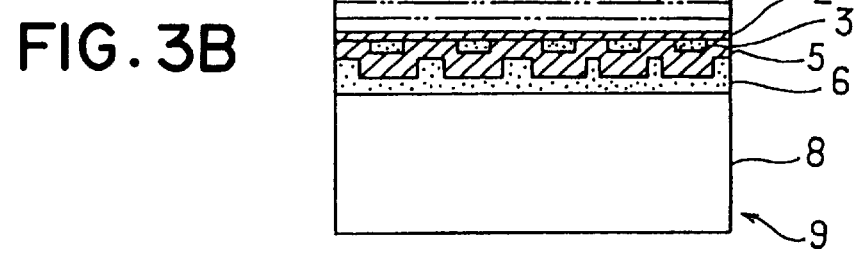

In the second laminating step illustrated in FIG. 3B, hydrophilicizing treatment is first carried out. As this hydrophilicizing treatment, by means such as immersing the buried electrode substrate 9 and the hydrogen high-concentration layer substrate 11 in an acidic solution such as a mixed solution of sulfuric acid and aqueous hydrogen peroxide (for example $H_2SO_4:H_2O_2=4:1$) held at a temperature of about 90° C. to 120° C., or oxygen plasma irradiation, an oxide layer is formed on the surface of the buried electrode substrate 9 (the surface of the silicon oxide film 2) and on the surface of the hydrogen high-concentration layer substrate 11 (in this case, because the silicon oxide film 12 has been completely removed, equivalent to the surface of the second semiconductor substrate 10) to impart hydrophilicity. After that, they are washed with flowing ultrapure water. Then, drying by means of a spin dryer or the like is carried out to control the amount of water adsorbed onto the surfaces of the buried electrode substrate 9 and the hydrogen high-concentration layer substrate 11.

Next, the surface of the buried electrode substrate 9 (the surface of the silicon oxide film 2) and the surface of the hydrogen high-concentration layer substrate 11 are brought together. As a result, the substrates 9 and 11 are directly bonded to each other by hydrogen bonding of silanol radicals formed at their surfaces.

Figure 3C:
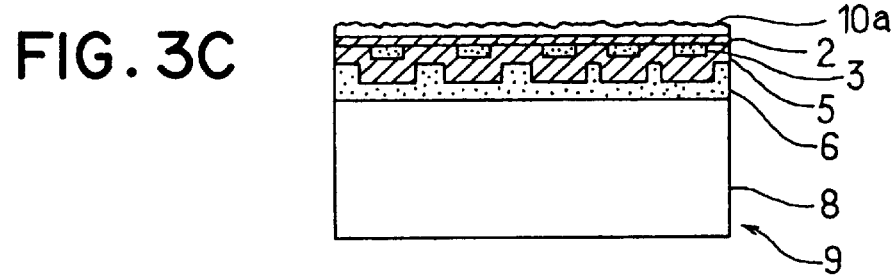

After that, in a detaching step illustrated in FIG. 3C, by heat treatment being carried out in an inert gas atmosphere of, for example, nitrogen on the buried electrode substrate 9 and the hydrogen high-concentration layer substrate 11 thus laminated together, the hydrogen high-concentration layer substrate 11 is detached at a defective layer region formed by the hydrogen high-concentration layer 13. As a result, a residual silicon 10a consisting of a monocrystalline silicon thin film is left on the silicon oxide film 2 serving as an insulating film on the buried electrode substrate 9.

In this detaching step, the heat treatment preferably is carried out at about 400° C. to 600° C. Due to this heat treatment, microbubbles coalesce at the defective layer region formed by the hydrogen high-concentration layer 13 and form macrobubbles. Therefore, detachment of the hydrogen high-concentration substrate 11 at the defective layer region occurs.

In this case, because, in the ion implantation step mentioned above, the hydrogen high-concentration layer 13 was formed at a depth of 0.1 $\mu$m to 2 $\mu$m from the surface of the second semiconductor substrate 10, the film thickness of the residual silicon 10a is no more than about 0.1 $\mu$m to 2 $\mu$m. The second semiconductor substrate 10 from which the residual silicon 10a part has been cut off in the detaching step can have its detachment surface flattened by chemical mechanical polishing or the like and be reused.

After the residual silicon 10a is detached from the hydrogen high-concentration layer substrate 11 in the detaching step described above, although it is not specifically shown in the drawings, a heat treatment step is then carried out. In this heat treatment step, in an inert gas atmosphere such as nitrogen, heat treatment at a higher temperature (preferably over 1000° C. to 1300° C.) than the heat treatment temperature in the detaching step is carried out for one hour or more. As a result, the strength with which the laminated surfaces of the silicon oxide film 2 and the hydrogen high-concentration layer substrate 11 (the residual silicon 10a) are bonded is increased.

Also, after this heat treatment step, a supplementary heat treatment step of carrying out high-temperature heat treatment in an oxidizing atmosphere is performed. In this supplementary heat treatment step, for example, after the heat treatment step mentioned above is finished, the atmosphere gas is changed from an inert gas to oxygen gas, and a heat treatment of about 1000° C. to 1300° C., is carried out for about 1 hour in this state. As a result, an oxide layer, for example, of a film thickness less than about 10 nm is formed at the interface with the silicon oxide film 2 in the residual silicon 10a on the buried electrode substrata 9 side.

Because, in response to the execution of this kind of supplementary heat treatment step, a silicon oxide layer is also formed on the surface of the residual silicon 10a, the film thickness of the residual silicon 10a (the ion implantation depth in the ion implantation step) is set with this oxidation amount also being anticipated. The heat treatment step and the supplementary heat treatment step may alternatively be executed together by the heat treatment step being carried out in an oxidizing atmosphere from the start.

Figure 3D:
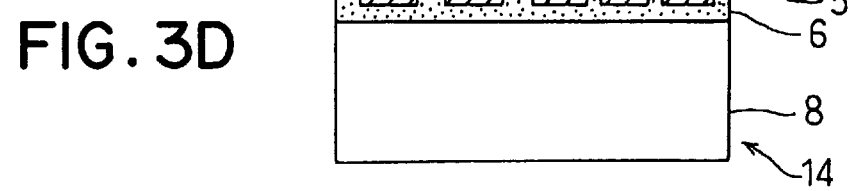

At the surface (the detachment surface) of this residual silicon 10a, a defective layer formed due to the ion implantation remains and minute steps of several nanometers to several tens of nanometers arise. To deal with this, after the supplementary heat treatment step is executed, as illustrated in FIG. 3D, a detachment surface treating step for removing the surface steps and the defective layer and the silicon oxide layer of the residual silicon 10a is carried out. As a result, a SOI substrate 14 (semiconductor substrate) having a monocrystalline silicon thin film 10b (equivalent to the residual silicon 10a) constituting a SOI layer (semiconductor layer), a pattern structure for a buried electrode (the electrode pattern 3) and a silicon oxide film 2 to function as a gate oxide film for this buried electrode is finally completed.

In the detachment surface treating step described above, it is possible to remove the surface steps and the defective layer of the residual silicon 10a by chemical mechanical polishing. However, if chemical mechanical polishing is carried out after the oxide layer at the residual silicon 10a surface is removed by, for example, wet etching, compared to when they are removed by chemical mechanical polishing only, it is possible to raise the film thickness controllability of the monocrystalline silicon thin film 10b (the SOI layer). That is, when a silicon oxide layer is formed on the surface of the residual silicon 10a in response to the execution of the supplementary heat treatment step, the irregularities of the surface of the monocrystalline silicon part of the residual silicon 10a (its interface with the silicon oxide being formed) diminish. As a result, the part of the residual silicon 10a to be polished is smaller than in the case of chemical mechanical polishing only carried out. Therefore, it is possible to increase the film thickness controllability of the monocrystalline silicon thin film 10b.

With a manufacturing method according to the preferred embodiment described above, in manufacturing a SOI substrate 14 having a buried electrode (the electrode pattern 3) and a gate oxide film (the silicon oxide film 2) for this buried electrode, it is possible to achieve numerous beneficial effects such as those discussed below.

That is, the film thickness of the monocrystalline silicon thin film 10b formed on the silicon oxide film 2 on the supporting substrate 8 is determined according to the depth of the hydrogen high-concentration layer 13 formed on the second semiconductor substrate 10 in the ion implantation step. This depth can be set exactly by control of the ion implantation energy. Therefore, even when the monocrystalline silicon thin film 10b is to be formed as an extremely thin film, its film thickness controllability can be greatly increased. Therefore, a SOI substrate 14 wherein the film thickness of the monocrystalline silicon thin film 10b is set to a desired dimension can be manufactured easily and hence can be deployed to various uses.

Also, the face of the second semiconductor substrate 10 on the ion implantation side can be brought to a flattened state in advance extremely easily. When, as in this preferred embodiment, a second semiconductor substrate 10 whose face on at least one side has been mirrorized is prepared and ion implantation is carried out from this mirror face (in practice, the face on which the silicon oxide film 12 has been formed as a contamination protection film) side, it is possible to make the hydrogen high-concentration layer 13 and the silicon oxide film 2 exactly parallel after the second laminating step has been executed. As a result, it becomes possible to greatly increase the film thickness uniformity of the monocrystalline silicon thin film 10b, and it is possible to realize a great improvement in the quality and characteristics of the SOI substrate 14 eventually obtained.

Also, in the manufacturing process of the SOI substrate 14, because the silicon oxide film 2, the electrode pattern 3, the silicon oxide film 5 and the polysilicon film 6 successively formed on the first semiconductor substrate 1 are transferred to the supporting substrate 8 side by a first laminating step and a substrate forming step (the first semiconductor substrate ion implantation step, the first semiconductor substrate detaching step and the removing step) being performed, that is, because a buried electrode substrate 9 in which a polysilicon film 6, a silicon oxide film 5, an electrode pattern 3 and a silicon oxide film 2 are disposed in this order on a supporting substrate 8 is formed, in particular it becomes possible to broaden the range of selection alternatives for the method of formation of the silicon oxide film 2 functioning as a gate oxide film.

Specifically, in this preferred embodiment, because the silicon oxide film 2 is formed by thermal oxidation, with which the film thickness controllability is high, it becomes possible to form the silicon oxide film 2 densely and also to a required film thickness. Also, it is possible to achieve an improvement in the uniformity of that film thickness and a stabilization of characteristics accompanying this.

In the flattening step necessary for laminating the first semiconductor substrate 1 having the silicon oxide film 2 and so on formed thereon to the supporting substrate 8, it is only necessary to carry out flattening on the polysilicon film 6, which is a flattening process material, and it is unnecessary to remove the silicon oxide film 5, which is an insulating material. Consequently, the thickness of the silicon oxide film 5 can be kept unchanged at the original thickness reached in the insulating material depositing step, and variation in this thickness dimension can be minimized. As a result, if consideration is given to the selection of the flattening process material, and for example as in this preferred embodiment a polysilicon film 6 is used, it becomes possible to suppress fluctuation of rear side electrode or rear side interconnection static capacitance depending on the film thickness of the silicon oxide film 5 and contribute to the characteristics stability of the SOI substrate 14 finally obtained.

In this case, when large irregularities arise in the surface of the polysilicon film 6 due to the structure of the electrode pattern 3, it is necessary to make the amount of cut in the flattening step large. Consequently, it becomes necessary to set the film thickness of the polysilicon film 6 large; however, generally, since the deposition rate of polycrystalline silicon is faster than the deposition rate of silicon oxide, there is the advantage that throughput increases compared to when the silicon oxide film 5 alone is deposited to reach the required film thickness.

The first semiconductor substrate 1 and the second semiconductor substrate 10, each time detaching of the residual silicon films 1a and 10a respectively therefrom is carried out, are only consumed by amounts corresponding to the thicknesses of the residual silicon films 1a and 10a. Further, because they can be repeatedly reused it is possible to greatly reduce overall manufacturing costs.

Because, in the heat treatment step carried out in a final stage by performing heat treatment at a higher temperature (preferably more than 1000° C. to 1300° C.) than the heat treatment temperature (400° C. to 600° C.) in the detaching step for detaching the second semiconductor substrate 10, the bonding strength of the laminated surfaces of the silicon oxide film 2 on the buried electrode substrate 9 side and the second semiconductor substrate 10 is increased. Therefore, the reliability of the SOI substrate 14 finally obtained can be improved.

Also, because, by a supplementary heat treatment step in an oxidizing atmosphere being executed in the final stage, an oxide layer is formed at the interface with the silicon oxide film 2 in the residual silicon 10a, the interface between the silicon layer 10b and the silicon oxide film 2 serving as a rear gate oxide film becomes not the lamination face but rather an interface with the oxide layer formed by the silicon layer 10b being thermally oxidized in the supplementary heat treatment step. Therefore, there are fewer defects and fixed charges at the interface. As a result, there cease to be insulation breakdown problems and threshold voltage fluctuations of the gate oxide film, the interface between the monocrystalline silicon thin film 10b finally obtained and the silicon oxide film 2 can be made good, and the characteristics of the SOI substrate 14 can be improved.

In forming the buried electrode substrate 9, to remove the residual silicon 1a on the silicon oxide film 2 and thereby expose the whole of the silicon oxide film 2, wet etching is carried out with the silicon oxide film 2 being made to function as a stopper. Therefore, it becomes possible to expose the entire surface of this silicon oxide film 2 simply and certainly. The same effect can be obtained when the residual silicon 1a is removed by selective polishing or dry etching with the silicon oxide film 2 being made to function as a stopper.

Also, in particular, when wet etching is carried out, in experiments conducted by the present inventors it has been found that when aqueous tetra methyl ammonium hydroxide (TMAH), aqueous sodium hydroxide (NaOH), aqueous potassium hydroxide (KOH) or a hydrofluoric acid—nitric acid etching liquid or the like is used, the surface uniformity of the final lamination face (the lamination face between the silicon oxide film 2 and the hydrogen high-concentration layer substrate 11) is good and thereby it is possible to realize an improvement in the reliability of the lamination. That is, the use of these etchants is thus practically beneficial.

(Second Preferred Embodiment)

A second preferred embodiment of the invention is shown in FIGS. 4A to 4E through FIGS. 6A through 6D, and parts thereof differing from the foregoing first preferred embodiment will now be described. FIGS. 4A to 4E through FIGS. 6A through 6D illustrate steps for manufacturing a SOI substrate by means of schematic sectional views in the same way as FIGS. 1A to 1E through FIGS. 3A to 3D.

Figure 4A:
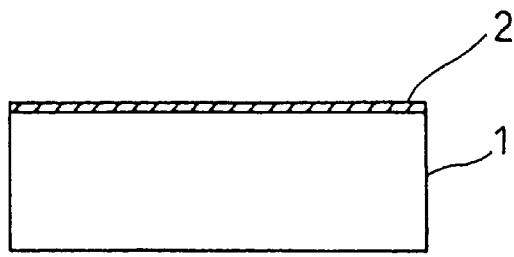
FIGS. 4A through 4E are schematic sectional views illustrating manufacturing steps according to a second preferred embodiment of the invention.
Figure 4B:
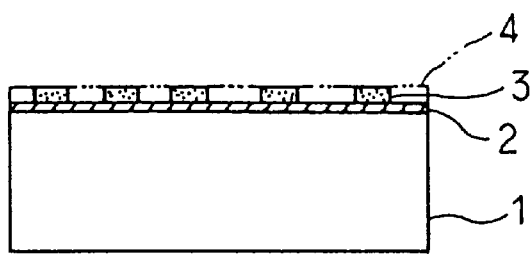
Figure 4C:
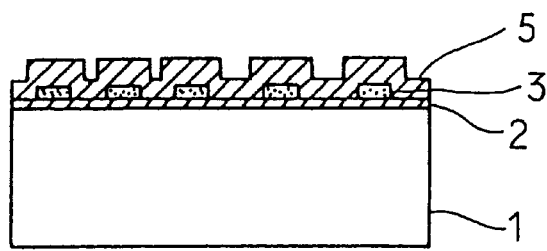
Figure 4D:
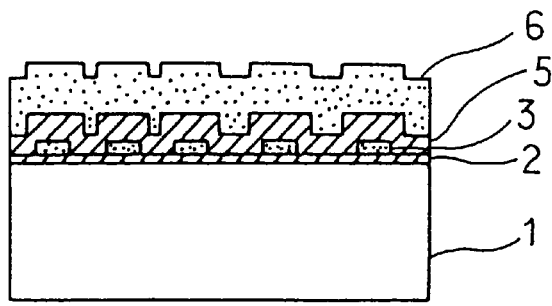
Figure 4E:
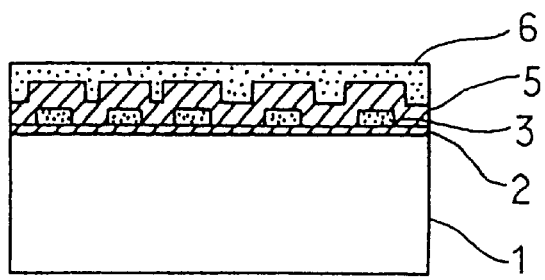

In this second preferred embodiment, an insulating film forming step shown in FIG. 4A, an electrode pattern forming step shown in FIG. 4B, an insulating material depositing step shown in FIG. 4C and a flattening process material depositing step shown in FIG. 4E are carried out in the same way as the insulating film forming step (see FIG. 1A), the electrode pattern forming step (see FIG. 1B), the insulating material depositing step (see FIG. 1C), the flattening process material depositing step (see FIG. 1D) and the flattening step (see FIG. 1E) in the first preferred embodiment.

Figure 5A:
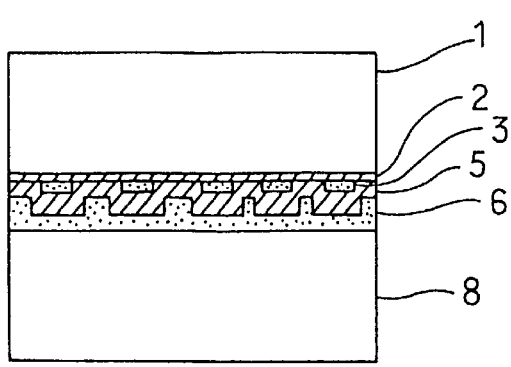
FIGS. 5A through 5C are schematic sectional views illustrating manufacturing steps continuing from FIG. 4E.

Thereafter, without a first semiconductor substrate ion implantation step of the kind described in the first preferred embodiment being carried out, a first laminating step illustrated in FIG. 5A is executed. In this case, in the first laminating step, hydrophilicizing treatment is first carried out. As this hydrophilicizing treatment, after a supporting substrate 8 consisting of a monocrystalline silicon wafer whose face on at least one side is a mirror face is prepared, a treatment for imparting hydrophilicity to the surface (the mirror surface) of this supporting substrate 8 and the surface of the polysilicon film 6 on the first semiconductor substrate 1 is executed in the same way as in the first preferred embodiment.

After that, by the surface of the first semiconductor substrate 1 (the surface of the polysilicon film 6) and the surface of the supporting substrate 8 being brought together, the substrates 1 and 8 are directly bonded to each other by hydrogen bonding of silanol radicals formed at their surfaces and water molecules adsorbed onto their surfaces. Then, by heat treatment being carried out on this laminated substrate, the bonding strength of the lamination face between the polysilicon film 6 and the supporting substrate 8 is strengthened. The heat treatment in this case is preferably carried out at a temperature of 1000° C. to 1300° C. or more for no less than one hour. Alternatively, a silicon oxide film of a uniform thickness (about 100 to 1000 nm) may be formed on the surface (the mirror surface) of the supporting substrate 8 in advance by, for example, thermal oxidation and this first laminating step carried out after hydrophilicizing is carried out on the surface of this silicon oxide film.

Figure 5B:
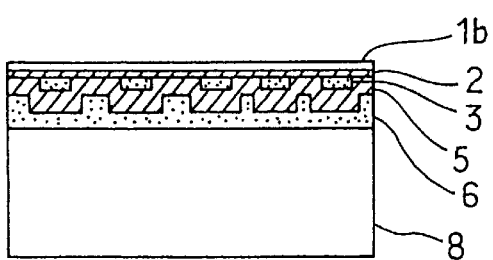

Next, in a polishing step illustrated in FIG. 5B, by the first semiconductor substrate 1 being polished to just before the silicon oxide film 2 becomes exposed, residual silicon 1b of film thickness about 1 µm to 10 µm is formed.

Figure 5C:
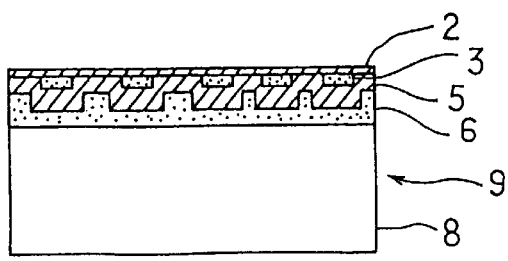

After that, as shown in FIG. 5C, the residual silicon 1b on the silicon oxide film 2 is removed by an etching step being carried out and a buried electrode substrate 9 having the silicon oxide film 2 exposed over its entire surface is thereby formed. Specifically, in this etching step, the residual silicon 1b can be removed by carrying out wet etching wherein the silicon oxide film 2 is made to function as a stopper. As the etching solvent in this case, aqueous tetra methyl ammonium hydroxide (TMAH), aqueous sodium hydroxide (NaOH), aqueous potassium hydroxide (KOH) or a hydrofluoric acid—nitric acid etching liquid or the like can be used.

Instead of the first semiconductor substrate 1 being polished, it may be etched, in which case the silicon oxide film 2 can be exposed over its entire surface by means of a series of etching processes.

Figure 6A:
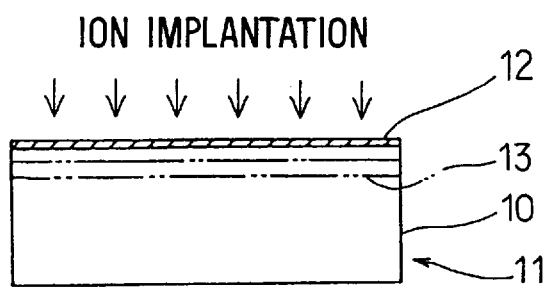
FIGS. 6A through 6D are schematic sectional views illustrating manufacturing steps continuing from FIG. 5C.
Figure 6B:
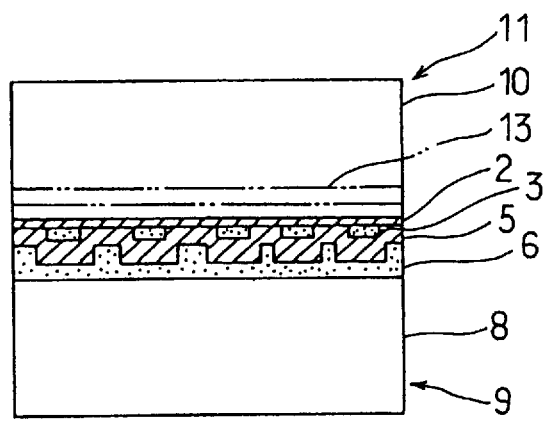
Figure 6C:
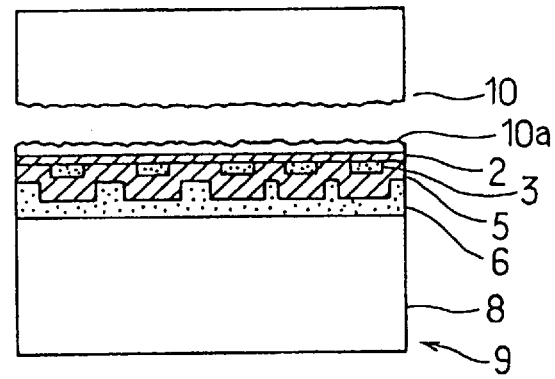
Figure 6D:
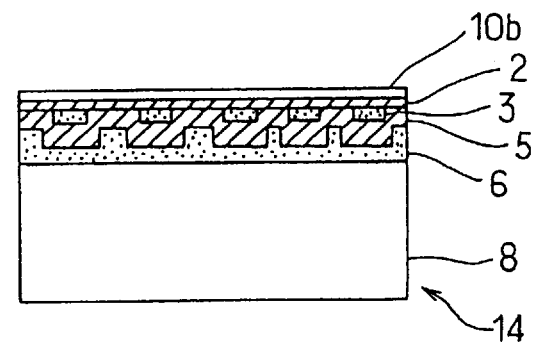

Of the steps for forming a buried electrode substrate 9 as described above, the polishing step and the etching step are equivalent to the substrate forming step referred to in the present invention. As well as a buried electrode substrate 9 being formed in this way, a second semiconductor substrate 10 consisting of a monocrystalline silicon wafer whose face on at least one side is a mirror face is prepared. An ion implantation step shown in FIG. 6A, a second laminating step shown in FIG. 6B, a detaching step shown in FIG. 6C and a detachment surface treating step shown in FIG. 6D are executed in the same way as the ion implantation step (see FIG. 3A), the second laminating step (see FIG. 3B), the detaching step (see FIG. 3C) and the detachment surface treating step (see FIG. 3D) in the first preferred embodiment to complete a SOI substrate 14.

In this preferred embodiment also, after the execution of the detaching step, a heat treatment step for raising the bonding strength of the laminated surfaces and a supplementary heat treatment step for forming an oxide layer at the interface with the silicon oxide film 2 in the residual silicon 10a are carried out.

Because, with this preferred embodiment, the substrate forming step can be completed with a polishing step and an etching step only, it is useful when the number of types of step required is to be reduced.

In this preferred embodiment, the substrate forming step was made up of a polishing step of polishing the first semiconductor substrate 1 and an etching step of wet etching the residual silicon 1b. However, instead of this etching step, a selective polishing step wherein the silicon oxide film 2 is made to function as a stopper may be carried out or dry etching may be carried out.

(Third Preferred Embodiment)

A third preferred embodiment of the invention is shown in FIGS. 7A to 7D through FIGS. 9A to 9D, and parts thereof differing from the foregoing first preferred embodiment will now be described. FIGS. 7A through 7E to FIGS. 9A through 9D illustrate steps for manufacturing a SOI substrate by means of schematic sectional views in the same way as FIGS. 1A to 1E through FIGS. 3A to 3D.

Figure 7A:
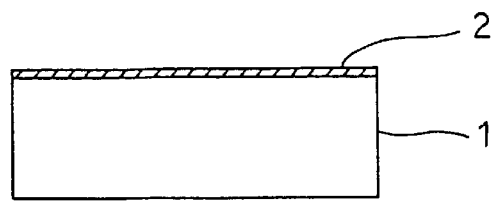
FIGS. 7A through 7D are schematic sectional views illustrating manufacturing steps according to a third preferred embodiment of the invention.
Figure 7B:
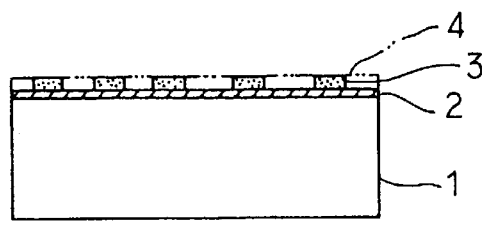
Figure 7C:
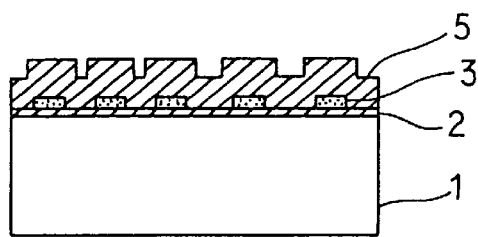
Figure 7D:
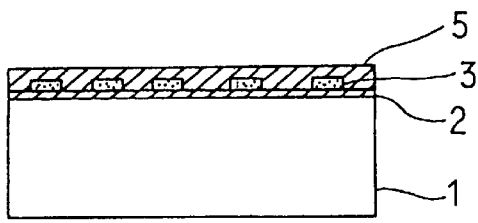

In this preferred embodiment, an insulating film forming step shown in FIG. 7A, an electrode pattern forming step shown in FIG. 7B and an insulating material depositing step shown in FIG. 7C are carried out in the same way as the insulating film forming step (see FIG. 1A), the electrode pattern forming step (see FIG. 1B) and the insulating material depositing step (see FIG. 1C) in the first preferred embodiment. After that, a flattening step shown in FIG. 7D is carried out. In this flattening step, by, for example, chemical mechanical polishing (CMP) being carried out on the silicon oxide film 5, its film thickness is reduced and its surface is flattened.

Figure 8A:
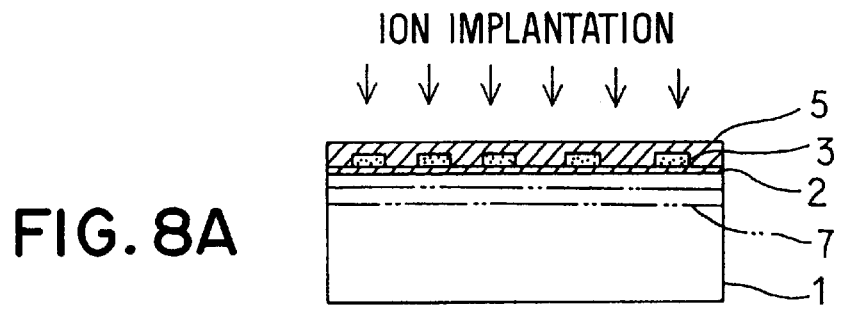
FIGS. 8A through 8D are schematic sectional views illustrating manufacturing steps continuing from FIG. 7D.
Figure 8B:
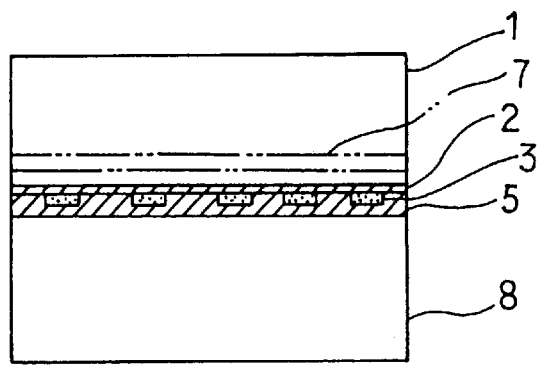
Figure 8C:
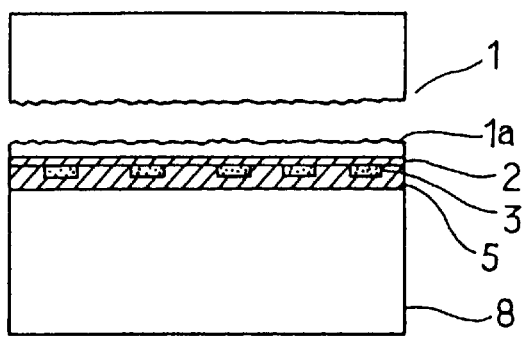
Figure 8D:
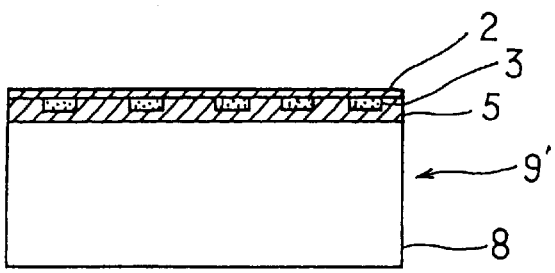

Thereafter, a first semiconductor substrate ion implantation step shown in FIG. 8A, a first laminating step shown in FIG. 8B, a first semiconductor substrate detaching step shown in FIG. 8C and a removing step shown in FIG. 8D are carried out in the same way as the first semiconductor substrate ion implantation step (see FIG. 2A), the first laminating step (see FIG. 2B), and the first semiconductor substrate detaching step and removing step (see FIG. 2C) in the first preferred embodiment, and a buried electrode substrate 9' having a silicon oxide film 2 exposed over its entire surface is thereby formed.

Of the steps for forming the buried electrode substrate 9' in this way, the first semiconductor substrate ion implantation step and the first semiconductor substrate detaching step and removing step are equivalent to the substrate forming step referred to in the invention.

Figure 9A:
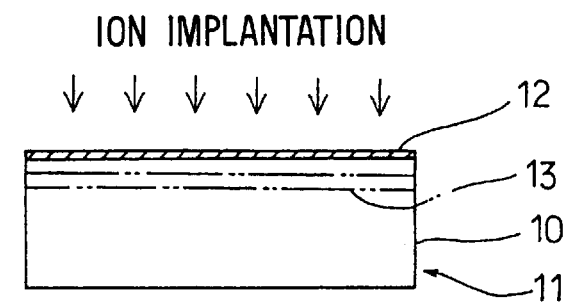
FIGS. 9A through 9D are schematic sectional views illustrating manufacturing steps continuing from FIG. 8D.
Figure 9B:
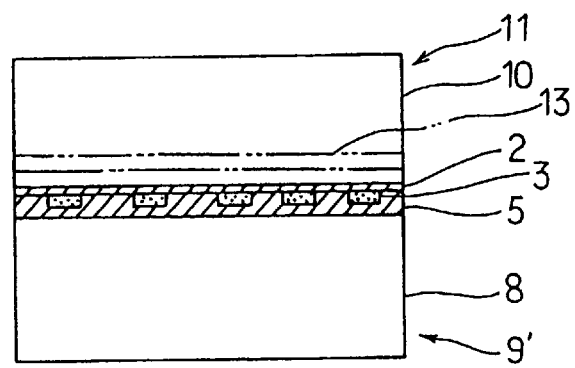
Figure 9C:
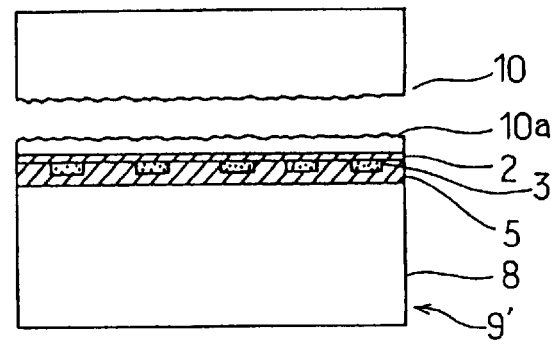
Figure 9D:
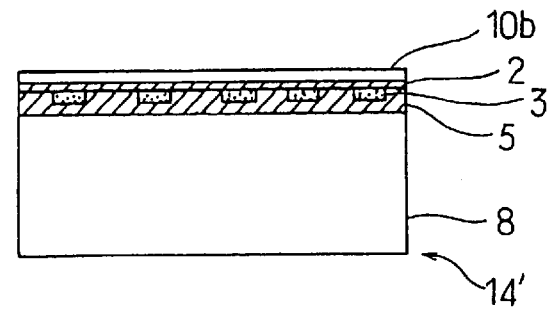

A second semiconductor substrate 10 consisting of a monocrystalline silicon wafer whose face on at least one side is a mirror face is prepared and an ion implantation step shown in FIG. 9A, a second laminating step shown in FIG. 9B, a detaching step shown in FIG. 9C and a detachment surface treating step shown in FIG. 9D are carried out in the same way as the ion implantation step (see FIG. 3A), the second laminating step (see FIG. 3B), the detaching step (see FIG. 3C) and the detachment surface treating step (see FIG. 3D) in the first preferred embodiment to complete a SOI substrate 14'. In this preferred embodiment also, after the execution of the detaching step, a heat treatment step and a supplementary heat treatment step the same as those of the first preferred embodiment are carried out.

This preferred embodiment has the characteristic that the flattening process material depositing step (see FIG. 1D) that was necessary in the first preferred embodiment is omitted. This manufacturing method is suitable for cases where the irregularities arising in the surface of the silicon oxide film 5 due to the structure of the electrode pattern 3 are relatively small. That is, when the irregularities arising in the surface of the silicon oxide film 5 are relatively small, because it is not necessary for the amount of cut in the flattening step to be large, it becomes unnecessary to carry out a flattening process material depositing step to deposit a polysilicon film 6 as was done in the first preferred embodiment. Therefore, when the irregularities arising in the surface of the silicon oxide film 5 are relatively small, it is possible to achieve an improvement in throughput.

Although, in this preferred embodiment, a substrate forming step made up of a first semiconductor substrate ion implantation step and first semiconductor substrate detaching and removing steps was carried out, a substrate forming step made up of a polishing step and an etching step or a substrate forming step made up of a polishing step and a selective polishing step may alternatively be carried out, as in the second preferred embodiment described above.

(Fourth Preferred Embodiment)

FIGS. 10A to 10E through FIGS. 13A to 13C show a fourth preferred embodiment of the invention, which will be described below. FIGS. 10A to 10E through FIGS. 13A to 13C illustrate steps for manufacturing a SOI substrate by means of schematic sectional views in the same way as FIGS. 1A to 1E through FIGS. 3A to 3D.

When a device is formed on the monocrystalline silicon thin film 10b (SOI layer) of a SOI substrate 14 or 14' manufactured in the first through third preferred embodiments, position alignment with the electrode pattern 3 serving as a buried electrode becomes necessary. For this position alignment, it is necessary to form in advance an alignment mark needed in a photolithography step carried out in the device forming process. This preferred embodiment provides a method for forming this kind of alignment mark.

Figure 10A:
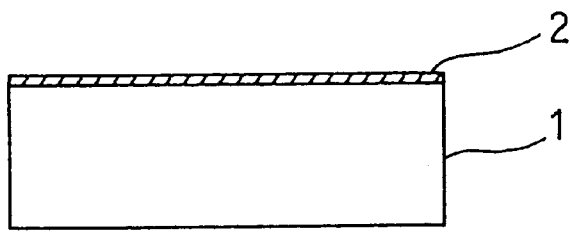
FIGS. 10A through 10E are schematic sectional views illustrating manufacturing steps according to a fourth preferred embodiment of the invention.
Figure 10B:
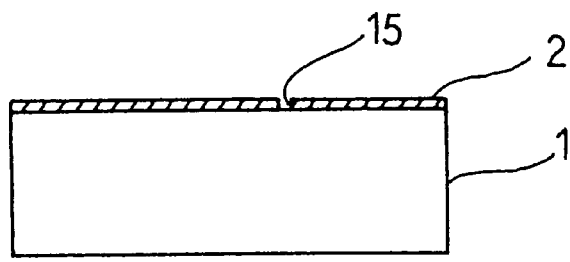

Specifically, this preferred embodiment shows an example applied to the manufacturing method of the first preferred embodiment; an insulating film forming step shown in FIG. 10A is carried out in the same way as the insulating film forming step (see FIG. 1A) carried in the first preferred embodiment, and after that an alignment hole forming step illustrated in FIG. 10B is carried out. In this step, by the silicon oxide film 2 being etched (for example dry-etched) with resist as a mask, a hole 15 reaching the first semiconductor substrate 1 is formed in a predetermined position in the silicon oxide film 2.

Figure 10C:
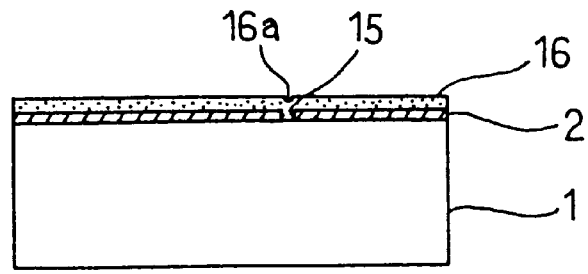

Next, in an electrode pattern forming step carried out thereafter, first, as shown in FIG. 10C, a uniform polysilicon film 16 is deposited by, for example, LPCVD on the entire surface of the silicon oxide film 2, and impurities are added to this polysilicon film 16 by ion implantation or diffusion or the like. When this deposition is carried out, a concavity 16a is formed in the polysilicon film 16 in a position corresponding to that of the hole 15. The thickness of the polysilicon film 16 is set in a range of for example 0.1 $\mu$m to several micrometers.

Figure 10D:
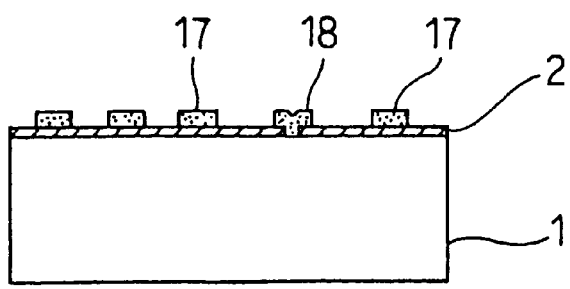

Then, in the above-mentioned electrode pattern forming step, as shown in FIG. 10D, using photolithography or the like, patterning of the polysilicon film 16 with the concavity 16a as a reference position is carried out. An electrode pattern 17 in a predetermined positional relationship with the hole 15 and a dummy electrode pattern 18 of such a shape that it covers the hole 15 are formed.

Figure 10E:
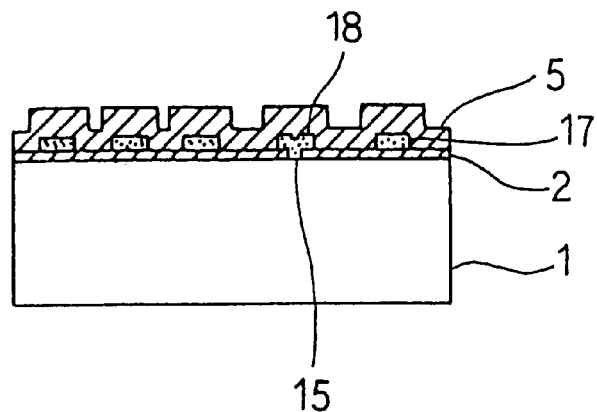
Figure 11A:
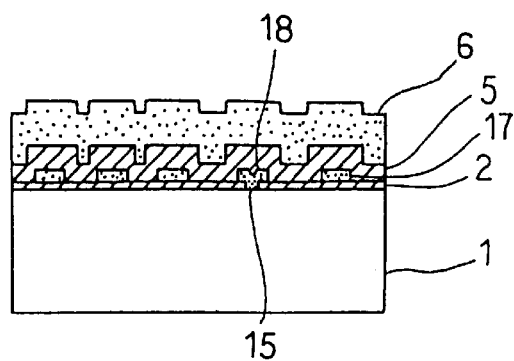
FIGS. 11A through 11D are schematic sectional views illustrating manufacturing steps continuing from FIG. 10E.
Figure 11B:
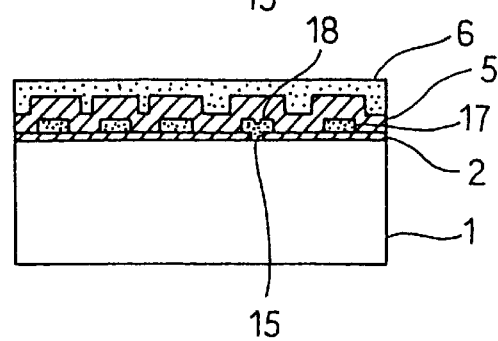
Figure 11C:
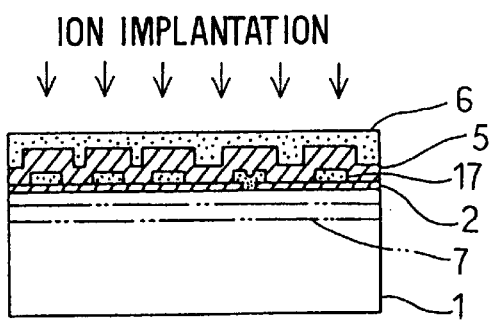
Figure 11D:
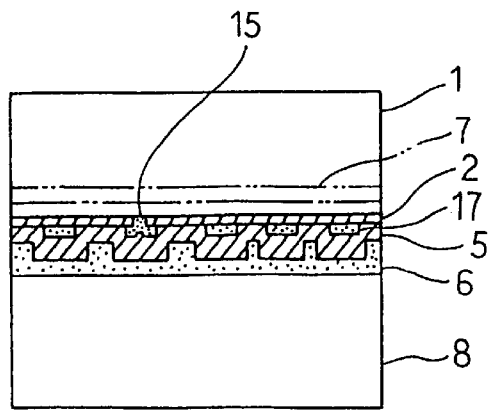
Figure 12A:
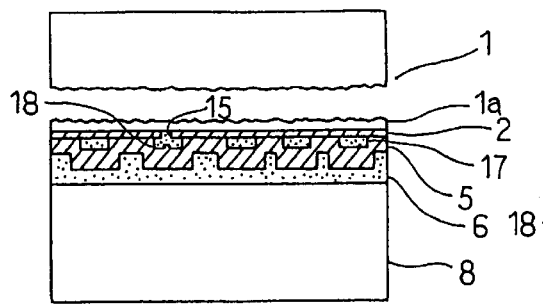
FIGS. 12A and 12B are schematic sectional views illustrating manufacturing steps continuing from FIG. 11D.
Figure 12B:
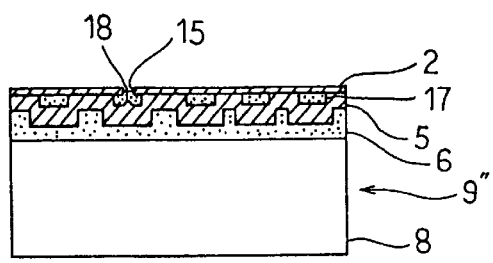

After that, an insulating material depositing step shown in FIG. 10E, a flattening process material depositing step shown in FIG. 11A, a flattening step shown in FIG. 11B, a first semiconductor substrate ion implantation step shown in FIG. 11C, a secondary flattening step (not shown), a first laminating step shown in FIG. 11D, a first semiconductor substrate detaching step shown in FIG. 12A and a removing step shown in FIG. 12B are carried out in the same way as the insulating material depositing step (see FIG. 1C), the flattening process material depositing step (see FIG. 1D), the flattening step (see FIG. 1E), the first semiconductor substrate ion implantation step (see FIG. 2A), the first laminating step (see FIG. 2B), the first semiconductor substrate detaching step (see FIG. 2C) and the removing step (see FIG. 2D) in the first preferred embodiment, and a buried electrode substrate 9" is thereby completed.

In the above-mentioned removing step (see FIG. 12B) for removing the residual silicon 1a on the silicon oxide film 2, the residual silicon 1a is removed by carried out dry etching or selective polishing with the silicon oxide film 2 being made to function as a stopper. However, because the silicon oxide film 2 does not exist on the dummy electrode pattern 18 in the hole 15, when the whole of the silicon oxide film 2 is exposed and the buried electrode substrate 9" is completed, the dummy electrode pattern 18 in the hole 15 is in a state indented from the surface of the silicon oxide film 2; that is, a step is formed at the surface of the dummy electrode pattern 18.

Figure 13B:
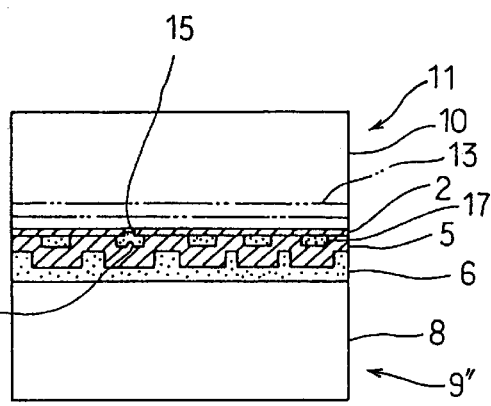
FIGS. 13A through 13D are schematic sectional views illustrating manufacturing steps continuing from FIG. 12B.
Figure 13C:
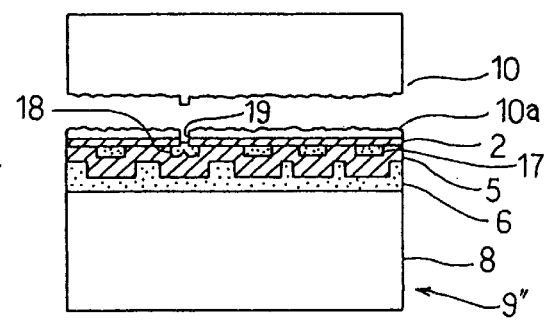
Figure 13A:
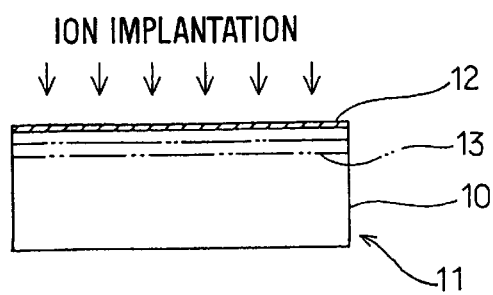

After this removing step, an ion implantation step shown in FIG. 13A, a second laminating step shown in FIG. 13B and a detaching step shown in FIG. 13C are carried out in the same way as the ion implantation step (see FIG. 3A), the second laminating step (see FIG. 3B) and the detaching step (see FIG. 3C) in the first preferred embodiment.

In this case, when the second laminating step (see FIG. 13A) for laminating together the surface of the buried electrode substrate 9" (the surface of the silicon oxide film 2) and the surface of the hydrogen high-concentration layer substrate 11 (the surface of the second semiconductor substrate 10) has been carried out, because there is a step at the hole 15 on the buried electrode substrate 9" side, this part is not bonded to the surface of the hydrogen high-concentration layer substrate 11.

In the detaching step (see FIG. 13C) for detaching the hydrogen high-concentration layer substrate 11 at the defective layer region formed by the hydrogen high-concentration layer 13, the hydrogen high-concentration layer substrate 11 detaches at the hydrogen high-concentration layer 13 part and a residual silicon 10a bonded to the buried electrode substrate 9" side is formed. However, at the hole 15, because as mentioned above the second semiconductor substrate 10 is not bonded to the buried electrode substrate 9" side, it remains on the hydrogen high-concentration layer substrate 11 side. As a result, an alignment mark 19 is formed in the second semiconductor substrate 10 in a position corresponding to that of the hole 15.

Figure 13D:
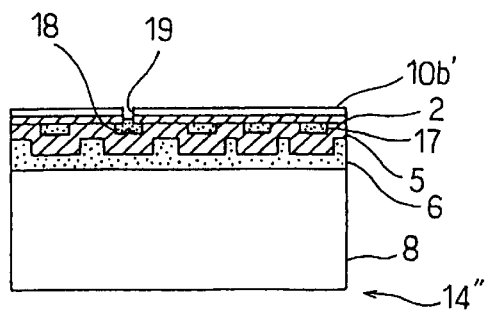

After that, by a detachment surface treating step of the kind illustrated in FIG. 13D being carried out in the same way as the detachment surface treating step (see FIG. 3A) in the first preferred embodiment, a SOI substrate 14" (semiconductor substrate) having a monocrystalline silicon thin film 10b' in which an alignment mark 19' is formed in a position corresponding to that of the hole 15 is formed.

With this manufacturing method, if a hole 15 is preformed in the silicon oxide film 2, an alignment mark 19 is automatically formed in the monocrystalline silicon thin film 10b' constituting a SOI layer as the subsequent steps are carried out in the same way as in the first preferred embodiment. Therefore, it is possible to form an alignment mark 19 extremely easily.

An alignment mark formation method according to this preferred embodiment can of course be applied to either of the second and third preferred embodiments described above. This alignment mark formation method can also be applied to a device separation structure in the SOI substrate. Specifically, if a hole 15 is preformed in the silicon oxide film 2 by etching or the like in a position corresponding to a device separation region to be formed in the SOI layer, when the SOI substrate is finally completed, in the device separation region at the hole there is no monocrystalline silicon thin film; that is, a concavity is formed. Therefore, by filling this concavity with a silicon oxide film or the like, it is possible to form a SOI substrate having a device separation structure.

The present aspect of the invention is not limited to the preferred embodiments described above, and for example the following modifications and extensions are possible.

In the first through third preferred embodiments, the detachment surface treating step carried out at the final stage need only be carried out when necessary. Also, as the ions implanted in the ion implantation step and the first semiconductor substrate ion implantation step, besides hydrogen ions, various ions such as those of noble gases, oxygen, chlorine and fluorine can be used.

To make the bonded interface of the monocrystalline silicon thin film 10b good, the following method may be used. That is, if, after the silicon oxide film 12 of the hydrogen high-concentration layer substrate 11 is removed, the surface thereof is thermally oxidized at a low temperature such that no detachment phenomenon at the hydrogen high-concentration layer 13 occurs to form a silicon oxide film of a few tens of nanometers in thickness and this silicon oxide film and the silicon oxide film 2 on the buried electrode substrate 9 side are then bonded together, it is possible to make the bonded interface of the monocrystalline silicon thin film 10b good.

Also, without using this kind of low-temperature heat treatment, by the hydrogen high-concentration layer substrate 11 having had the silicon oxide film 12 removed therefrom being immersed in an acidic solution such as a mixed solution of sulfuric acid and aqueous hydrogen peroxide (for example $H_2SO_4:H_2O_2=4:1$) held at a suitable temperature, a silicon oxide film may be formed thereon. This silicon oxide film is then bonded to the silicon oxide film 2 of the buried electrode substrate 9 side.

As other means for making good the bonded interface of the monocrystalline silicon thin film 10b, it is also conceivable to, at a stage before hydrogen ions are implanted into the second semiconductor substrate 10 to form the hydrogen high-concentration layer substrate 11, or at a stage after this, implant oxygen ions into a surface region of the second semiconductor substrate 10 or leave the second semiconductor substrate 10 in an oxygen plasma atmosphere and form a silicon oxide film of good quality on the underside of the residual silicon 10a in the heat treatment step for bond strengthening after steps of laminating a hydrogen high-concentration layer substrate 11 made from this second semiconductor substrate 10 to the buried electrode substrate 9 and detaching it are carried out.

Although, in the electrode pattern forming step, the electrode pattern 3 or 17 was formed using impurity-doped polycrystalline silicon, the electrode pattern may alternatively be made from another impurity-doped polycrystalline semiconductor material or from a refractory metal material such as tungsten. Also, although, in the insulating material depositing step, a silicon oxide film 5 was deposited as the insulating material, a silicon nitride film or some other insulating material may be deposited.

As the first semiconductor substrate 1 and the second semiconductor substrate 10, substrates made by epitaxially growing silicon on a monocrystalline silicon wafer, or substrates made by epitaxially growing monocrystalline silicon on a porous silicon surface and the like can also be used.

Although the first semiconductor substrate 1 and the second semiconductor substrate 10 were made from monocrystalline silicon, substrates of other semiconductors based on group four elements, for example Ge (germanium), SiC (silicon carbide), SiGe (silicon germanium) and the like, can be used, and polycrystalline silicon substrates may be used. Although the supporting substrate 8 is also made from a monocrystalline silicon wafer in the preferred embodiments described above, the substrate 8 is not limited to this and may be made using another semiconductor wafer or an insulating ceramic substrate or a glass substrate or the like.

It is also possible to carry out the first semiconductor substrate ion implantation step immediately after the insulating film forming step (FIG. 1A, FIG. 4A, FIG. 7A, FIG. 10A). However, in this case, it is necessary to ensure (for example by using plasma CVD or the like) that the deposition temperature conditions and so on in the steps carried out thereafter are lower than the detachment temperature conditions (400° C. to 600° C.).

Fifth through tenth preferred embodiments of the invention will now be described. First, the background against which the aspect of the invention illustrated in these fifth through tenth preferred embodiments was made will be explained, and then this aspect of the invention itself will be explained in outline. The fifth through tenth preferred embodiments will then be described in detail.

There have been various methods for manufacturing a monocrystalline silicon thin film provided on a SOI substrate. Among these methods, a semiconductor thin film manufacturing method wherein a monocrystalline silicon thin film is manufactured in three stages is disclosed in Japanese Patent Application Laid-Open No. H.5-211128. This manufacturing method will now be briefly explained.

First, as a first stage, hydrogen gas or a noble gas is ionized and accelerated with a predetermined energy and implanted into a semiconductor substrate to form an ion-implanted layer wherein implanted ions are distributed at a predetermined depth from the surface of the semiconductor substrate. Then, as a second stage, a supporting substrate made from at least one rigid material is bonded by a method such as lamination to the face of the semiconductor substrate on the side into which the ion implantation was carried out. Here, a substrate made of a semiconductor can be used for the supporting substrate. From the point of view of eventually forming a SOI substrate, an insulating film such as an oxide film is preferably grown on the supporting substrate in advance.

Next, as a third stage, by heat treatment being carried out on the semiconductor substrate and the supporting substrate thus bonded together, the semiconductor substrate and a thin film part are made to detach from each other along a microvoid (microbubble) part formed by the ion-implanted layer. As a result, a SOI substrate of a structure wherein a monocrystalline silicon thin film is directly bonded to a supporting substrate with an insulating film therebetween is formed.

In practice, because surface roughness of several nanometers in size exists in the detachment face, polishing is carried out on this detachment face by chemical mechanical polishing (CMP). The surface of the monocrystalline silicon thin film is thereby brought to a flat finish and also is adjusted to a predetermined thickness (for example 0.1 μm) to form a SOI substrate.

This method is suitable in the case of a semiconductor substrate which is made from a single material and whose surface is flat, as described above, or in the case of a multilayer structure wherein various materials are laminated to the semiconductor substrate uniformly. However, for example in cases such as when a pattern structure is formed wherein a plurality of laminated materials are disposed on different parts of the surface of the semiconductor substrate, or when there are steps in the surface of the semiconductor substrate, the following problems arise.

Figure 23:
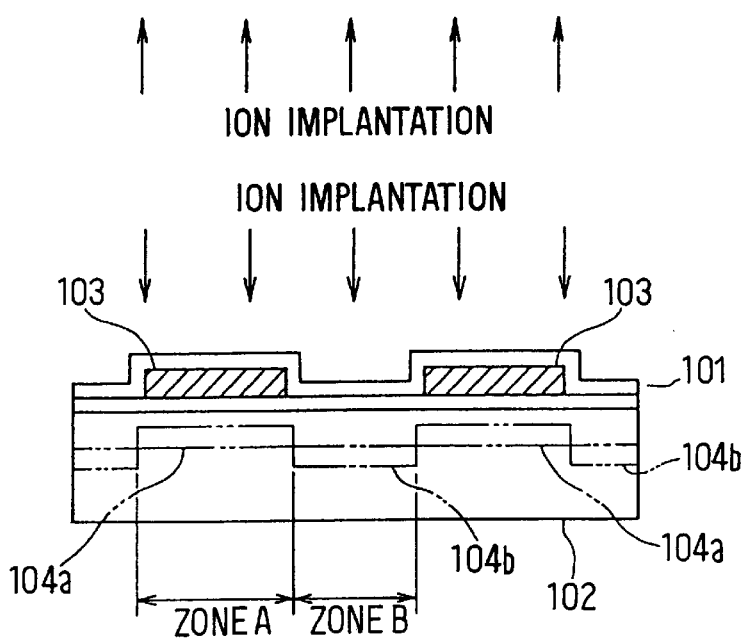
FIG. 23 is a schematic sectional view illustrating related art.

That is, as shown in FIG. 23, with a semiconductor substrate 102 on which a pattern structure 101 of the kind mentioned above has been formed, when ion implantation is carried out through its surface, under influences of the pattern structure 101 caused by differences and steps in the pattern material 103, the depth to which ions are implanted into the semiconductor substrate 102 varies according to position. For example, in the region A where the pattern material 103 is present, the depth of the ion-implanted region 104a is shallow. To the contrary, in a region B where the pattern material 103 is not present the depth of the ion-implanted region 104b is deep. As a result, when a detaching step is carried out with the supporting substrate in a laminated state, detachment occurs along the faces of the ion-implanted regions 104a, 104b influenced by the pattern structure. Consequently, the detached face has steps corresponding to the steps in the ion-implanted layer.

Therefore, the surface of the monocrystalline silicon thin film obtained on detachment is a face having steps. Although it is not impossible to flatten a detachment face obtained like this in a polishing step, there are cases wherein the steps initially remaining in the detachment face are many times the film thickness of the monocrystalline silicon thin film to be finally left (for example 0.2 μm after polishing step). Therefore, it is difficult to flatten this size of step by polishing. Also, it is extremely difficult to carry out polishing while maintaining the parallelism of the monocrystalline silicon thin film and controlling its film thickness accurately. Further, there is the problem that the process increases costs.

In other words, when performing an ion implantation step and forming a defective layer region to become a detachment face and carrying out detachment when there are steps on the semiconductor substrate, because the implantation depth of the ion implantation material implanted into the substrate varies according to the pattern structure, it is difficult to make the detachment face flat, and in practice the method cannot be employed.

To overcome this problem, the present aspect of the invention provides a method whereby, even when a pattern structure has been formed by film-growing steps and etching steps and the like on a substrate and the substrate is then to be detached from a supporting substrate laminated to the substrate leaving a part of the substrate as a thin film of a required film thickness onto the supporting substrate, a semiconductor substrate such as a SOI substrate can be formed by the thin film being left onto the supporting substrate in such a state that flatness of the detachment face of the thin film is ensured.

More particularly, when forming an ion-implanted layer in a substrate for forming a semiconductor layer provided with a pattern structure, by carrying out a regulating material forming step, an ion implantation regulating material is provided on the surface of the pattern structure. As a result, the degree to which ions of the type to be implanted are blocked in regions where pattern members of the pattern structure are not disposed is made the same level as the degree to which ions of the same type are blocked by the pattern members. By this means, it becomes possible to form an ion-implanted layer in the substrate at a uniform depth by carrying out one ion implantation. The accuracy of flattening of a detachment face of the semiconductor layer obtained in a subsequent detaching step can be increased. Therefore, it becomes possible to form a semiconductor layer accurately.

In the regulating material forming step, as the ion implantation regulating material, a material having an ion blocking effect equal to the ion blocking effect of the pattern member of the pattern structure may be used. By this material being disposed in such a state that it is electrically separated from the pattern structure, it is possible to make uniform the depth of the ions implanted into the substrate for forming a semiconductor layer during the ion implantation. As a result, an ion-implanted layer is substantially formed in the same flat plane in the substrate.

When the pattern structure has steps formed by an arrangement of pattern members, in the regulating material forming step, the ion implantation regulating material is preferably formed so as to eliminate the steps formed by the pattern members. When this is done, the ion blocking effect can be made the same over the whole face above the substrate by providing an ion implantation regulating material having the same ion blocking effect as the pattern members. Thus, it is possible to make the depth to which ions of a given type penetrate during ion implantation the same and thereby form an ion-implanted layer in substantially the same flat plane.

In the regulating material forming step, the ion implantation regulating material may be deployed so as to eliminate the steps formed by the pattern members and in a state such that it is laminated to a further predetermined film thickness from the face of the pattern structure over the entire face. In this case, because the amount by which the regulating material affects the blocking effect on ion implantation just increases uniformly over the entire face, in the same way as that described above, it is possible to make the depth to which ions of a given type penetrate during ion implantation the same and thereby form an ion-implanted layer in substantially the same flat plane.

In the regulating material forming step, polysilicon may be used as the ion implantation regulating material, formed in such a state that it is electrically insulated from the pattern structure. In this case, when a silicon material is used for the substrate or the pattern material, because the ion implantation regulating material is also a silicon material, from the points of view of processability and ion blocking effect, handling and film thickness setting are easy to carry out and it is possible to practice the method without complicating the manufacturing process.

The regulating material forming step may be carried out by means of a polysilicon film forming step and a polishing step. In the polysilicon film forming step, a polysilicon film is formed over the entire surface of the side of the substrate for forming a semiconductor layer on which the pattern structure is formed. In the polishing step which follows, polishing of the polysilicon film is carried out to eliminate the above-mentioned steps, and it is thereby possible to form an ion implantation regulating material so that the ion blocking effect is uniform over the entire face of the substrate.

After an ion-implanted layer forming step is carried out, if, in a polysilicon film forming step, a second polysilicon film is formed on the surface of the polysilicon film formed in the regulating material forming step and the supporting substrate is then laminated to the surface of this second polysilicon film, the lamination face therebetween can be made a homogeneous face and the quality of the lamination adhesion can be increased.

When the polysilicon film is polished in the polishing step, this polishing may be stopped with a predetermined film thickness of the polysilicon film remaining on the entire surface of the substrate.

In the regulating material forming step, an ion implantation regulating material having a smaller ion blocking effect than that of the pattern members of the pattern structure may be used. In this case, the depth of the ion implantation can be controlled finely by controlling the film thickness of the ion implantation regulating material. For example, when the thickness of the pattern members is relatively thin, it is possible to carry out regulation of the penetration depth of the ion implantation without having to form the ion implantation regulating material excessively thick.

In the regulating material forming step, a photoresist film can be used as the ion implantation regulating material. In this case, it becomes possible to regulate the ion implantation depth easily by carrying out ordinary photolithography processing.

In the regulating material forming step, an ion implantation regulating material having a larger ion blocking effect than that of the pattern members may be used. In this case, it becomes possible for the film thickness set to control the ion implantation depth to be made thinner than the film thickness of the pattern members. As a result, the time required for regulating material film formation can be shortened. For example, when the film thickness of the pattern members is thick, this time shortening effect becomes considerable.

In the regulating material forming step, a refractory metal material can be used as the ion implantation regulating material. In this case, it is possible to form a material having a high ion blocking effect easily.

In the regulating material forming step, an ion implantation regulating material may be formed over the entire surface of the face on which the pattern structure is formed so as to absorb steps in the ion implantation depth caused by the pattern members. When this is done, it becomes unnecessary for the ion implantation regulating material to be disposed in correspondence with the shape of the pattern members, and the regulating material forming step can be carried out easily without photolithography processing. In this case, when the film thickness of the pattern members is thin, the film thickness to which the ion implantation regulating material is formed car also be set relatively thin. Therefore, it becomes possible to shorten the time required for the formation of the regulating material film.

In the regulating material forming step, a material made by mixing a metal filler into photoresist can be used as the ion implantation regulating material. In this case, the ion implantation regulating material film can be formed by ordinary photolithography processing and the step can be made simple.

It is also possible for the ion implantation for forming the ion-implanted layer to be carried out from the opposite side of the substrate for forming a semiconductor layer from the face on which the pattern structure is formed. In this case, it is possible to form the ion-implanted layer at a uniform depth easily, without suffering the influence of the pattern structure. However, because the ion-implanted layer is to be formed in a region at a predetermined depth from the side on which the pattern structure is formed by the ion implantation being carried out from the rear side of the substrate, it is necessary for the ions being implanted to be accelerated with a considerably greater energy than in the cases described above. When this kind of ion implantation is used, it is preferable that the thickness of the substrate be thin.

(Fifth Preferred Embodiment)

A fifth preferred embodiment of the invention will now be described with reference to FIG. 14 through FIGS. 17A to 17D.

Figure 15:
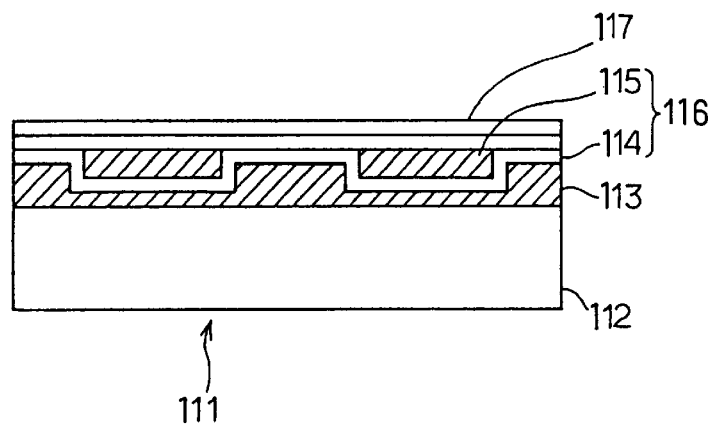
FIG. 15 is a schematic sectional view of a SOI substrate.

FIG. 15 is a schematic sectional view of a SOI substrate 111, which is a semiconductor substrate. In the SOI substrate 111, a polysilicon film 113 is formed on a base silicon substrate 112 serving as a supporting substrate, a pattern structure 116 made up of an insulating film 114 of silicon oxide or the like and pattern members made from a polysilicon film 115 is formed on the polysilicon film 113. A monocrystalline silicon thin film 117 is formed on that as a semiconductor layer for semiconductor device formation.

The SOI substrate 111 in this preferred embodiment is suitable for forming a device of a structure wherein the pattern member consisting of the polysilicon film 115 formed in the insulating film 114 of the pattern structure 116 is used as a buried electrode for the device such as a FET that is formed in the monocrystalline silicon thin film 117 by device formation steps. Devices other than this kind of FET can also be formed on the SOI substrate 111. Further, it is possible to make an integrated circuit consisting of devices of various different types.

Figure 14:
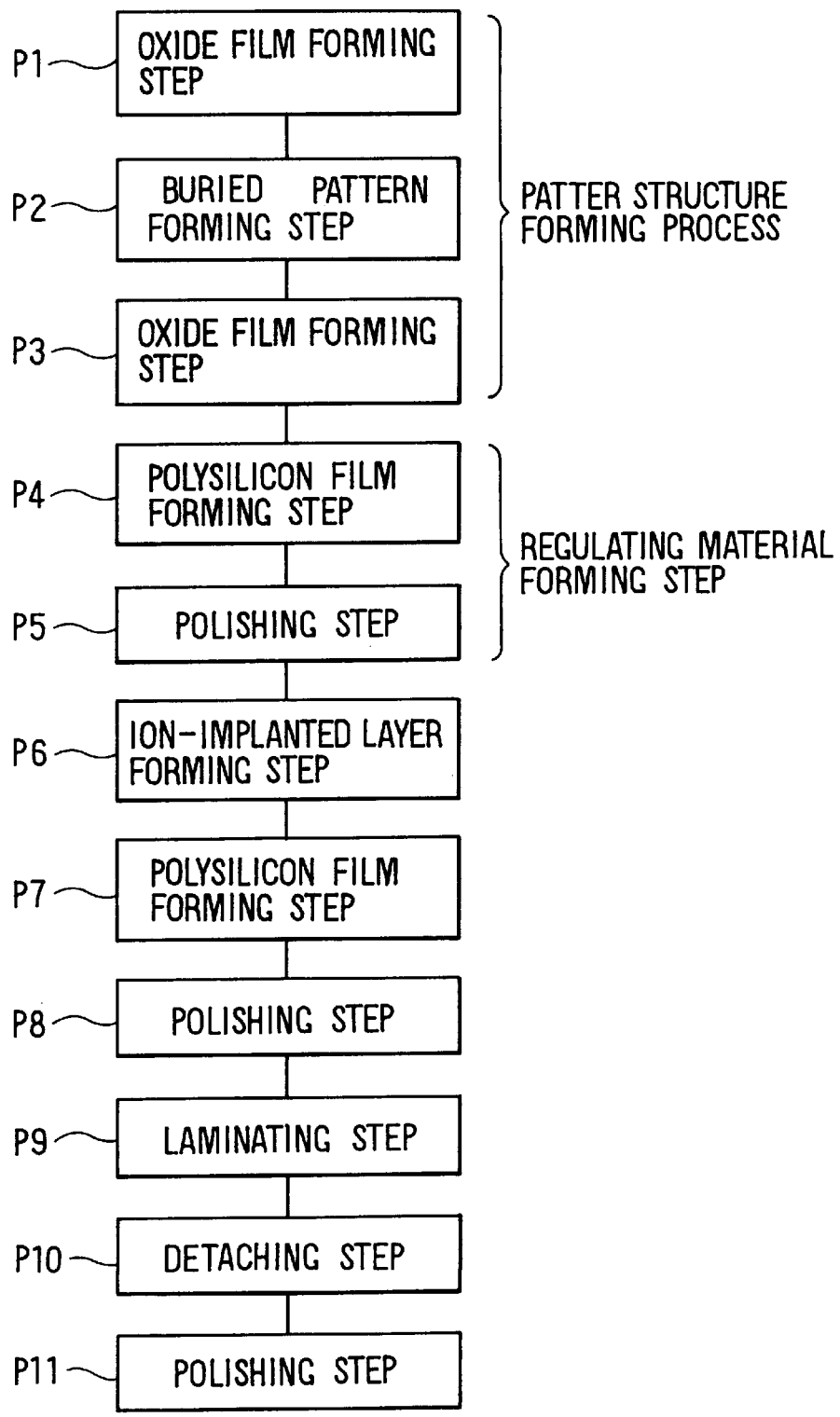
FIG. 14 is a block diagram showing a manufacturing process according to a fifth preferred embodiment of the invention.

Next, a method for manufacturing a SOI substrate 111 of the construction described above will be described with reference to FIG. 14, FIGS. 16A through 16E and FIGS. 17A through 17D. FIG. 14 shows in outline the flow of an overall process of manufacturing the SOI substrate 111. FIGS. 16A through 16E and FIGS. 17A through 17D illustrate states corresponding to different steps of the process with schematic sectional views.

First, as a pattern structure forming process for forming the above-mentioned pattern structure 116, an oxide film forming step P1, a buried pattern forming step P2 and an oxide film forming step P3 are carried out in order on a monocrystalline silicon substrate 118 constituting a substrate for semiconductor layer formation. In the oxide film forming step P1, an oxide film 114a is formed on the surface of the monocrystalline silicon substrate 118 (see FIG. 16A).

The oxide film 114a can be formed by a method such as thermal oxidation or CVD. Its film thickness is, for example, 100 nm. Particularly, when this oxide film 114a is formed by thermal oxidation, an oxide film 114a having good quality as a gate oxide film of when electrical control by a polysilicon film 115 constituting a buried electrode pattern is to be carried out can be provided.

Figure 16A:
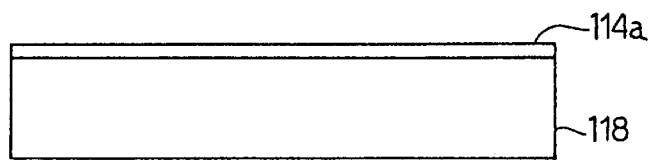
FIGS. 16A through 16E are schematic sectional views illustrating steps for manufacturing a SOI substrate.
Figure 16B:
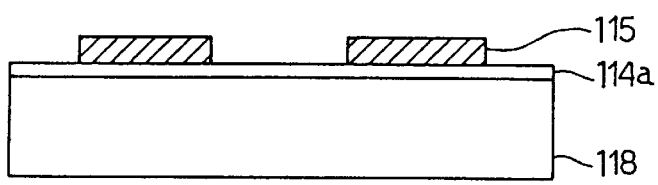

Next, in the buried pattern forming step P2, to form a buried pattern to become a buried electrode, a polysilicon film 115 is formed by CVD or the like and patterned by photolithography (see FIG. 16B). At this time, the polysilicon film 115 is formed to a film thickness of, for example, 350 nm. If necessary, impurities are introduced simultaneously with or after the formation of the polysilicon film to adjust its resistance. For the patterning, a method such as dry etching or wet etching can be used.

Figure 16C:
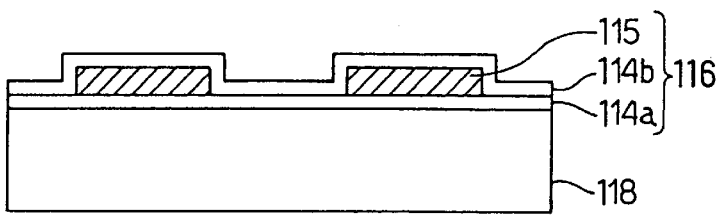
Figure 16D:
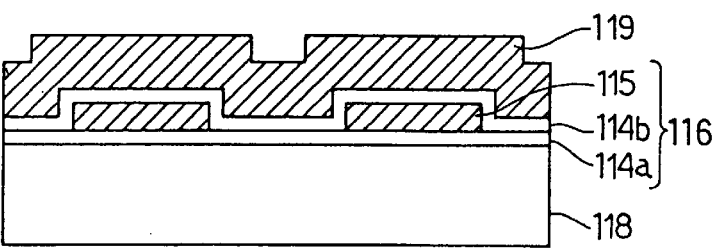

In the oxide film forming step P3 which follows, an oxide film 114b is formed by CVD to a thickness of, for example, 100 nm (see FIG. 16C). By this means, a polysilicon film 115 patterned and electrically insulated by the oxide films 114a, 114b is formed on the monocrystalline silicon substrate 118, and a pattern structure 116 is thus formed.

Next, a regulating material forming step for forming a polysilicon film 119 to serve as an ion implantation regulating material is carried out, divided into a polysilicon film forming step P4 and a polishing step P5. In the polysilicon film forming step P4, a polysilicon film 119 is formed by CVD or the like over the entire surface of the pattern structure 116. The film thickness of the polysilicon film 119 must be a dimension greater than the steps in the pattern structure 116, and is set to a suitable thickness taking into account polishing thickness in the following polishing step P5.

Figure 16E:
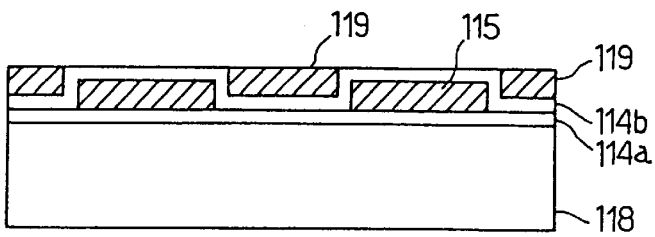

In the polishing step P5, the polysilicon film 119 is polished until its film thickness becomes equal to that of the polysilicon film 115. Because the oxide film 114b is formed over the entire surface, as shown in FIG. 16E, this can be achieved by carrying out polishing with the oxide film 114b as a polishing stopper.

As a result, over substantially the whole area of the face of the monocrystalline silicon substrate 118, the oxide films 114a, 114b are formed to the same film thickness and also one or the other of the polysilicon film 115 and the polysilicon film 119 is formed to the same film thickness. As shown in the figure, at the boundary between the polysilicon film 115 and the polysilicon film 119, a narrow region where only the oxide films 114a, 114b exist is formed. However, because this is a narrow range corresponding to the thickness of the oxide films 114a, 114b, it essentially does not cause any problem in the ion-implanted layer forming step P6 that follows.

Figure 17A:
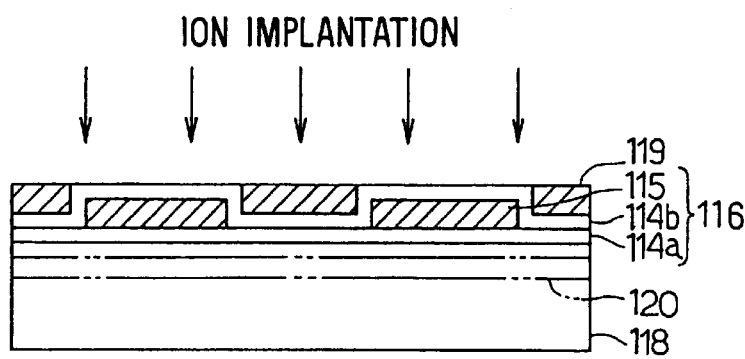
FIGS. 17A through 17D are schematic sectional views illustrating steps for manufacturing a SOI substrate.
Figure 17B:
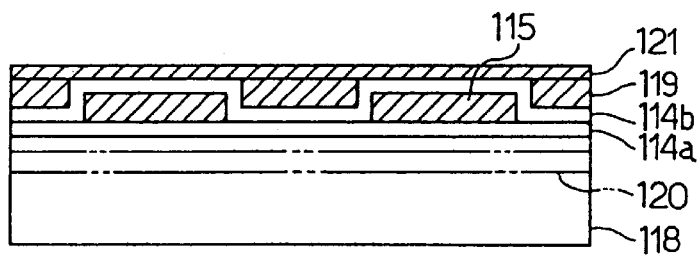
Figure 17C:
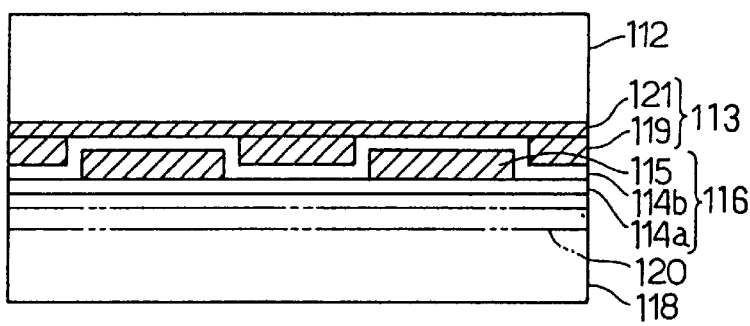
Figure 17D:
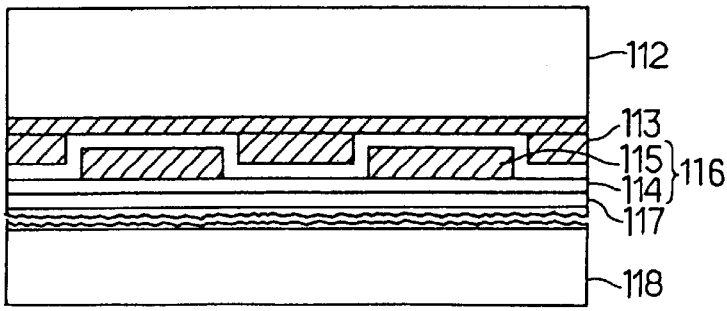

In the ion-implanted layer forming step P6, ion implantation is carried out on the monocrystalline silicon substrate 118 from the side on which the pattern structure 116 and the polysilicon film 119 were formed as described above, to form at a predetermined depth an ion-implanted layer 120 for detachment use (see FIG. 17A). As the implanted ions, for example hydrogen ions (protons) or ions of a noble gas are used. These ions are accelerated and implanted with a predetermined acceleration energy corresponding to the required penetration depth. The implanted amount (the dose) is in a range of $1 \times 10^{16}$ to $1 \times 10^{17}$ atoms/cm$^2$ and preferably is about $5 \times 10^{16}$ atoms/cm$^2$.

As a result, even though the pattern structure 116 has been formed, the ion-implanted layer 120 is formed uniformly in a plane at substantially the same depth in the monocrystalline silicon substrate 118 both in the region where the polysilicon film 115 is formed and in the region where the polysilicon film 119 is formed. This is because the degree (the blocking effect) to which the ions being implanted (for example hydrogen ions) are blocked by the polysilicon film 115 and the oxide films 114a, 114b before they reach the monocrystalline silicon substrate 118 and the degree (blocking effect) to which they are blocked by the polysilicon film 119 and the oxide films 114a, 114b are made about the same by the respective films being set to the same film thicknesses.

As mentioned above, a narrow region where only the oxide films 114a, 114b exist is formed at the boundary between the polysilicon films 115 and 119. However, this is in a narrow range corresponding to the thickness of the oxide films 114a, 114b. Consequently, because the ion-implanted layer 120 is so formed that the boundary between the polysilicon film 115 and the polysilicon film 119 is made substantially continuous by ions implanted through the polysilicon film 115 and the polysilicon film 119, this does not cause any hindrance to the detaching process in a subsequent detaching step P10.

Next, in a polysilicon film forming step P7, a polysilicon film 121 is formed to a predetermined thickness over the entire surface as a flattening process film. After that, in a polishing step P8, the surface of the polysilicon film 121 is polished and thereby finished to a surface flat enough to be laminatable in a laminating step P9 that is the next step (see FIG. 17B). When the state of the face of the polysilicon film 119 which has been formed on the pattern structure 116 before the ion-implanted layer forming step P6 was carried out is sufficiently flat and finished to a laminatable face, the polysilicon film forming step P7 and the polishing step P8 can be dispensed with. Also, the ion-implanted layer 120 can alternatively be formed by carrying out ion implantation in the state shown in FIG. 17B, that is, after a polysilicon film 121 has been formed.

In a laminating step P9, a base silicon substrate 112 to serve as a supporting substrate is laminated, after hydrophilicizing treatment has been carried out, with the monocrystalline silicon substrate 118 on which the pattern structure 116 and so on have been formed as described above (see FIG. 17C). In the hydrophilicizing treatment, the substrates are washed in a solution made by mixing, for example, sulfuric acid ($H_2SO_4$) and hydrogen peroxide water ($H_2O_2$) in the ratio 4:1 held at 90° C. to 120° C. and then washed with pure water after which the amounts of water adsorbed on the substrate surfaces are controlled by spin drying. In this state, the two substrates are laminated together in intimate contact. By this means, the two monocrystalline silicon substrates 112, 118 are directly bonded together by hydrogen bonding of silanol radicals formed on their surfaces.

Then, in a detaching step P10, heat treatment of the monocrystalline silicon substrates 112 and 118 thus laminated together is carried out, divided into two stages. That is, in a first heat treatment, by heat treatment being carried out in a range of 400° C. to 600° C. (when the ion type is hydrogen ions), for example at a temperature of 500° C., defects are made to form in concentration where the ion-implanted layer 120 is formed in the monocrystalline silicon substrate 118, that is, in the region of high hydrogen concentration. As a result, a thin film part of high hydrogen concentration is made to split and cause detachment of the rest of the monocrystalline silicon substrate 118. Also, this heat treatment causes a dehydrating and condensing reaction to arise at the bonding interface where the lamination was carried out and the strength of the direct bonding between the two consequently increases. By this means, it is possible to form a SOI substrate 111 having a monocrystalline silicon thin film 117 bonded to the base silicon substrate 112 serving as a supporting substrate.

Next, in a second heat treatment, to further raise the intimacy of contact between the monocrystalline silicon thin film 117 and the insulating film 114, heat treatment is carried out at a higher temperature. This second heat treatment is carried out in a temperature range of, for example, 1000° C. to 1300° C., and preferably at about 1100° C. As a result of this, a dehydrating and condensing reaction arises at the bonding interface and the two become bonded in a firmer state.

In the heat treatment steps described above, the heat treatment is preferably carried out in a nitrogen atmosphere or an oxygen atmosphere. In particular, when the second heat treatment is carried out in an oxygen atmosphere, during that second heat treatment an oxide film is simultaneously formed on the monocrystalline silicon thin film 117 detachment face.

In a polishing step P11, polishing is carried out to flatten fine steps from a few nanometers to several tens of nanometers in size formed by irregularities remaining in the surface of the monocrystalline silicon thin film 117, i.e. the detachment face. In this polishing, using chemical mechanical polishing (CMP) the surface is flattened and the monocrystalline silicon thin film 117 is finished to a required film thickness.

When the second heat treatment of the detaching step P10 described above was carried out in an oxygen atmosphere, because an oxide film is formed on the surface of the detachment face, this oxide film is removed by etching with fluoric acid or the like before the polishing. The reason for forming an oxide film like this is that irregularities remaining on the detachment face can be eliminated by being absorbed into the oxide film as a result of thermal oxidation being carried out. It is therefore possible to lighten the polishing load.

With this preferred embodiment, even when a pattern structure 116 is formed on the surface of the monocrystalline silicon substrate 118 into which ion implantation is to be carried out, the polysilicon film 119 as an ion implantation regulating material for regulating the blocking effect on ion implantation is provided in necessary regions. As a result, it becomes possible to form an ion-implanted layer 120 at a uniform depth just by carrying out one ion implantation.

Also, by using the polysilicon film 119 as the ion implantation regulating material, because it is the same material as the polysilicon film 115 of the pattern members, it is possible to achieve the object of forming an ion-implanted layer 120 at a uniform depth by setting the polysilicon film 119 to the same thickness as the polysilicon film 115. When this film thickness is so set, because polishing can be stopped when the oxide film 114b becomes exposed, the set film thickness can be obtained easily by carrying out selective polishing with the oxide film 114b as a stopper.

(Sixth Preferred Embodiment)

Figure 18A:
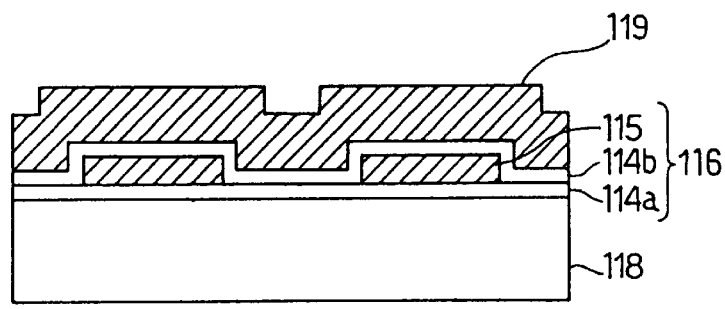
FIGS. 18A through 18C are schematic sectional views illustrating steps for manufacturing a SOI substrate according to a sixth preferred embodiment.
Figure 18B:
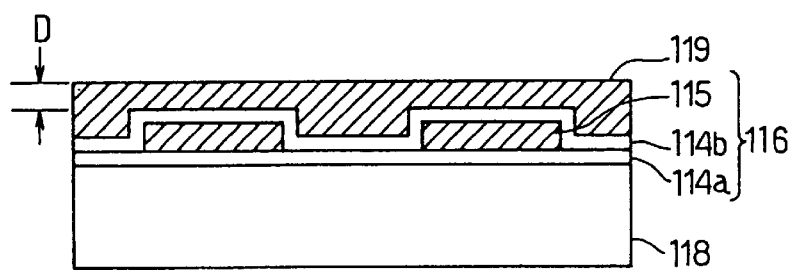
Figure 18C:
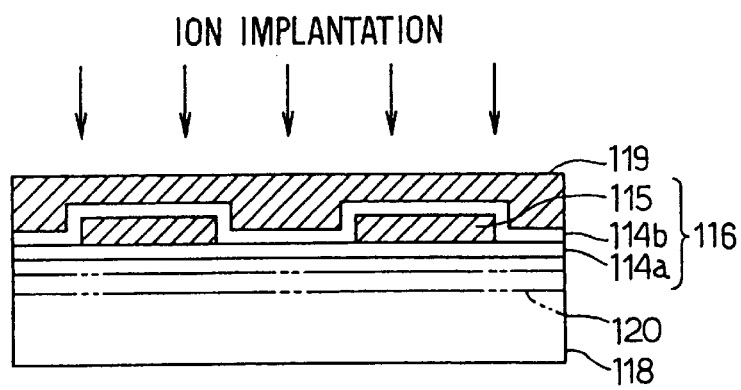

FIGS. 18A through 18C show a sixth preferred embodiment of the invention, and parts of this sixth preferred embodiment differing from the fifth preferred embodiment will now be described. In this preferred embodiment, with respect to the polysilicon film 119 formed as an ion implantation regulating material in the polysilicon film forming step P4 in the fifth preferred embodiment, instead of polishing being carried out with the oxide film 114b as a stopper in the subsequent polishing step P5, the polishing is stopped before the surface of the oxide film 114b becomes exposed. That is, a predetermined film thickness of the polysilicon film 119 remains on the entire surface.

As shown in FIG. 18A, in the polysilicon film forming step P4, a polysilicon film 119 is formed over the entire surface to a film thickness such that it can absorb steps created by the pattern structure 116. Then, in the polishing step P5, the polysilicon film 119 is not polished with the oxide film 114b as a polishing stopper but rather the polishing is stopped before it reaches the surface of the oxide film 114b so that a predetermined film thickness D of the polysilicon film 119 is left (see FIG. 18B).

In this case, to leave a film thickness D of the polysilicon film 119 after the polishing, since a stopper material is not being used, in practice the film thickness has to be controlled by adjusting the polishing time. That is, it is being presupposed that this control can be carried out accurately.

From this state, the ion-implanted layer forming step P6 is carried out. At this time, because the implantation depth of the ions being implanted becomes shallower by an amount corresponding to the remaining polysilicon film 119, it is necessary for this film thickness D to be taken into account when the implantation depth is set. Since the polysilicon film 119 is being left so as to be thicker by the film thickness D over the entire surface, in contrast to the state of FIG. 17A of the fifth preferred embodiment, the polysilicon film 119 exists over the entire surface of the substrate irrespective of whether or not the pattern structure 116 is present.

Therefore, in the point of carrying out regulation of ion implantation, it is possible to obtain exactly the same effect as in the fifth preferred embodiment. That is, when carrying out the ion-implanted layer forming step P6, it is possible to form an ion-implanted layer 120 uniformly in the same plane at a predetermined depth inside the monocrystalline silicon substrate 118 by carrying out one ion implantation over the entire surface of the substrate.

Because the surface of the polysilicon film 119 has been sufficiently flattened by polishing, it is possible to laminate the monocrystalline silicon substrate 112 serving as a supporting substrate to that surface. That is, the polysilicon film forming step P7 and the polishing step P8 which follows it in the fifth preferred embodiment can be dispensed with. Therefore, it becomes possible to obtain a semiconductor substrate 111 by skipping the polysilicon film forming step P7 and the polishing step P8 and directly proceeding to the laminating step P9 and going through the same steps as in the fifth preferred embodiment thereafter.

With this sixth preferred embodiment, because polishing of the polysilicon film 119 is stopped so as to leave a predetermined film thickness of the polysilicon film 119 over the entire surface of the monocrystalline silicon substrate 118, as well as it being possible to form an ion-implanted layer 120 uniformly and in a flat plane with a single ion implantation, because flatness of the polysilicon film 119 for lamination is maintained, the process can proceed to the laminating step P9 without going through steps for forming a flattening process film. As a result, the process can be simplified and hence it is possible to achieve cost reductions.

(Seventh Preferred Embodiment)

Figure 19:
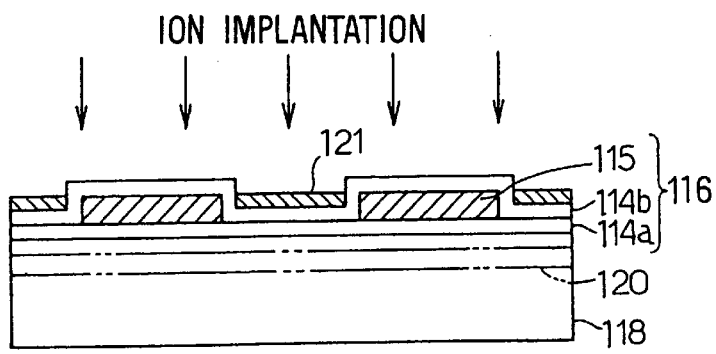
FIG. 19 is a schematic sectional view illustrating an ion implantation step of a seventh preferred embodiment.

FIG. 19 shows a seventh preferred embodiment of the invention, which differs from the fifth preferred embodiment in that a refractory metal material is used as the ion implantation regulating material. Since the blocking effect on ion implantation of refractory metal materials is generally higher than that of semiconductors such as silicon, the film thickness to which the ion implantation regulating material is formed to provide the same blocking effect as pattern members of a pattern structure 116 made of polycrystalline silicon can be set thinner than the film thickness of the pattern members.

That is, in the regulating material forming step, in regions forming recesses where the polysilicon film 115 constituting the pattern members of the pattern structure 116 is not present, a tungsten silicide film 121 serving as a refractory metal material is formed to a predetermined thickness. By this means, it is possible to make the blocking effect on ions passing through the polysilicon film 115 and the blocking effect on ions passing through the tungsten silicide film 121 the same. In the same way as in the fifth preferred embodiment, it is possible to form a uniform and flat ion-implanted layer 120 at a predetermined depth in the monocrystalline silicon substrate 118 by carrying out a single ion implantation.

With this preferred embodiment, as well as it being possible to obtain the same effects as those of the fifth preferred embodiment, it is also possible to shorten the time required for film formation and the process time can thus be shortened.

(Eighth Preferred Embodiment)

Figure 20:
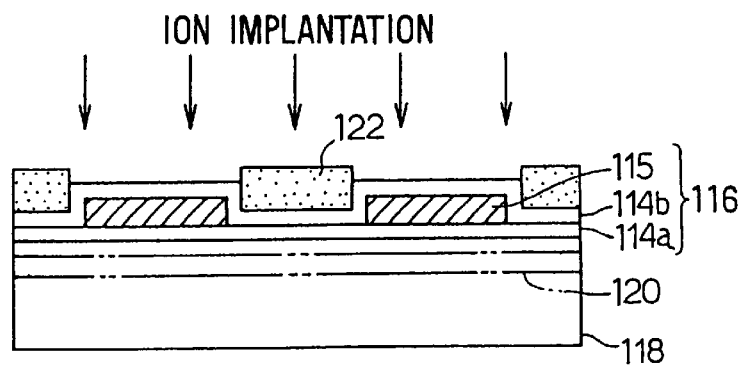
FIG. 20 is a schematic sectional view illustrating an eighth preferred embodiment.

FIG. 20 shows an eighth preferred embodiment of the invention, which differs from the fifth preferred embodiment in that photoresist is used as the ion implantation regulating material. Photoresist has a lower blocking effect on ion implantation than semiconductors such as silicon. Therefore, the film thickness to which the ion implantation regulating material is formed to provide the same blocking effect as pattern members of a pattern structure 116 made of polycrystalline silicon must be set thicker than the film thickness of the pattern members.

However, because, on the other hand, a photoresist film can be coated to a predetermined thickness easily and also it is naturally easy to pattern, by adjusting the film thickness of the photoresist to the required thickness it is possible to carry out setting of an ion implantation blocking effect with good accuracy.

In FIG. 20, in the regulating material forming step, in regions forming recesses where the polysilicon film 115 constituting the pattern members of the pattern structure 116 is not present, by photoresist being coated and patterned under predetermined conditions, a photoresist film 122 is formed to a predetermined film thickness. By this means, it is possible to make the blocking effect on ions passing through the polysilicon film 115 and the blocking effect on ions passing through the photoresist film 122 the same. Therefore, in the same way as in the fifth preferred embodiment, it is possible to form a uniform and flat ion-implanted layer 120 at a predetermined depth in the monocrystalline silicon substrate 118 by carrying out a single ion implantation.

With this preferred embodiment, as well as it being possible to obtain the same effects as those of the fifth preferred embodiment, it is also possible to make the step for forming the ion implantation regulating material simple and the process time can be shortened. In particular, when the film thickness of the polysilicon film 115 constituting the pattern members of the pattern structure 116 is not thick, since the thickness of the photoresist film 122 formed will not be excessively thick, this use of photoresist can be applied easily.

(Ninth Preferred Embodiment)

Figure 21:
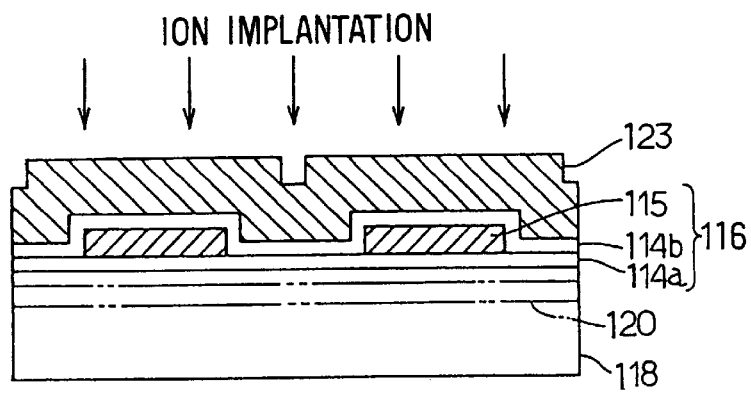
FIG. 21 is a schematic sectional view illustrating a ninth preferred embodiment.

FIG. 21 shows a ninth preferred embodiment of the invention, which differs from the fifth preferred embodiment in that regulation is carried out by an ion implantation regulating material being formed over the entire surface of the pattern structure 116. That is, in this preferred embodiment, an ion implantation regulating material is not disposed in correspondence with the pattern of the pattern structure 116 but rather a metal-containing photoresist film 123 is formed as an ion implantation regulating material having a high blocking effect on ion implantation relatively thickly over the entire surface, as shown in FIG. 21.

As a result, because the blocking effect of the photoresist film 123 is extremely large, the size of the ion blocking effect arising from the difference between the presence and absence of the polysilicon film 115 constituting the pattern members of the pattern structure 116 positioned below the photoresist film 123 becomes of an error range level. If ion implantation is carried out with a high accelerating voltage from the surface of the photoresist film 123, a uniform and flat ion-implanted layer 120 can be formed in the monocrystalline silicon substrate 118 without the influence of the pattern structure 116 being suffered.

Therefore, by forming this kind of metal-containing photoresist film 123, it is possible to form the flat ion-implanted layer 120 just by carrying out a single ion implantation without carrying out patterning. Therefore, except that the acceleration energy of the ion implantation is larger, the effect that the process of forming the ion-implanted layer 120 becomes extremely simple is obtained.

(Tenth Preferred Embodiment)

Figure 22:
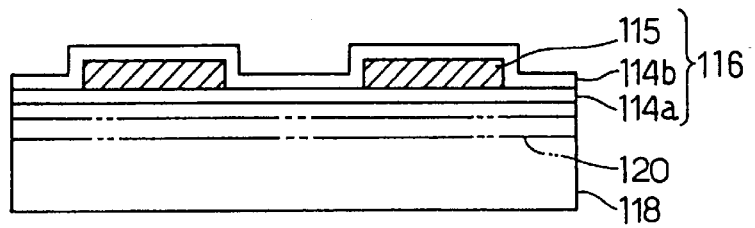
FIG. 22 is a schematic sectional view illustrating a tenth preferred embodiment.

FIG. 22 shows a tenth preferred embodiment of the invention, which differs from the fifth preferred embodiment in that the ion implantation step is carried out with nothing being particularly provided as an ion implantation regulating material. However, this preferred embodiment differs from the fifth preferred embodiment also in that the face into which ion implantation is carried out is the flat face side of the monocrystalline silicon substrate 118 on which the pattern structure 116 is not formed.

In this case, as shown in FIG. 22, if the parallelism of the front face and the rear face of the monocrystalline silicon substrate 118 is maintained accurately, by carrying out ion implantation from the rear face side with a high acceleration energy, it is possible to form an ion-implanted layer 120 in the monocrystalline silicon substrate 118 in the vicinity of the pattern structure 116. In this case, because ion implantation is carried out through the rear face, it is possible to carry out the ion-implanted layer forming step directly without providing an ion implantation regulating material as was done in the preferred embodiments described above and without the influence of differences in ion blocking effect due to the pattern structure 116 being suffered.

In the case described above, because the position of the ion-implanted layer 120 being formed is a region extremely near to the pattern structure 116, it is necessary for the ions to be driven in to a depth substantially equal to the overall thickness of the monocrystalline silicon substrate 118. Even if, for example, the thickness dimension of the monocrystalline silicon substrate 118 is only a few hundred micrometers, a considerably higher acceleration energy is required compared to the acceleration energy of when ions are implanted from the pattern structure 116 side. Therefore, in current technology this necessitates a special apparatus; however, since there are no problems in other points, if this kind of ion implantation is possible, the process can be simplified. Ion implantation carried out in this way can also be practiced after the polishing step P8 (see FIG. 17B) or after the laminating step P9 (see FIG. 17C) in the fifth preferred embodiment.

The present aspect of the invention is not limited to the fifth through tenth preferred embodiments described above, and can be modified or extended as follows.

As the ion implantation regulating material, although in the fifth preferred embodiment a polysilicon film 119 was used, as a material similar to this an amorphous silicon film may alternatively be used, or an oxide film can be used, or another material having a blocking effect on ion implantation can be used.

The polysilicon film 121 serving as a flattening process film may only be provided when necessary. If the flatness necessary for lamination has already been obtained by the polysilicon film 119, it can be dispensed with. Also, even when the flattening process film is provided, it does not have to be a polysilicon film, and an oxide film such as PEG, BPSG or the like can also be used as a flattening process film.

As the substrate for semiconductor layer formation, besides the monocrystalline silicon substrate 118, an ion-implanted layer can be formed using a substrate provided with an epitaxial layer thereon, or a substrate consisting of an epitaxial layer formed on porous silicon can be used and an ion-implanted layer formed in the porous silicon film part.

Next, eleventh through fourteenth preferred embodiments of the invention will be described. Before the description of these preferred embodiments, the aspect of the invention illustrated in them will first be briefly explained. After that, the eleventh through fourteenth preferred embodiments will be described in detail.

This aspect of the invention, like the last one, has the object of, when a pattern structure has been formed by film-growing steps and etching steps and the like on a substrate and the substrate is to be detached from a supporting substrate laminated thereto leaving a part of the substrate as a thin film of a required film thickness onto the supporting substrate, forming a semiconductor substrate such as a SOI substrate by the thin film being left onto the supporting substrate in such a state that flatness of the detachment face of the thin film is ensured.

According to the present aspect of the invention, a pattern structure (215, 221, 223, 224) is formed on a semiconductor substrate (211, 220, 222) in a pattern structure forming step P21. Pattern members (215a, 221a, 223a, 224a) of this pattern structure (215, 221, 223, 224) cause an ion-implanted layer (219) formed in an ion implantation step P22 to have steps within a substrate for a thin film semiconductor layer (217). Therefore, dummy pattern members (215b, 221b, 223b, 224b) are provided in regions where the pattern members (215a, 221a, 223a, 224a) are not formed in the pattern structure forming step P21.

In the ion implantation step P22 which follows, the ion-implanted layer (219) is formed by ions being implanted into the substrate for a thin film semiconductor layer (217) on which the pattern structure (215, 221, 223, 224) has been formed from its pattern structure (215, 221, 223, 224) side. This ion-implanted layer (219) is thus so formed that the distribution state of the implanted ions in the depth direction of the substrate for a thin film semiconductor layer (217) does not depend on the shape of the pattern structure (215, 221, 223, 224) and the ions are distributed in substantially the same flat plane. As a result, in a detaching step P24, it is possible to effect detachment along a flat face (P). By going through a detachment face polishing step P25 following this, it is possible to obtain accurate thin film semiconductor layer for semiconductor device formation (214, 214a).

When the pattern structure (215) is formed using a single semiconductor layer (214), the pattern structure forming step P21 can be carried out so as to provide both pattern members (215a) and dummy pattern members (215b) using that single semiconductor layer. In the ion implantation step P22, an ion-implanted layer (219) can be formed in substantially the same plane in the substrate on which the pattern structure has been formed. It is thereby possible to obtain a flat detachment face (P).

When a plurality of semiconductor layers (214a, 214b) are formed on a substrate (212) and a pattern structure (221, 223, 224) is to be formed in at least one of those semiconductor layers (214a, 214b), the pattern structure forming step P21 is carried out so as to additionally provide dummy pattern members (221b, 223b, 224b) in correspondence with the pattern members (221a, 223a, 224a). Consequently again in the ion implantation step P22, it is possible to form an ion-implanted layer (219) in substantially the same flat plane and thereby obtain a flat detachment face P.

When pattern members (221a, 223a, 224a) are provided in all of a plurality of semiconductor layers (214a, 214b), the dummy pattern members (221b, 223b, 224b) are provided in correspondence with those pattern members (221a, 223a, 224a). Even when the sizes and shapes of the pattern members (221a, 223a, 224a) are set in correspondence with a structure of devices to be formed on the semiconductor layers (214a, 214b), because, in the pattern structure forming step P21, the dummy pattern members (221b, 223b, 224b) are provided in correspondence with the pattern members, it is possible to form an ion-implanted layer (219) in substantially the same flat plane in the substrate and thereby raise the flatness of the detachment face (P) and form the semiconductor layers (214a, 214b) accurately.

Even when steps arise in the surface of the substrate as a result of the pattern members (215a, 221a, 223a, 224a) of the pattern structure (215, 221, 223, 224) being formed, if, in the pattern structure forming step P21, the dummy pattern members (215b, 221b, 223b, 224b) are so formed on the substrate with an insulating film (213) therebetween that they eliminate those steps, it is possible to form an ion-implanted layer (219) in substantially the same flat plane and thereby raise the flatness of the detachment face (P) and form the semiconductor layers (214a, 214b) accurately.

(Eleventh Preferred Embodiment)

An eleventh preferred embodiment of the invention will now be described with reference to FIG. 24 through FIGS. 28A through 28C.

Figure 24:
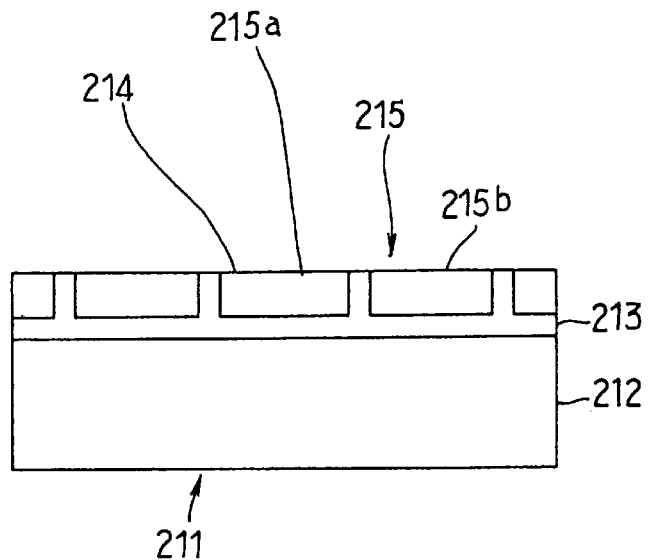
FIG. 24 is a schematic sectional view of a SOI substrate illustrating an eleventh preferred embodiment.

FIG. 24 is a schematic sectional view of a SOI substrate 211 which is a semiconductor substrate. In the SOI substrate 211, a monocrystalline silicon film 214 constituting a semiconductor layer is formed on a silicon substrate 212, serving as a supporting substrate, with an oxide film 213 serving as an insulating film therebetween. This monocrystalline silicon film 214 is formed divided up into multiple island-like parts as a pattern structure 215. When seen from above, there is an array of square regions on the supporting substrate, as shown in FIG. 25.

The pattern structure 215 is made up of pattern members 215a (in the figure, the unhatched regions), which are parts corresponding to regions for semiconductor device formation, and dummy pattern members 215b (the hatched regions in the figure), which are parts corresponding to regions not to be directly used for semiconductor device formation.

Figure 25:
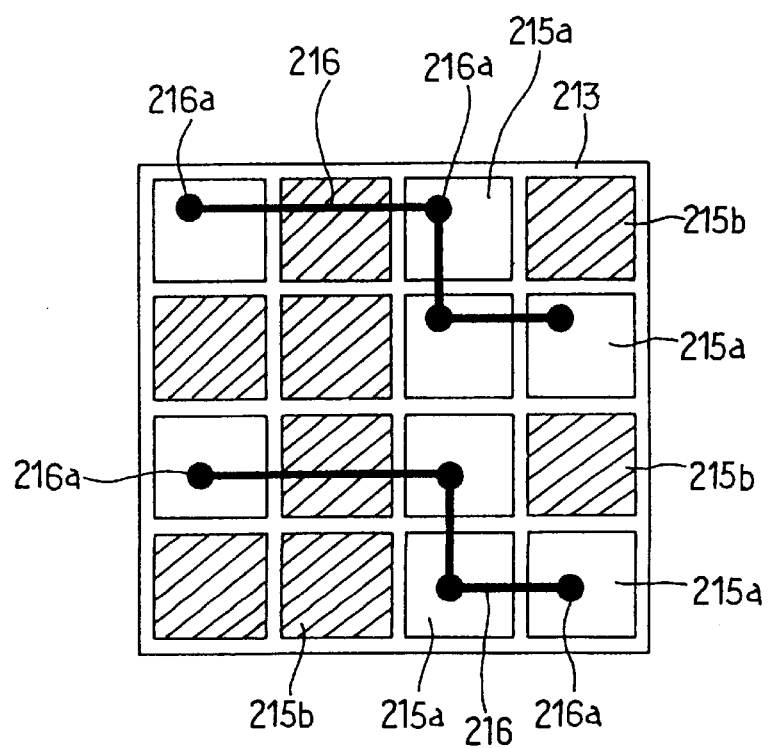
FIG. 25 is a schematic plan view of the same SOI substrate.

As shown in FIG. 25, the pattern members 215a each have, for example, one semiconductor device formed therein and are electrically connected by interconnection patterns 216. For the dummy pattern members 215b, since they have no devices formed therein, electrical connection by interconnection patterns 216 is not carried out. The pattern members 215a and the dummy pattern members 215b are each, for example, 10 µm×10 µm in size, and the width of the oxide film 213 dividing them is set to about 0.5 µm.

In the SOI substrate 211 in this preferred embodiment, semiconductor devices are formed by device formation steps in the pattern members 215a of the pattern structure 215 which is made of the monocrystalline silicon film 214 and connected by the interconnection patterns 216 to form a circuit. By this means, the semiconductor devices can be formed in such a state that they are each insulated by the oxide film 213. Therefore, it is possible to obtain an integrated circuit having excellent electrical characteristics.

Next, a method for manufacturing a SOI substrate 211 having this construction will be described with reference to FIG. 26 through FIGS. 28A to 28C.

Figure 27A:
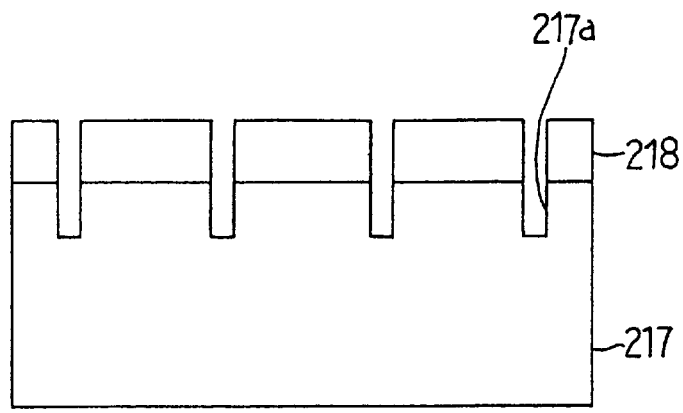
FIGS. 27A through 27C are schematic sectional views illustrating steps for manufacturing a SOI substrate according to the eleventh preferred embodiment.
Figure 27B:
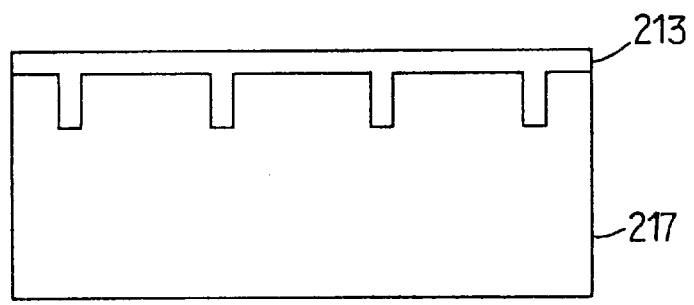
Figure 27C:
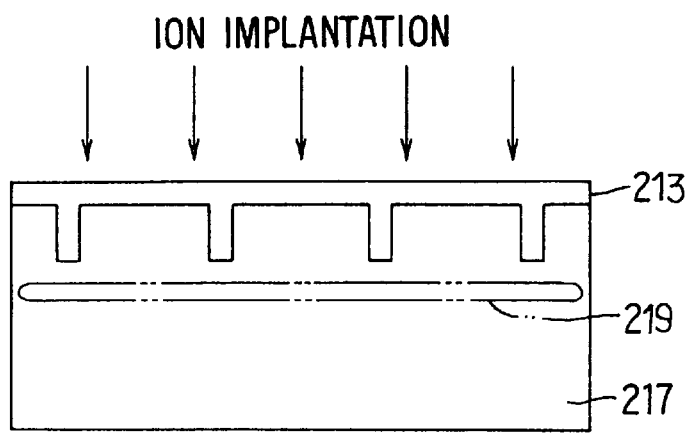

FIG. 26 is a block diagram showing the flow of an overall process for manufacturing a SOI substrate 211. First, in a pattern structure forming step P21, a pattern structure 215 is formed on a monocrystalline silicon substrate 217 serving as a substrate for a thin film semiconductor layer. FIG. 27A is a schematic sectional view of this monocrystalline silicon substrate 217 serving as a substrate for a thin film semiconductor layer. Photoresist 218 is coated onto the surface of this monocrystalline silicon substrate 217 and patterned by photolithography so as to expose parts of the monocrystalline silicon substrate 217 in the form of a grid, and then these exposed parts are etched to form channels 217a. Next, the photoresist 218 is removed and a silicon oxide film 213 is formed as an insulating film on the surface of the monocrystalline silicon substrate 217 (see FIG. 27B). The width of the channels 217a is set to about 0.5 µm.

Then, in an ion implantation step P22 (see FIG. 26), ion implantation is carried out with predetermined conditions from the side of the monocrystalline silicon substrate 217 on which the oxide film 213 was formed. For the implanted ions, ions produced by ionizing hydrogen gas or a noble gas or the like are used. Here, a case wherein hydrogen ions $H^+$ (protons) are used is shown; they are implanted after being accelerated with a predetermined acceleration energy. The implanted amount (the dose) at this time is about $1\times10^{16}$ to $1\times10^{17}$ atoms/cm$^2$. By this means, an ion-implanted layer 219 is formed at a predetermined depth, deeper than the bottoms of the channels 217a (see FIG. 27C).

Figure 28A:
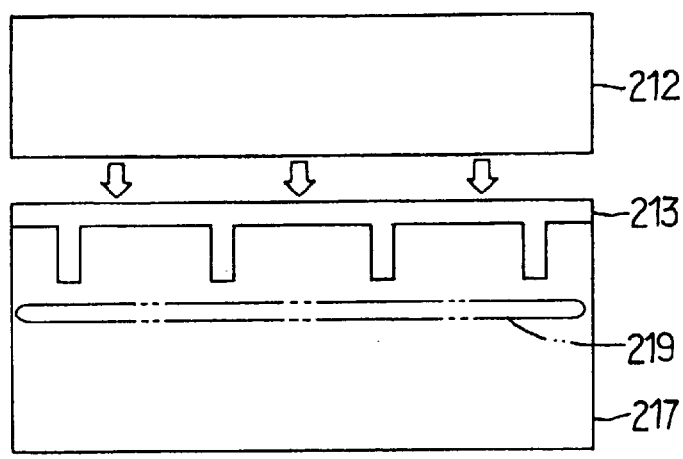
FIGS. 28A through 28C are schematic sectional views illustrating manufacturing steps continuing from FIG. 27C.
Figure 28B:
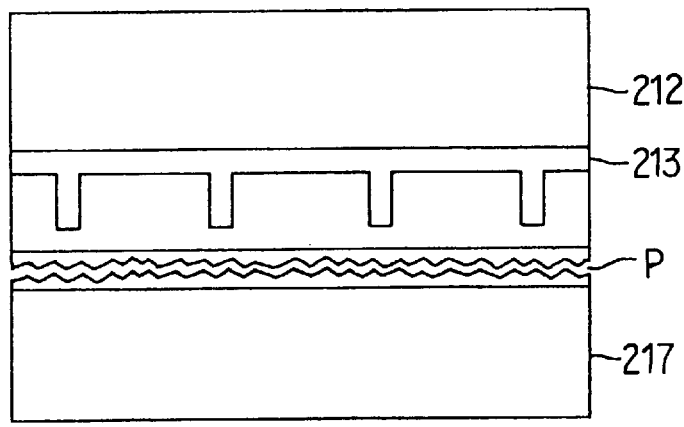

Next, after the oxide film 213 on the monocrystalline silicon substrate 217 is laminated to the base silicon substrate 212 in a laminating step P23, heat treatment is carried out at a temperature of about 500° C. as a heat treatment for bonding (see FIG. 28A). After that, in a detaching step P24, to raise the bonding strength of the above-mentioned lamination and also to effect a detachment, heat treatment is carried out at a high temperature. In this case, the heat treatment is preferably carried out at a temperature above 1100° C. and more preferably at about 1150° C. At this time, the bond between the oxide film 213 and the base silicon substrate 212 becomes strong and also detachment occurs at a defective layer region for detachment formed in the ion-implanted layer 219 (see FIG. 28B).

Instead of the laminating step P23 and the detaching step P24 being divided into two stages as described above, to simplify the process, a single heat treatment can be carried out. In this case, for example by carrying out heat treatment at a temperature of preferably over 1100° C. and more preferably about 1150° C. for about sixty minutes, it is possible to effect detachment at the defective layer region as well.

Figure 28C:
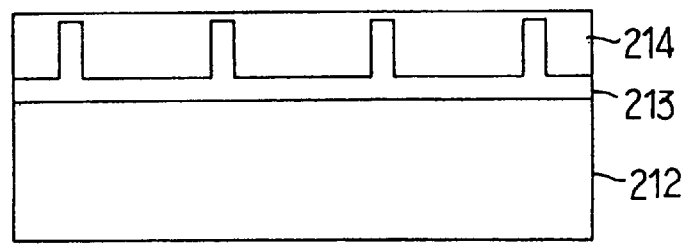

Next, in a detachment face polishing step P25, polishing is carried out to flatten the detachment face P created in the above-mentioned detaching step P24 (see FIG. 28C). At this time, polishing is carried out until the oxide film 213 formed at the bottoms of the channels 217a is reached. As a result, pattern structure 215 wherein parts (pattern members) constituting the monocrystalline silicon film 214 are separated from each other is formed (see FIG. 24). Thus, it is possible to obtain a pattern structure 215 consisting of pattern members 215a and dummy pattern members 215b separated from each other and thereby form a SOI substrate 211.

When detachment is carried out using the above-mentioned ion-implanted layer 219, hydrogen ions implanted into the monocrystalline silicon substrate 217 are distributed in a state such that they cause crystal lattice defects and crystal lattice dislocation. At this time, even when the target depth of the ion implantation was set to, for example, 0.1 µm, the distribution of hydrogen ions in practice spreads in a range of about 0.3 µm. However, where the amount of implanted hydrogen ions exceeds a fixed amount (the threshold value), in the state immediately before the detachment, as a result of going through heat treatment, the defective layer region is condensed to an extremely narrow region of a few nanometers in thickness.

As a result, detachment occurs along a very thin defective layer region, and it is possible to obtain a detachment face having extremely good flatness. The detachment face polishing step P25 is carried out to ensure flatness and also to reduce the level of roughness of the surface and to reach a state wherein the pattern structure 215 is divided up. As the ions for carrying out this kind of detachment, besides the hydrogen mentioned above they may be of a noble gas, and various others such as oxygen, chlorine and fluorine can also be considered.

When manufacturing the SOI substrate 211 formed in this preferred embodiment, to ensure quality of the monocrystalline silicon film 214, a product wafer whose impurity concentration has been controlled to a fixed value in the same way as one used for forming an ordinary semiconductor device is preferably used for the monocrystalline silicon substrate 217. For the base silicon substrate 212, on the other hand, because the substrate has only need to perform the function of holding the monocrystalline silicon substrate 217 with the oxide film 213 therebetween, a dummy wafer whose impurity concentration has not been strictly controlled can be used. Therefore, it is possible to use a cheap substrate for the base silicon substrate 212. Also, by carrying out a flattening process such as polishing on the surface of the monocrystalline silicon substrate 217 after its detachment, it is possible to use the monocrystalline silicon substrate 217 again for manufacturing another SOI substrate 211, whereby resources can be used effectively and it is possible to achieve reductions in overall cost.

With this eleventh preferred embodiment, in manufacturing a SOI substrate 211 having a pattern structure 215, as a result of dummy pattern members 215b the same as the pattern members 215a being provided in the pattern structure 215, it is possible to form the ion-implanted layer 219 in the ion implantation step P22 in substantially the same flat plane. Consequently, when detachment is carried out in the detaching step P24 there are no steps in the detachment surface P and it is possible to obtain a SOI substrate 211 having an accurately formed monocrystalline silicon film 214.

(Twelfth Preferred Embodiment)

FIG. 29 through FIGS. 32A and 32B show a twelfth preferred embodiment of the invention, and parts of this twelfth preferred embodiment which differ from the eleventh preferred embodiment will now be described.

Figure 29:
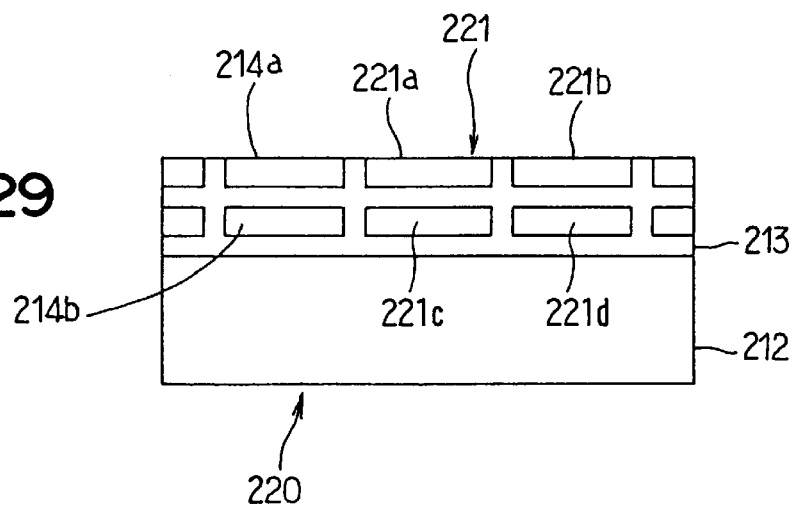
FIG. 29 is a schematic sectional view illustrating a twelfth preferred embodiment.

In this preferred embodiment, as shown in FIG. 29, a SOI substrate 220 constituting a semiconductor substrate has a pattern structure 221 instead of the pattern structure 215 of the eleventh preferred embodiment. In this pattern structure 221, below a monocrystalline silicon film 214a constituting a semiconductor layer of the same construction as in the eleventh preferred embodiment and exposed at the surface, there is separately formed in a buried state a polysilicon film 214b constituting a semiconductor layer, with an oxide film 213 serving as an insulating film therebetween.

In the pattern structure 221 of this SOI substrate 220, the monocrystalline silicon film 214a and the polysilicon film 214b, which are upper and lower semiconductor layers, are formed in the same shape and have pattern members 221a, 221c and dummy pattern members 221b, 221d separated by the oxide film 213. The pattern members 221c of the polysilicon film 214b on the lower side are provided to be used as back gates or the like when semiconductor devices are formed in the pattern members 221a.

FIGS. 30A to 30C through FIGS. 32A to 32B are sectional views illustrating a process for manufacturing the SOI substrate 220. In its basic procedure, this manufacturing process is carried out like the eleventh preferred embodiment according to the flow shown in FIG. 26. Here, the content of the pattern structure forming step P21 will be described in detail.

Figure 30A:
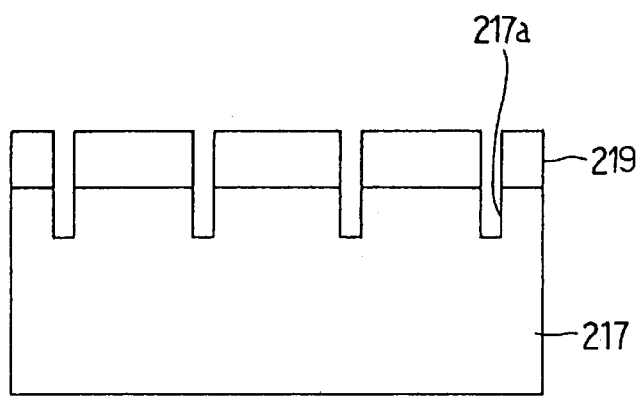
FIGS. 30A through 30C are schematic sectional views illustrating steps for manufacturing a SOI substrate according to the twelfth preferred embodiment.
Figure 30B:
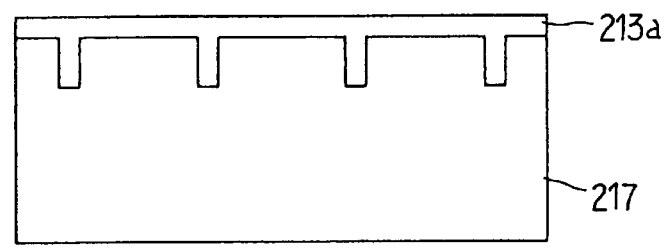
Figure 30C:
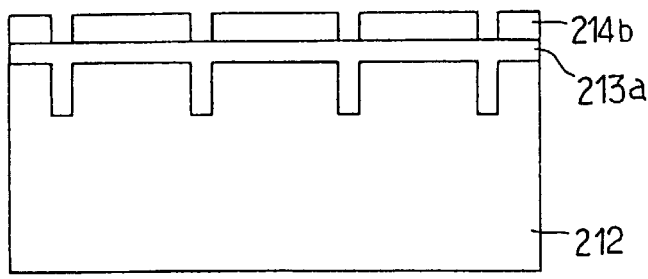

In the pattern structure forming step P21, after photoresist 219 is coated and patterned by photolithography, channels 217a are formed by etching (see FIG. 30A). Then, an oxide film 213a is formed (see FIG. 30B).

Next, a polysilicon film 214b to constitute a semiconductor layer is formed on the oxide film 213a and patterned by photolithography, after which etching is carried out. In this etching, the polysilicon film 214b is etched into the same pattern as when the channels 217a for forming the oxide film 213a were formed (see FIG. 30C). Then, an oxide film 213b is formed over the entire surface so as to fill the gaps in the pattern of the polysilicon film 214b (see FIG. 31A), and flattened.

Figure 31A:
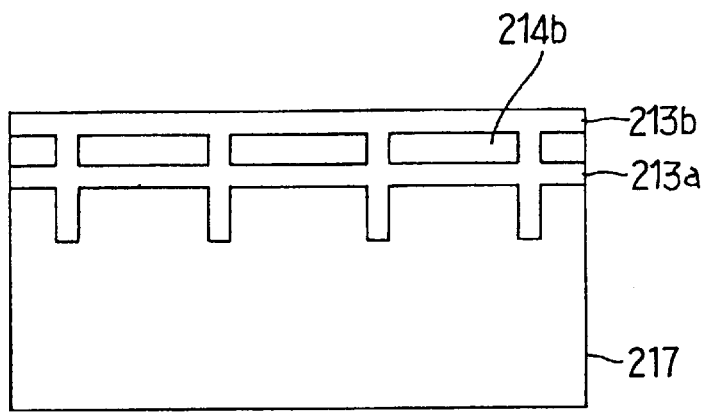
FIGS. 31A through 31C are schematic sectional views illustrating steps for manufacturing a SOI substrate continuing from FIG. 30C.
Figure 31B:
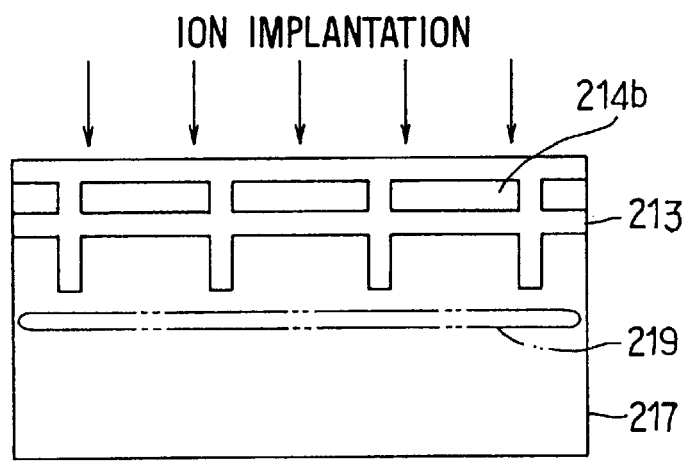
Figure 31C:
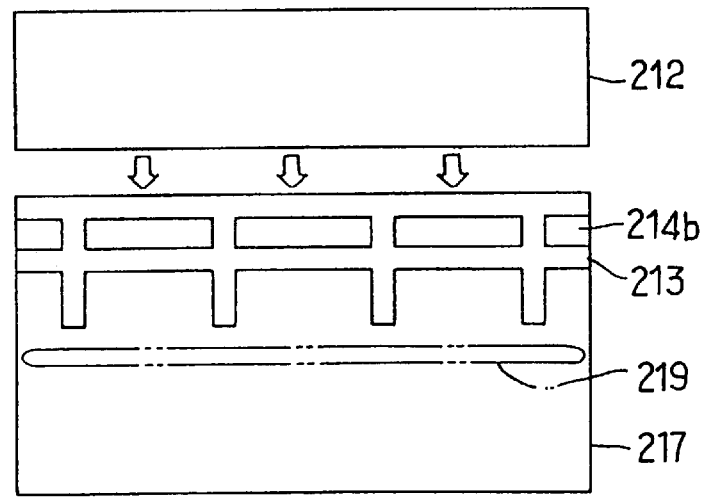

In the ion implantation step P22 which follows, in the same way as in the eleventh preferred embodiment, ion implantation is carried out with predetermined conditions to form an ion-implanted layer region 219 (see FIG. 31B). Then, after the oxide film 213b of the monocrystalline silicon substrate 217 and a supporting substrate 212 are laminated together in the laminating step P23, heat treatment for bonding is carried out (see FIG. 31C). After that, in a detaching step P24, heat treatment at a high temperature is carried out to raise the bonding strength of the lamination and to effect detachment. At this time, strengthening of the bond with the supporting substrate 212 and detachment at a defective layer region formed in the ion-implanted layer region 219 occur (see FIG. 32A).

Next, in the detachment face polishing step P25, polishing is carried out to flatten the detachment face P created in the detaching step P24 (see FIG. 32B). At this time, polishing is carried out until the oxide film 213 formed at the bottoms of the channels 217a is reached to form a pattern structure 221 wherein parts (pattern members) consisting of the monocrystalline silicon film 214a are separated from each other and a SOI substrate 220 is thereby obtained.

With this twelfth preferred embodiment, even when the pattern structure 221 is made up of a plurality of semiconductor layers (the monocrystalline silicon film 214a and the polysilicon film 214b) and has pattern members 221a, 221c in each layer, by forming dummy pattern members 221b, 221d in a pattern structure forming step P21 in the same way as in the eleventh preferred embodiment, it is possible to form the ion-implanted layer 219 to a uniform depth in the ion implantation step P22. By this means, it is possible to eliminate steps in the detachment face P and obtain a SOI substrate 220 having accurately formed semiconductor layers 214a, 214b.

(Thirteenth Preferred Embodiment)

Figure 33:
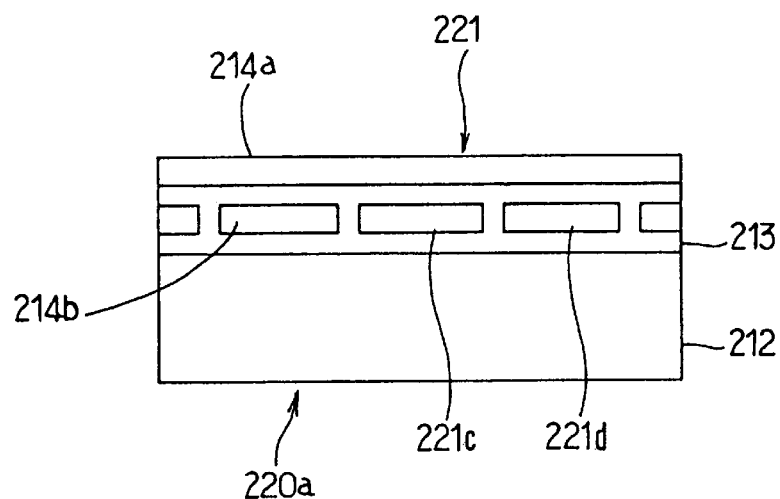
FIG. 33 is a schematic view illustrating a thirteenth preferred embodiment.

FIG. 33 shows a thirteenth preferred embodiment of the invention, which differs from the twelfth preferred embodiment in that in a SOI substrate 220a no pattern members are provided in the monocrystalline silicon film 214a. That is, a pattern structure 221 is made up of pattern members 221c and dummy pattern members 221d provided in the buried polysilicon film 214b.

To manufacture a SOI substrate 220a of this construction, in the pattern structure forming step P21 of the twelfth preferred embodiment, an oxide film 213 is formed on the face of the monocrystalline silicon substrate 217 without channels 217a being provided therein, and the polysilicon film 214b is formed on the oxide film 213. After that, the same steps as the twelfth embodiment are carried out. With this thirteenth preferred embodiment also, because dummy pattern members 221d are provided, the same effects as those of the twelfth preferred embodiment can be obtained.

(Fourteenth Preferred Embodiment)

Figure 34:
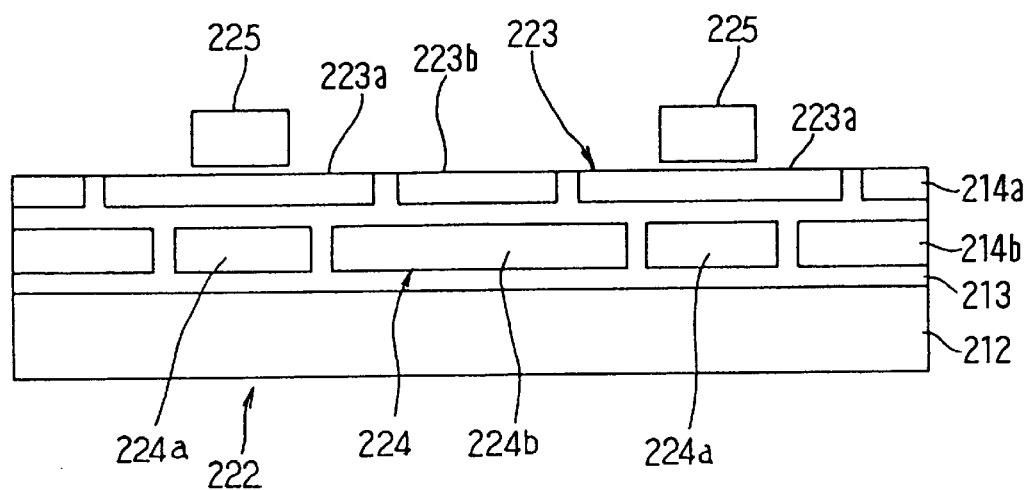
FIG. 34 is a schematic view illustrating a fourteenth preferred embodiment.

FIG. 34 shows a fourteenth preferred embodiment of the invention, and points of difference between this preferred embodiment and the twelfth preferred embodiment will now be described. In a SOI substrate 222 in this preferred embodiment, a monocrystalline silicon film 214a and a polysilicon film 214b constituting upper and lower semiconductor layers are respectively provided with pattern structures 223, 224 made up of pattern members 223a, 224a having different shapes. In this case, in the pattern structure forming step P21, dummy pattern members 223b, 224b are formed in correspondence with the pattern members 223a, 224a, respectively.

In a SOI substrate 222 having this construction, for example pattern members 223a are formed in correspondence with a structure of devices to be formed on the monocrystalline silicon film 214a and pattern members 224a are formed to use the polysilicon film 214b positioned therebelow as a back gate electrode. When forming devices on the SOI substrate 222 it is possible to make simply a high-performance device of a construction wherein gates 225 are disposed on pattern members 223a of the monocrystalline silicon film 214a with an insulating film therebetween, as shown in FIG. 34.

The aspect of the invention embodied in the eleventh through fourteenth preferred embodiments described above is not limited to these preferred embodiments, and, for example, the following modifications and extensions are possible.

In the pattern structure, the shapes of the dummy pattern members do not have to be the same as the shapes of the pattern members and also do not necessarily have to be in a cell form of the same shape. The dummy pattern can be set as necessary, for example, with the parts where pattern members are not provided being formed as a continuous dummy pattern member.

As the substrate for a thin film semiconductor layer, monocrystalline substrates of other semiconductors based on group four elements, for example Ge (germanium), SiC (silicon carbide), SiGe (silicon germanium) and the like, or diamond can be used. In this case, when a SiC substrate or the like is used, because the substrate itself is extremely expensive, the effective use of resources and cost reduction effect of polishing and reusing the substrate after its detachment is great.

Fifteenth through eighteenth preferred embodiments of the invention will now be described. Before the description of these preferred embodiments, first, the aspect of the invention illustrated in them will be briefly explained. After that, the fifteenth through eighteenth preferred embodiments will be described in detail.

This aspect of the invention, like the last one, has the object of, when a pattern structure has been formed by film-growing steps and etching steps and the like on a substrate and the substrate is to be detached from a supporting substrate laminated thereto leaving a part of the substrate as a thin film of a required film thickness onto the supporting substrate, forming a semiconductor substrate such as a SOI substrate by the thin film being left onto the supporting substrate in such a state that flatness of the detachment face of the thin film is ensured.

According to the present aspect of the invention, when an ion implantation step (P32, T32) is carried out on a substrate (318) for forming a thin film semiconductor layer on which a pattern structure (316) has been formed, a plurality of ion-implantation operations having different ion-implantation energy levels are selectively carried out on each regions of the substrate (318) for a thin film semiconductor layer. Because of the pattern structure (316), there are steps on the substrate (318). Therefore, in correspondence with the steps on the substrate, the plurality of ion implantation operations are carried out so that an ion-implanted region to become a defective layer region (320) for detachment is formed in a single flat plane in the substrate. As a result, because it is possible to form the defective layer region (320) in the same plane, detachment can be effected on a flat plane in a detachment step (P34, T34). Further, by going through a subsequent detachment face polishing step (P35, T35), it is possible to obtain an accurate thin film semiconductor layer for device formation (317, 324)

That is, even when a pattern structure (316) having steps is formed on the substrate (318), by ion implantation being carried out a plurality of times with different ion implantation energy level settings in the ion implantation step (P32, T33), it is possible to make uniform the distribution depth of ions in the depth direction of the ion implantation and form an ion-implanted region to become a defective layer region (320) without suffering the adverse influence of the steps of the pattern structure (316). By this means, it is possible in the detaching step (P35, T35) to effect detachment in substantially the same flat plane and carry out film thickness control of the semiconductor layer for device formation (317, 324) with high precision.

Even when the pattern structure (316) is provided by patterning films having different characteristics on the substrate (318) for a thin film semiconductor layer, by ion implantation being carried out a plurality of times with different ion implantation energy level settings in the ion implantation step (P32, T33), it is possible to make uniform the distribution depth of ions in the depth direction of the ion implantation and form an ion-implanted region to become a defective layer region (320) without suffering the adverse influence of the steps. By this means, it is possible in the detaching step (P35, T35) to effect detachment in substantially the same flat plane and form an accurate semiconductor layer for device formation (317, 324).

When the ion implantation step (P32) has been finished, or before the ion implantation step (T33) is carried out, a flattening step (P33, T32) of forming a flattening process film (313) such as a polysilicon film, an amorphous silicon film or a silicon oxide film on the surface of the substrate (318) and then flattening the surface of this flattening process film (313) by polishing may be carried out. By doing this, it is possible to eliminate steps arising due to the formation of the pattern structure and thereby make it easy to laminate the supporting substrate (312) to the substrate (318) for a thin film semiconductor layer.

When the flattening step (P33) is carried out after the ion implantation step (P32), it is necessary for a heat treatment for forming the flattening process film (313) to be carried out at a temperature lower than the temperature at which ions implanted into the substrate (318) undergo desorption. When, on the other hand, the flattening step (T32) is carried out before the ion implantation step (T33), the flattening process film (313) can be formed without there being restrictions on the heat treatment temperature.

In a pattern structure forming step (P31, T31), a pattern structure (316) having a polishing stopper (323) for detecting the completion of polishing in a detachment face polishing step (P35, T35) may be formed on the substrate (318). By this means,1 it is possible to end the detachment face polishing step (P35, T35) surely when the semiconductor layer (324) has been polished to a predetermined thickness. Also, it becomes possible to form the semiconductor layer (324) with good accuracy.

If the polishing stopper (323) is formed at a position corresponding to a required thickness of the semiconductor layer (324) using a material whose polishing rate is different from that of the semiconductor layer (324), because the amount of heat produced in polishing in the detachment face polishing step (P35, T35) changes, it is possible to detect the completion of polishing in response to the change of the produced heat amount. As a result, it becomes possible to form the semiconductor layer (324) accurately. Also, if the polishing stopper (323) is formed using a material such as an oxide film or a nitride film having a slower polishing rate than that of the substrate (318), the change in the amount of heat produced in polishing is greater and hence the completion of polishing can be detected still more surely.

In the processing steps subsequent to the ion implantation step (P32, T33) but prior to the detaching step (P35, T35), the temperature of heat treatment necessary is preferably set to a temperature lower than the desorption temperature that is the heat treatment temperature at which ions implanted in the ion implantation step (P32, T33) desorb from the substrate (318) in the detaching step (P35, T35). By this means, in the processing steps up to when the detaching step (P35, T35) is carried out, the implanted ions can be held in the substrate (318) without desorbing. Also, because a defective layer region (320) is formed and detachment is effected with the ions being desorbed for the first time at the temperature of the heat treatment carried out in the detaching step (P35, T35), detachment can be effected surely and with good accuracy.

(Fifteenth Preferred Embodiment)

A fifteenth preferred embodiment of the invention will now be described with reference to FIGS. 35A through 35C to FIG. 39.

Figure 37:
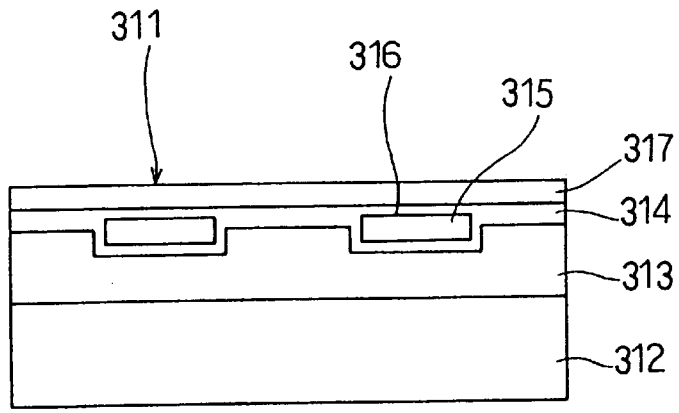
FIG. 37 is a schematic sectional view of a completed SOI substrate.
Figure 38:
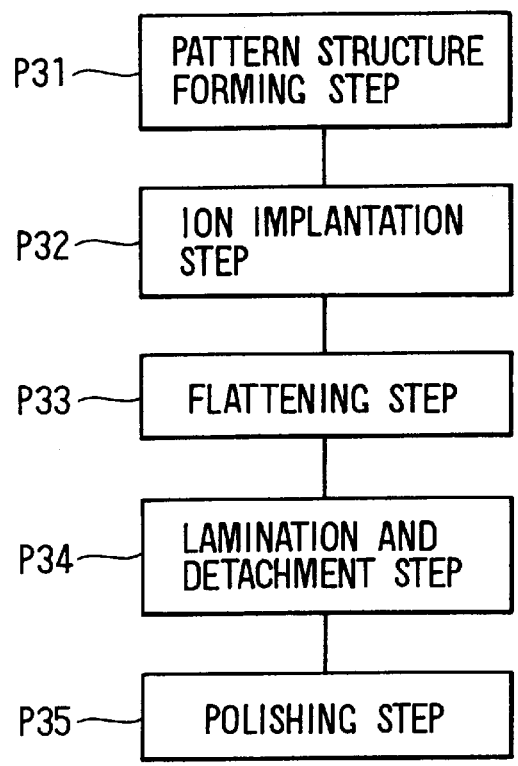
FIG. 38 is an outline process diagram of the fifteenth preferred embodiment.

FIG. 37 is a schematic sectional view of a SOI substrate 311 which is a semiconductor substrate. In this SOI substrate 311, a flattening process film 313 consisting of a polysilicon film, an amorphous silicon film or a silicon oxide film or the like is formed on a base silicon substrate 312 serving as a supporting substrate. A pattern structure 316 made up of an insulating film 314 of silicon oxide or the like and a polysilicon film 315 is formed on this, and a silicon monocrystalline film 317 serving as a semiconductor layer for device formation is formed on that.

The SOI substrate 311 in this preferred embodiment is one which, for example, when a device such as a FET has been formed in the silicon monocrystalline film 317 by device formation steps, is suitable for forming a device of a structure wherein the polysilicon film 315 formed buried in the insulating film 314 of the pattern structure 316 is used as a back gate electrode of that device. It can also be used to form various devices for other applications.

Next, a method for manufacturing a SOI substrate 311 having the construction described above will be described with reference to FIGS. 35A through 35C, FIGS. 36A through 36C and FIGS. 38 and 39.

Figure 35A:
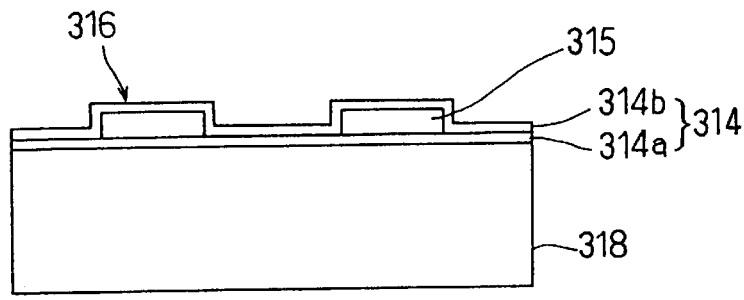
FIGS. 35A through 35C are schematic sectional views illustrating steps for manufacturing a SOI substrate according to a fifteenth preferred embodiment.
Figure 35B:
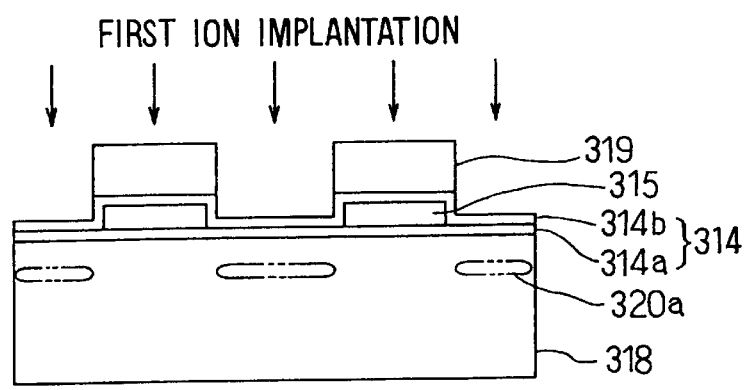
Figure 35C:
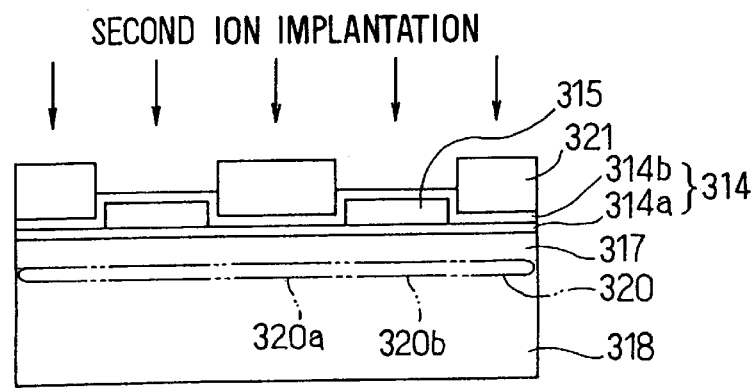
Figure 36A:
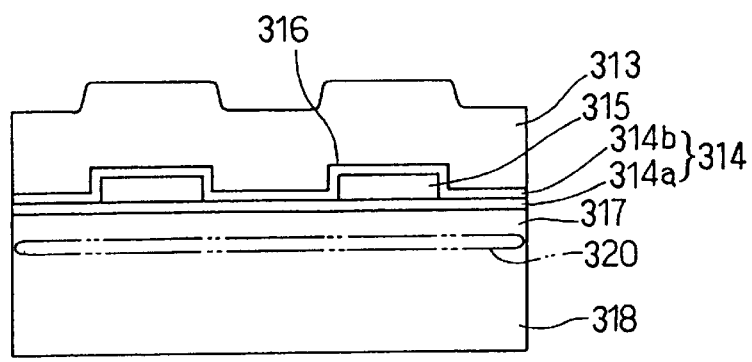
FIGS. 36A through 36C are schematic sectional views illustrating steps for manufacturing a SOI substrate continuing from FIG. 35C.
Figure 36B:
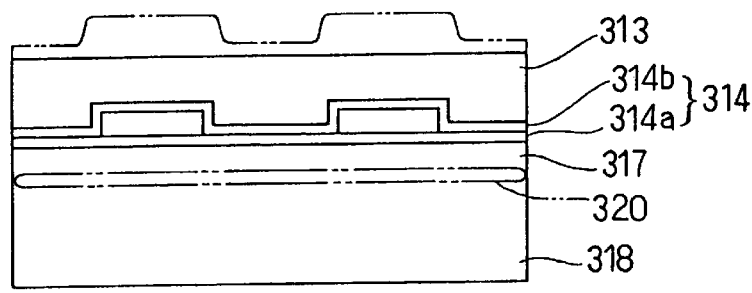
Figure 36C:
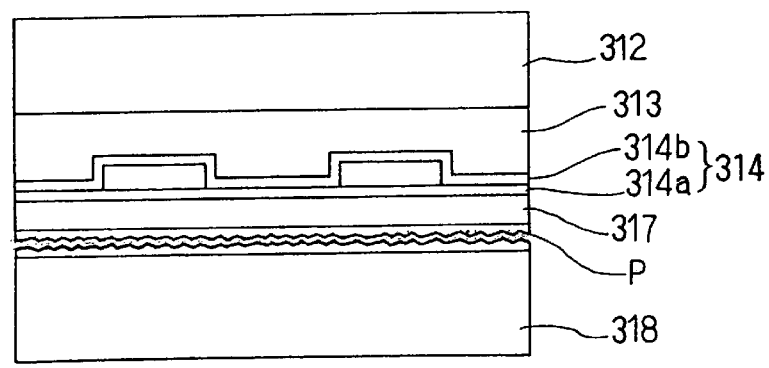
Figure 39:
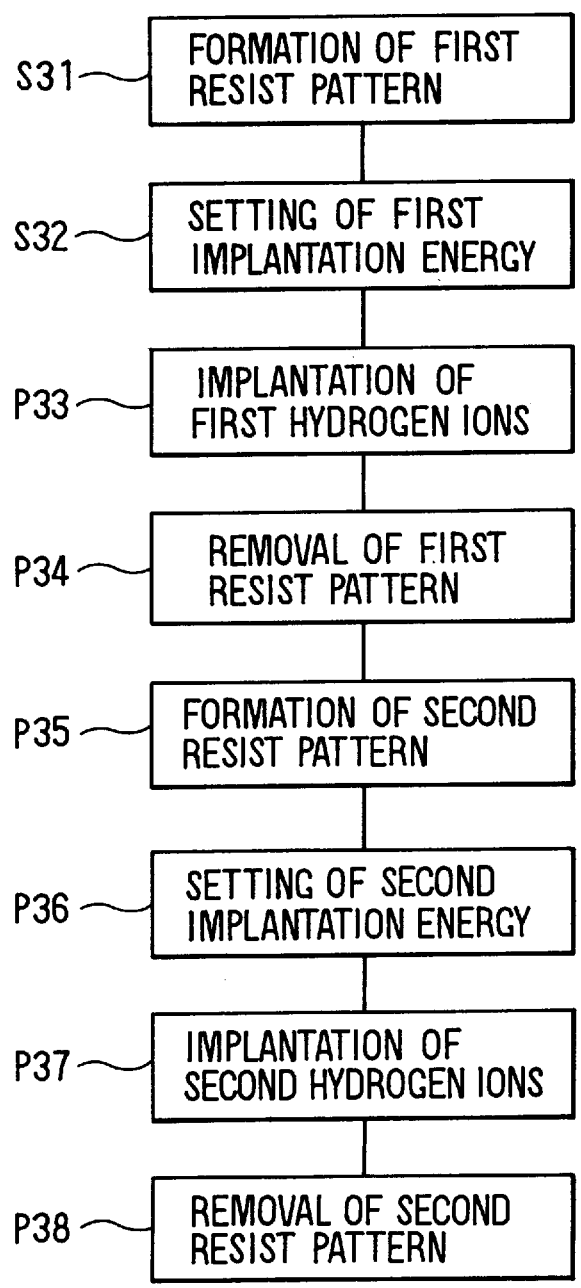
FIG. 39 is a detailed process diagram of an ion implantation step.

FIG. 39 is a block diagram showing in outline the overall flow of a process for manufacturing a SOI substrate 311. First, in a pattern structure forming step P31, a pattern structure 316 is formed on a monocrystalline silicon substrate 318 serving as a substrate for forming a thin film semiconductor layer. FIG. 35A is a schematic sectional view of the monocrystalline silicon substrate 318. The surface of this monocrystalline silicon substrate 318 is thermally oxidized to form a thermal oxide film 314a (of film thickness, for example, 0.1 μm) as an insulating film 314. Then, polycrystalline silicon is deposited by CVD or the like and patterned by photolithography and etching or the like to form a polysilicon film 315 (of film thickness, for example, 0.35 μm). An oxide film 314b (of film thickness, for example, 0.1 μm) is then further deposited by CVD or the like to form a pattern structure 316.

Next, in an ion implantation step P32 (see FIG. 38), ion implantation is carried out by means of the detail steps shown in FIG. 39. That is, first, in steps S31 through S34, a first ion implantation is carried out, and then in steps S35 through S38 a second ion implantation is performed. This is, in order to form a flat detachment face by ion implantation inside a monocrystalline silicon substrate 318 on which a pattern structure has been formed as described above, it is necessary in the ion implantation step to control the ion implantation energy taking into account variations in the ion penetration depth caused by differences in the structure of the implantation region (that is, the pattern structure). As the implanted ions, ions produced by ionizing hydrogen gas or noble gas are used, and in this preferred embodiment, hydrogen ions $H^+$ (protons) are used.

The maximum depths to which hydrogen ions are distributed at different ion implantation energies are shown in Table 1 for different materials into which hydrogen ions are implanted. On the basis of these results, an implantation energy is determined for each part of the pattern structure. In regions where only the oxide film 314a and the oxide film 314b are present, the overall insulating film 314 has a film thickness of about 0.2 μm. If it is assumed that here the target depth in the monocrystalline silicon substrate 318 is 0.1 μm then an implantation energy of 30 keV to 40 keV is necessary.

In the regions where the polysilicon film 315 is formed, an implantation energy of 80 KeV to 100 keV is necessary. As for the dose, as in a case of detaching a substrate for forming a thin film semiconductor layer on which there is no pattern structure 316, a dose of about $1 \times 10^{16}$ to $1 \times 10^{17}$ atoms/cm$^2$ is necessary.

TABLE 1

| | (hydrogen ion implantation depth μm) | | |
|---|---|---|---|
| implantation energy | monocrystalline silicon | polycrystalline silicon | oxide film |
| 50 | 0.59 | 0.54 | 0.50 |
| 100 | 1.00 | 0.92 | 0.84 |
| 150 | 1.39 | 1.28 | 1.17 |

In the first ion implantation process S31 through S34 (see FIG. 39), photoresist 319 is coated onto the pattern structure 316 of the monocrystalline silicon substrate 318 and the photoresist 319 positioned on the polysilicon film 315 is left to form a first resist pattern (S31). Then, as described above, 30 keV to 40 keV is set as a first ion implantation energy (S32) and hydrogen ions are implanted in the above-mentioned dose (S33) to form an ion-implanted region 320a (see FIG. 35B). After that, the first resist pattern formed by the photoresist 319 is removed (S34).

Next, in the second ion implantation process S35 through S38 (see FIG. 39), photoresist 321 is again coated onto the pattern structure 316 of the monocrystalline silicon substrate 318 and the photoresist 321 is left on the parts other than the polysilicon film 315 to form a second resist pattern (S35). Then, as described above, 80 keV to 100 keV is set as a second ion implantation energy (S36) and hydrogen ions are implanted in the above-mentioned dose (S37) to form an ion-implanted region 320b in a plane at the same depth as the above-mentioned ion-implanted region 320a. As a result, an ion-implanted region 320 positioned entirely in the same flat plane is formed (see FIG. 35C).

After that, the resist pattern formed by the photoresist 321 is removed (S38). Thus is formed an ion-implanted region 320 to become a defective layer region for effecting detachment when heat treatment is carried out in a later detaching step P34. The photoresists 319, 321 constitute ion implantation masks and are the same as ordinary resist materials.

Next, to laminate the monocrystalline silicon substrate 318 having this pattern structure 316 to the supporting silicon substrate 312, it is necessary to make the surface of the silicon substrate 318 flat. To this end, as a flattening step P33 (see FIG. 38), a flattening process film 313 of polycrystalline silicon or amorphous silicon or silicon oxide or the like is deposited to a predetermined film thickness (for example about 5 μm to 10 μm) on the surface of the monocrystalline silicon substrate 318 by CVD using a silicon gas source or sputtering a silicon target or a PVD method such as heated vapor deposition (see FIG. 36A).

In this case, to prevent the occurrence of detachment at the ion-implanted region 320, the deposition of the flattening process film 313 of polysilicon or amorphous silicon or silicon oxide or the like must be carried out with the monocrystalline silicon substrate 318 at a low temperature below 500° C. This is because desorption of the hydrogen ions introduced into the monocrystalline silicon substrate 318 by ion implantation occurs at 500° C. or over. Next, the flattening process film 313 formed for laminating to the supporting substrate 312 is polished (for example, to a film thickness of 2 μm to 3 μm) to eliminate the surface steps caused by the pattern structure 316 therebelow (see FIG. 36B).

Then, in a lamination and detachment step P34, the polished surface of the monocrystalline silicon substrate 318 and the supporting silicon substrate 312 are laminated to each other and heat treatment to bond them together is carried out. Here, the heat treatment is carried out in two stages. That is, first, in a laminating step, heat treatment is carried out at a temperature of 500° C. After that, heat treatment is carried out at preferably over 1100° C. and more preferably about 1150° C. for about sixty minutes with the object of increasing the strength of the bond. At this time, strengthening of the bond with the supporting silicon substrate 312 and detachment at the defective layer region for detachment formed in the ion-implanted region 320 occur (see FIG. 36C).

The heat treatment does not have to be divided into two stages as described above. That is, to simplify the process, it can alternatively be carried out in a single heat treatment. In this case, detachment at the defective layer region for detachment can be effect by carrying out heat treatment for sixty minutes at a temperature of preferably above, for example, 1100° C. and more preferably about 1150° C.

As a result of the implantation depths having being made the same in the ion implantation step P32, detachment occurs leaving the detachment face P in a state such that its surface roughness is less than a few nanometers, and consequently a flat surface can be formed easily in a subsequent detachment face polishing step P35. As a result, a SOI substrate 311 wherein a semiconductor thin film 317 is formed to a predetermined thickness on the supporting substrate 312 having a pattern structure 316 is formed.

When detachment is carried out using the above-mentioned ion-implanted region 320, hydrogen ions implanted into the monocrystalline silicon substrate 318 are distributed in a state such that they cause crystal lattice defects and crystal lattice distortion. At this time, the distribution of hydrogen ions when the target depth of the ion implantation was set to, for example, 0.1 μm in practice spreads to about 0.3 μm. However, where the amount of implanted hydrogen ions exceeds a fixed amount (the threshold value), in the state immediately before the detachment, as a result of going through heat treatment, the defective layer region is condensed to an extremely narrow region of a few tens of nanometers to a few nanometers in thickness.

As a result, detachment occurs along a very thin defective layer region, and it is possible to obtain a detachment face having extremely good flatness. The detachment face polishing step P35 is carried out to ensure flatness and also to reduce the level of roughness of the surface. As the ions for carrying out this kind of detachment, besides the hydrogen mentioned above, they may be of noble gas, and various others such as oxygen, chlorine and fluorine can also be adopted.

When making the SOI substrate 311 formed in this preferred embodiment, for the monocrystalline silicon substrate 318, to ensure quality of the monocrystalline silicon thin film 317, a product wafer whose impurity concentration has been controlled to a fixed value in the same way as one used for forming an ordinary semiconductor device is preferably used. For the supporting silicon substrate 312, on the other hand, because it only needs to perform the function of holding the monocrystalline silicon film 317 with the oxide film 314 therebetween, a dummy wafer whose impurity concentration has not been strictly controlled can be used.

Therefore, it is possible to use a cheap substrate for the supporting silicon substrate 312. Also, by carrying out a flattening process such as polishing on the surface of the monocrystalline silicon substrate 318 after its detachment, it is possible to use the monocrystalline silicon substrate 318 again for manufacturing another SOI substrate 311, whereby resources can be used effectively and it is possible to achieve reductions in overall cost.

With this fifteenth preferred embodiment, even when a monocrystalline silicon substrate 318 on which a pattern structure 316 is formed is employed as a substrate for forming a thin film semiconductor layer, by carrying out ion implantation in the ion implantation step P32 with implantation energies set to differ in correspondence with the steps caused by the pattern structure 316, it is possible to form an ion-implanted region 320 in the same flat plane in the silicon substrate 318. By this means, when detachment is carried out in the lamination and detachment step P34, there are no steps in the resulting detachment face. Therefore, it is possible to obtain a SOI substrate 311 having an accurately formed semiconductor thin film 317.

(Sixteenth Preferred Embodiment)

FIGS. 40A to 40C through FIG. 42 show a sixteenth preferred embodiment of the invention, and parts of this sixteenth preferred embodiment differing from the fifteenth preferred embodiment will now be described.

Figure 42:
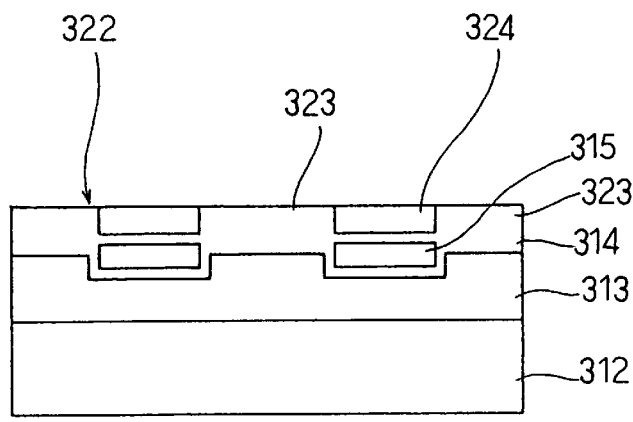
FIG. 42 is a schematic sectional view of a completed SOI substrate.
Figure 43A:
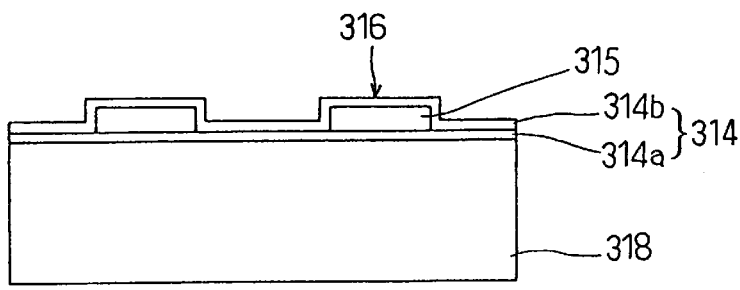
FIGS. 43A through 43C are sectional views illustrating steps for manufacturing a SOI substrate according to a seventeenth preferred embodiment.
Figure 43B:
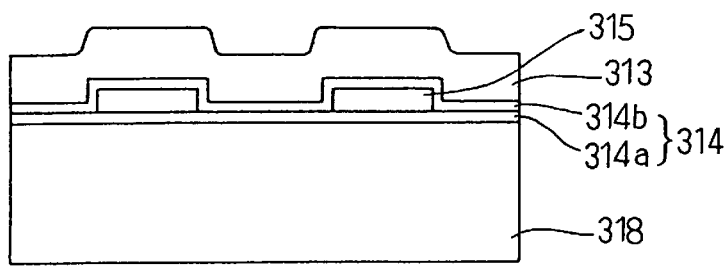
Figure 43C:
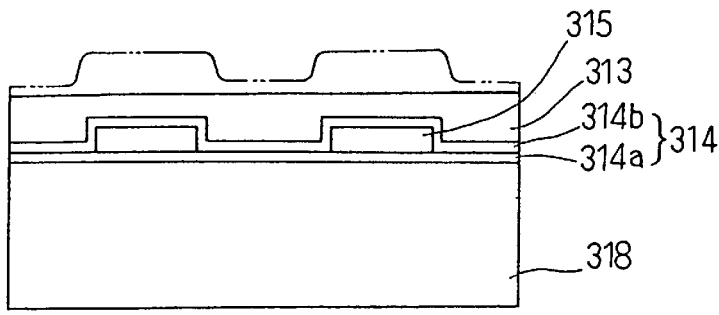

In this preferred embodiment, as shown in FIG. 42, an oxide film 314 serving as an insulating film is formed on a SOI substrate 322 so as to be partially exposed at the face of a silicon monocrystalline thin film 324 serving as a semiconductor layer. That is, the oxide film 314 functions as a polishing stopper 323. A semiconductor thin film 324 for device formation is formed as an island region at the surface of the SOI substrate 322 in an insulated and separated state.

FIGS. 40A through 40C and FIGS. 41A through 41C are sectional views illustrating a process for manufacturing this SOI substrate 322. In a pattern forming step P31 (see FIG. 40A), unlike in the fifteenth preferred embodiment, a channel 318a for forming a polishing stopper 323 is formed in advance in the monocrystalline silicon substrate 318 by photolithography process and etching. In this channel 318a, an oxide film 314 is formed as the polishing stopper 323. The subsequent steps are substantially the same as in the fifteenth preferred embodiment.

Figure 40A:
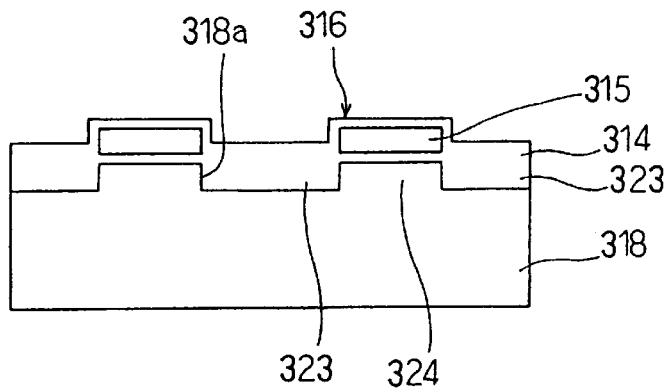
FIGS. 40A through 40C are sectional views illustrating steps for manufacturing a SOI substrate according to a sixteenth preferred embodiment.
Figure 40B:
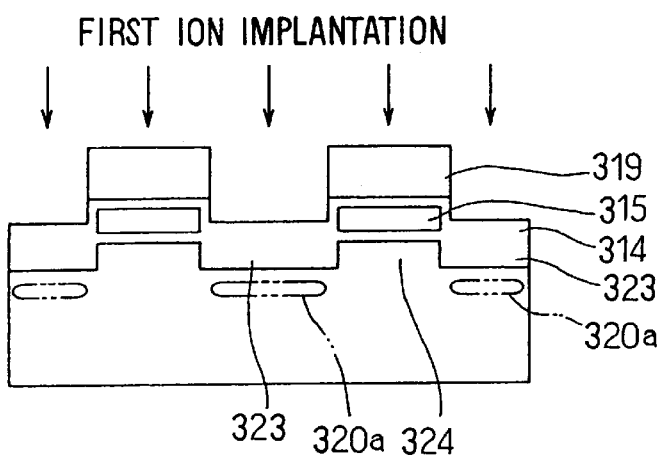
Figure 40C:
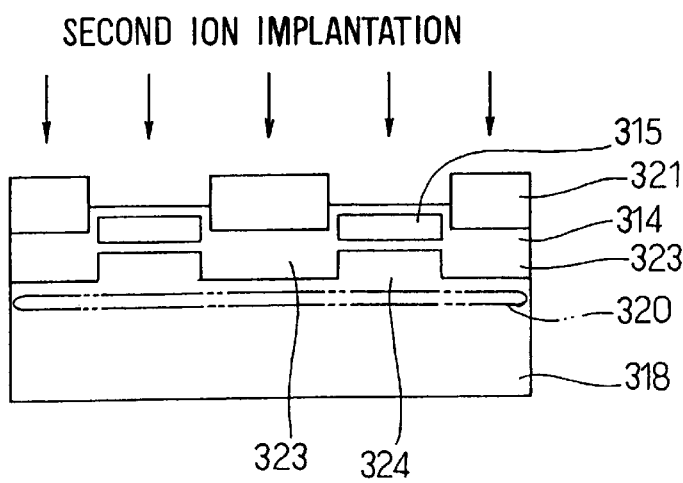

That is, in an ion implantation step P32, photoresist 319 is patterned and ion implantation is carried out with the patterned photoresist 319 as a mask to form an ion-implanted region 320a (see FIG. 40B). Then, photoresist 321 is patterned and ion implantation is carried out with the patterned photoresist 321 as a mask to form an ion-implanted region 320 in the silicon substrate 318 in a single flat plane (see FIG. 40C).

Figure 41A:
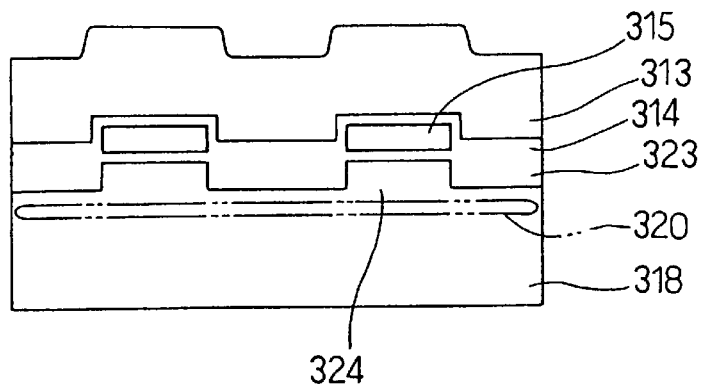
FIGS. 41A through 41C are sectional views illustrating steps continuing from FIG. 40C.
Figure 41B:
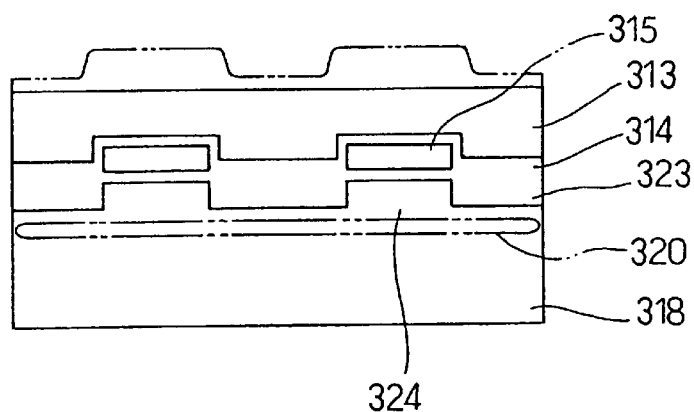
Figure 41C:
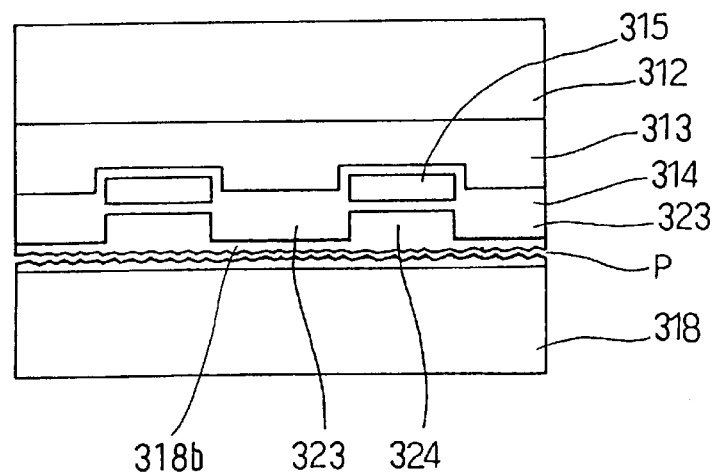

Then, in a flattening step P33, a flattening process film 313 is formed on the surface (see FIG. 41A), and polished to a predetermined thickness to make it flat (see FIG. 41B). After that, in a lamination and detachment step P34, in the same way as in the fifteenth preferred embodiment, the supporting substrate 312 is laminated to the surface of a monocrystalline silicon substrate 318 and heat treatment is carried out to detach the monocrystalline silicon substrate 318 (see 41C). In this case also, the heat treatment may be carried out in two stages as in the case of the fifteenth preferred embodiment or may be carried out as a single heat treatment.

In the state thus reached, an extremely thin silicon film 318b remains at the detachment face where the polishing stopper 323 was formed thereunder. This thin silicon film 318b is removed by polishing in a detachment face polishing step P35. At this time, when the polishing reaches a point at which the silicon film 318b disappears, the surface of the polishing stopper 323 becomes exposed as the polishing face. Since the polishing rate of the polishing stopper 323, which is a silicon oxide film, is slower than that of the silicon film 318b, there is an increase in the amount of heat produced by the polishing. By this being detected with a temperature sensor or the like, it is possible to detect that the polishing face has reached the surface of the polishing stopper 323, and polishing is stopped at this point. In this way, it is possible to obtain as the semiconductor layer 324 an accurate thin film semiconductor layer which is both thin and uniform in thickness.

The pattern structure 316 is preferably so formed that the polishing stopper 323 occupies 30% to 50% of the area of the polishing face. Also, if the exposure of the polishing stopper 323 can be detected by some method other than the above-mentioned method of detecting a change in the amount of heat produced caused by a difference in polishing rates, the area and the pattern of the polishing stopper 323 can be set freely.

(Seventeenth Preferred Embodiment)

FIGS. 43A to 43C through FIG. 45 show a seventeenth preferred embodiment of the invention, and parts of this seventeenth preferred embodiment differing from the fifteenth preferred embodiment will now be described.

In this preferred embodiment, as shown in FIG. 45, the order of the processing steps is set so that, compared to the fifteenth preferred embodiment described above, the flattening step, step T32 in this preferred embodiment, and the ion implantation step, step T33 in this preferred embodiment, are interchanged. That is, after the pattern structure forming step T31, first the flattening step T32 is carried out and then the ion implantation step T33 is carried out after that. The lamination and detachment step T34 and the detachment face polishing step T35 that are the subsequent steps are the same as in the fifteenth preferred embodiment.

FIGS. 43A through 43C and FIGS. 44A through 44C are schematic sectional views of a substrate in a case where processing is carried out in the order shown in FIG. 45, and this will now be briefly explained. First, in the same way as in the fifteenth preferred embodiment, in the pattern structure forming step T31, a pattern structure 316 is formed on a monocrystalline silicon substrate 318 to serve as a substrate for forming a thin film semiconductor layer (see FIG. 43A).

Next, in the flattening step T32, a flattening process film 313 is formed on the pattern structure 316 side of the monocrystalline silicon substrate 318. This flattening process film 313 is formed by CVD or PVD to a predetermined film thickness (for example, 5 $\mu$m to 10 $\mu$m) as a polycrystalline silicon or amorphous silicon film for lamination (see FIG. 43B) and then polished (for example, until the film thickness of the flattening process film 313 is 2 $\mu$m to 3 $\mu$m) to flatten the pattern structure 316 face (see FIG. 43C).

In this case, when forming the flattening process film 313, because, unlike in the fifteenth and sixteenth preferred embodiments, an ion-implanted region 320 has not yet been formed, there are no restrictions on the heat treatment temperature. Consequently, for example when growing a polycrystalline silicon or amorphous silicon film or a silicon oxide film, the film can be grown at a high temperature over 500° C. By using this method, it becomes possible to grow a polycrystalline silicon or amorphous silicon film or a silicon oxide film with conditions such as crystallinity of the deposited film, film thickness distribution over the face and growth rate optimized.

Figure 44A:
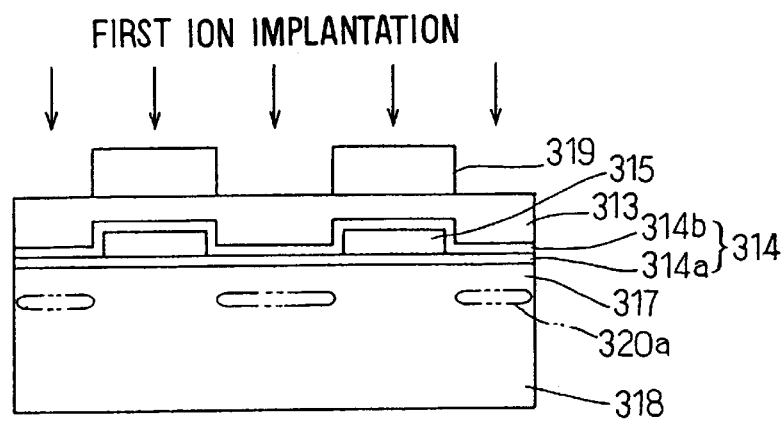
FIGS. 44A through 44C are sectional views illustrating manufacturing steps continuing from FIG. 43C.
Figure 44B:
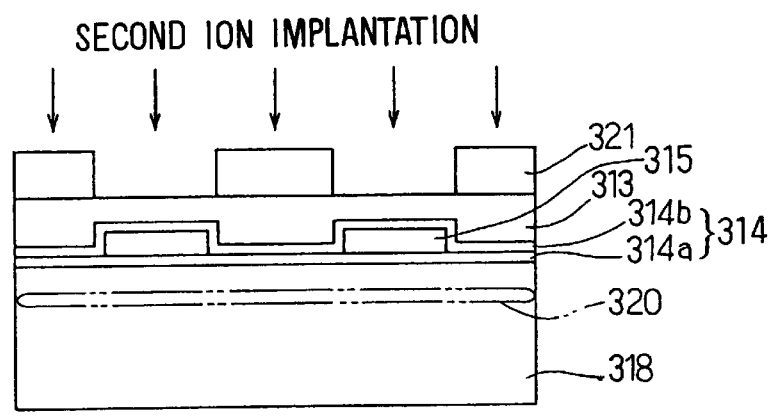
Figure 44C:
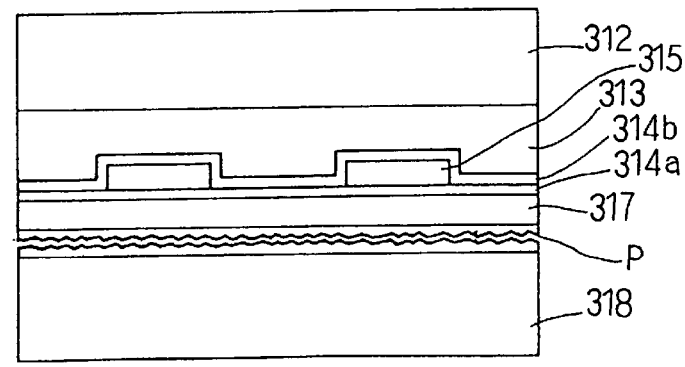
Figure 46A:
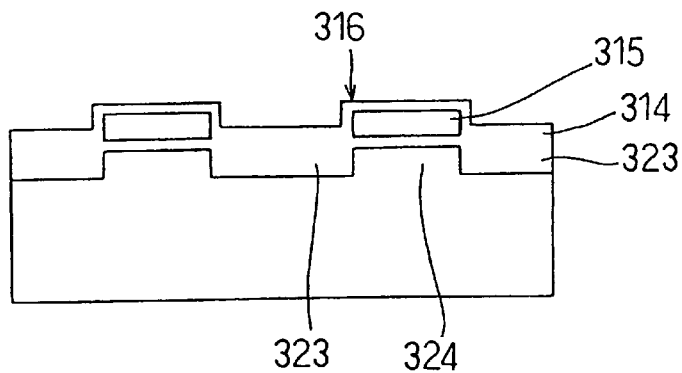
FIGS. 46A through 46C are sectional views illustrating steps for manufacturing a SOI substrate according to an eighteenth preferred embodiment.
Figure 46B:
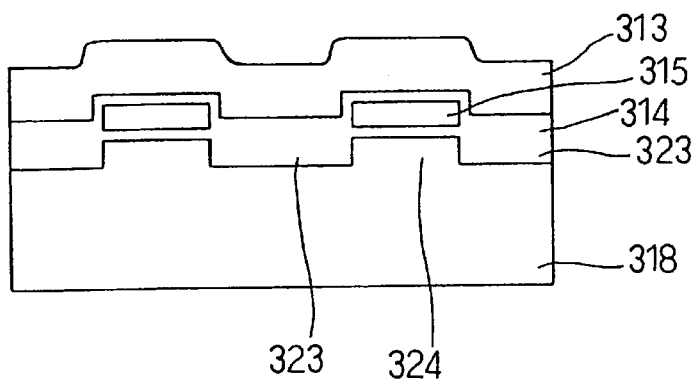
Figure 46C:
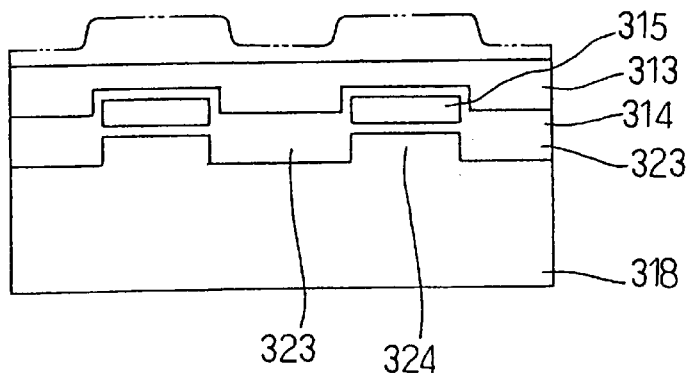

In the ion implantation step T33 which follows, as described above in the fifteenth preferred embodiment, because the degree of penetration of the ion implantation varies depending on the nature of the films constituting the pattern structure 316, a first ion implantation step and a second ion implantation step are carried out successively with the implantation energies of the ion implantations set to vary accordingly (see FIG. 39). That is, a first ion implantation is carried out with the regions of the pattern structure 316 where a polysilicon film 315 exists masked with photoresist 319, as shown in FIG. 44A, and then a second ion implantation is carried out with the regions where there is only an insulating film 314 masked with photoresist 321 as shown in FIG. 44B. By this means, an ion-implanted region 320 is formed in a single flat plane at a predetermined depth in the monocrystalline silicon substrate 318 and is used as a defective layer region for detachment in a subsequent detaching step.

Then, by going through the lamination and detachment step T34 (see FIG. 44C) and the detachment face polishing step T35, it is possible to obtain a SOI substrate 311 substantially the same as that obtained in the fifteenth preferred embodiment.

In this preferred embodiment, because the flattening step T32 is carried out before the ion implantation step T33, the heat treatment temperature of the flattening process film 313 formed in the flattening step T32 can be set to a high temperature above 500° C. and it is thereby possible to form a good quality film. Also, in the ion implantation step T33, the photolithography can be carried out with the pattern structure 316 of the monocrystalline silicon substrate 318 flattened by the flattening process film 313.

(Eighteenth Preferred Embodiment)

FIGS. 46A through 46C and FIGS. 47A through 47C show an eighteenth preferred embodiment of the invention, wherein a SOI substrate 322 of a pattern structure having a polishing stopper 323 the same as that obtained in the sixteenth preferred embodiment is manufactured. In this manufacturing process, as in the seventeenth preferred embodiment, a flattening step T32 is carried out before an ion implantation step T33.

Accordingly, in this manufacturing process, in the same way as described above, first a channel 318a is formed in the monocrystalline silicon substrate 318. Then, an oxide film 314 is formed as a stopper and a pattern structure 316 is formed by the polysilicon film 315 (see FIG. 46A). After that, a flattening process film 313 is formed (see FIG. 46B) and then flattened by polishing (see FIG. 46C).

Figure 47A:
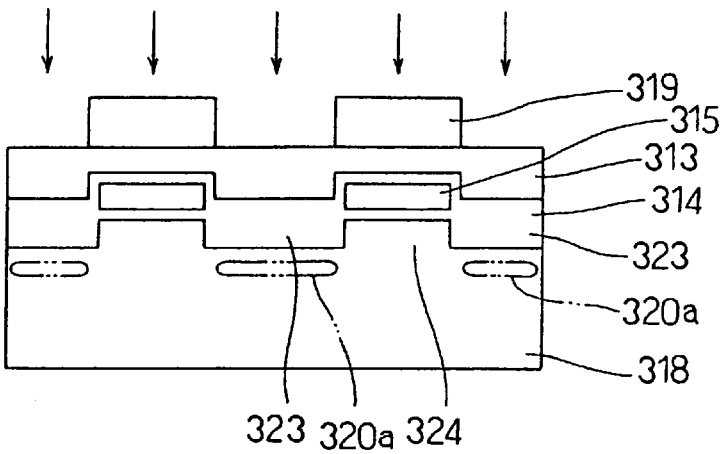
FIGS. 47A through 47C are sectional views illustrating steps continuing from FIG. 46C.
Figure 47B:
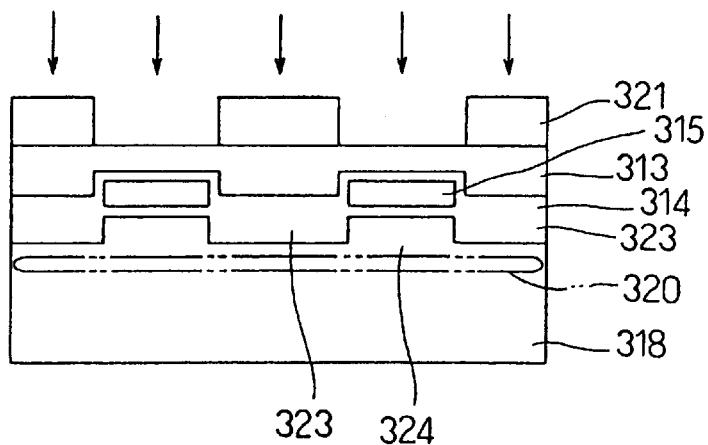
Figure 47C:
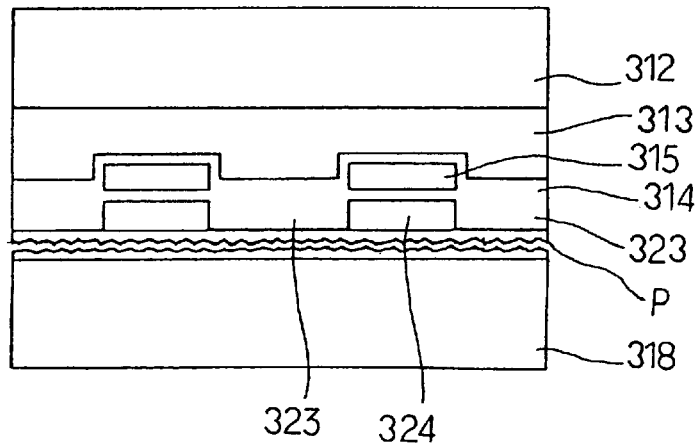
Figure 48A:
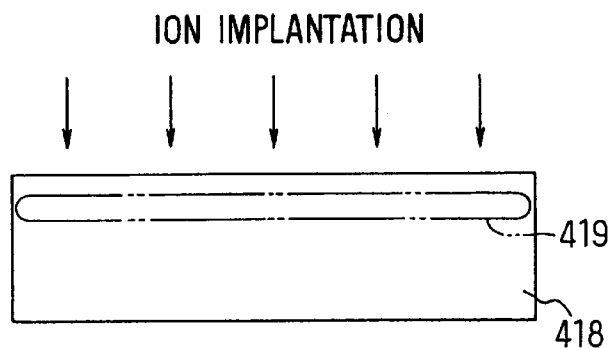
FIGS. 48A through 48C are schematic sectional views illustrating steps for manufacturing a SOI substrate according to a nineteenth preferred embodiment.
Figure 48B:
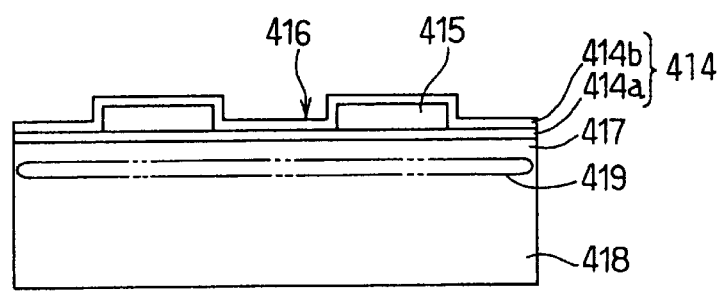
Figure 48C:
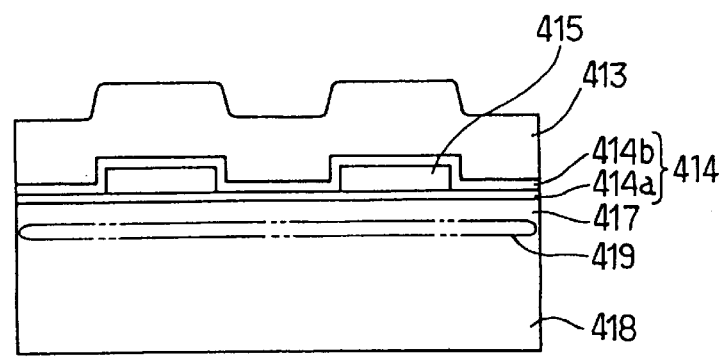
Figure 49A:
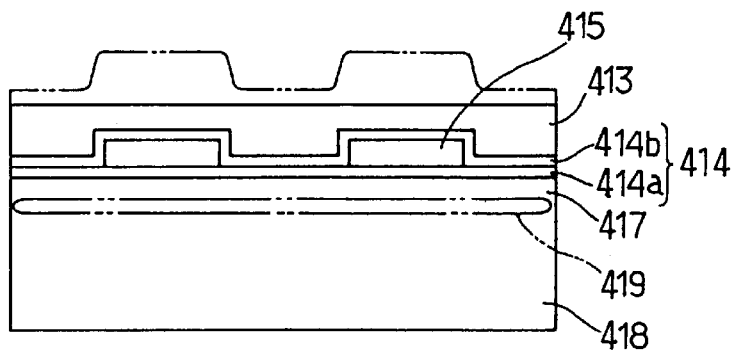
FIGS. 49A and 49B are schematic sectional views illustrating manufacturing steps continuing from FIG. 48C.
Figure 49B:
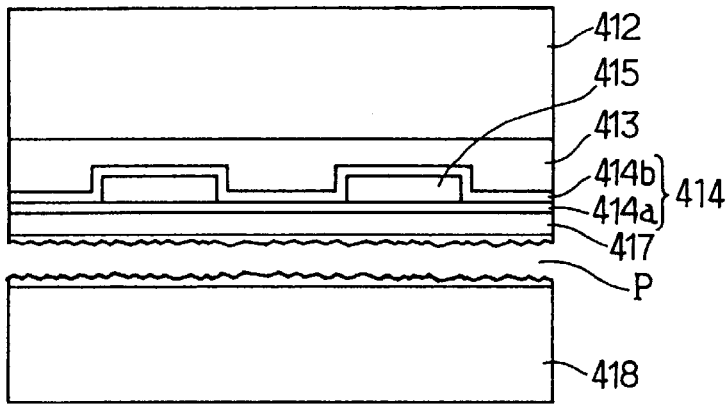

Then, in the ion implantation step T33, two ion implantation operations are carried out to form an ion-implanted region 320 (see FIGS. 47A, 47B). After that, the lamination and detachment step T34 is carried out (see FIG. 47C) and a detachment face polishing step T35 is performed to obtain a SOI substrate 322.

The aspect of the invention illustrated in the fifteenth through eighteenth preferred embodiments described above is not limited to these preferred embodiments, and for example the following modifications and extensions can be made.

As the substrate for forming a thin film semiconductor layer 318, as materials other than silicon, monocrystalline substrates of other semiconductors based on group four elements, for example Ge (germanium), SiC (silicon carbide), SiGe (silicon germanium) and the like, or diamond can be used. When a SiC substrate or the like is used, because the substrate itself is extremely expensive, the effective use of resources and cost reduction effect of polishing and reusing the substrate after its detachment is considerable.

The SOI substrates 311, 322 in the preferred embodiments described above were constructed by providing monocrystalline silicon films 317, 324 on a supporting silicon substrate 312 with an insulating film 314 therebetween. However, by employing manufacturing processes similar to those of these preferred embodiments it is also possible to make a SOI substrate so constructed that the monocrystalline silicon films 317, 324 partially make contact with the supporting silicon substrate 312. A SOI substrate formed in this way can, for example, be applied to a semiconductor device of a construction wherein a bulk (the supporting silicon substrate 312) is used to form a protecting device or the like.

Next, nineteenth through twenty-first preferred embodiments of the invention will be described. Before the description of these preferred embodiments, an aspect of the invention illustrated in them will first be briefly explained. After that, the nineteenth through twenty-first preferred embodiments will be described in detail.

It is an object of this aspect of the invention to provide a semiconductor substrate manufacturing method in which restrictions on heat treatment temperature existing when a pattern structure is to be formed by film-growing steps and etching steps and the like on a side of a substrate to be laminated to another substrate are reduced.

According to this aspect of the invention, in an ion implantation step (P41) carried out on a monocrystalline silicon substrate (418) to form a defective layer for detachment use in the monocrystalline silicon substrate (418), as the ion implantation material, ions of a high-temperature desorption material, that is, ions obtained by ionizing a material whose temperature of desorption from the monocrystalline silicon substrate (418) is a high temperature of, for example, over 600° C. are used. As a result, thereafter, even if there are processing steps involving heat treatment among steps of up to when a lamination and detachment step (P44) is carried out, compared to when hydrogen ions or the like are implanted, these processing steps can be carried out at higher temperatures. In particular, in carrying out film-forming steps and the like, by means of heat treatment at high temperatures it is possible to form films of higher quality. Also, by reducing restrictions on the manufacturing process, it is possible to raise the degree of freedom of working processes. (Although so that the implanted high-temperature desorption material does not desorb from the monocrystalline silicon substrate (418) the heat treatment temperatures at this time must of course still be set to below the desorption temperature.)

As the high-temperature desorption material, materials such as fluorine and chlorine which have high electronegativity and bond strongly with semiconductor substrate (418) materials such as silicon are used. By this means, in steps preceding the lamination and detachment step (P44) it is possible carry out heat treatment of up to about 600° C. without causing the high-temperature desorption material to desorb.

Also, in the defective layer, which had been formed over a wide region about a high-concentration layer of the high-temperature desorption material at the ion implantation step (P41) stage, as a result of this heat treatment at a temperature below the desorption temperature, the defects in the regions where the high-temperature desorption material is distributed at a low concentration cease to exist and crystallinity is recovered. The defective layer consequently concentrates at the high-concentration layer of the high-temperature desorption material.

In a pattern structure forming step (P42), a processing step of forming a pattern structure (416) having a polishing stopper (422) for detecting the completion of polishing in a detachment face polishing step P45 on the monocrystalline silicon substrate (418) is preferably included. When this is done, the detachment face polishing step P45 can be surely ended when the semiconductor layer (421) has been polished to a predetermined thickness. By this means, it is possible to form the semiconductor layer (421) accurately.

If the polishing stopper (422) is made with a material having a different polishing rate from that of the semiconductor layer (421), when the material having the different polishing rate becomes exposed at the polishing face during polishing in the detachment face polishing step P45, the amount of heat produced changes. On this basis, it is possible to detect the completion of polishing and it becomes possible to form the semiconductor layer (421) accurately. Also, if the polishing stopper (422) is made of a material such as, for example, an oxide film or a nitride film whose polishing rate is slower than the polishing rate of the substrate (418), the change in the amount of heat produced during polishing is greater and hence the completion of polishing can be detected still more reliably.

By a hydrogen diffusion process step (PA) being performed before the lamination and detachment step (P44), hydrogen plasma treatment may be carried out to diffuse hydrogen into the interior of the substrate (418). As a result, in the lamination and detachment step (P44), the temperature of the heat treatment for detachment can be set to a lower temperature than the temperature that would otherwise have been necessary to effect detachment at the high-temperature desorption material ion-implanted layer (419). Thus, in heat treatment of the intermediate steps, it is possible to carry out heat treatment at temperatures of up to about 600° C. while, in the detachment step at the final stage, the heat treatment temperature can be set low.

(Nineteenth Preferred Embodiment)

A nineteenth preferred embodiment of the invention will now be described with reference to FIGS. 48A to 48C through FIG. 51.

Figure 50:
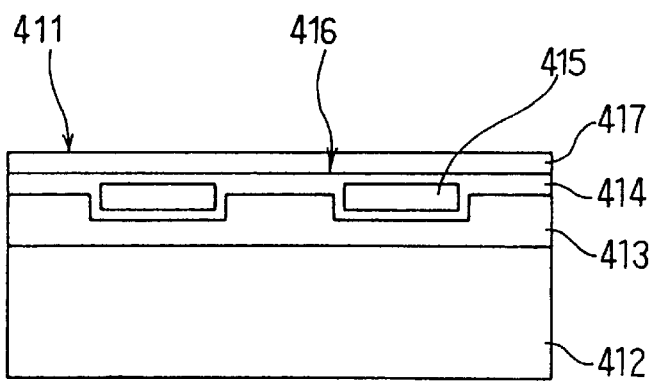
FIG. 50 is a schematic sectional view of a completed SOI substrate.
Figure 52A:
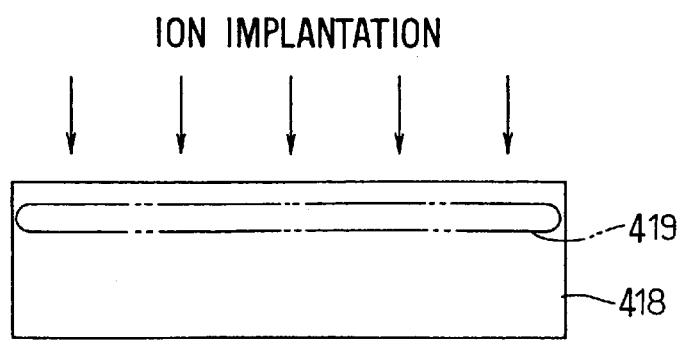
FIGS. 52A through 52C are sectional views illustrating steps for manufacturing a SOI substrate according to a twentieth preferred embodiment.
Figure 52B:
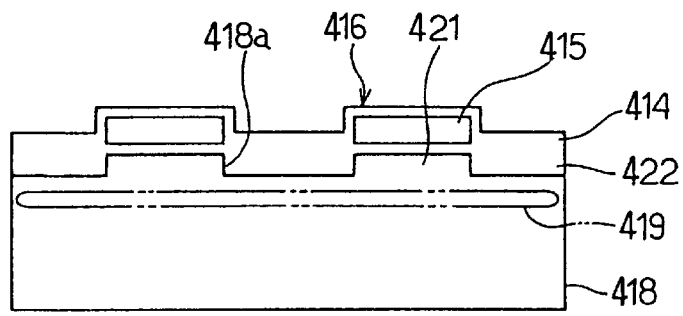
Figure 52C:
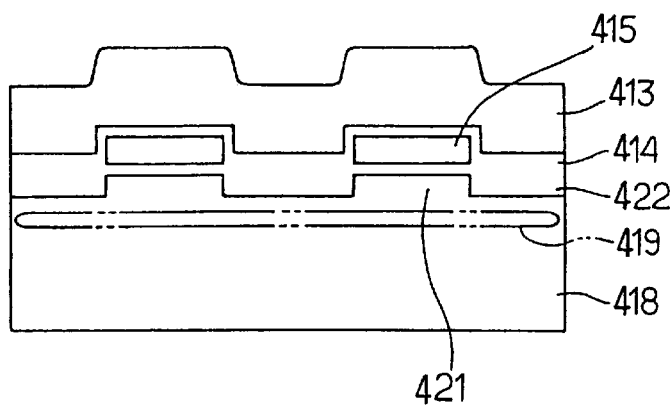

FIG. 50 is a schematic sectional view of a SOI substrate 411, a semiconductor substrate. In this SOI substrate 411, a flattening process film 413 such as a polysilicon film, an amorphous silicon film or an oxide film is formed on a supporting silicon substrate 412 for supporting a thin film semiconductor layer 417. On this is formed a pattern structure 416 comprising an insulating film 414 made of silicon oxide or the like and a polysilicon film 415 doped with an impurity such as boron. On that is further formed a silicon monocrystalline film 417 serving as a semiconductor thin film for device formation.

The SOI substrate 411 in this preferred embodiment is one which, for example when a device such as a FET has been formed in the silicon monocrystalline film 417 by device formation steps, is suitable for forming a device of a structure wherein the polysilicon film 415 formed buried in the insulating film 414 of the pattern structure 416 is used as a back gate electrode of that device. It can also be used to form various devices for other applications.

Next, a method for manufacturing a SOI substrate 411 of the above construction will be described with reference to FIGS. 48A to 48C, FIGS. 49A and 49B and FIG. 51.

FIG. 51 is a block diagram showing in outline the flow of an overall process for manufacturing the SOI substrate 411. First, in an ion implantation step P41, at least one face of a monocrystalline silicon substrate 418 to serve as a substrate for forming a semiconductor thin film (silicon monocrystalline film) 417 is polished to a mirror finish and then ions of a halogen element such as fluorine or chlorine as a high-temperature desorption material are implanted into that face (see FIG. 48A). At this time, as the energy level needed for the implantation, with, for example, fluorine (F), an acceleration of about 300 keV is necessary to drive the ions by a depth of 1 μm into the monocrystalline silicon substrate 418.

The high-temperature desorption material mentioned above is defined as a material having the property that, when it is heat treated after being driven into the monocrystalline silicon substrate 418, it first starts to undergo bond breakdown and desorption at a high temperature above, for example, 600° C. The greater the electronegativity, which is the energy of bonding with elements such as silicon constituting the material of the substrate, of a material, the higher the desorption temperature of the material.

Halogen elements such as fluorine and chlorine have high electronegativities and are representative of practically usable high-temperature desorption materials. Although carbon (C), oxygen (O) and nitrogen (N) and the like are also high-temperature desorption materials in that they have high electronegativities, because these elements combine with silicon and form carbides, oxides and nitrides, they are not suitable for practical use.

When ion implantation of a high-temperature desorption material is carried out, the high-temperature desorption material becomes distributed over a wide range in the depth direction inside the monocrystalline silicon substrate 418 about a high-concentration layer at a predetermined depth. By this means, an ion-implanted layer 419 is formed. This ion-implanted layer 419, as will be further discussed later, as a result of going through heat treatment (at heat treatment temperatures lower than the desorption temperature of the high-temperature desorption material) in steps leading to a lamination and detachment step P44, redistributes without the high-temperature desorption material desorbing and forms a defective layer for detachment in an extremely thin region.

Next, in a pattern structure forming step P42, a pattern structure 416 is formed on the surface of the monocrystalline silicon substrate 418. More particularly, the surface of the monocrystalline silicon substrate 418 is heat treated to form a thermal oxide film 414a (of film thickness, for example, 0.1 μm) to serve as an insulating film 414, polycrystalline silicon is then deposited by CVD or the like and patterned by photolithography and etching to form a polysilicon film 415 (of film thickness, for example, 0.35 μm), and an oxide film 414b (of film thickness, for example, 0.1 μm) is deposited by CVD or the like to complete the pattern structure 416.

In the heat treatment step and the CVD film deposition steps mentioned above the monocrystalline silicon substrate 418 is heated. However, the heat treatment temperature at this time is set lower than the temperature at which the high-temperature desorption material desorbs. Therefore, the high-temperature desorption material does not desorb from the silicon substrate 418 during these steps. However, in the defective layer that had been formed over a wide region about a high-concentration layer of the high-temperature desorption material at the ion implantation stage, as a result of this low-temperature heat treatment, the defects in the regions where the high-temperature desorption material is distributed at a low concentration cease to exist and crystallinity of the silicon substrate 418 is recovered. The defective layer consequently concentrates at the high-concentration layer of the high-temperature desorption material.

Next, it is necessary for the surface of the monocrystalline silicon substrate 418 having this pattern structure 416 to be flattened for its lamination to a supporting silicon substrate 412. To this end, as a flattening step P43 (see FIG. 51), by CVD using a silicon gas source or sputtering a silicon target or PVD such as heat deposition a flattening process film 413 of polycrystalline silicon or amorphous silicon or silicon oxide or the like is deposited on the surface of the monocrystalline silicon substrate 418 to a predetermined film thickness (for example 5 μm to 10 μm) (see FIG. 48C).

In this case, in the deposition of the flattening process film 413 made of polycrystalline silicon or amorphous silicon or silicon oxide or the like, it is necessary for the temperature to which the monocrystalline silicon substrate 418 is heated to be lower than the temperature at which the high-temperature desorption material desorbs, to prevent the occurrence of detachment in the ion-implanted layer 419. In this step also, the defective layer tends to concentrate in a narrow region as a result of going through the heat treatment. Then, the flattening process film 413 grown for lamination to the supporting silicon substrate 412 is polished (for example to a film thickness of 2 μm to 3 μm) to eliminate surface steps caused by the pattern structure 416 therebelow and to reduce the roughness of its surface (see FIG. 49A).

Then, in a lamination and detachment step P44, the polished face of the monocrystalline silicon substrate 418 and the supporting silicon substrate 412 are laminated together and heat treatment for bonding is carried out. Here, at least the face of the supporting silicon substrate 412 to be laminated is polished to a mirror finish. The supporting silicon substrate 412 can also be used in a state that an oxide film is formed on its lamination face.

For the lamination, for example washing with a mixed solution ($H_2SO_4$:$H_2O_2$=4:1) of sulfuric acid ($H_2SO_4$) and hydrogen peroxide water ($H_2O_2$) and washing with pure water are successively carried out. Then, the amounts of water adsorbed onto the substrate surfaces are controlled by spin drying and the lamination faces of the monocrystalline silicon substrate 418 and the supporting silicon substrate 412 are brought together. By this means, the two monocrystalline silicon substrates 418, 412 are directly bonded together by hydrogen bonding of silanol radicals formed on their surfaces and water adsorbed onto their surfaces (see FIG. 49B).

After that, the two laminated silicon substrates 418, 412 are strongly bonded together and thereby integrated by heat treatment being carried out in a nitrogen atmosphere or an oxygen atmosphere, for example, at 1100° C. for one hour to cause a dehydration and condensation reaction at the lamination face. As a result of the high-temperature heat treatment of this bonding step, the monocrystalline silicon substrate 418 splits and detaches at the defective layer P formed therein (see FIG. 49B). In this case, because the defective layer P is formed in a narrow region and furthermore to a fixed distance from the surface of the insulating film 414, the thickness of the obtained silicon monocrystalline film 417 from the surface of the insulating film 414 to the defective layer P is fixed and the film thickness is uniform.

Next, in a detachment face polishing step P45, the detachment face of the defective layer P is flattened and smoothed by polishing. In this way, a SOI substrate 411 having a semiconductor layer 417 formed to a predetermined thickness on a supporting silicon substrate 412 having a pattern structure 416 is formed.

When making a SOI substrate 411 according to this preferred embodiment, for the monocrystalline silicon substrate 418, to ensure quality of the monocrystalline silicon film 417, a product wafer whose impurity concentration has been controlled to a fixed value in the same way as one used for forming an ordinary semiconductor device is preferably used. For the supporting silicon substrate 412, on the other hand, because it only needs to perform the function of holding the monocrystalline silicon substrate 417 with the oxide film 414 therebetween, a dummy wafer whose impurity concentration has not been strictly controlled can be used.

With this nineteenth preferred embodiment, by ionizing and implanting into the monocrystalline silicon substrate 418 in the ion implantation step P41 a high-temperature desorption material, the desorption temperature thereof can be raised to about 600° C. or more. Because of this, heat treatment at high temperatures up to 600° C. becomes possible in the processing steps carried out up to the lamination and detachment step P44. As a result, there are fewer restrictions on the film-forming steps and heat treatment steps and the quality of the films formed can be increased and the degree of freedom of the manufacturing process increases.

(Twentieth Preferred Embodiment)

FIGS. 52A through 52C to FIG. 54 show a twentieth preferred embodiment of the invention, and parts of this twentieth preferred embodiment which differ from the nineteenth preferred embodiment will now be described.

Figure 54:
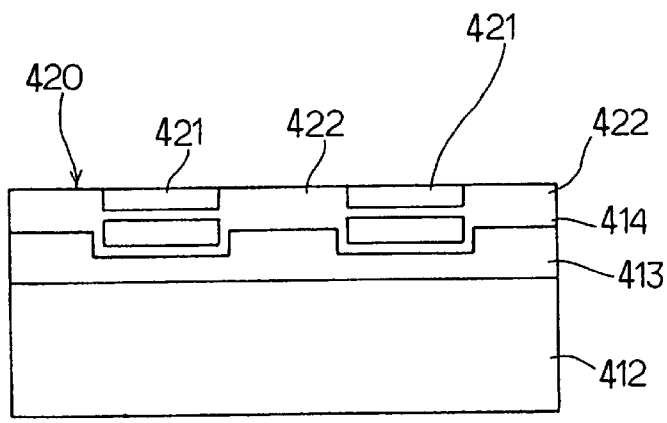
FIG. 54 is a sectional view of a completed SOI substrate.

In this preferred embodiment, as shown in FIG. 54, in a SOI semiconductor substrate 420, an insulating film 414 is formed so as to be partially exposed at the surface of a silicon monocrystalline film 421 constituting a semiconductor thin film. That is, the insulating film 414 functions as a polishing stopper 422. The silicon monocrystalline film 421 is for device formation and is formed in island form at the surface of the SOI substrate 420 in an insulated/separated state.

FIGS. 52A through 52C and FIGS. 53A through 53C are sectional views showing states corresponding to steps in a process for manufacturing this SOI substrate 420. An ion implantation step P41 is carried out in the same way as in the nineteenth preferred embodiment (see FIG. 52A). That is, a high-temperature desorption material such as fluorine or chlorine is ionized and accelerated with a predetermined energy and thereby implanted into a monocrystalline silicon substrate 418 to form an ion-implanted layer 419.

Then, in a pattern structure forming step P42 (see FIG. 52B), unlike in the nineteenth preferred embodiment, to preform a polishing stopper 422 in the monocrystalline silicon substrate 418, a channel 418a is formed by photolithography and etching. An oxide film is formed in this channel 418a to constitute a polishing stopper 422. The subsequent steps are substantially the same as in the nineteenth preferred embodiment.

Figure 53A:
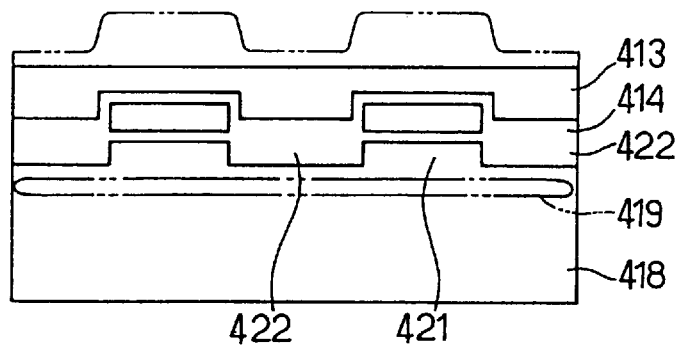
FIGS. 53A through 53C are sectional views of SOI substrate manufacturing steps continuing from FIG. 52C.
Figure 53B:
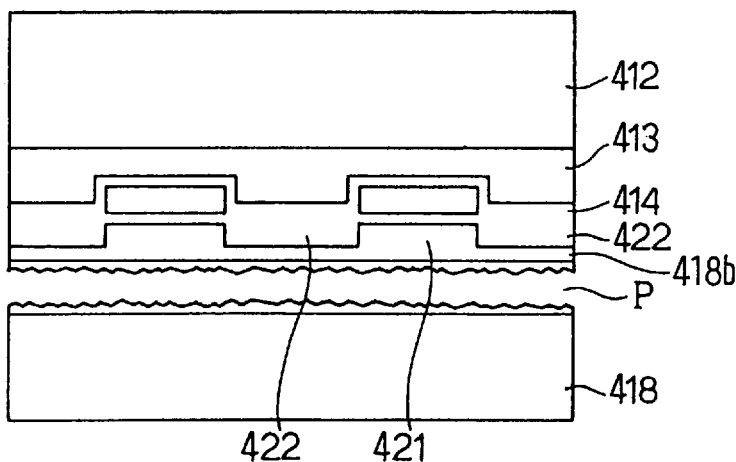
Figure 53C:
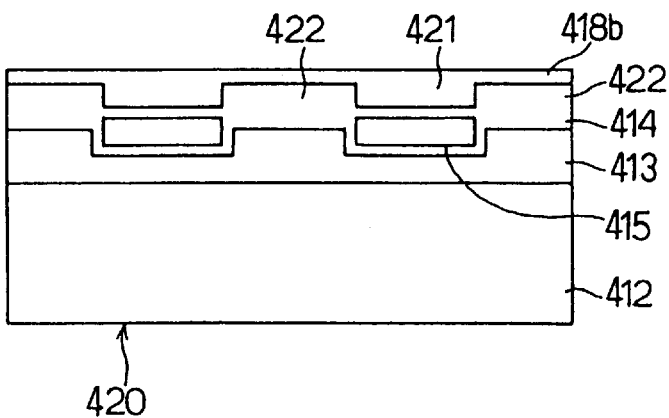

In a flattening step P43, a flattening process film 413 is formed on the surface of the monocrystalline silicon substrate 418 (see FIG. 52C) and flattened to a predetermined thickness by polishing (see FIG. 53A). Thereafter, in a lamination and detachment step P44, in the same way as that described above, the supporting silicon substrate 412 is laminated to the surface of the monocrystalline silicon substrate 418 and heat treatment is carried out to effect a detachment (see FIG. 53B).

In the state thus reached, an extremely thin silicon film 418b remains at the detachment face under which the polishing stopper 422 was formed. This silicon film 418b is removed by polishing in a detachment face polishing step P45. At this time, when the polishing reaches the point at which the silicon film 418b disappears, the surface of the polishing stopper 422 becomes exposed as the polishing face. Since the polishing rate of the polishing stopper 422, which is a silicon oxide film, is slower than that of the silicon film 418b, and the heat of friction with the polishing cloth is different between silicon and silicon oxide, there is an increase in the amount of heat produced by the polishing. By this being detected with a temperature sensor or the like as a temperature change of the polishing cloth, it is possible to detect that the polishing face has reached the surface of the polishing stopper 422, and polishing is stopped at this point.

In this way, it is possible to obtain as the semiconductor layer 421 an accurate semiconductor layer which is both thin and uniform in thickness. Also, because the silicon monocrystalline film 421 constituting a semiconductor layer is formed in the form of an insulated/separated island, if it is preformed into the necessary shape, it is possible to simplify the manufacturing process by which a device is formed thereafter.

The pattern structure 416 is preferably so formed that the polishing stopper 422 occupies 30% to 50% of the area of the polishing face.

(Twenty-first Preferred Embodiment)

Figure 55:
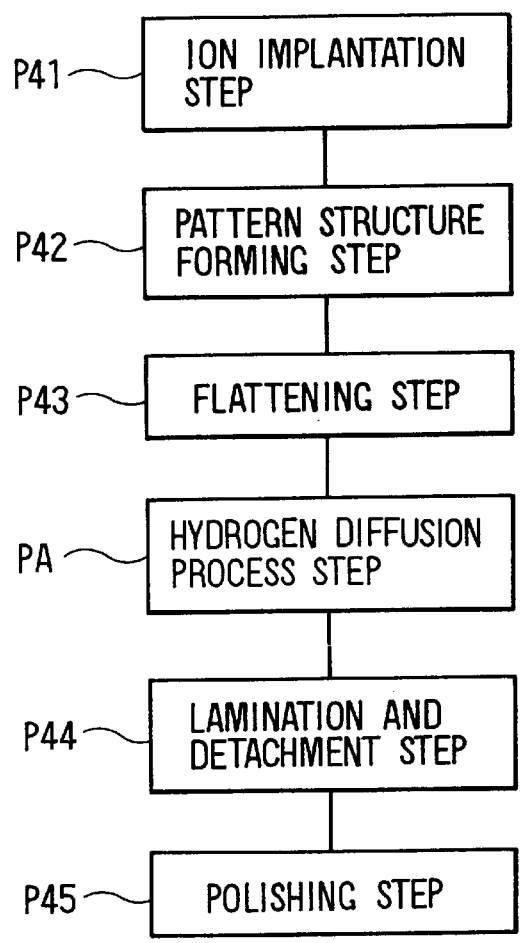
FIG. 55 is an outline process diagram of a twenty-first preferred embodiment.

FIG. 55 shows a twenty-first preferred embodiment of the invention, a characterizing feature of which is that, in addition to the manufacturing steps of the nineteenth or the twentieth preferred embodiment described above, a hydrogen diffusion process step PA is carried out before the lamination and detachment step P44.

That is, in this hydrogen diffusion process step PA (see FIG. 55), heat treatment in a hydrogen atmosphere or hydrogen plasma treatment is carried out on the monocrystalline silicon substrate 418 with the flattening process film 413 thereon to introduce hydrogen to the interior of the monocrystalline silicon substrate 418. Thereafter, by heat treatment being carried out at a temperature lower than the desorption temperature of hydrogen, hydrogen is diffused into the defective layer region of the monocrystalline silicon substrate 418. Then, by the heat treatment of the lamination and detachment step P44 being carried out, the monocrystalline silicon substrate 418 is detached at the defective layer P. At this time, as an effect of the hydrogen diffusion process step PA having been carried out, the heat treatment temperature can be set low.

With this twenty-first preferred embodiment, as a result of a hydrogen diffusion process step PA being carried out, in the heat treatment for effecting detachment in the final stage of the process, it becomes unnecessary for heat treatment at a high temperature exceeding 1000° C. to be performed. That is, while it is made possible for heat treatment to be carried out at high temperatures (of up to about 600° C.) in intermediate stages, in the final stage heat treatment can be carried out at a low temperature the same that of when the hydrogen ions were implanted.

The aspect of the invention illustrated in the nineteenth through twenty-first preferred embodiments described above is not limited to these embodiments, and for example the following modifications and extensions are possible.

The oxide film 414a formed on the monocrystalline silicon substrate 418 can also be formed before the ion implantation step P41 is carried out. In this case, the ion implantation is carried out through the oxide film 414a, but in process terms either method can be employed as necessary.

In the lamination and detachment step P44, the heat treatment for detachment was set to about 1100° C., but as this heat treatment for detachment other temperatures above 1000° C. and preferably in the range of 1100° C. to 1300° C. can be applied.

Next, twenty-second through twenty-seventh preferred embodiments of the invention will be described. Before the description of these preferred embodiments, an aspect of the invention illustrated in them will first be briefly explained. After that, the twenty-second through twenty-seventh preferred embodiments will be described in detail.

A first object of this aspect of the invention is to provide a semiconductor substrate manufacturing method which, even when it is necessary for a pattern structure to be formed on a substrate for forming a thin film semiconductor layer by film-forming steps and etching steps and the like at high temperatures, makes it possible to form a semiconductor substrate such as a SOI substrate by detaching the substrate for a thin film semiconductor layer leaving a thin film of a required film thickness on all or a part of the pattern structure and bonding it to a supporting substrate.

A second object of this aspect of the invention is to provide a semiconductor substrate manufacturing method with which it is possible to form a semiconductor substrate such as a SOI substrate having a thick semiconductor layer without suffering restrictions on the formation conditions of the semiconductor layer which is detached from the substrate for forming a semiconductor layer at a defective layer formed by ion implantation being carried out.

According to this aspect of the invention, as a substrate (515, 524, 532, 536) for forming a semiconductor layer (514, 523, 527, 531, 535, 538), one inside which is provided an oxygen segregation layer (516, 525, 533) is used. In a laminating step (P54, T53), the substrate for a semiconductor layer is laminated to a supporting substrate (512, 518) and heat treatment is carried out to detach the substrate for a semiconductor layer at a defective layer part formed by the oxygen segregation layer. This detachment face is polished to produce a semiconductor substrate (511, 517, 526, 530, 534, 537).

At this time, oxygen has been introduced into the substrate for a semiconductor layer so that an oxygen segregation layer is formed. By carrying out the heat treatment at a high temperature, it is possible to form a defective layer wherein oxide precipitants and lamination defects and dislocations and the like arising due to them have segregated and thereby effect detachment. Therefore, as long as it is at a temperature lower than the temperature at which the defective layer is formed and detachment occurs, processing steps involving heat treatment can be carried out in intermediate steps. In other words, processing steps can be carried out after oxygen is introduced.

Also, because oxygen is introduced into the substrate for a semiconductor layer, by means of the oxygen segregation layer it is possible to obtain an action of gettering heavy metal impurities included in the substrate for a semiconductor layer. As a result, the concentration of heavy metal impurities in the semiconductor layer is lowered in the course of heat treatment and thereby a good quality semiconductor layer can be formed.

It is possible to form an oxygen segregation layer by implanting oxygen ions into the substrate for a semiconductor layer. In this case, it becomes possible for the depth at which the oxygen segregation layer is formed to be controlled by setting of the acceleration energy at the time of the ion implantation. Also, if other processing steps are carried out after an oxygen segregation layer is formed as described above, that is, if the ion implantation (P1) is carried out on the substrate having a flat surface before those processing steps, the oxygen segregation layer can be provided in a flat state without creating steps in its depth inside the substrate for a semiconductor layer. The remainder of the substrate for a semiconductor layer after detachment can be used again as a substrate for a semiconductor layer.

The oxygen segregation layer (533) can also be formed by heat treatment using a silicon substrate having a high initial oxygen concentration as the substrate for a semiconductor layer (532, 536). In this case, without it being necessary to carry out an ion implantation or the like, by going through ordinary processing steps and performing a heat treatment for detachment at a final stage it is possible to obtain a semiconductor layer (531, 535, 538) while utilizing the gettering action of the oxygen segregation layer (533).

By using a silicon substrate whose initial oxygen concentration is high of this kind, the oxygen segregation layer is formed in an interior region 10 $\mu$m to several tens of micrometers from the surface of the substrate for a semiconductor layer. Therefore, by detaching the substrate for a semiconductor layer at this part it is possible to form a thick semiconductor layer of 10 $\mu$m to several tens of micrometers in thickness on the supporting substrate (512, 518). By this means, it is possible simply and cheaply to obtain a semiconductor layer (530, 534, 537) suitable for making devices such as power devices and microactuators requiring a thick semiconductor layer without needing a high-energy ion implantation step.

When an oxygen segregation layer (525, 533) is provided inside the substrate for a semiconductor layer (524, 536), the heat treatment for effecting detachment can be raised.

Consequently, when forming a pattern structure (522, 529) having steps in its surface or a pattern structure (522, 529) wherein regions having different film qualities are provided selectively, it is possible to make the film-forming temperatures relatively high.

When a pattern structure has been formed, a flattening step (P53, T52) of forming a flattening process film (519) consisting of a polysilicon film, an amorphous silicon film or an oxide film or the like on the surface of the substrate for a semiconductor layer and polishing the surface of this flattening process film is preferably carried out. In this way it is possible to eliminate steps arising as a result of the pattern structure being formed and facilitate the lamination of a supporting substrate (512, 518) to the substrate for a semiconductor layer.

In the pattern structure forming step (P52, T51), a pattern structure (522, 529) having a polishing stopper (528) for detecting the completion of polishing in the detachment face polishing step (P56, T55) may be formed on the substrate for a semiconductor layer (524, 536). In this way, it is possible to surely end the detachment face polishing step when the semiconductor layer (527, 538) has been polished to a predetermined thickness.

The polishing stopper is preferably made of a material whose polishing rate is different from that of the semiconductor layer (527, 538). When this is done, because the amount of heat produced changes in the polishing of the detachment face polishing step, the completion of polishing can be detected on the basis thereof. In particular, if the polishing stopper is made of a material whose polishing rate is slower than that of the semiconductor layer, for example an oxide film or a nitride film or the like, the completion of polishing can be surely detected as an increase in the amount of heat produced during polishing.

(Twenty-second Preferred Embodiment)

A twenty-second preferred embodiment of the invention will now be described with reference to FIGS. 56A through 56D.

Figure 56A:
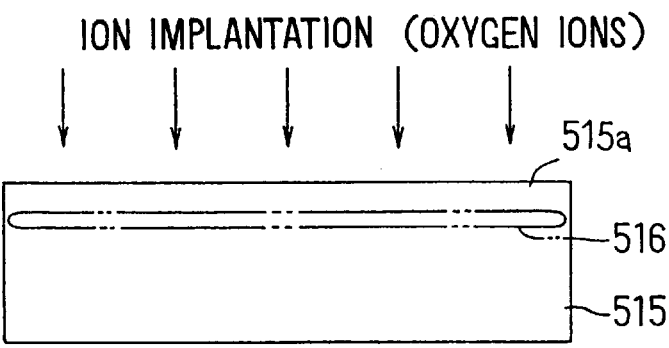
FIGS. 56A through 56D are schematic sectional views illustrating a manufacturing process of a SOI substrate according to a twenty-second preferred embodiment.
Figure 56B:
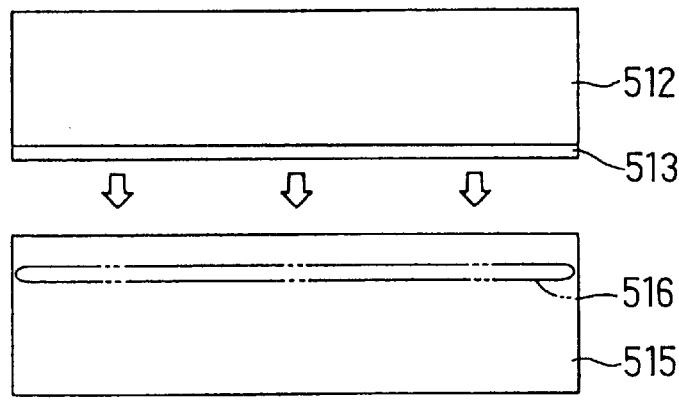
Figure 56C:
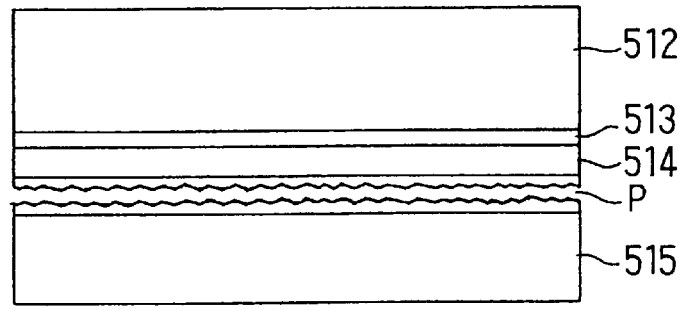
Figure 56D:
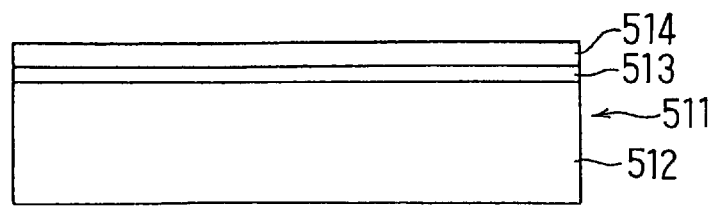

FIGS. 56A through 56D illustrate a basic manufacturing process for manufacturing a SOI substrate 511, which is a semiconductor substrate, according to the invention. As shown in FIG. 56D, the SOI substrate 511 has a construction wherein a monocrystalline silicon film 514 constituting a semiconductor layer is disposed on a base silicon substrate 512 serving as a supporting substrate with an oxide film 513 serving as an insulating film therebetween. This monocrystalline silicon film 514 does not have a pattern structure, and is formed as a film having a uniform thickness.

That is, first, in an ion implantation step, oxygen ions are accelerated with a predetermined energy and implanted into a monocrystalline silicon substrate 515 constituting a substrate for a semiconductor layer. By this means, an oxygen segregation layer 516 is formed at a predetermined depth from the surface of the monocrystalline silicon substrate 515 (see FIG. 56A). Also, a layer 515a on the surface side of the oxygen segregation layer 516 is to be formed as a monocrystalline silicon film 514 by going through a later step.

Next, in a lamination step, lamination of a base silicon substrate 512 to the monocrystalline silicon substrate 515 is carried out. In this case, an oxide film 513 is formed in advance on the surface of the base silicon substrate 512 to be laminated. In this lamination, lamination heat treatment is carried out at a low temperature of, for example, 600° C.

After that, in a detaching step, the silicon substrate 512 and the monosilicon substrate 515 thus laminated together are heat treated for a long period at a high temperature of, for example, 1000° C. to 1100° C. By this means, in the oxygen segregation layer 516, precipitants of silicon oxide and lamination defects and dislocations due to them form a segregated defective layer.

Then, the monocrystalline silicon substrate 515 is detached at the defective layer part and, on the silicon supporting substrate 512 side, the surface layer part 515a of the monocrystalline silicon substrate 515 remains as a monocrystalline silicon film 514. In this case, because the defective layer formed by the oxygen segregation layer 516 is formed uniformly at a predetermined depth in the monocrystalline silicon substrate 515 and furthermore is formed in an extremely thin region, the monocrystalline silicon film 514 remaining after the detachment is formed with a uniform thickness and flat surface.

In the heat treatment of the above-mentioned detaching step, the defective layer caused by silicon oxide precipitants also has the action of gettering heavy metal impurities. Consequently, the heavy metal impurity concentration of the monocrystalline silicon film 514 formed by the monocrystalline silicon substrate 515 being detached at the defective layer is lowered and a good quality monocrystalline silicon film 514 can be formed.

In a detachment face polishing step which follows, small irregularities remaining in the detachment face P obtained in the detaching step described above are made flat and smooth by polishing. In this way a monocrystalline silicon film 514 on an oxide film 513 on a base silicon substrate 512 is formed with a uniform thickness and with a lowered heavy metal impurity concentration.

With this twenty-second preferred embodiment, because the defective layer for detachment is formed by implanting oxygen ions, when other processing steps are carried out before the detaching step, heat treatment in these steps can be carried out at a higher temperature than when the defective layer is formed by implanting ions of hydrogen or the like.

(Twenty-third Preferred Embodiment)

FIG. 57 through FIGS. 60A and 60B show a twenty-third preferred embodiment of the invention. In this preferred embodiment, a SOI substrate 517 constituting a semiconductor substrate is formed by means of a manufacturing method consisting of the manufacturing method of the twenty-second preferred embodiment as a base with a pattern forming step P52 and a flattening step P53 added.

Figure 57:
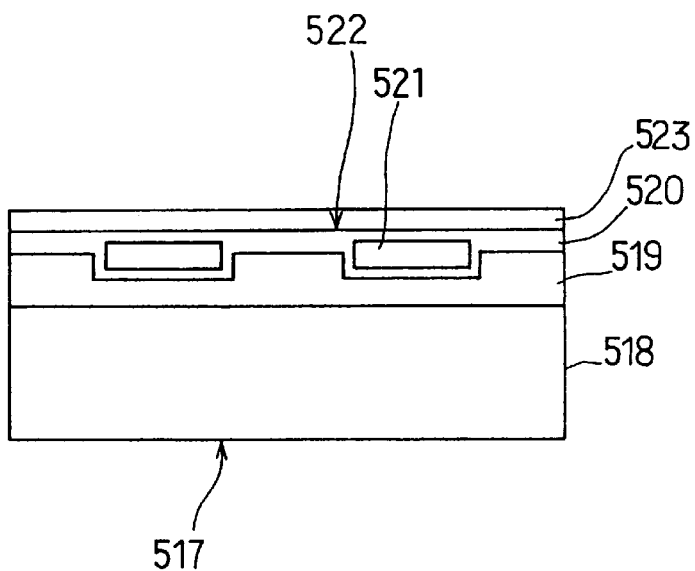
FIG. 57 is a schematic sectional view of a SOI substrate illustrating a twenty-third preferred embodiment.

FIG. 57 is a schematic sectional view of the overall construction of the SOI substrate 517. Referring to FIG. 57, a flattening process film 519 consisting of a polycrystalline silicon film, an amorphous silicon film or a silicon oxide film is formed on a base silicon substrate 518 serving as a supporting substrate. On this is formed a pattern structure 522 made up of an insulating film 520 of silicon oxide or the like and a polycrystalline silicon film 521. Also, a monocrystalline silicon film 523 serving as a semiconductor layer for device formation is formed on that.

The SOI substrate 517 in this preferred embodiment is one which, for example when a device such as a FET has been formed in the silicon monocrystalline film 523 by device formation steps, is suitable for forming a device of a structure wherein the polysilicon film 521 formed buried in the insulating film 520 of the pattern structure 522 is used as a back gate electrode of that device. It can also be used to form various devices for other applications.

Next, a method for manufacturing a SOI substrate 517 of the above construction will be described with reference to FIG. 58 through FIGS. 60A and 60B.

Figure 58:
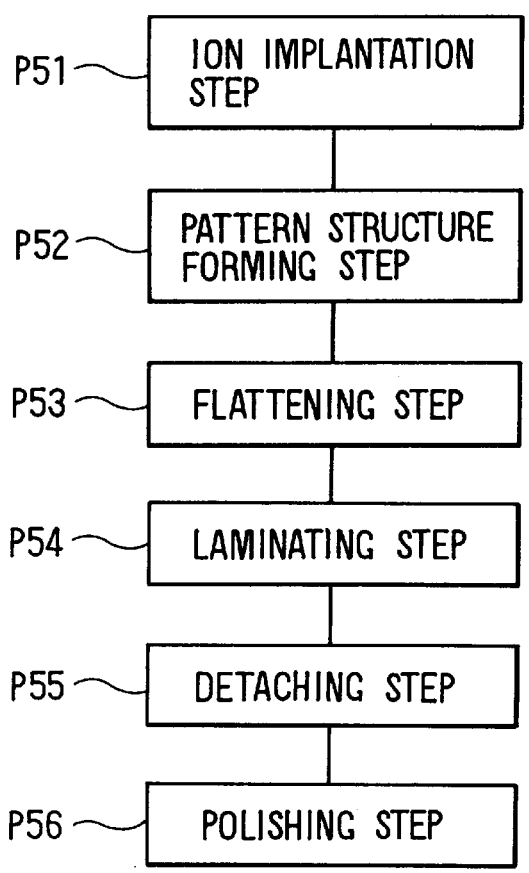
FIG. 58 is an outline process diagram of a manufacturing process of the twenty-third preferred embodiment.
Figure 59A:
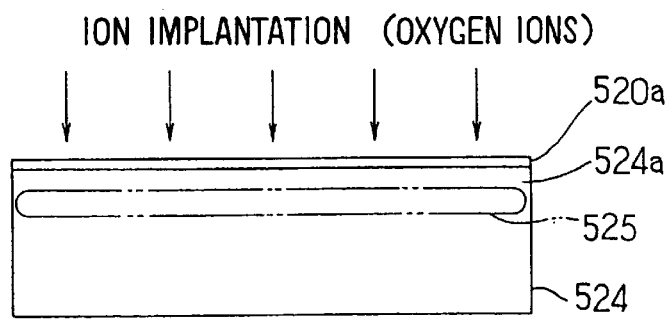
FIGS. 59A through 59C are schematic sectional views illustrating the manufacturing steps according to the twenty-third preferred embodiment.
Figure 59B:
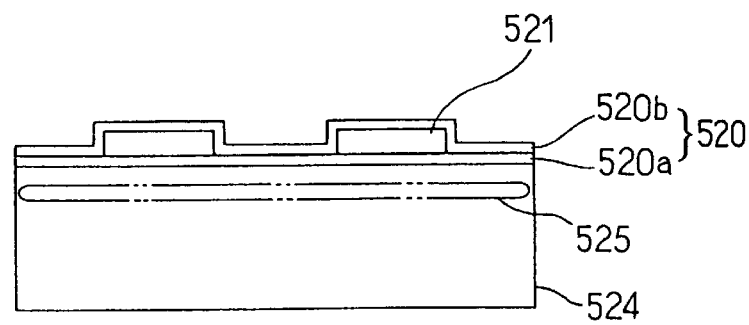
Figure 59C:
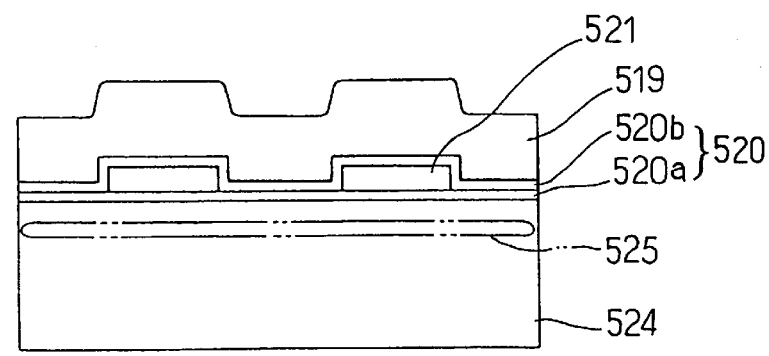
Figure 60A:
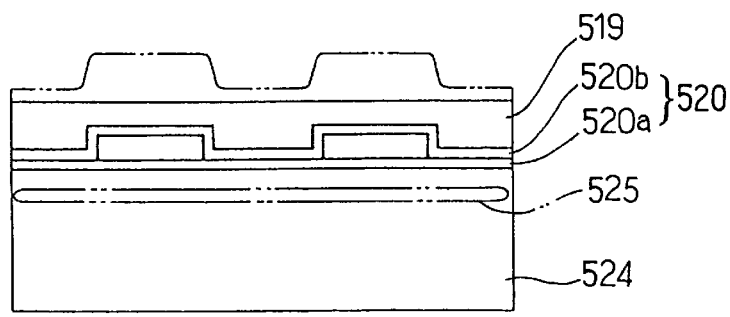
FIGS. 60A through 60B are schematic sectional views illustrating the manufacturing steps continuing from FIG. 59C.
Figure 60B:
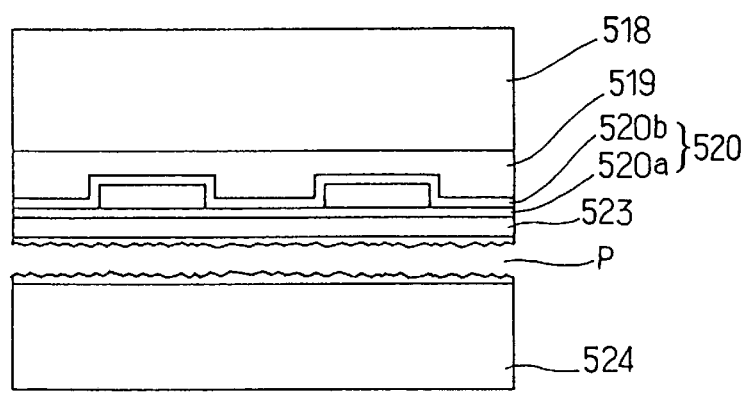

FIG. 58 is a block diagram showing in outline the overall flow of a process for manufacturing the SOI substrate 517. Specifically, processing steps are carried out in the order of an ion implantation step P51, a pattern structure forming step P52, a flattening step P53, a laminating step P54, a detaching step P55 and a detachment face polishing step P56.

First, in the ion implantation step P51, an oxide film 520a to serve as an insulating film is formed by, for example, thermal oxidation to a uniform film thickness (of, for example, 0.1 μm) on the surface of a monocrystalline silicon substrate 524 serving as a substrate for a semiconductor layer (a monocrystalline silicon film 523). From this state, oxygen ions are accelerated with a predetermined energy and implanted in a predetermined dose into the surface of the substrate. By this means, an oxygen segregation layer 525 is formed at a predetermined depth in the monocrystalline silicon substrate 524 (see FIG. 59A).

Then, in the pattern structure forming step P52, a pattern structure 522 is formed on the face of the monocrystalline silicon substrate 524 on the side from which the ion implantation was carried out. First, polycrystalline silicon is deposited on the oxide film 520a by a method such as CVD and patterned by photolithography and etching or the like to form a polysilicon film 521 (of film thickness, for example, 0.35 μm). Then, an oxide film 520b (of film thickness, for example, 0.1 μm) is deposited by CVD or the like to complete a pattern structure 522 (see FIG. 59B).

In the above-mentioned thermal oxidation step and CVD film deposition steps, the monocrystalline silicon substrate 524 is heat treated. However, at this time the heat treatment temperature is set lower than the temperature at which detachment occurs in the oxygen segregation layer 525 part implanted with ions. Consequently, detachment does not occur; however, as result of this low-temperature heat treatment, the oxygen segregation layer 525, which had been formed over a wide region at the ion implantation stage, so changes that in its low-concentration regions defects cease to exist and crystallinity is recovered and in its high-concentration regions the defective layer concentrates.

Next, the monocrystalline silicon substrate 524 having this pattern structure 522 must have its surface flattened for lamination to the base silicon substrate 518. To this end, as the flattening step P53, a flattening process film 519 of polycrystalline silicon or amorphous silicon or silicon oxide or the like is deposited to a predetermined film thickness (for example about 5 μm to 10 μm) on the surface of the monocrystalline silicon substrate 524 by CVD using a silicon gas source or sputtering a silicon target or a PVD method such as heated vapor deposition (see FIG. 59C).

To prevent the occurrence of detachment at the oxygen segregation layer 525, the deposition of the flattening process film 519 of polysilicon or amorphous silicon or silicon oxide or the like must be carried out with the monocrystalline silicon substrate 524 at a low temperature below 600° C. In this step also, as a result of going through heat treatment, the defective layer concentrates into a still narrower region. Next, the flattening process film 519 formed for laminating to the base silicon substrate 518 is polished (for example to a film thickness of 2 μm to 3 μm) to eliminate surface steps caused by the pattern structure 522 therebelow and to improve the surface roughness of its surface (see FIG. 60A).

Next, in the laminating step P54, the polished surface of the monocrystalline silicon substrate 524 and the base silicon substrate 518 are laminated together and then heat treatment for bonding is carried out. Here, at least the lamination face of the base silicon substrate 518 is polished to a mirror finish. An oxide film may also be formed on the lamination face of the base silicon substrate 518.

For the lamination, for example washing with a mixed solution ($H_2SO_4$:$H_2SO_2$=4:1) of sulfuric acid ($H_2O_4$) and hydrogen peroxide water ($H_2O_2$) and washing with pure water are successively carried out and then the amounts of water adsorbed onto the substrate surfaces are controlled by spin drying and the lamination faces of the monocrystalline silicon substrate 524 and base silicon substrate 518 are brought together. By this means, the two silicon substrates 524, 518 are directly bonded together by hydrogen bonding of silanol radicals formed on their surfaces and water adsorbed onto their surfaces.

After that, the two silicon substrates 524, 518 thus laminated together are directly bonded together and thereby integrated by heat treatment being carried out on them in a nitrogen atmosphere or an oxygen atmosphere, for example, at 1100° C. for one hour to cause a dehydration and condensation reaction at the lamination face. In the high-temperature heat treatment of this bonding step, the heavy metal impurities included in the monocrystalline silicon substrate 524 are gettered by the oxygen segregation layer 525 and also the monocrystalline silicon substrate 524 splits at the defective layer part formed by the oxygen segregation layer 525 and detaches (see FIG. 60B).

In this case, because the detachment face P has been formed in a narrow region and furthermore a fixed distance from the lamination face, the thickness of the monocrystalline silicon film 523 between the surface of the oxide film 520 and the face of the detachment face P is fixed and the film is uniform, and also, because of the above-mentioned gettering effect, it is possible to obtain a good quality thin film having a low concentration of heavy metal impurities.

Next, in the detachment face polishing step P56, the face of the defective layer P is flattened and smoothed by polishing. In this way, a SOI substrate 517 having a semiconductor layer 523 formed to a predetermined thickness on a base silicon substrate 518 having a pattern structure 522 is formed.

When making a SOI substrate 517 according to this preferred embodiment, for the monocrystalline silicon substrate 524, to ensure quality of the monocrystalline silicon film 523, a product wafer whose impurity concentration has been controlled to a fixed value in the same way as one used for forming an ordinary semiconductor device is preferably used. For the base silicon substrate 518, on the other hand, because it only needs to perform the function of holding the monocrystalline silicon film 523 with the oxide film 520 therebetween, a dummy wafer whose impurity concentration has not been strictly controlled can be used.

(Twenty-fourth Preferred Embodiment)

FIG. 61 through FIGS. 63A to 63C show a twenty-fourth preferred embodiment of the invention, and parts of this preferred embodiment which differ from the twenty-third preferred embodiment will now be described.

Figure 61:
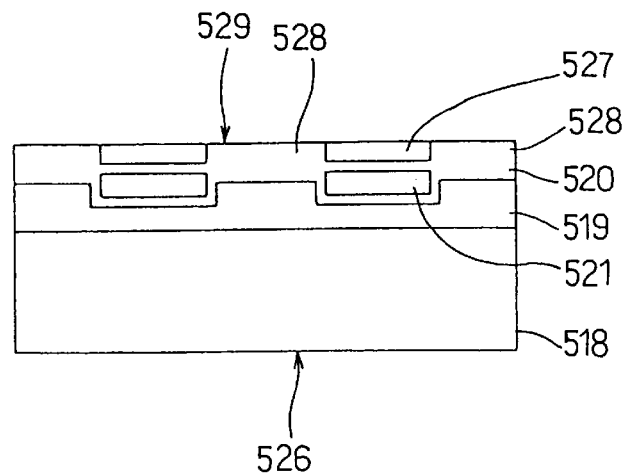
FIG. 61 is a schematic sectional view of a SOI substrate illustrating a twenty-fourth preferred embodiment.
Figure 62A:
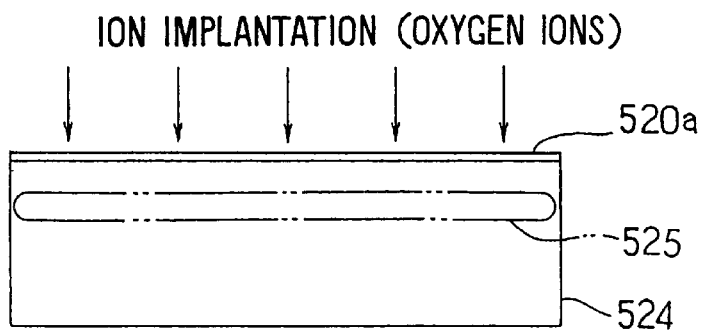
FIGS. 62A through 62C are schematic sectional views illustrating manufacturing steps of the twenty-fourth preferred embodiment.
Figure 62B:
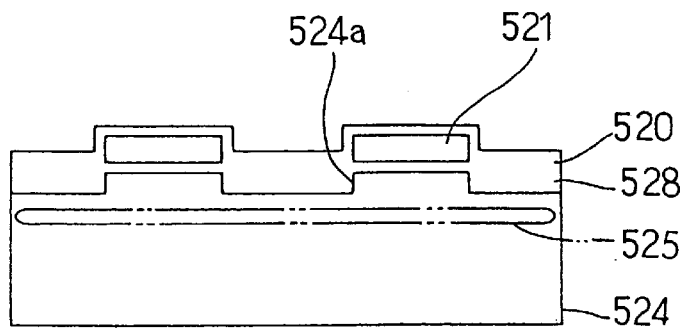
Figure 62C:
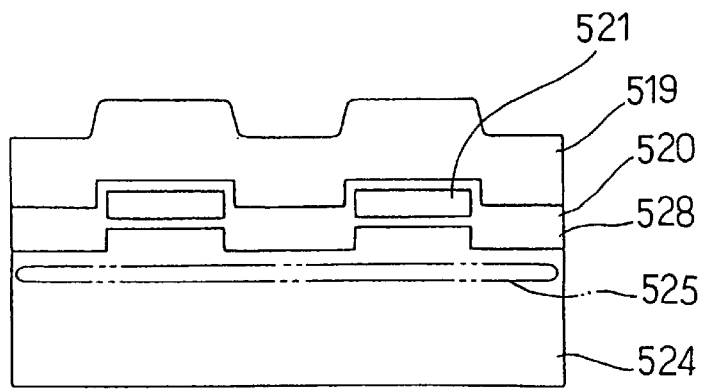

In this preferred embodiment, as shown in FIG. 61, an oxide film 520 serving as an insulating film is formed on a SOI substrate 526 constituting a semiconductor substrate so that it is partially exposed at the face of a monocrystalline silicon film 527 serving as a semiconductor layer. As a result, the oxide film 520 functions as a polishing stopper 528. As a pattern structure 529, a polysilicon film 521 formed buried as a pattern member is formed on the base silicon substrate 518 with the oxide film 520 therebetween, and a monocrystalline silicon film 527 for device formation is formed on that in the shape of an island. The monocrystalline silicon film 527 is in such a state that it is insulated and separated by the polishing stopper 528.

FIGS. 62A to 62C and FIGS. 63A to 63C are sectional views showing states corresponding to steps in a process for manufacturing the SOI substrate 526. An ion implantation step P51 is carried out in the same way as in the twenty-second preferred embodiment. That is, with an oxide film 520a formed on a monocrystalline silicon substrate 524, oxygen ions are accelerated with a predetermined energy and implanted into the substrate to form an oxygen segregation layer 525 at a predetermined depth (see FIG. 62A).

Then, in a pattern structure forming step P52, unlike in the twenty-second preferred embodiment, a channel 524a is formed on a monocrystalline silicon substrate 524 by photolithography and dry etching or the like for use in the formation of a polishing stopper 528. An oxide film as a polishing stopper 528 is then formed in this channel 524a (see FIG. 62B). The rest of the process is substantially the same as in the twenty-second preferred embodiment.

Figure 63A:
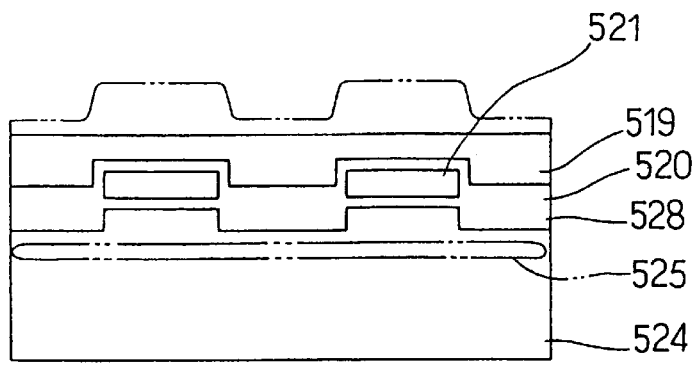
FIGS. 63A through 63C are schematic sectional views illustrating manufacturing steps continuing from FIG. 62C.
Figure 63B:
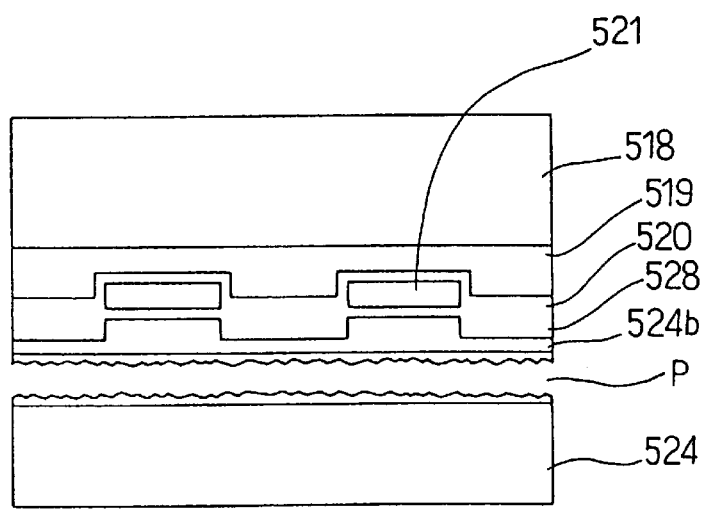
Figure 63C:
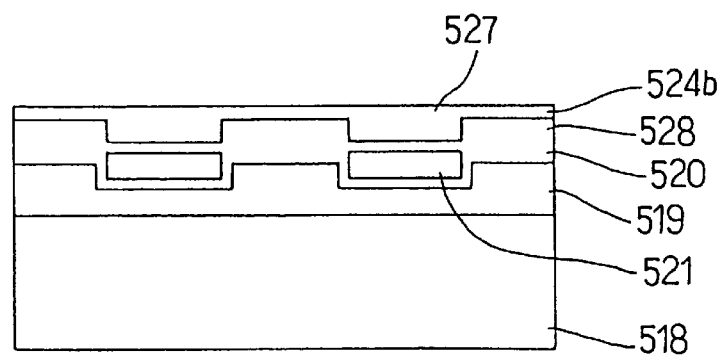

In a flattening step P53, a flattening process film 519 is formed on the surface (see FIG. 62C), and flattened by polishing to a predetermined depth (see FIG. 63A). In a laminating step P54 and a detaching step P55, in the same way as that described above the supporting substrate 518 is laminated to the surface of the monocrystalline silicon substrate 524 and then detached by heat treatment (see FIG. 63B).

In this state an extremely thin silicon film 524b remains on the part of the detachment face under which the polishing stopper 528 is formed. This is removed in the detaching step P55 by polishing. At this time, when polishing has proceeded to the point at which the silicon film 524b ceases to exist, the surface of the polishing stopper 528 becomes exposed as the polishing face. Since the polishing stopper 528, which is a silicon oxide film, has a slower polishing rate than the silicon film 524b, there is an increase in the amount of heat produced by the polishing. By this being detected by means of a temperature sensor or the like, it is detected that the polishing face has reached the surface of the polishing stopper 528 and the polishing process is stopped at this point.

In this way, it is possible to obtain as a semiconductor layer an accurate monocrystalline silicon film 527 which is thin and of a uniform thickness. Also, because the monocrystalline silicon film 527 to become the semiconductor layer obtained is formed directly in the shape of an insulated and separated island, it does not have to be preformed into the necessary shape. Thus, it is possible to simplify the manufacturing process by which a device is formed thereafter.

The pattern structure 529 is preferably so formed that the polishing stopper 528 occupies 30% to 50% of the area of the polishing face.

(Twenty-fifth Preferred Embodiment)

FIGS. 64A through 64D show a twenty-fifth preferred embodiment of the invention. Parts of this preferred embodiment which differ from the twenty-second preferred embodiment will now be described. In this twenty-fifth preferred embodiment, a SOI substrate 530 constituting a semiconductor substrate to be formed is one wherein a monocrystalline silicon film 531 constituting a semiconductor layer for device formation is obtained as a thick film of, for example, over 10 μm of the kind referred to in the second object of the present aspect of the invention mentioned above. Therefore, it is suitable, for example, for making power devices or devices such as microactuators.

Figure 64A:
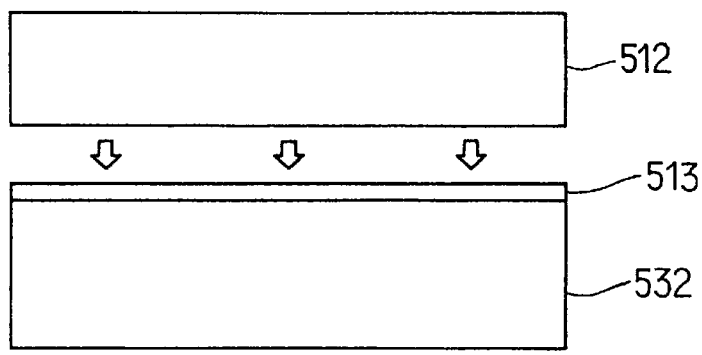
FIGS. 64A through 64D are views illustrating manufacturing steps of a twenty-fifth preferred embodiment.
Figure 64B:
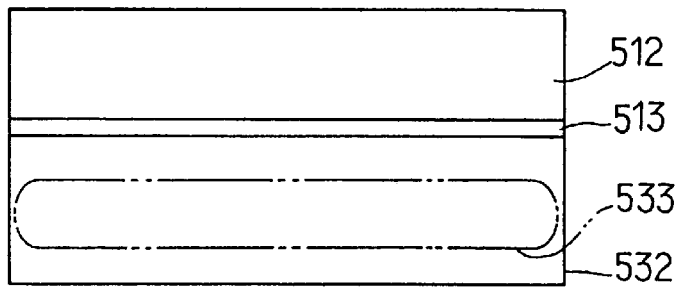
Figure 64C:
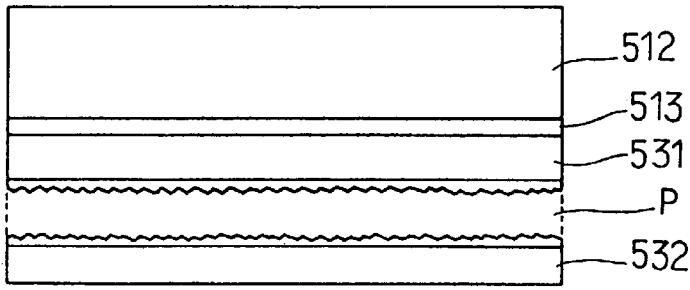
Figure 64D:
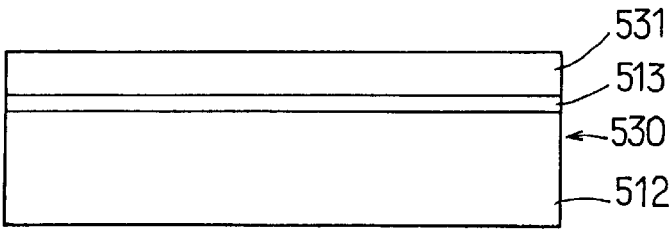

FIG. 64D shows the outline construction of a SOI substrate 530, a semiconductor substrate. A monocrystalline silicon film 531 to serve as a semiconductor layer is disposed on a base silicon substrate 512 serving as a supporting substrate with an oxide film 513 serving as an insulating film therebetween. This monocrystalline silicon film 531 is formed to a thickness of 10 μm to several tens of micrometers, as will be further discussed below.

A process for manufacturing this SOI substrate 530 will be briefly described. First, a monocrystalline silicon substrate 532, is manufactured by CZ (czochralski) method or the like and is a silicon substrate having a high initial concentration of oxygen included inside it. With an oxide film 513 formed on the surface of the monocrystalline silicon substrate 532, in a lamination step, a base silicon substrate 512 serving as a supporting substrate is laminated to the monocrystalline silicon substrate 532 (see FIG. 64A).

Then, a high-temperature, long-duration heat treatment is carried out (see FIG. 64B). In this way, a defective layer 533 constituting an oxygen segregation layer wherein silicon oxide precipitants and lamination defects and dislocations due to them have segregated is formed. At this defective layer 533, the monocrystalline silicon substrate 532 is detached. As a result, a monocrystalline silicon film 531 is formed on the base silicon substrate 512 with the oxide film 513 therebetween (see FIG. 64C). After that, in a detachment face polishing step the detachment face P is polished and steps in the detachment face are flattened and a SOI substrate 530 is thereby obtained (see FIG. 64D).

In the case described above, the defective layer 533 is formed inside the monocrystalline silicon substrate 532 at a depth of several tens of micrometers from the surface over its entire extent. As a result of the detachment of the monocrystalline silicon substrate 532 being carried out at this defective layer 533 part, it becomes possible to form a monocrystalline silicon film 531 remaining on the base silicon substrate 512 side having a film thickness of several tens of micrometers. Therefore, compared to a case wherein the defective layer 533 is formed by ion implantation, fundamentally it is possible to form a thicker film. Also, because in a defective layer 533 created by silicon oxide precipitants, there is an action of gettering heavy metal impurities, the heavy metal impurity concentration of the part obtained as the monocrystalline silicon film 531 is lowered and it is possible to obtain a semiconductor layer of good quality.

(Twenty-sixth Preferred Embodiment)

FIG. 65 through FIGS. 68A, 68B show a twenty-sixth preferred embodiment of the invention. Here, parts of this preferred embodiment which differ from the twenty-fifth preferred embodiment will be described. In this preferred embodiment, a SOI substrate 534 of a construction having the structure in the twenty-third preferred embodiment, i.e. a pattern structure, is obtained by applying a manufacturing method according to the twenty-fifth preferred embodiment. Accordingly, a monocrystalline silicon film 535 serving as a semiconductor layer is a thick one of several tens of micrometers in thickness.

Figure 65:
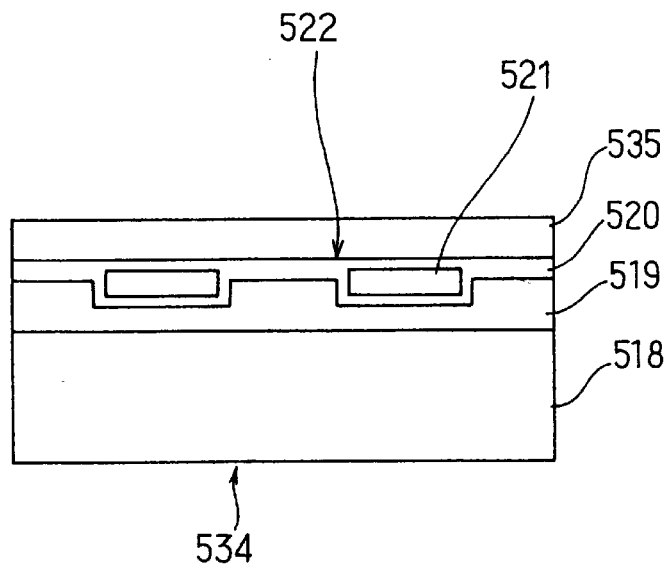
FIG. 65 is a schematic sectional view of a SOI substrate of a twenty-sixth preferred embodiment.

FIG. 65 is a schematic sectional view of the overall construction of the SOI substrate 534. In FIG. 65, a flattening process film 519 consisting of a polycrystalline silicon film, an amorphous silicon film or a silicon oxide film or the like is formed on a base silicon substrate 518 serving as a supporting substrate. A pattern structure 522 made up of, for example, an insulating film 520 of silicon oxide or the like and a polysilicon film 521 is formed on this flattening process film 519. On the pattern structure 522 is formed a monocrystalline silicon film 535 serving as a semiconductor layer for device formation.

Next, a method for manufacturing this SOI substrate 534 will be described with reference to FIG. 66 through FIGS. 68A and 68B.

Figure 66:
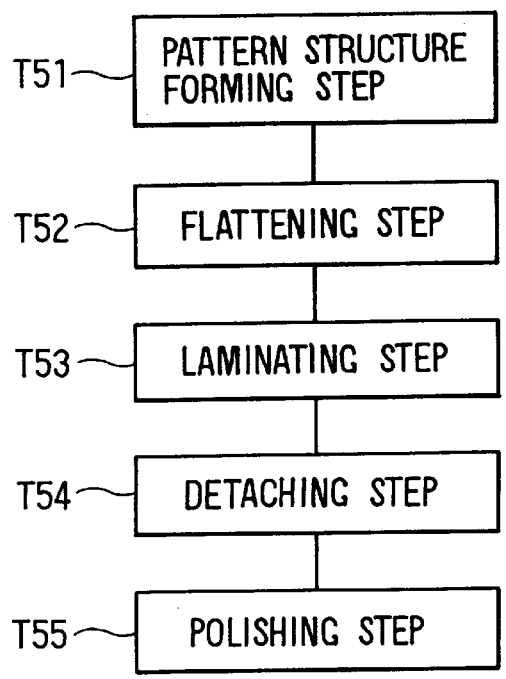
FIG. 66 is a manufacturing process diagram of the twenty-sixth preferred embodiment.

FIG. 66 is a block diagram showing in outline the overall flow of a process for manufacturing the SOI substrate 534. As shown in FIG. 66, processing steps are carried out in the order of a pattern structure forming step T51, a flattening step T52, a laminating step T53, a detaching step T54 and a detachment face polishing step T55. That is, steps T51 through T55 consisting of the steps P51 through P56 in the twenty-third preferred embodiment without the ion implantation step P51 are carried out.

Figure 67A:
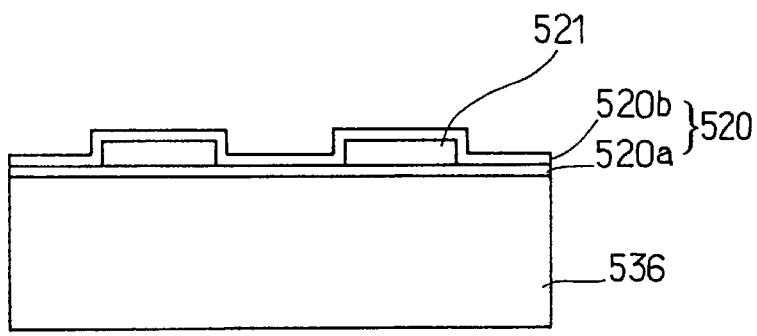
FIGS. 67A through 67C are sectional views of a SOI substrate illustrating manufacturing steps of the twenty-sixth preferred embodiment.
Figure 67B:
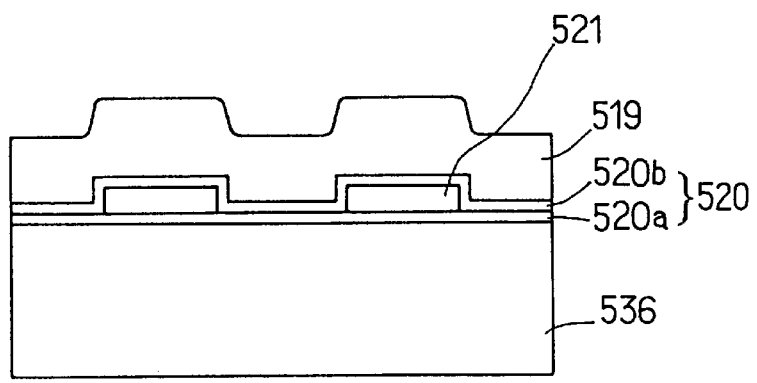

First, in the pattern structure forming step T51, a pattern structure 522 made up of an oxide film 520 and a patterned polysilicon film 521 is formed in the same way as that described above on a monocrystalline silicon substrate 536 having a high initial oxygen concentration (see FIG. 67A). Then, the surface of this monocrystalline silicon substrate 536 having the pattern structure 522 must be flattened for lamination to a base silicon substrate 518. To this end, as the flattening step T52, a flattening process film 519 is deposited to a predetermined thickness on the surface of the monocrystalline silicon substrate 536 (see FIG. 67B).

Figure 67C:
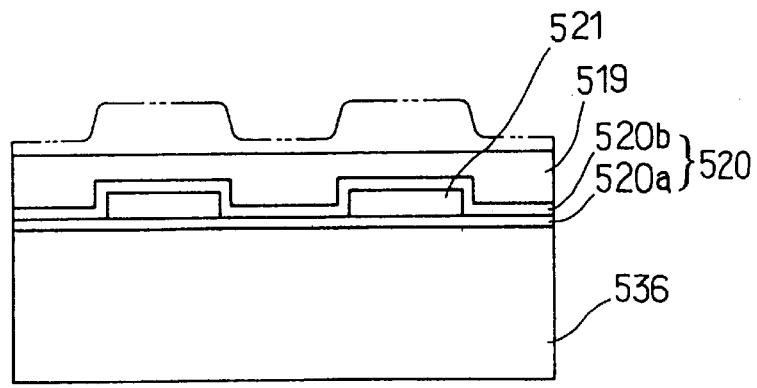
Figure 68A:
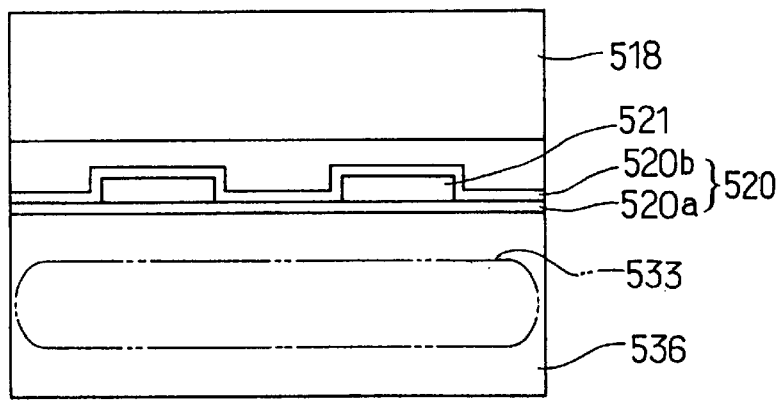
FIGS. 68A and 68B are sectional views illustrating manufacturing steps continuing from FIG. 67C.
Figure 68B:
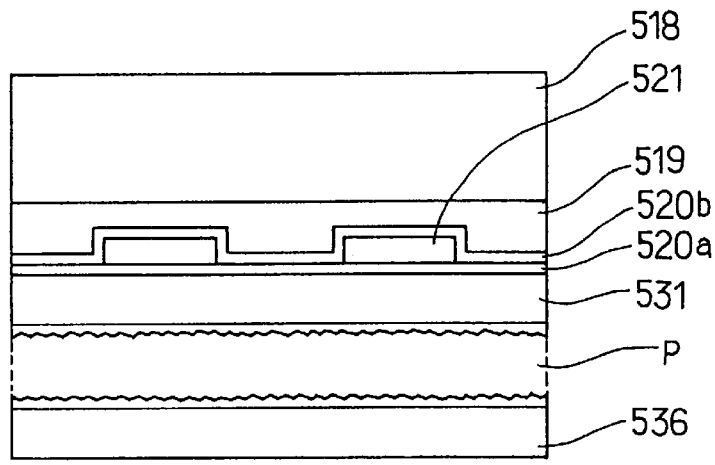

Next, the flattening process film 519 made to be laminated to the base silicon substrate 518 is polished, whereby surface steps caused by the pattern structure 522 therebelow are eliminated and the roughness of the surface is also reduced (see FIG. 67C). Then, in the laminating step T53, the polished face of the monocrystalline silicon substrate 536 and the base silicon substrate 518 are laminated together and heat treatment for bonding is carried out (see FIG. 68A). Here, the base silicon substrate 518 has at least its lamination face polished to a mirror finish.

After that, in the detaching step T54, the two silicon substrates 536, 518 thus laminated together are heat treated in a nitrogen atmosphere or an oxygen atmosphere, for example, at 1100° C. for one hour to make an oxygen segregation layer 533 a defective layer and to getter heavy metal impurities. Thereafter, the monocrystalline silicon substrate 536 is detached at the defective layer part (see FIG. 68B). By this means, it is possible to form a monocrystalline silicon film 531 having a film thickness of several tens of micrometers on the base silicon substrate 518.

Next, in the detachment face polishing step T55, the surface of the detached detachment face P is flattened and smoothed and has its surface roughness improved by polishing. In this way, it is possible to obtain a SOI substrate 534 on which is formed a thick monocrystalline silicon film 531 of over several tens of micrometers in film thickness on a pattern structure 522 on a base silicon substrate 518.

(Twenty-seventh Preferred Embodiment)

FIG. 69 through FIGS. 71A to 71C show a twenty-seventh preferred embodiment of the invention. In this preferred embodiment, the basic manufacturing method shown in the twenty-fifth preferred embodiment is used to illustrate a method for manufacturing a SOI semiconductor substrate 537 of the structure shown in the twenty-fourth preferred embodiment.

Figure 69:
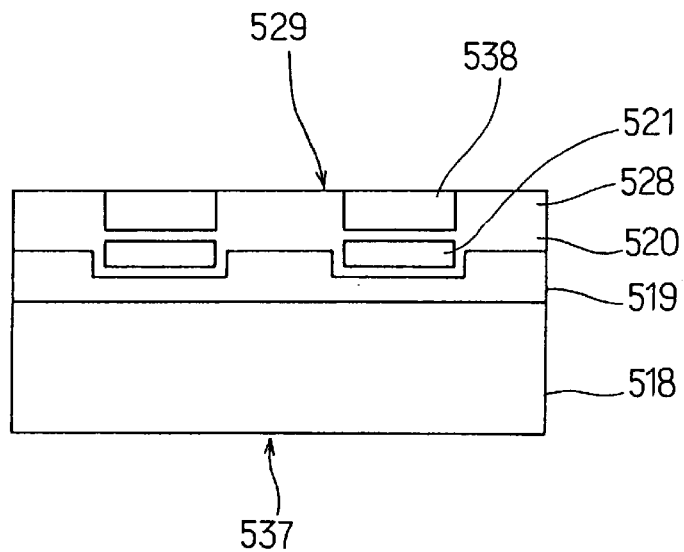
FIG. 69 is a schematic sectional view of a SOI substrate illustrating a twenty-seventh preferred embodiment.

In the SOI substrate 537, as shown in FIG. 69, an oxide film 520 serving as an insulating film is so formed that it is partially exposed at the face of a monocrystalline silicon film 538 to constitute a semiconductor layer. That is, the oxide film 520 functions as a stopper. As a pattern structure 529, a polysilicon film 521 is formed on the base silicon substrate 518 with the oxide film 520 therebetween and a monocrystalline silicon film 538 for device formation is formed on that as an island. The monocrystalline silicon film 538 is insulated and separated from the rest of the substrate by the polishing stopper 528.

FIGS. 70A to 70C through 71A to 71C are sectional views illustrating states corresponding to steps in the manufacture of the SOI substrate 537. For the monocrystalline silicon substrate 536, as in the previous preferred embodiment, one having a high initial oxygen concentration is used. In the pattern structure forming step T51, a channel 536a for forming a polishing stopper 528 is preformed in the monocrystalline silicon substrate 536, and a polishing stopper 528 is provided by forming an oxide film in this channel 536a (see FIG. 70A). The subsequent process is substantially the same as in the twenty-fourth preferred embodiment.

Figure 70A:
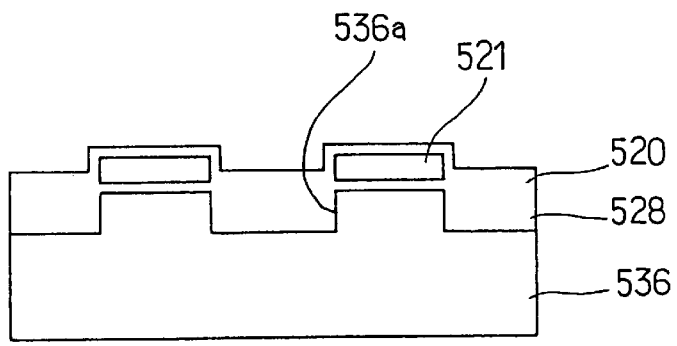
FIGS. 70A through 70C are sectional views of a SOI substrate illustrating manufacturing steps of the twenty-seventh preferred embodiment.
Figure 70B:
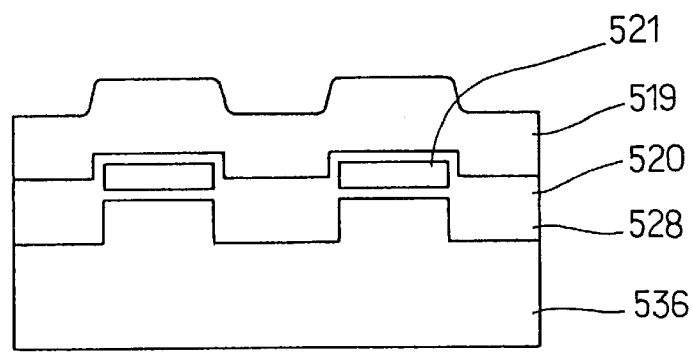
Figure 70C:
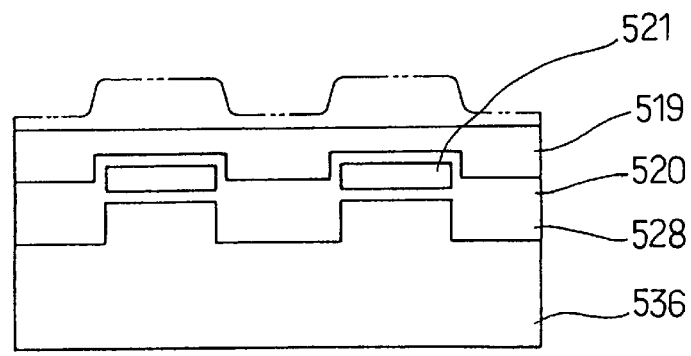
Figure 71A:
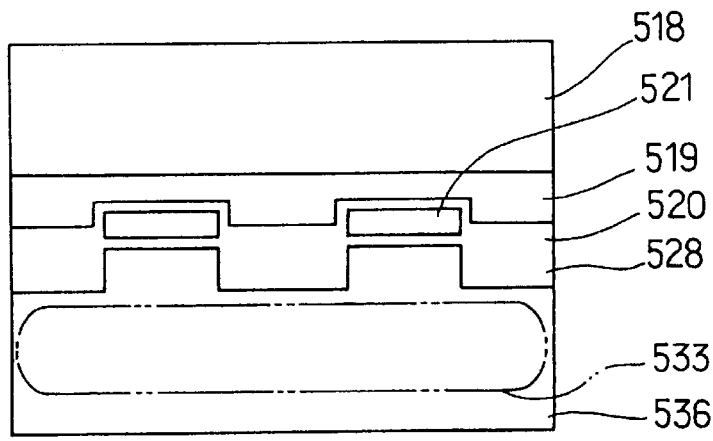
FIGS. 71A through 71C are sectional views continuing illustrating manufacturing steps from FIG. 70C.
Figure 71B:
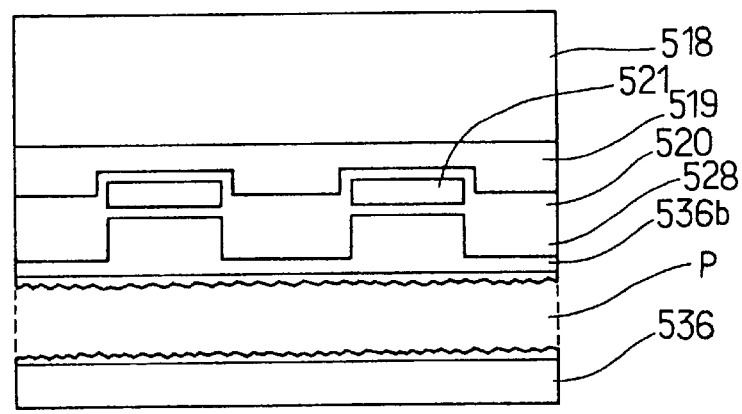
Figure 71C:
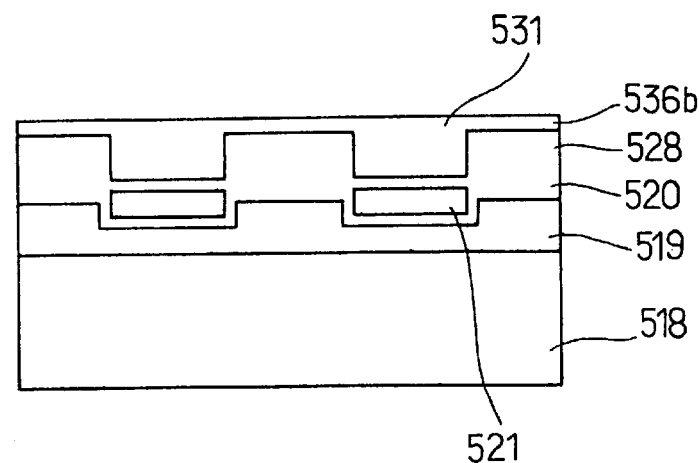

In the flattening step T52, a flattening process film 519 is formed on the surface of the substrate (see FIG. 70B). Then, in the laminating step T53 and the detaching step T54, the base silicon substrate 518 is laminated to the surface of the monocrystalline silicon substrate 536 (FIG. 71A) and high-temperature heat treatment is carried out to detach the monocrystalline silicon substrate 536 (FIG. 71B).

After that, an extremely thin silicon film 536b remaining on the part of the detachment face under which the polishing stopper 528 is formed is removed by polishing in the detachment face polishing step T55. At this time, when polishing has proceeded to the point at which the silicon film 536b ceases to exist, the surface of the polishing stopper 528 becomes exposed as the polishing face. An increase in the amount of heat produced by the polishing is detected with a temperature sensor or the like and polishing is stopped.

By this means, it becomes possible to obtain an accurate monocrystalline silicon film 538 which is thin and of a uniform thickness as a semiconductor layer. Also, because the monocrystalline silicon film 538 to constitute the semiconductor layer is formed directly in the shape of an insulated and separated island, it does not have to be preformed into the necessary shape and thus it is possible to simplify the manufacturing process by which a device is formed thereafter.

The aspect of the invention illustrated in the twenty-second through twenty-seventh preferred embodiments described above is not limited to these preferred embodiments, and for example the following modifications an extensions are possible.

As the substrate for semiconductor layer use 515, 524, 532, 536, monocrystalline substrates of other semiconductors based on group four elements, for example Ge (germanium), SiC (silicon carbide), SiGe (silicon germanium) and the like, or diamond can be used. In this case, when a SiC substrate or the like is used, because the substrate itself is extremely expensive, the effective use of resources and cost reduction effect of polishing and reusing the substrate after its detachment is great.

The pattern structure 522, 529 can be shaped as a construction made up of a plurality of semiconductor layers.

Next, twenty-eighth through thirty-fifth preferred embodiments of the invention will be described. Before the description of these preferred embodiments, the aspect of the invention illustrated in them will be explained. The twenty-eighth through thirty-fifth preferred embodiments will then be described in detail.

As a semiconductor substrate wherein a monocrystalline semiconductor layer for device formation is formed on an insulating film on a supporting substrate, for example there is the SOI (Silicon On Insulator) having a monocrystalline silicon semiconductor layer. This has a structure wherein a monocrystalline silicon thin film to serve as a semiconductor layer is formed on an oxide film serving as an insulating film on a silicon substrate constituting a supporting substrate. When MOS transistors are formed using this kind of semiconductor substrate, for reasons such as that structurally their parasitic capacitance can be lowered, high speed, low power consumption operation of semiconductor integrated circuits is possible.

There have been various methods for forming semiconductor substrates having this kind of SOI structure, and one of these is the lamination method. In this method, a monocrystalline semiconductor substrate for forming a semiconductor layer for device formation is laminated to a supporting substrate on which an insulating film has been formed. After that, the monocrystalline semiconductor substrate is ground and polished to a predetermined thickness from its rear side, or detached by the kind of method disclosed in Japanese Patent Application Laid-Open No. H.5-211128, to leave a monocrystalline silicon thin film of a required thickness on the supporting substrate side and thereby form a semiconductor layer.

Semiconductor substrates having the kind of SOI structure described above include those of a construction wherein the monocrystalline silicon thin film formed on the surface is brought to a state such that it is isolated in the form of an island in advance, before it is formed on the oxide film. In this case, for reasons associated with the manufacturing process, the face of the substrate to be laminated has irregularities, and in Japanese Patent Application Laid-Open No. H. 1-302837 there is shown a method for making it possible for lamination to be carried out surely even when such irregularities arise.

In this method, a concavity is formed in a predetermined region of the surface of the semiconductor substrate. An oxide film is formed on the semiconductor substrate. A polycrystalline silicon film is formed on the oxide film, and polishing is carried out to flatten the surface of the polycrystalline silicon film. After that, the semiconductor substrate is laminated with another semiconductor substrate serving as a supporting substrate. Selective polishing is carried out to complete a semiconductor substrate having a SOI structure. In this way, it is possible to form a monocrystalline silicon thin film of a uniform film thickness as thinly as about 0.1 $\mu$m.

In recent years, as devices formed using semiconductor substrates having this kind of SOI structure, devices of a construction wherein in advance an electrode pattern is formed buried in an oxide film positioned below the semiconductor layer have been being considered. When a semiconductor substrate having this kind of construction is provided, with respect to a device formed in the semiconductor layer on the substrate surface, by varying a voltage impressed on the buried electrode it is possible to changeably set the operating threshold voltage of the gate provided on the surface side.

Figure 91A:
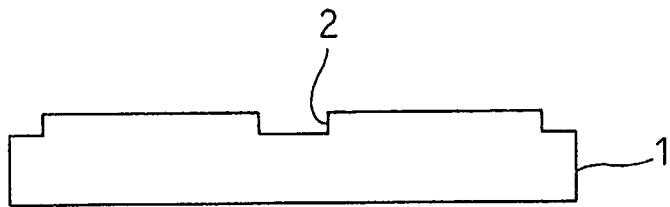
FIGS. 91A through 91E are views showing manufacturing steps according to a related art.
Figure 91B:
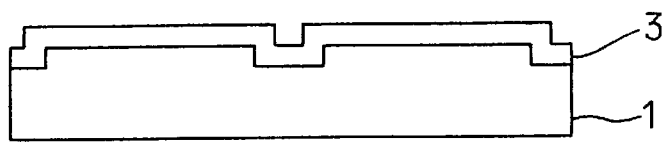

Now, a case of forming a semiconductor substrate of this structure according to the manufacturing method described above will be considered. FIGS. 91A through 91E and FIGS. 92A through 92C are schematic sectional views illustrating stages in this manufacturing process. The process will now be briefly described. First, in a predetermined position on the surface of a monocrystalline silicon substrate 601 for forming a SOI layer, a concavity 602 of a depth corresponding to the thickness of the SOI layer to be formed is formed by photolithography and etching (see FIG. 91A). Then, an oxide film 603 is formed over the entire surface (FIG. 91B).

Figure 91C:
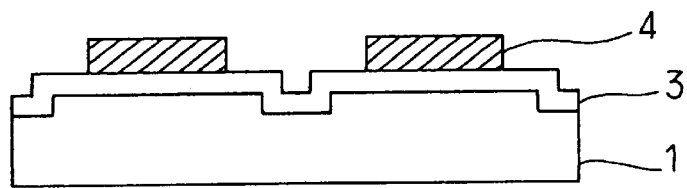
Figure 91D:
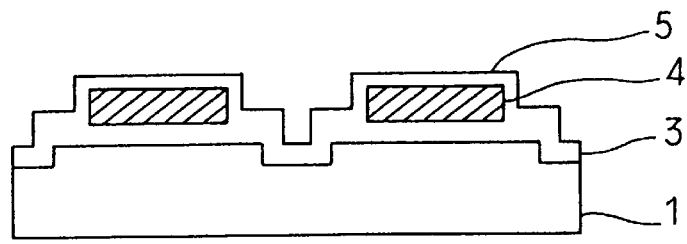
Figure 91E:
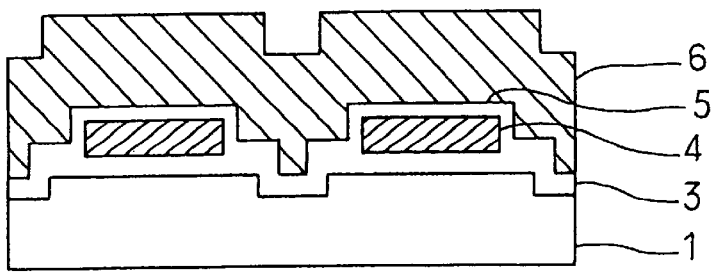
Figure 92A:
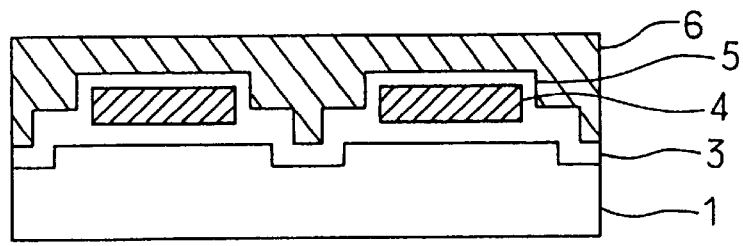
FIGS. 92A through 92C are views showing manufacturing steps continuing from FIG. 91E.

Next, a polycrystalline silicon film is formed over the entire surface of the oxide film 603, after which photolithography and etching are carried out to form a buried electrode pattern 604 (FIG. 91C). After that, another oxide film 605 is formed covering the buried electrode pattern 604 to complete the pattern structure (FIG. 91D). Then, a polycrystalline silicon film 606 is formed over the entire surface (FIG. 91E) and polishing is carried out to eliminate steps remaining in the surface and flatten it (FIG. 92A).

Figure 92B:
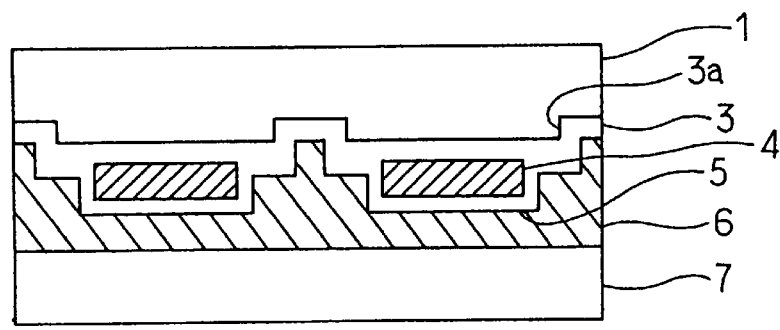
Figure 92C:
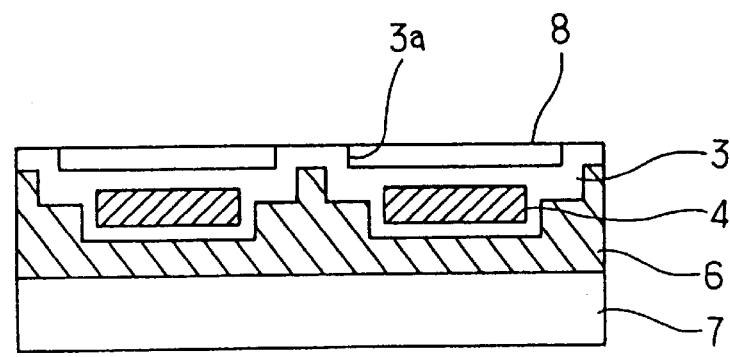

Thereafter, the monocrystalline silicon substrate 601 with the polycrystalline silicon film 606 formed thereon and a monocrystalline silicon substrate 607 to serve as a supporting substrate are put through a hydrophilicizing treatment and laminated together and then bonded by heat treatment (FIG. 92B). Then, by the monocrystalline silicon substrate 601 being polished from its rear side, the oxide film 603 is exposed (FIG. 92C). In this way, it is possible to form a monocrystalline silicon thin film 608 in the form of an island filled into a concavity 603$a$ in an oxide film 603.

However, when a pattern structure having a complicated step structure is formed on a monocrystalline silicon substrate 601 in this way, with the manufacturing method described above (the method disclosed in Japanese Patent Application Laid-Open No. H.1-302837), it is difficult to form the face to be laminated as a smooth bonding face.

It is therefore an object of an aspect of the invention illustrated in the following twenty-eighth through thirty-fifth preferred embodiments to provide a semiconductor substrate manufacturing method with which it is possible form a smooth bonding face easily even in the case of a pattern structure having steps in the surface of the face of the substrate to be laminated.

According to this aspect of the invention, a pattern structure body is formed on a supporting substrate in such a state that it is insulated from the semiconductor substrate, and a substrate for forming a semiconductor layer is laminated to this pattern structure body to form a semiconductor layer in an insulated state. Then, a semiconductor substrate is formed by the substrate for a semiconductor layer being so detached that a thin film part of a predetermined thickness thereof remains on the pattern structure body. That is, in a pattern structure forming step, a pattern structure body is provided insulated from the supporting substrate and its surface is formed to a flat state. In an ion-implanted layer forming step, an ion-implanted layer for detachment use is formed at a predetermined depth in a substrate for forming a semiconductor layer. Then, the supporting substrate and the substrate for a semiconductor layer are laminated together and heat treatment for effecting detachment is carried out. Finally, in a detachment face polishing step, the irregularities and the defective layer of the detachment face are removed and a semiconductor substrate is thereby formed.

When forming a semiconductor substrate provided with a pattern structure body having a buried pattern, which is a special structure, because this is not formed on the side of the substrate for forming a semiconductor layer but rather is formed on the supporting substrate side and then flattened, it is possible to suppress steps arising before lamination as a result of the formation of the buried pattern. Also, a flat and smooth bonding face suitable for lamination can be formed by going through a simple process.

The pattern structure body formed on the supporting substrate can be used as a buried electrode pattern by a material for a buried electrode being selectively disposed in the insulating film. Steps arising with the presence and absence of this buried electrode pattern are flattened in a following flattening step, after which lamination of the supporting substrate and the substrate for semiconductor layer use is carried out.

The buried electrode pattern can be formed by forming an oxide film on the supporting substrate in an oxide film forming step, then forming in the oxide film a concavity corresponding to the buried electrode pattern in a following buried electrode concavity forming step, and then filling this concavity with a buried electrode material in an electrode burying step. Because steps in the surface are thus diminished at a stage prior to the flattening step, the precision of the flattening can be increased.

In the above-mentioned oxide film forming step, the oxide film can be formed by thermally oxidizing the supporting substrate. In this case, an oxide film of good quality can be obtained.

In the above-mentioned buried electrode concavity forming step, the concavity can be formed by etching the oxide film to a predetermined depth with a single etching process. It is thus possible to form the concavity by means of a simple processing step.

In the above-mentioned buried electrode concavity forming step, the oxide film can be removed once by etching in correspondence with the shape of the buried electrode pattern to expose the face of the supporting substrate therebelow and then an oxide film formed again over the entire surface. In this way also, the concavity can be formed in the oxide film. In this case, although the number of processing steps increases, the depth of the concavity and the thickness of the oxide film at the bottom of the concavity can be formed with good accuracy.

In the electrode burying step, a film of a buried electrode material may be formed over the entire surface of the oxide film in which the concavity for the buried electrode pattern has been formed in the buried electrode film forming step, and by a following polishing step this buried electrode material film may be polished until the face of the oxide film becomes exposed. In other words, the buried electrode pattern can be formed by the buried electrode material being made to remain only in the concavity in the oxide film.

In the above-mentioned buried electrode film forming step, a polycrystalline silicon film can be formed as the buried electrode material. By an impurity being introduced into this, it can be made to function as a buried electrode pattern. Also, the processability in a subsequent polishing step is good. Furthermore, when a manufacturing process for forming a device in the semiconductor layer of the semiconductor substrate is carried out, unlike a buried electrode material for which a metal or the like is used, because its heat-withstanding characteristics are excellent, it does not reduce the degree of freedom of the manufacturing process.

When a polycrystalline silicon film is formed as the above-mentioned buried electrode material film, preferably, a polycrystalline silicon film pre-doped with an impurity is formed using CVD. When this is done, the step for introducing the impurity becomes simple and control of the doped amount also becomes easy.

A metal material such as tungsten, copper or aluminum can also be used as the buried electrode material film. In this case, a material having superior electrical characteristics of low resistance can be formed as the buried electrode.

In the above-mentioned flattening step, a flattening process film can be formed in a flattening process film forming step on the supporting substrate on which the pattern structure has been formed, and the surface of this flattening process film can be flattened by being polished in a following polishing step.

In the flattening process film forming step, a polycrystalline silicon film can be formed as the flattening process film and, in a thermal oxidation step carried out after a polishing step, the flattened polycrystalline silicon film can be thermally oxidized and thereby made a silicon oxide film. In this case, in the polishing step a polycrystalline silicon film having good polishing characteristics can be polished and the processability can be improved.

In the flattening process film forming step, a film having thermal fluidity such as BPSG, PSG, SOG may be formed as the flattening process film. Then, even when there are steps therebelow, by the flattening process film being formed, the surface of the substrate can be flattened easily.

Preferably, a polycrystalline silicon film having insulativity is formed on the entire surface after a buried conducting pattern is formed and a predetermined film thickness of this polycrystalline silicon film is thermally oxidized so that a surface portion thereof is made into an oxide film but a part still in a polycrystalline silicon film state remains. In this way, it is possible to completely prevent problems of irregularities being formed in the surface of the oxide film between buried electrode pattern parts and other parts thereof resulting from thermal oxidation being carried out excessively and thereby make the surface flat.

In the pattern structure forming step, when a polycrystalline silicon film to serve as a buried electrode material is formed on the entire surface of the oxide film in which the concavity has been formed, by the polycrystalline silicon film being polished in a polishing step to a thickness such that a predetermined film thickness thereof from the surface of the oxide film remains and a surface layer portion of the polycrystalline silicon film then being thermally oxidized in a thermal oxidation step, a buried electrode pattern consisting of a polycrystalline silicon film can be formed in the concavity. In this process, the forming and the polishing of the polycrystalline silicon film can be completed in a single step and it is thereby possible to reduce the number of processing steps.

In the pattern structure forming process, by forming an oxide film on the supporting substrate in an oxide film forming step and forming a buried electrode pattern on the oxide film in a buried electrode pattern forming step and forming a flattening process film on the entire surface of the oxide film and the buried electrode pattern in a flattening process film forming step and then polishing and flattening the surface of the flattening process film to a predetermined film thickness in a polishing step, it is possible to form a buried conductive pattern with a reduced number of processing steps.

In the manufacturing method described above, in the flattening process film forming step, it is possible to form an oxide film as the flattening process film. In this case, it is possible to provide a semiconductor substrate with which stable operating characteristics can be obtained.

In the pattern structure forming step, a buried electrode pattern can be formed by introducing an impurity selectively into a buried electrode film provided on the supporting substrate in an insulated state. That is, the buried electrode pattern can be formed directly in a flat state. When a supporting substrate formed in this way is laminated in a laminating step to a substrate for forming a semiconductor layer in which an ion-implanted layer has been formed in an ion-implanted layer forming step, because the face of the supporting substrate to be laminated has been formed in a flat state, it can be laminated to the substrate for a semiconductor layer with good contact intimacy. After that, by going through a detaching step and a detachment face polishing step, it is possible to form a semiconductor layer in an insulated state on the part of the supporting substrate where the buried electrode pattern was formed. A polycrystalline silicon film can be used as the above-mentioned film for the buried electrode.

As the method for selectively introducing an impurity into the buried electrode film provided on the supporting substrate, an impurity can be selectively introduced into the buried electrode film by ion implantation or diffusion.

In the step of forming an ion-implanted layer in the substrate for forming a semiconductor layer, preferably, an oxide film is formed on the substrate for a semiconductor layer in an oxide film forming step and in an ion implantation step ion implantation is carried out through the face of the substrate for a semiconductor layer on which the oxide film has been formed to form an ion-implanted layer for detachment use in the substrate for a semiconductor layer. In this way, it is possible to maximally prevent damage and contamination by heavy metals and the like arising during the ion implantation from spreading to the substrate for a semiconductor layer and it is thereby possible to increase the film quality of the semiconductor layer being formed.

In the oxide film forming step, if the oxide film is formed by thermally oxidizing the substrate for a semiconductor layer, a dense and good quality oxide film can be formed. Also, when thereafter the substrate for a semiconductor layer having gone through an ion implantation step is laminated to a supporting substrate, the lamination of the substrates can be carried out with this thermal oxide film interposed between. This thermal oxide film can be utilized as an insulating film provided below the semiconductor layer.

Following the ion implantation step, an oxide film removing step may be provided to remove the oxide film formed on the substrate for a semiconductor layer by etching. In this way, it is possible to manufacture a semiconductor substrate with the oxide film damaged and contaminated with heavy metals in the ion implantation step removed.

Following the above-mentioned oxide film removing step, a step of forming an oxide film again may be provided and an oxide film reformed on the etched surface of the substrate for a semiconductor layer. When this is done, the lamination step can be carried out with a good quality oxide film which has not had damage and heavy metal contamination suffered during the ion implantation provided on the substrate for a semiconductor layer.

Following the ion implantation step mentioned above, an etching step may be provided and a surface layer portion of the oxide film removed by etching. A surface layer part of the oxide film having suffered damage and heavy metal contamination in the ion implantation step or a region in that vicinity is then removed while the rest of the oxide film is allowed to remain, and the process can be essentially simplified. Also, when the oxide film is formed by thermal oxidation, a substrate for a semiconductor layer having a good quality oxide film partially remaining thereon can be laminated to the supporting substrate.

In the detaching process, the heat treatment can be divided into two stages, with detachment of the substrate for a semiconductor layer at the ion-implanted layer being effected to form a semiconductor layer on the supporting substrate by heating to 400° C. to 600° C. in a first heat treatment and the semiconductor layer being firmly bonded to the supporting substrate in a second heat treatment.

By the heat treatment of the detaching step being carried out in an oxygen atmosphere, an oxide film can be formed on the detachment face. By this means, it is possible to diminish irregularities in the surface arising at the time of the detachment and remove a defective region remaining in the vicinity of the detachment face. Since an oxide film formed in this way can be removed easily by wet etching with fluoric acid or the like in a following detachment face polishing step, the thickness to be removed by polishing can be greatly reduced and it is possible to shorten the time required for the polishing step.

(Twenty-eighth Preferred Embodiment)

A twenty-eighth preferred embodiment of the invention will now be described with reference to FIG. 72 through FIG. 79.

Figure 73:
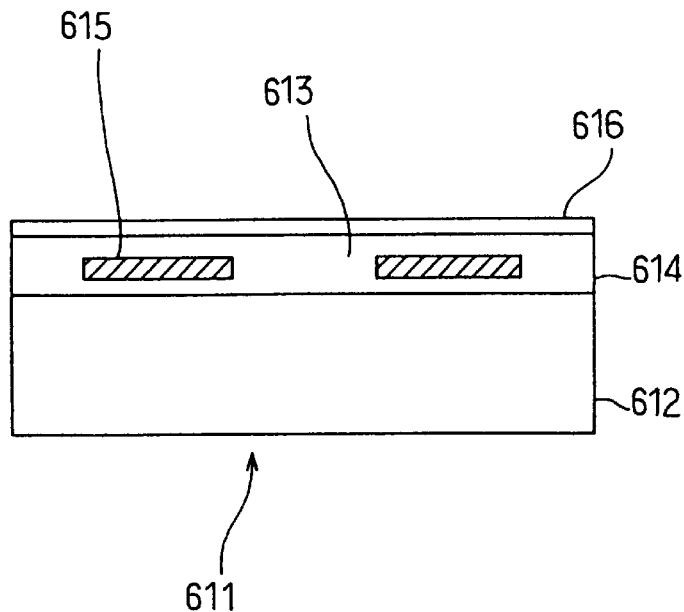
FIG. 73 is a schematic sectional view of a SOI substrate.

FIG. 73 is a schematic sectional view of a SOI substrate 611 which is a semiconductor substrate formed using a manufacturing method according to this preferred embodiment. A pattern structure 613 is formed in an insulated state on a monocrystalline silicon substrate 612 serving as a supporting substrate; that is, there is provided a pattern structure 613 of a structure wherein a buried electrode pattern 615 is formed buried in an insulated state inside a silicon oxide film 614.

The silicon oxide film 614 is formed to a film thickness of about 550 nm, made up of the thickness (for example about 350 nm) of the buried electrode pattern 615 provided inside it, the film thickness (for example about 100 nm) for achieving insulation between the buried electrode pattern 615 and the monocrystalline silicon substrate 612 therebelow, and a film thickness (for example about 100 nm) of a part to become a gate oxide film. The film thickness of a monocrystalline silicon film 616 serving as a semiconductor layer is about 0.1 μm to several micrometers.

Figure 74:
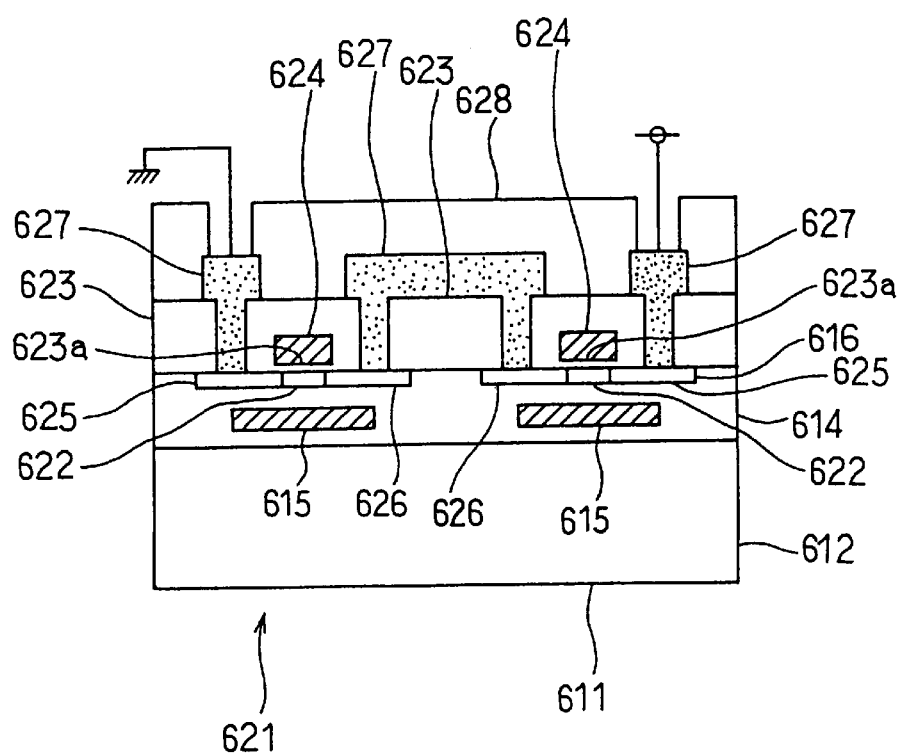
FIG. 74 is a schematic sectional view of a semiconductor device formed using a SOI substrate.

The SOI substrate 611 formed in this way is, for example, used in a semiconductor device 621 of the kind shown in FIG. 74. In this semiconductor device 621, a channel region 622 is formed by, for example, diffusing an impurity into a device formation region formed in the shape of an island by insulating/separating the monocrystalline silicon film 616 of the SOI substrate 611. A gate oxide film 623a is formed on this and a gate electrode 624 is disposed on the gate oxide film 623a and the whole is covered with an oxide film 623. After that, metal electrodes 627 of aluminum or the like are formed on a source terminal 625 and a drain terminal 626 for the channel region 622 and on the gate electrode 624, and a protective film 628 is then formed.

Also, ohmic contact from another part (not shown) is taken at the buried electrode pattern 615 buried in the silicon oxide film 614 so that a voltage from outside can be impressed on it. By forming a semiconductor device 621 like this, a device of good quality wherein the channel region 622 is insulated/separated can be formed, and using the buried electrode pattern 615 the construction can be made to have the added function of a back gate electrode. That is, it is possible to change the threshold value of the control voltage impressed on the gate electrode 624 and an improvement in the control characteristics of the device can be achieved.

Figure 72:
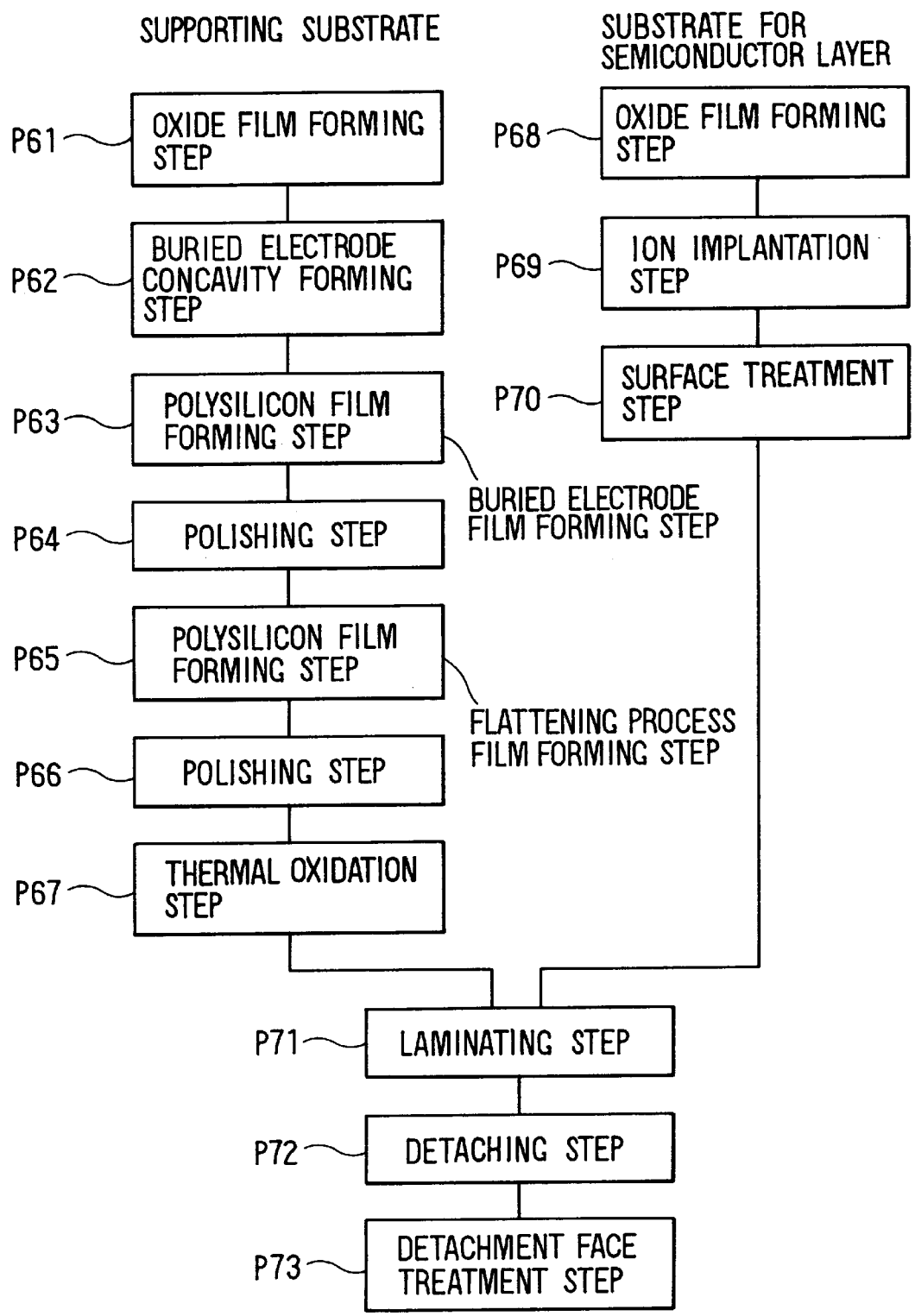
FIG. 72 is a block diagram of a manufacturing process illustrating a twenty-eighth preferred embodiment.

Next, a method for manufacturing a SOI substrate 611 having this kind of structure will be described with reference to FIG. 72 and FIGS. 75A to 75C through FIG. 79. FIG. 72 is a block diagram showing a process for manufacturing the SOI substrate 611 in outline, and this manufacturing process will be followed in the description below.

As the basic flow of the overall process, a buried electrode pattern 615 constituting a pattern structure 613 is formed on a monocrystalline silicon substrate 612 serving as a supporting substrate in 8Ha pattern structure forming process (P61 through P67). Meanwhile, an ion-implanted layer 636 is formed in a monocrystalline silicon substrate 631 serving as a substrate for forming a semiconductor layer in an ion-implanted layer forming process (P68 through P70). After these silicon substrates 612, 631 are laminated together in a laminating step (P71), a monocrystalline silicon film 616 constituting a semiconductor layer is formed on the a monocrystalline silicon substrate 612 by going through a detaching step (P72) and a detachment face polishing step (P73).

(1) pattern structure forming process (a) oxide film forming step (P61)

Figure 75A:
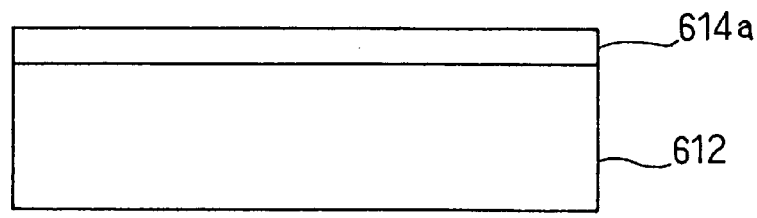
FIGS. 75A through 75C are schematic sectional views illustrating steps for manufacturing a SOI substrate according to the twenty-eighth preferred embodiment.

First, in the pattern structure forming process, an oxide film 614a is formed by a method such as, for example, thermal oxidation on the surface of a monocrystalline silicon substrate 612 by an oxide film forming step P61 (see FIG. 75A). In this case, for the monocrystalline silicon substrate 612, for example a substrate made by introducing a P-type impurity into a monocrystalline silicon substrate to make its resistivity $\rho$ a value of 5 $\Omega$cm to 10 $\Omega$cm is used.

In the oxide film forming step P61, preferably, either thermal oxidation is carried out to form the oxide film 614a or the oxide film 614a is formed by a method such as CVD, to keep high uniformity of an oxide film thickness. The film thickness of the oxide film 614a formed here, as will be further discussed later, is set to, for example, 450 nm. That is, it is a film thickness obtained by adding a film thickness of 350 nm necessary for the buried electrode pattern 615 to a film thickness of 100 nm necessary for the insulating film therebelow.

(b) buried electrode concavity forming step (P62)

Figure 75B:
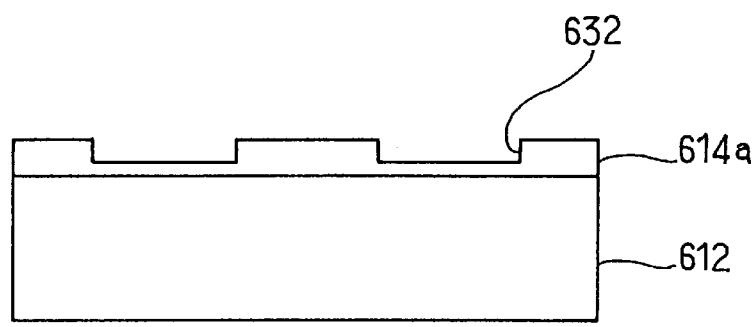

Next, in an electrode concavity forming step P62, a concavity 632 for forming the buried electrode pattern 615 is formed in a predetermined position in the oxide film 614a (FIG. 75B). In this case, the concavity 632 is patterned to a predetermined shape by photolithography and etched to a predetermined depth (about 350 nm) by dry etching using $CF_4$ gas or the like or by wet etching using a fluoric acid etching liquid to leave a film thickness of about 100 nm of the oxide film 614a at the bottom.

(c) polysilicon film forming step (P63)

Figure 75C:
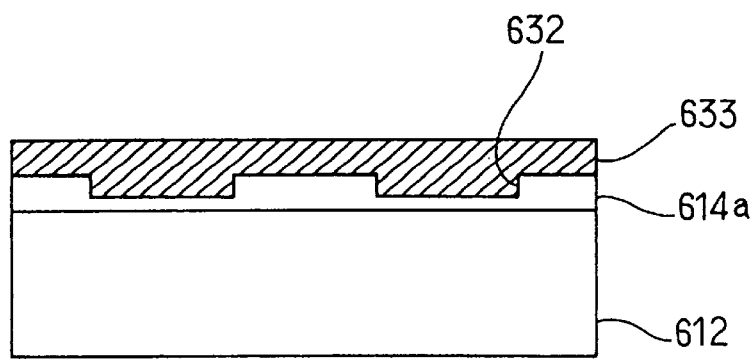

Next, in a polysilicon film forming step P63, a polysilicon film 633 serving as a buried electrode material is formed over the entire substrate to a predetermined film thickness (for example 0.1 $\mu$m to several micrometers, preferably 1 $\mu$m, and at least formed thicker than the depth of the concavity 632) using LPCVD or the like (FIG. 75C). In this case, the polysilicon film 633 is formed in an impurity-predoped state. By this means, the inside of the buried electrode concavity 632 is filled with the polysilicon film 633 predoped with the impurity.

When the polysilicon film 633 is formed by CVD or the like with an impurity already doped into it, the following is also possible. That is, first, at the time of formation of the polysilicon film 633 to fill the inside of the buried electrode concavity 632, the polysilicon film 633 is formed already doped with an impurity, and then a non-doped polysilicon film is formed thereon.

At this time, the polycrystalline silicon can be filled into the concavity 632 by setting the film thickness of the doped polycrystalline silicon formed to greater than the depth of the concavity 632 when the dimension of the opening of the concavity 632 is more than twice as large as its depth or to greater than half of the width of the opening when the depth is larger than the dimension of the opening. This is because essentially only the part of the polysilicon film 633 filled into the inside of the concavity 632 is used as the buried electrode pattern 615. When a doped polycrystalline silicon film and a non-doped polycrystalline silicon film are formed in this way, it is possible to shorten the time required to form the overall film compared to when the film is formed with a doped polycrystalline silicon film only.

As the method for introducing the impurity into the polysilicon film 633, besides the above, ordinary methods such as forming a polysilicon film 633 in a non-doped state and introducing an impurity by thermal diffusion or introducing an impurity by ion implantation thereafter can be adopted.

(d) polishing step (P64)

Figure 76A:
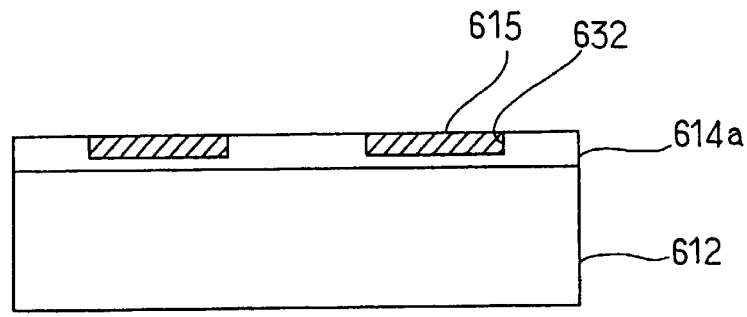
FIGS. 76A through 76C are schematic sectional views illustrating further steps for manufacturing a SOI substrate.

Next, in a polishing step P64, so-called selective polishing is carried out on the polysilicon film 633 using chemical mechanical polishing until only the polycrystalline silicon filled into the concavity 632 remains (FIG. 76A). In this case, when, as polishing progresses, the surface of the oxide film 614a becomes exposed, because it has a different polishing rate from that of polycrystalline silicon, the amount of heat produced by the polishing increases and the degree of temperature change increases. By detecting this as a temperature change of the polishing cloth, it is possible to detect that the polysilicon film 633 has been polished as far as the surface of the oxide film 614a.

Figure 79:
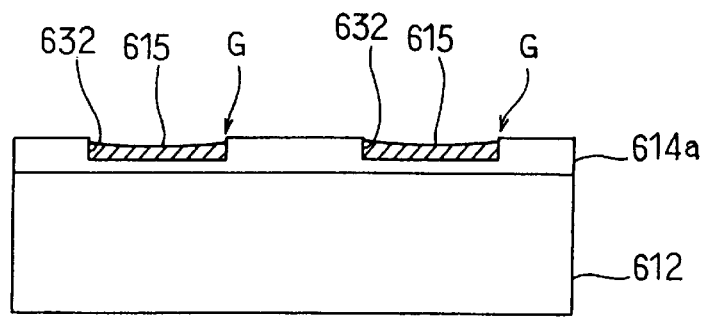
FIG. 79 is a schematic sectional view illustrating steps arising after polishing.
Figure 78A:
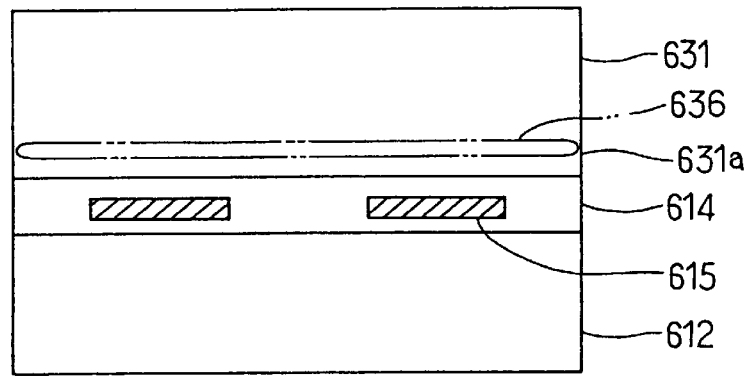
FIGS. 78A through 78C are schematic sectional views illustrating further steps for manufacturing a SOI substrate.
Figure 78B:
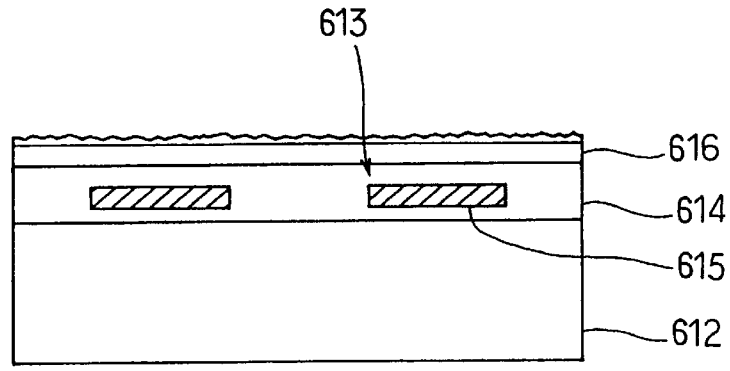
Figure 78C:
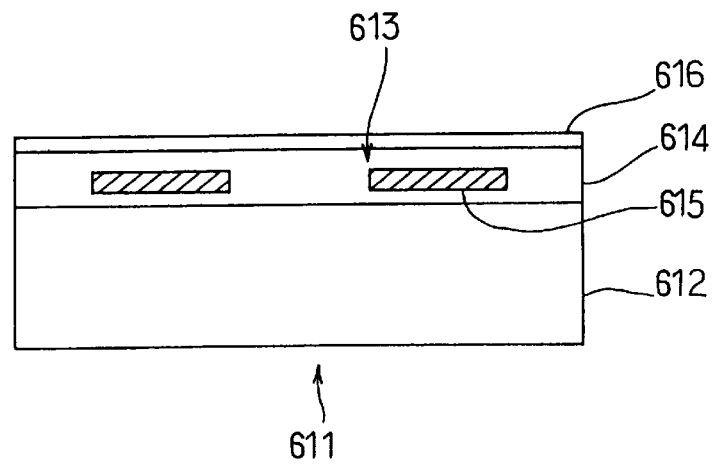

In the case described above, a phenomenon called dishing sometimes occurs. This is a phenomenon wherein as shown in FIG. 79 when materials (for example, a polycrystalline silicon and an oxide film) whose polishing rates differ are polished at the same time, a material (polycrystalline silicon) whose polishing rate is faster is polished more deeply and a step G forms at the boundary of the different materials. Consequently, because microscopically there is a loss of flatness, it is necessary for a flattening process to be carried out separately.

In this case, instead of carrying out a polishing step, the polysilicon film 633 can be etched back by dry etching to form the buried electrode pattern 615. Or, polishing for flattening can be carried out to a midway point and then the polysilicon film 633 etched back by dry etching and left inside the concavity 632 to form the buried electrode pattern 615.

(e) polysilicon film forming step (P65)

Figure 76B:
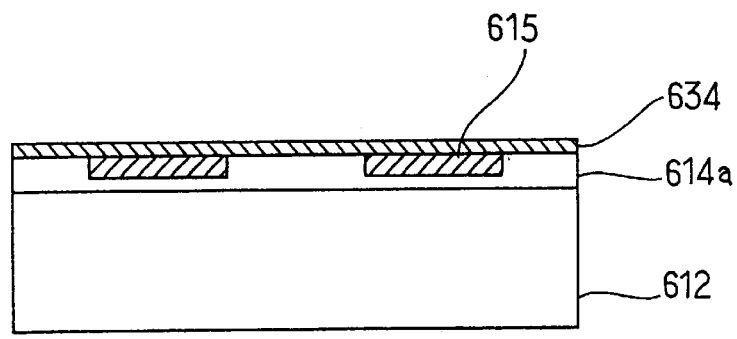
Figure 76C:
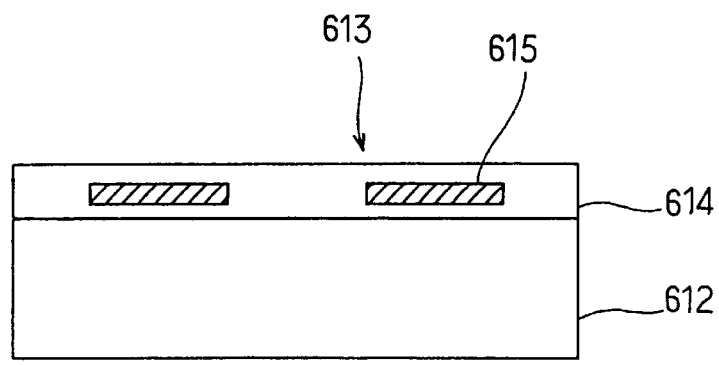

Next, in a polysilicon film forming step P65, a polysilicon film 634 is formed over the entire face of the substrate by LPCVD or the like (FIG. 76B). In this case, the film thickness of the polysilicon film 634 formed is set considering that it will become a part corresponding to a gate oxide film 614 (for example 100 nm) of the buried electrode pattern 615. As a result, the above-mentioned step G that had arisen in the face polished to form the buried electrode pattern 615 is eliminated by polycrystalline silicon being filled into the concavity 632 and a polishing step P66 being carried out thereafter. Although a polysilicon film 634 is being formed in this step, the film does not have to be polysilicon and for example the step G can be eliminated by forming an amorphous silicon film instead.

(f) polishing step (P66)

Then, in a polishing step P66, the surface of the polysilicon film 634 thus formed is flattened by polishing (FIG. 76B).

(g) thermal oxidation step (P67)

After the polysilicon film 634 is flattened as described above, by a thermal oxidation step P76, the polysilicon film 634 is oxidized to form an oxide film 614 so that it becomes integral with the oxide film 614a therebelow. In this way, a pattern structure 613 of a structure having an buried electrode pattern 615 inside an oxide film 614 can be formed with its surface flattened. Here, the thickness of the oxide film formed by oxidation is set to be about 100 nm.

(2) ion-implanted layer forming process (h) oxide film forming step (P68)

Figure 77A:
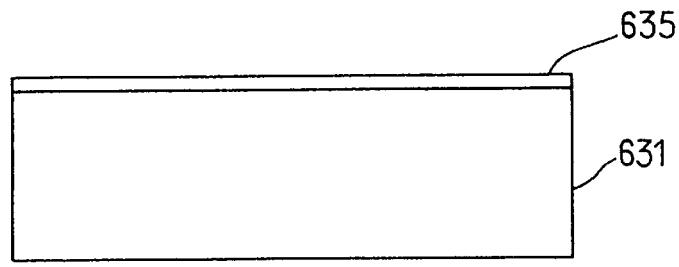
FIGS. 77A through 77C are schematic sectional views illustrating further steps for manufacturing a SOI substrate.
Figure 77B:
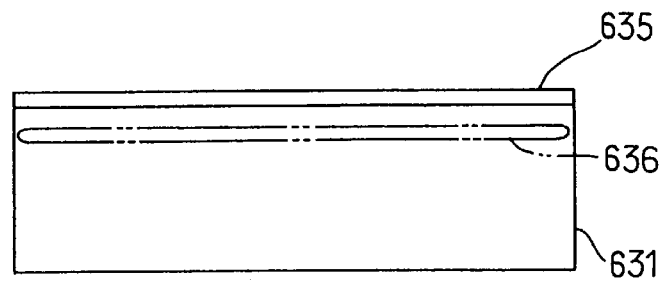

Meanwhile, with a monocrystalline silicon substrate 631 to constitute a substrate for forming a semiconductor layer, first, in an oxide film forming step P68, an oxide film 635 is formed on the substrate surface (FIG. 77A). This film is for preventing contamination due to heavy metals entering the monocrystalline silicon substrate 631 when ion implantation is carried out in a following ion implantation step P69. The oxide film 635 is formed by oxidizing the monocrystalline silicon substrate 631 by thermal oxidation. Besides thermal oxidation, this oxide film 635 can also be formed by CVD or the like.

(i) ion implantation step (P69)

Next, in an ion implantation step P69, a predetermined dose of hydrogen ions (protons) or ions of a noble gas is implanted through the oxide film 635 to a predetermined depth (FIG. 77B) to form an ion-implanted layer 636. In this case, the dose is made over $1 \times 10^{16}$ atoms/cm$^2$ and preferably over $5 \times 10^{16}$ atoms/cm$^2$. The accelerating voltage is determined so that the ion-implanted layer 636 is formed in accordance with the film thickness to which a monocrystalline silicon film 616 is to be formed.

Also, at this stage, if necessary, an impurity can be introduced into the part 631a to become the monocrystalline silicon film 616. When an impurity is introduced through this face, there is the merit that the impurity concentration of the bottom side of the monocrystalline silicon film 616 in the finished SOI substrate 611 can be raised.

(j) surface treatment step (P70)

Figure 77C:
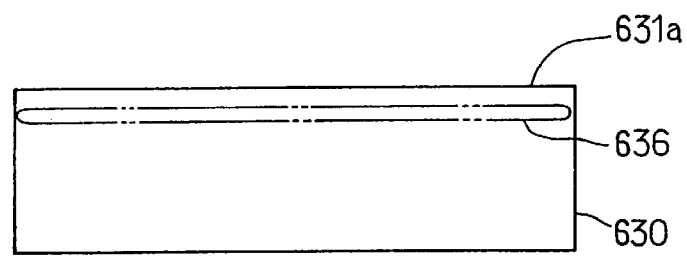

Next, in a surface treatment step P70, the oxide film 635 is chemically etched (FIG. 77C). Specifically, the oxide film 635 is removed by wet etching with a fluoric acid etching liquid. In this case, when the oxide film 635 was formed by being deposited by CVD or the like, the whole of it may be removed by etching, and when the oxide film 635 was formed by thermally oxidizing the monocrystalline silicon substrate 631 etching may be carried out not so as to remove the whole of it but to partially remove it and leave an oxide film on the surface of the monocrystalline silicon substrate 631. Also, processing may proceed to the next step with the oxide film 635 left unchanged without being etched, or the whole of the oxide film 635 may be removed and then an oxide film formed on the surface again by a method such as thermal oxidation or CVD.

That is, when the oxide film 635 is formed by thermal oxidation, it is useful to utilize that oxide film 635 as an insulating film of the SOI substrate 611, and for this reason processing may proceed to the next step with it left there or etching may be carried out so as not to remove the whole of it but to leave a little of it on the surface of the monocrystalline silicon substrate 631. When on the other hand the oxide film 635 is formed by being deposited by CVD or the like, it is effective to remove the whole of it in order to remove parts having suffered ion implantation damage or contamination by heavy metals in the ion implantation step P69 or to remove it and then form an oxide film again by thermal oxidation or CVD.

(3) laminating step (P71)

Next, hydrophilicizing treatment is carried out on the monocrystalline substrate 612 and the monocrystalline silicon substrate 631 formed as described above and they are laminated together (FIG. 78A). In the hydrophilicizing treatment, the substrates are washed in a solution made by mixing, for example, sulfuric acid ($H_2SO_4$) and hydrogen peroxide water ($H_2O_2$) in the ratio 4:1 held at 90° C. to 120° C. and then washed with pure water after which the amounts of water adsorbed on the substrate surfaces are controlled by spin drying, and in this state the two are laminated together in intimate contact. By this means, the two monocrystalline silicon substrates 612, 631 are directly bonded together by hydrogen bonding of silanol radicals formed on their surfaces and water adsorbed onto the surfaces.

(4) detaching step (P72)

After that, heat treatment is carried out in two stages on the monocrystalline silicon substrates 612, 631 thus laminated together. That is, by heat treatment being carried out in a range of 400° C. to 600° C. and for example at about 500° C. in a first heat treatment, in the ion-implanted layer 636 formed in the monocrystalline silicon substrate 631, i.e. the hydrogen high-concentration layer, defects are formed in concentration and the monocrystalline silicon substrate 631 detaches from the monocrystalline silicon substrate 612. As a result, a thin film part 631a separates from the monocrystalline silicon substrate 631 and remains on the monocrystalline silicon substrate 612. Also, at the directly bonding interface between the thin film 631a and the monocrystalline silicon substrate 612, a dehydration and condensation reaction occurs and the strength of the direct bonding of the two increases. By this means, the structure of a SOI substrate 611 having a monocrystalline silicon thin film 616 bonded to a monocrystalline silicon substrate 612 can be formed.

Then, in a second heat treatment, to raise the degree of intimacy of the monocrystalline silicon film 616 with the oxide film 614, heat treatment is carried out at a higher temperature. This second heat treatment is carried out at a temperature in the range of 1000° C. to 1300° C., and preferably at about 1100° C. As a result of this, a dehydration and condensation reaction occurs at the directly bonding interface and the two substrates are bonded together in a firmer state.

In the heat treatment step described above, the heat treatments are preferably carried out in a nitrogen atmosphere or in an oxygen atmosphere. When the second heat treatment is carried out in an oxygen atmosphere, during this heat treatment an oxide film is simultaneously formed on the monocrystalline silicon film 616 at the detachment face.

(5) detachment face treatment step (P73)

Irregularities formed at the time of the detachment remain as minute steps of a few nanometers to several tens of nanometers in size on the surface of the monocrystalline silicon film 616 separated from the monocrystalline silicon substrate 631 as described above. Here, a defective layer created when the ion-implanted layer 636 was formed in the ion implantation step P69 still exists. When the substrate can be used in this state, there is no need for this detachment face treatment step P73 to be carried out, but normally when a semiconductor device is to be formed on the monocrystalline silicon film 616, it is necessary for this kind of surface treatment of the detachment face to be carried out.

Accordingly, in this detachment face treatment step P73, the monocrystalline silicon film 616 is polished to remove small irregularities (steps) remaining on the detachment face and the defective layer and to bring the monocrystalline silicon film 616 to a predetermined film thickness, and is thereby made a final finished surface.

In the above-mentioned detaching step P72, when the second heat treatment was carried out in an oxygen atmosphere, an oxide film is formed on the surface of the detachment face. In this case, the oxide film formed on the surface is removed by wet etching using fluoric acid or the like before the polishing is carried out. Also, in this case, because irregularities and defective regions remaining in the detachment face are consumed by oxidation in the course of the oxide film being formed on the surface, although an etching step is added, since the amount of material removed in the polishing can be reduced, there is the merit that it is possible to improve the uniformity of the film thickness of the monocrystalline silicon film 616.

With this preferred embodiment, by forming a pattern structure including a buried electrode pattern 615 provided in an oxide film 614 on the side of a monocrystalline silicon substrate 612 serving as a supporting substrate, even when making a semiconductor substrate having a buried electrode pattern 615, steps existing before lamination can be suppressed by carrying out a simple process.

(Twenty-ninth Preferred Embodiment)

Figure 80A:
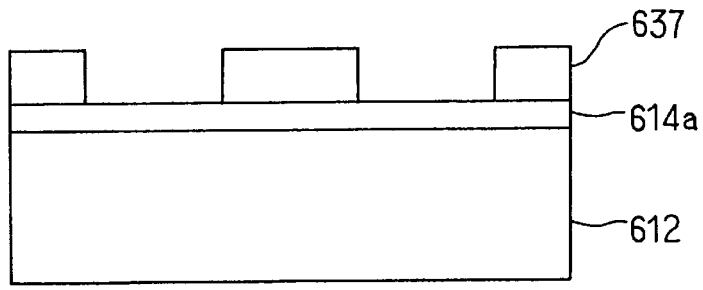
FIGS. 80A through 80C are schematic sectional views illustrating manufacturing steps according to a twenty-ninth preferred embodiment.
Figure 80B:
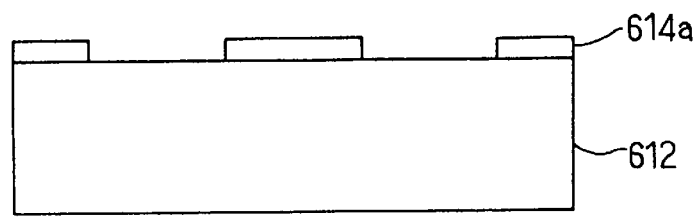
Figure 80C:
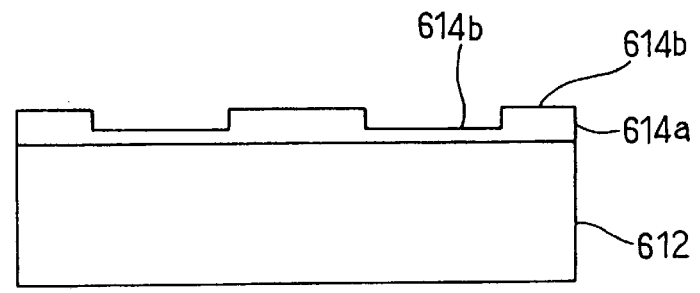

FIGS. 80A through 80C show a twenty-ninth preferred embodiment of the invention. This preferred embodiment differs from the twenty-eighth preferred embodiment in the method of forming the concavity 632 in the buried electrode concavity forming step P62. That is, first, photoresist 637 is coated on a monocrystalline silicon substrate 612 with an oxide film 614a thereon and formed to a shape corresponding with a buried electrode pattern 615 by photolithography (see FIG. 80A).

Then, the oxide film 614a left exposed by the photoresist 637 is removed by etching to expose the face of the monocrystalline silicon substrate 612. After that, the photoresist 637 is removed (FIG. 80B). Then, an oxide film 614b is formed to a predetermined thickness so as to cover the exposed parts of the monocrystalline silicon substrate 612, and a concavity 632 for a buried electrode is thereby formed (FIG. 80C).

In this preferred embodiment, by the film thickness of the oxide film 614a formed first being set to a film thickness corresponding to the depth of the concavity 632, for example 350 nm, the depth of the concavity 632 eventually formed can be made the same as in the twenty-eighth preferred embodiment.

With this twenty-ninth preferred embodiment, because, in forming the buried electrode concavity 632, the oxide film 614a on the corresponding parts is once removed and then another oxide film is formed, the controllability of the film thickness of the oxide film 614b at the bottom of the concavity 632 increases and also the depth of the concavity 632 can be set accurately.

(Thirtieth Preferred Embodiment)

Figure 81A:
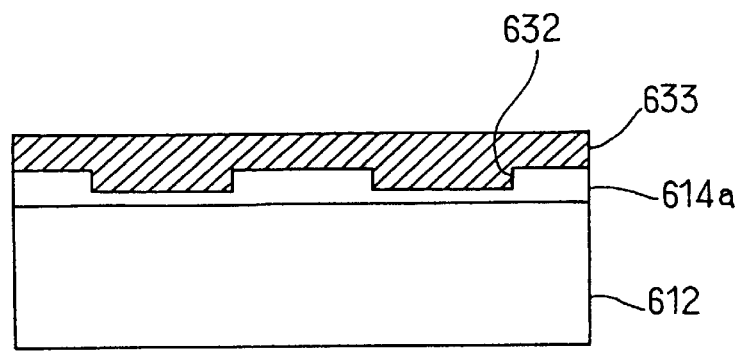
FIGS. 81A through 81C are schematic sectional views illustrating manufacturing steps according to a thirtieth preferred embodiment.
Figure 81B:
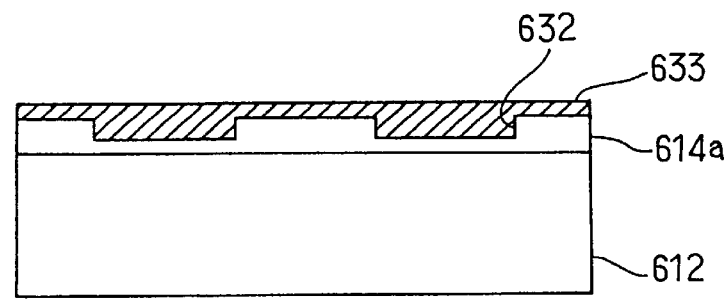
Figure 81C:
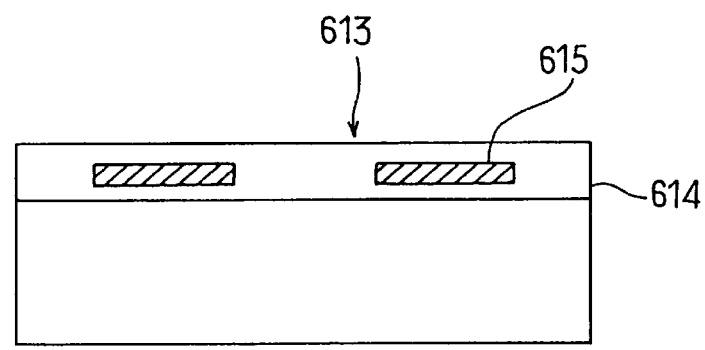
Figure 82:
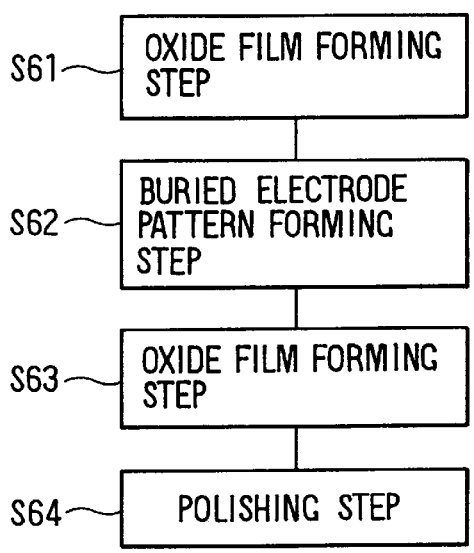
FIG. 82 is a block diagram of a manufacturing process according to a thirty-first preferred embodiment.
Figure 86:
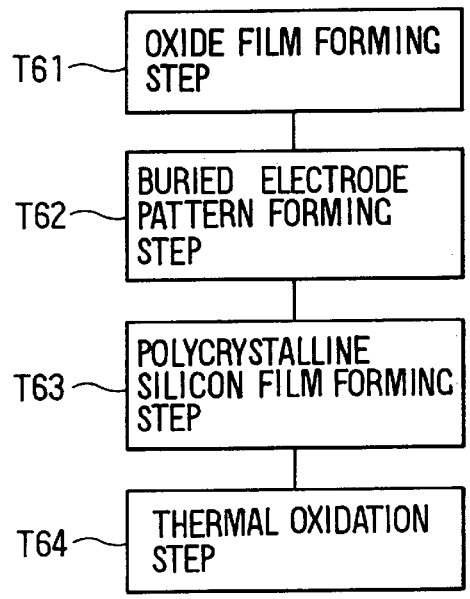
FIG. 86 is a block diagram of a manufacturing process according to a thirty-third preferred embodiment.
Figure 84:
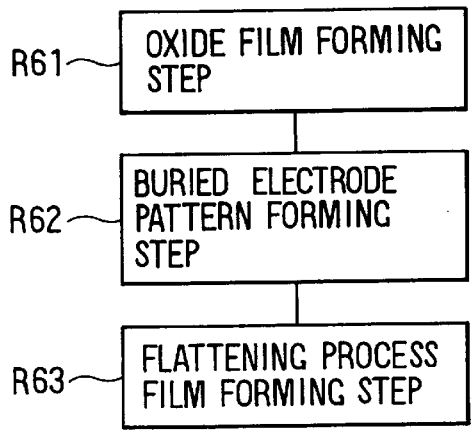
FIG. 84 is a block diagram of a manufacturing process according to a thirty-second preferred embodiment.
Figure 88:
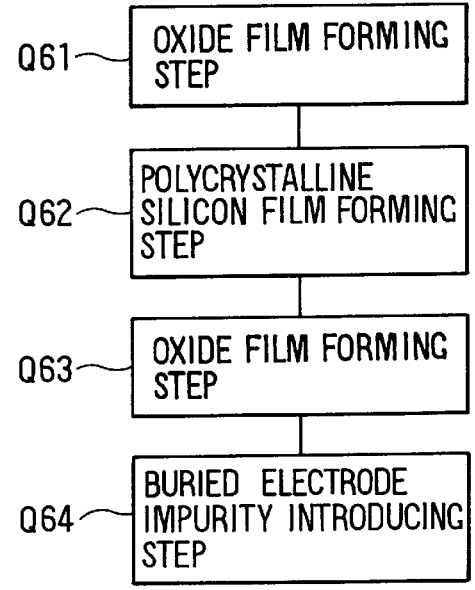
FIG. 88 is a block diagram of a manufacturing process according to a thirty-fourth preferred embodiment.

FIGS. 81A through 81C show a thirtieth preferred embodiment of the invention. This preferred embodiment differs from the twenty-eighth preferred embodiment in the processing steps leading up to the second polishing step P66 after the polysilicon film for forming a buried electrode is formed (P63). That is, in this preferred embodiment, after a polysilicon film 633 is formed (FIG. 81A), in the polishing step, polishing is not carried out until the oxide film 614a becomes exposed. In other words, after the surface is flattened, polishing is ended with a predetermined film thickness of the polysilicon film 633 remaining on the oxide film 614a (FIG. 81B). This is the same state as that shown in FIG. 76B of the twenty-eighth preferred embodiment.

After that, the polysilicon film 633 is oxidized to form an oxide film 614 integral with the oxide film 614a therebelow (FIG. 81C). By this means, it becomes possible to form a pattern structure 613 of a structure wherein a buried electrode pattern 615 is provided in an oxide film 614 with the surface of the pattern structure 613 flattened.

With this thirtieth preferred embodiment, although there is the point that control of the polishing thickness of the polysilicon film 633 becomes technologically somewhat more difficult, it is possible to form the buried electrode pattern 615 with a simplified process.

(Thirty-first Preferred Embodiment)

FIG. 82 and FIGS. 83A through 83D show a thirty-first preferred embodiment of the invention. This preferred embodiment differs from the twenty-eighth preferred embodiment in the pattern structure forming process for forming the buried electrode pattern structure, and the differing parts will now be described. In this preferred embodiment, the pattern forming process is carried out according to the flow diagram shown in FIG. 82.

Figure 83A:
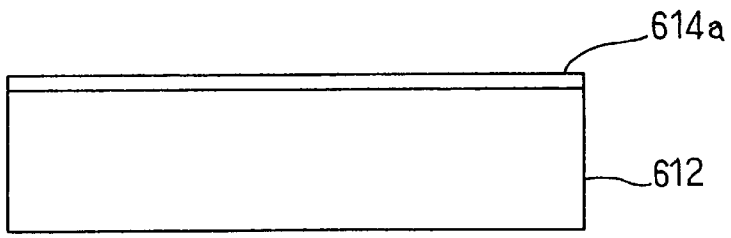
FIGS. 83A through 83D are schematic sectional views illustrating manufacturing steps of the thirty-first preferred embodiment.
Figure 83B:
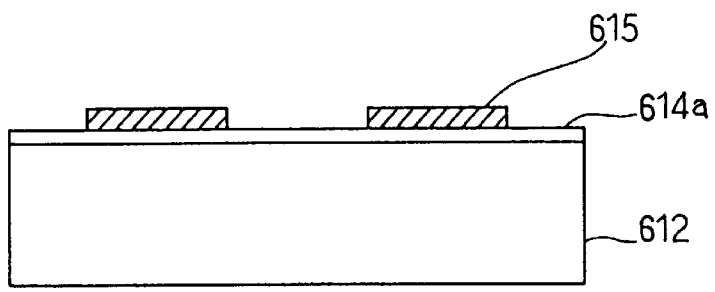
Figure 83C:
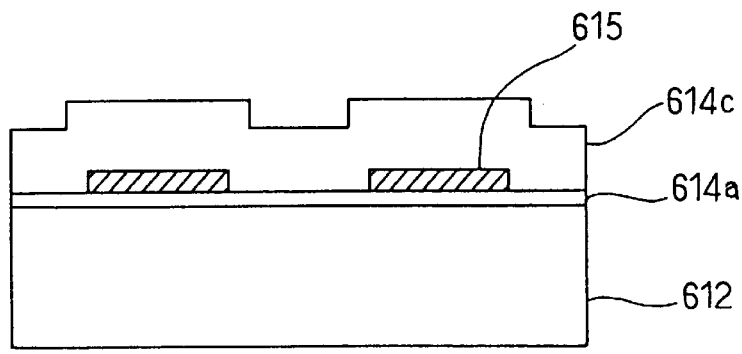

First, in an oxide film forming step S61, an oxide film 614a is formed in the same way as that described above on a monocrystalline silicon substrate 612 serving as a supporting substrate. After that, in a buried electrode pattern forming step S62, a polycrystalline silicon film to serve as a buried electrode material film is formed on the entire surface of the oxide film 614a and patterned by photolithography and etching to form a buried electrode pattern 615 (FIG. 83B).

Figure 83D:
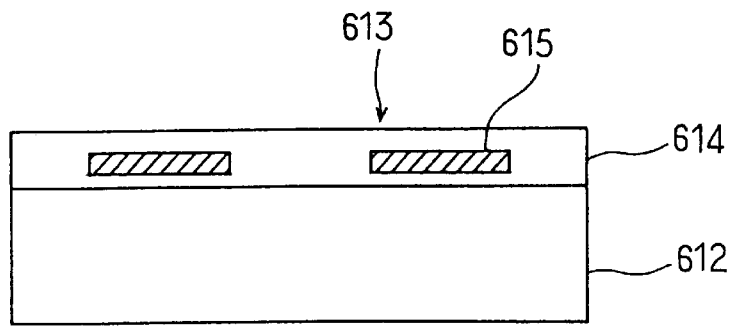

Next, in an oxide film forming step S63, an oxide film 614c of a predetermined film thickness is formed on the buried electrode pattern 615 over the entire surface of the substrate (FIG. 83C) and integrated with the oxide film 614a to bury the buried electrode pattern 615. After that, in a polishing step S64, the oxide film 614c is polished to a predetermined thickness (FIG. 83D). In this way, steps in the surface caused by the buried electrode pattern 615 are eliminated and flattening is carried out to form a pattern structure 613.

With this thirty-first preferred embodiment, because the buried electrode pattern 615 can be formed on a flat oxide film 614a by patterning, the controllability of its thickness increases. Also, because the entire surface of the substrate is flattened by the oxide film 614c formed thereafter being polished, the processing steps for forming the pattern structure can be made simple.

In this preferred embodiment, in the polishing of the polishing step S64, because there is no polishing stopper, to determine the point of time at which the predetermined film thickness has been reached, for example the time required for this polishing is measured in advance and the polishing process stopped after this time. However, since this is not directly measuring the film thickness, there is some technological difficulty in terms of controllability. To overcome this, if a polishing stopper is formed buried in the oxide film 614c in advance, the polishing process can be accurately stopped when the predetermined film thickness has been reached.

(Thirty-second Preferred Embodiment)

FIG. 84 and FIGS. 85A through 85C show a thirty-second preferred embodiment of the invention. This preferred embodiment differs from the twenty-eighth preferred embodiment in the pattern structure forming process for forming the buried electrode pattern structure, and the differing parts will now be described. In this preferred embodiment, the pattern forming process is carried out according to the flow diagram shown in FIG. 84.

Figure 85A:
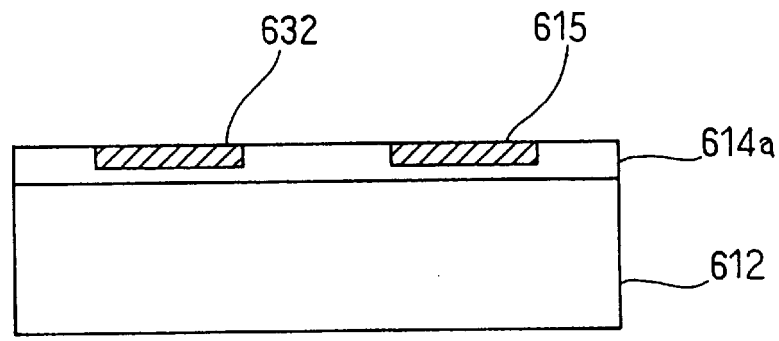
FIGS. 85A through 85C are sectional views of a SOI substrate illustrating manufacturing steps of the thirty-second preferred embodiment.

First, in an oxide film forming step R61, an oxide film 614a is formed on a monocrystalline silicon substrate 612 serving as a supporting substrate in the same way as that described above. After that, in a buried electrode pattern forming step R62, in the same way as in the twenty-eighth preferred embodiment or the twenty-ninth preferred embodiment, a polycrystalline silicon film to serve as a buried electrode material film is buried in the concavity 632 of the oxide film 614a to form a buried electrode pattern 615 (FIG. 85A).

Figure 85B:
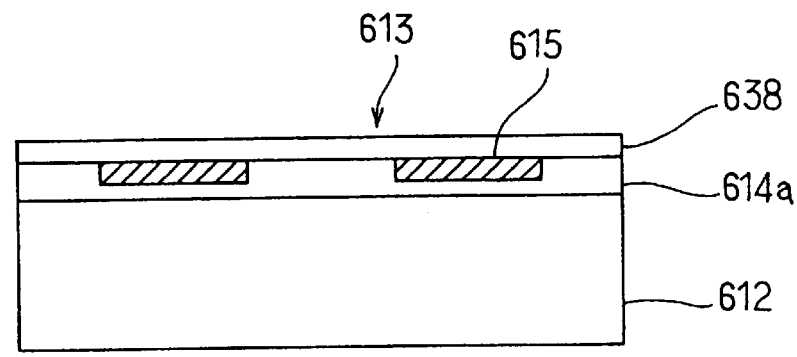
Figure 85C:
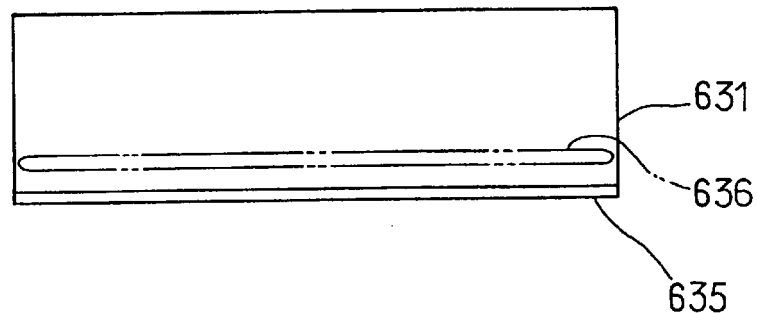

In this case, with the buried electrode pattern 615 buried in the concavity 632, because a polishing step has been carried out, it can be expected that there will be steps in the surface. To deal with this, in a flattening process film forming step R63, a flattening process film 638 is formed on the surface using a material having thermal fluidity such as BPSG (Boron-doped Phosphor Silicate Glass), PSG (Phosphor Silicate Glass) or SOG (Spin On Glass) (FIG. 85B).

By this means, it is possible to form a pattern structure 613 having a flattened surface with a buried electrode pattern 615 buried in an insulating film. After that, in a lamination step, the substrate is laminated to a monocrystalline silicon substrate 631 serving as a substrate for forming a semiconductor layer and then a detaching step and a detachment face polishing step are carried out to form a SOI substrate.

With this thirty-second preferred embodiment also, it is possible to obtain the same effects as those of the twenty-eighth preferred embodiment. Also, because the flattening process film 638 serving as the insulating film does not go through a polishing step the controllability of its film thickness is good.

In this case, the monocrystalline silicon substrate 631, to which the monocrystalline silicon substrate 612 is laminated, preferably is brought to a state wherein the oxide film 635 formed on its surface has not been entirely removed and a part thereof remains or a state wherein it has not been etched and remains intact. This is because, when a SOI substrate is being formed, its characteristics can be expected to be better when a good quality oxide film 635 formed by thermal oxidation or the like is disposed as the material of the insulating film underlying the monocrystalline silicon film serving as a semiconductor layer for device formation than when the flattening process film 638 mentioned above is so disposed directly.

(Thirty-third Preferred Embodiment)

FIG. 86 and FIGS. 87A through 87C show a thirty-third preferred embodiment of the invention. This preferred embodiment differs from the twenty-eighth preferred embodiment in its pattern structure forming process for forming a buried electrode pattern, and the differing parts will now be described. In this preferred embodiment, the pattern structure forming process is carried out according to the flow diagram shown in FIG. 86.

Figure 87A:
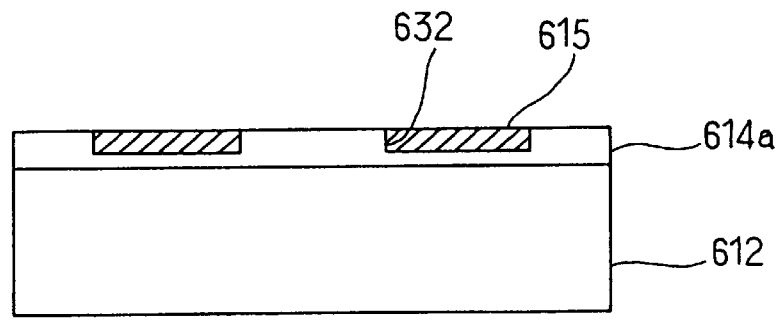
FIGS. 87A through 87C are sectional views of a SOI substrate illustrating manufacturing steps of the thirty-third preferred embodiment.

First, in an oxide film forming step T61, an oxide film 614a is formed in the same way as that described above on a monocrystalline silicon substrate 612 serving as a supporting substrate. After that, in a buried electrode pattern forming step T62, in the same way as in the twenty-eighth preferred embodiment or the twenty-ninth preferred embodiment, a polycrystalline silicon film serving as a buried electrode material is formed in a concavity 632 in the oxide film 614a to form a buried electrode pattern 615 (FIG. 87A).

Figure 87B:
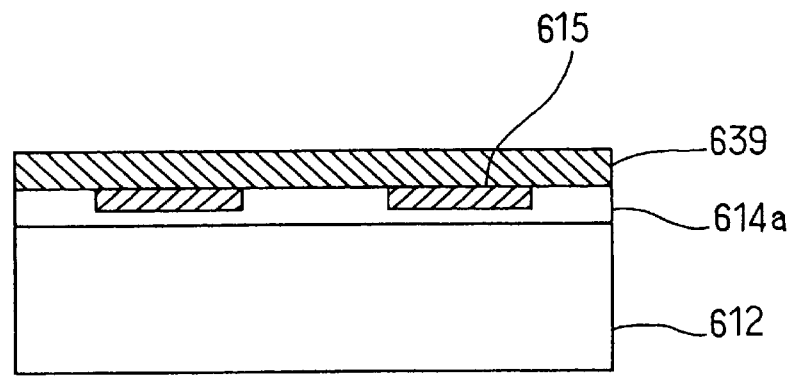

In this case, with the buried electrode pattern 615 buried in the concavity 632, in the same way as that mentioned above, it can be expected that, as a result of a polishing step being carried out, there will be steps in the surface. Then, in a polycrystalline silicon film forming step T63, a non-doped polysilicon film 639 is formed to a predetermined thickness on the surface of the substrate by a method such as LPCVD (FIG. 87B).

Figure 87C:
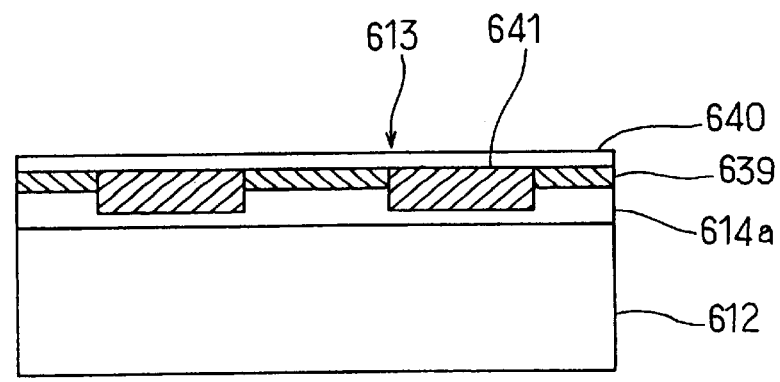

Then, in a thermal oxidation step T64, the polysilicon film 639 is thermally oxidized (FIG. 87C). In this case, the thickness of the oxide film 640 formed by the thermal oxidation is not the entire thickness of the polysilicon film 639 but rather about half of the film thickness of the polysilicon film 639 is left. At this time, because an impurity has been introduced into the polycrystalline silicon forming the buried electrode pattern 615 in advance to make it function as an electrode, in the course of the thermal oxidation, the impurity in the buried electrode pattern 615 passes by solid phase diffusion to the polysilicon film 639 side.

As a result, a buried electrode pattern 641 wherein a polycrystalline silicon film positioned as a lower layer and a part having a lower resistance than the rest of the non-doped polysilicon film 639 due to an impurity having diffused into it and functioning as a part of the buried electrode pattern are layered is formed. At this time, because regions of the polysilicon film 639 other than that into which an impurity has passed by solid phase diffusion are still non-doped, they maintain a high resistance and function as an electrically substantially non-conducting insulator.

In this case, irregularities arising on the surface of the polysilicon film 639 are flattened by polishing being carried out. Also, because irregularities arising on the oxide film 640 at the surface can be flattened by carrying out a thermal oxidation step T64, the contact quality in the lamination step which follows can be made good. Irregularities arising in the oxide film 640 at the surface can also be flattened when necessary by reflow processing or polishing.

With this thirty-third preferred embodiment, because only a surface layer portion of the polysilicon film 639 is thermally oxidized, compared to when the whole of the polysilicon film 639 formed is oxidized, the possibility of surface irregularities arising due to the thermal oxidation proceeding as far as the buried electrode pattern 615 is eliminated. Therefore, the surface of the pattern structure can be surely formed to a flat state.

(Thirty-fourth Preferred Embodiment)

FIG. 88 and FIGS. 89A through 89E show a thirty-fourth preferred embodiment of the invention. This preferred embodiment differs from the twenty-eighth preferred embodiment in its pattern structure forming process for forming a buried electrode pattern, and the differing parts will now be described. In this preferred embodiment, the pattern structure forming process is carried out according to the flow diagram shown in FIG. 88.

Figure 89A:
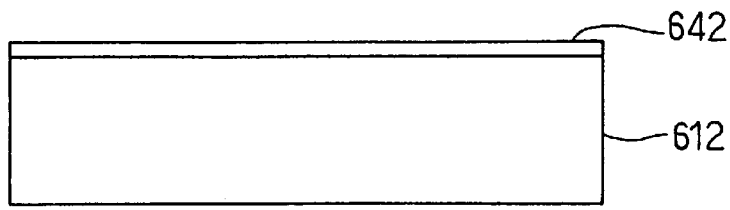
FIGS. 89A through 89E are sectional views of a SOI substrate illustrating manufacturing steps of the thirty-fourth preferred embodiment.
Figure 89B:
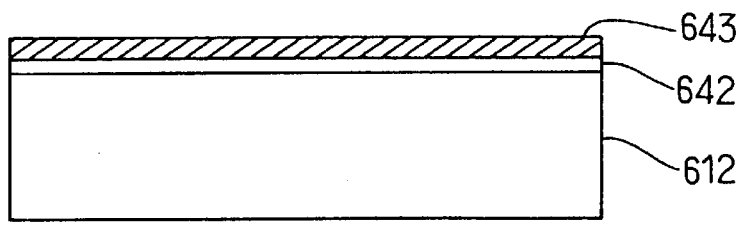

First, in an oxide film forming step Q61, an oxide film 642 is formed by thermal oxidation or CVD or the like on a monocrystalline silicon substrate 612 serving as a supporting substrate (FIG. 89A). Then, in a polycrystalline silicon film forming step Q62, a polysilicon film 643 of a predetermined film thickness is formed by LPCVD or the like on the surface of the oxide film 642 (FIG. 89B). In this case, the polysilicon film 643 is either non-doped or formed with a p-type or an n-type impurity introduced into it, and its film thickness is determined according to the film thickness of the buried electrode pattern in a range of, for example, from 0.1 µm to several micrometers. At this time, the surface of the polysilicon film 643 is preferably finished to a flat state by polishing.

Figure 89C:
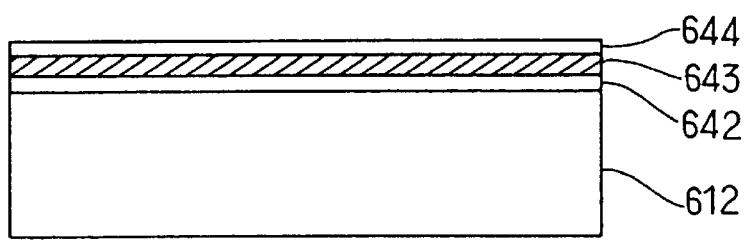

Next, in an oxide film forming step Q63, an oxide film 644 is further formed on the polysilicon film 643 to a predetermined thickness (for example from several tens of nanometers to several hundred nanometers) (FIG. 89C). The oxide film 644 can be formed by thermally oxidizing the polysilicon film 643 or can be deposited by CVD or the like.

Figure 89D:
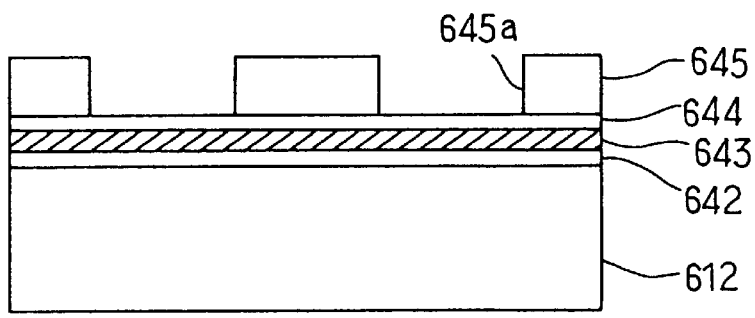
Figure 89E:
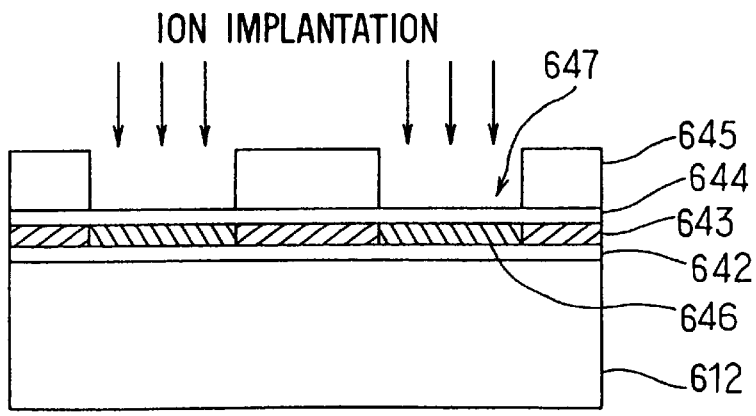

Then, in a buried electrode impurity introducing step Q64, a resist film 645 is formed in a predetermined shape on the oxide film 644 by photolithography (FIG. 89D). By this means, an opening 645a is formed in correspondence with the buried electrode pattern. After that, by carrying out ion implantation with the resist film 645 as a mask, an impurity is selectively introduced into the polysilicon film 643 to form a buried conductor pattern 646 (FIG. 89E).

When the polysilicon film 643 is non-doped, the implanted ions are of a predetermined impurity element. When the polysilicon film 643 has been doped with an impurity, the implanted ions are of an impurity element (a p-type or n-type impurity) of the opposite conductive type to the conductive type (p-type or n-type) of that impurity. The dose is of such a level that the resistivity of the polysilicon film 643 is sufficiently low, and preferably is a high concentration of, for example, over $3 \times 10^{15}$ atoms/cm$^2$.

In the step described above, the oxide film 644 performs the function of preventing damage and contamination caused by the ion implantation from spreading to the polysilicon film 643. Thereafter, by the resist film 645 being removed, a pattern structure 647 is formed on the monocrystalline silicon substrate 612.

With this thirty-fourth preferred embodiment, because the buried conductor pattern 646 is formed by successively layering the oxide film 642, the polysilicon film 643 and the oxide film 644 on the monocrystalline silicon substrate 612 and selectively introducing an impurity into the polysilicon film 643, steps and irregularities in the surface arising when lamination is carried out can be avoided. Also, the buried conductor pattern 646 can be formed simply and surely.

In the case described above, resist film 645 was used as the mask in the ion implantation step, but instead of this the oxide film 644 may be patterned and made to function as the mask. In this case, the film thickness of the oxide film 644 must be set so that it will function as a mask.

(Thirty-fifth Preferred Embodiment)

Figure 90A:
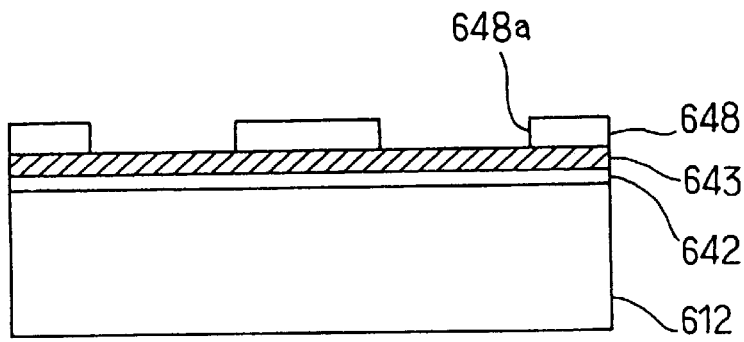
FIGS. 90A and 90B are sectional views of a SOI substrate illustrating a thirty-fifth preferred embodiment.
Figure 90B:
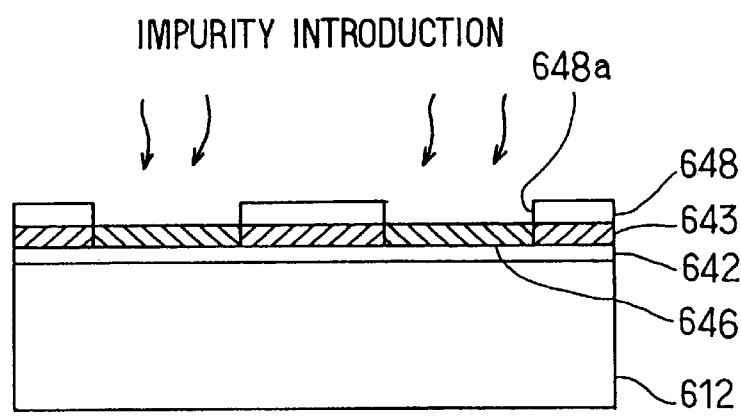

FIGS. 90A and 90B show a thirty-fifth preferred embodiment of the invention. This preferred embodiment differs from the thirty-fourth preferred embodiment in its impurity introduction method. That is, instead of the oxide film 644 in the thirty-fourth preferred embodiment described above, an oxide film 648 having a film thickness sufficient for it to function as a mask on impurity introduction is formed by thermal oxidation of the polysilicon film 643 or by CVD or the like. The part of the oxide film 648 corresponding to the buried conductor pattern 646 is then removed by etching so as to form an opening 648a (FIG. 90A). This etching can be carried out, for example, by wet etching using fluoric acid solution or dry etching using CF$_4$ gas or the like.

After that, in a buried electrode impurity introducing step Q64, an impurity is introduced into the polysilicon film 643 through the opening 648a formed in the oxide film 648. For example, when the polysilicon film 643 is non-doped or is p-type, an impurity (phosphorus) is introduced (diffused) through the surface of the polysilicon film 643 by a phosphorus deposition process, namely heat treatment carried out in an H$_3$PO$_5$ gas atmosphere. As a result, the resistivity of the polysilicon film 643 falls and it functions as a buried conductor pattern 646.

When the polysilicon film 643 is n-type or is non-doped, the buried conductor pattern 646 can be formed by introducing a p-type impurity into the polysilicon film 643 in the same way.

Thereafter, the oxide film 648 used as a mask is removed by etching. Then, by an oxide film being formed on the surface again by thermal oxidation or CVD or the like, a pattern structure 647 having the buried conductor pattern 646 inside it and having a flattened surface is formed.

With this thirty-fifth preferred embodiment, in the same way as in the thirty-fourth preferred embodiment it is possible to form a pattern structure 647 having a buried conductor pattern 646 formed inside it.

The aspect of the invention illustrated in the twenty-eight through thirty-fifth preferred embodiments described above is not limited to these preferred embodiments, and for example the following modifications and extensions are possible.

For the buried electrode material, a metal material such as aluminum (Al), copper (Cu) or tungsten (W) can be used. In particular, tungsten is convenient to use, because it has a high melting point and it reduces the temperature restrictions on heat treatment carried out in subsequent processing.

Next, thirty-sixth and thirty-seventh preferred embodiments of the invention will be described. Before the description of these preferred embodiments, an aspect of the invention illustrated in them will first be briefly explained. After that, the preferred embodiments will be described in detail.

It is an object of the aspect of the invention illustrated in the thirty-sixth and thirty-seventh preferred embodiments to provide a semiconductor substrate manufacturing method with which it is possible by going through a relatively simple process to form a semiconductor layer having a buried region on which a voltage can be impressed though an insulating film.

In this aspect of the invention, in a buried region forming step, a buried region is formed by introducing an impurity into a semiconductor substrate serving as a supporting substrate. Next, in an ion-implanted layer forming step an ion-implanted layer for detachment use is formed at a predetermined depth in a substrate for forming a semiconductor layer. Then, in a laminating step, these substrates are laminated together and, in a detaching step, heat treatment is carried out to effect detachment of the substrate for a semiconductor layer at the ion-implanted layer, whereby a semiconductor layer is formed on the semiconductor substrate serving as a supporting substrate. That is, by a simple step of forming a buried region by introducing an impurity into the semiconductor substrate as a supporting substrate being added, a construction wherein the buried region can be used as a buried electrode or as a buried interconnection can be obtained.

In the above-mentioned buried region forming step, the impurity can be introduced into the semiconductor substrate as a supporting substrate by ion implantation. Therefore, the buried region can be formed easily and with good accuracy, and the manufacturing process as a whole can be made simple.

In the buried region forming step, introduction of the impurity can be carried out with an oxide film formed on the surface of the semiconductor substrate as a supporting substrate. In this case, when the impurity is introduced by a method such as ion implantation, it is possible to prevent the surface of the semiconductor substrate as a supporting substrate from being directly damaged.

For the laminating step, the oxide film formed on the semiconductor substrate as a supporting substrate in the buried region forming step may be left as it is. Then, it is possible to proceed to the laminating step with the surface of the semiconductor substrate as a supporting substrate protected and not exposed. Furthermore, the oxide film can be used as a gate oxide film with respect to the semiconductor layer of the buried region.

The buried region forming step can be made up of an oxide film forming step, a mask forming step, an impurity ion implantation step and a mask removing step. In this way, the process of introducing the impurity can be carried out simply and in a short time.

In the buried region forming step, an oxide film is preferably formed by thermal oxidation of the semiconductor substrate as a supporting substrate. In this way, it is possible to obtain an oxide film which is dense and good quality and of a uniform film thickness. By using this oxide film as a gate oxide film with respect to the buried region, a device having good characteristics can be formed.

Disturbances in crystallinity arising when, in the buried region forming step, an impurity is introduced into the semiconductor substrate as a supporting substrate using ion implantation can be recrystallized by carrying out a heat treatment step. Therefore, if a monocrystalline substrate is used as the semiconductor substrate as a supporting substrate, a monocrystalline impurity region can be provided as the buried region and the resistance of the buried region thereby made low and the device characteristics improved.

The above-mentioned heat treatment step is preferably carried out after the laminating step. By this means, it is possible for this heat treatment to be carried out along with the heat treatment of the detaching step. In this way, it is possible to repair disturbances in the crystal structure of the buried region and it becomes unnecessary to provide a heat treatment step separately.

In the buried region forming step, as the impurity introduced into the buried region, an impurity which has a conductive type different to the conductive type of the region into which it is being introduced is preferably used. When this is done, when an impurity is introduced directly into the semiconductor substrate as a supporting substrate, a buried region of the opposite conductive type to the conductive type of the semiconductor substrate as a supporting substrate can be formed. And when an impurity-diffused region of a different conductive type to that of the semiconductor substrate has been formed therein in advance, by introducing an impurity of the opposite conductive type to that, i.e. of the same conductive type as the semiconductor substrate, a buried region of the opposite conductive types can be formed. In this way, a construction wherein it is possible to impress a voltage on the buried region independently is obtained and it is possible to realize the function of a buried gate electrode.

From the detaching step onward, the heat treatment steps are preferably carried out in an oxidizing atmosphere. Then, because the semiconductor layer at the interface part between the semiconductor layer and the oxide film consequently is oxidized, when the interface part between the semiconductor layer and the oxide film constitutes a lamination face at the time of lamination, a thermal oxide film newly formed causes the interface with the semiconductor layer to move to the interior of the semiconductor layer side. As a result, it is possible to achieve an improvement in the characteristics of the interface part and improve the characteristics of the gate oxide film with respect to the semiconductor layer of the buried region.

(Thirty-sixth Preferred Embodiment)

A thirty-sixth preferred embodiment of the invention will now be described with reference to FIG. 93 through FIG. 96.

Figure 95A:
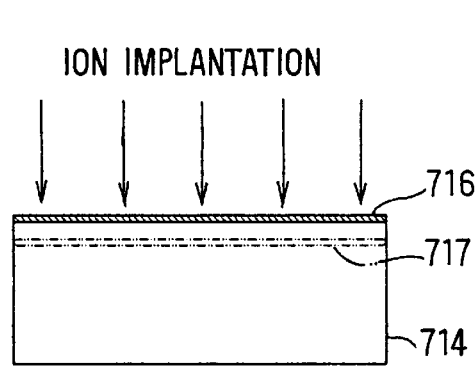
FIGS. 95A through 95C are further schematic sectional views illustrating the manufacturing steps continuing from FIG. 94D.
Figure 95B:
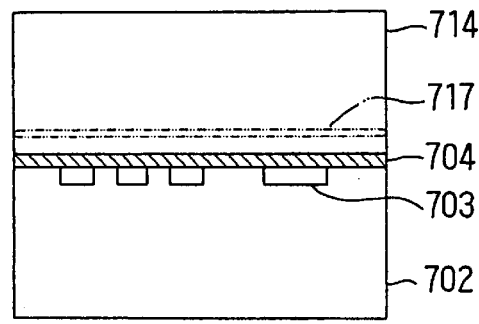
Figure 95C:
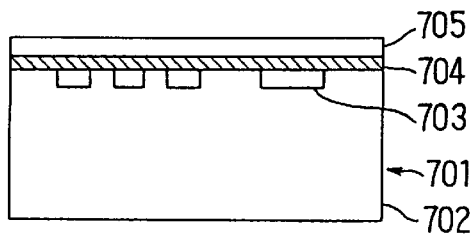

FIG. 95C is a schematic sectional view of a SOI semiconductor substrate 701 formed using a manufacturing method according to the present preferred embodiment. In this SOI substrate 701, a buried electrode pattern 703 constituting a buried region is formed at the surface of a monocrystalline silicon substrate 702 serving as a supporting substrate. In this case, the monocrystalline silicon substrate 702 is, for example, made of p-type monocrystalline silicon of a predetermined resistivity and has a plane orientation of <100>. The buried electrode pattern 703 is formed by an n-type impurity being introduced by ion implantation.

A silicon oxide film 704 of a predetermined thickness formed by thermal oxidation is provided on this monocrystalline silicon substrate 702. A monocrystalline silicon thin film 705 to serve as a semiconductor layer is formed on the silicon oxide film 704. The silicon oxide film 704 performs the function of a gate oxide film with respect to the buried electrode pattern 703.

Figure 96:
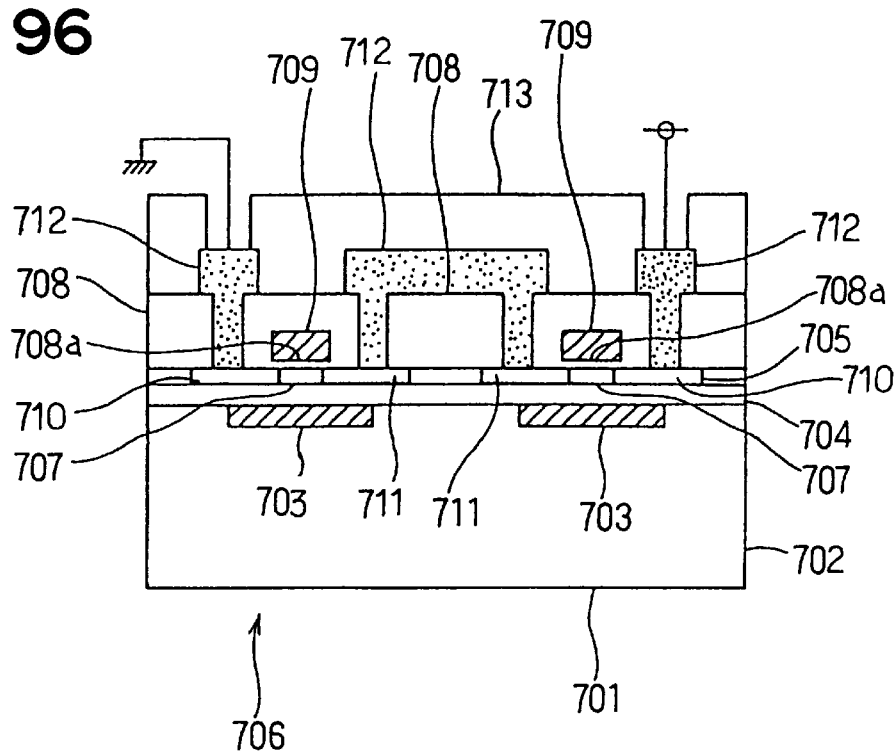
FIG. 96 is a schematic sectional view of a semiconductor device formed using the SOI substrate.

The SOI substrate 701 formed in this way is, for example, used to form a semiconductor device 706 of the kind shown in FIG. 96. That is, in this semiconductor device 706, in a device formation region formed as an island in the monocrystalline silicon thin film 705 of the SOI substrate 701 which is insulated and separated, a channel region 707 is formed by, for example, impurity diffusion. A gate oxide film 708a is formed on the channel region 707 and a gate electrode 709 is formed thereon. The whole is then covered with an oxide film 708, after which metal electrodes 712 made of aluminum or the like are formed on a source terminal 710 and a drain terminal 711 positioned on each side of the channel region 707 and on the gate electrode 709 and a protective film 713 is formed on the other parts.

Also, the buried electrode pattern 703 formed at the surface of the monocrystalline silicon substrate 702 makes ohmic contact with another part (not shown) so that a voltage can be impressed on it from outside. By forming this kind of semiconductor device 706, it is possible to form a device of good quality wherein the device formation region including the channel region 707 is insulated and isolated. Further, using the buried electrode pattern 703, a construction having the additional function due to a back gate electrode can be realized. By this means, it is possible to vary the threshold value of the control voltage impressed on the gate electrode 709 and improve the control characteristics of the device.

Figure 93:
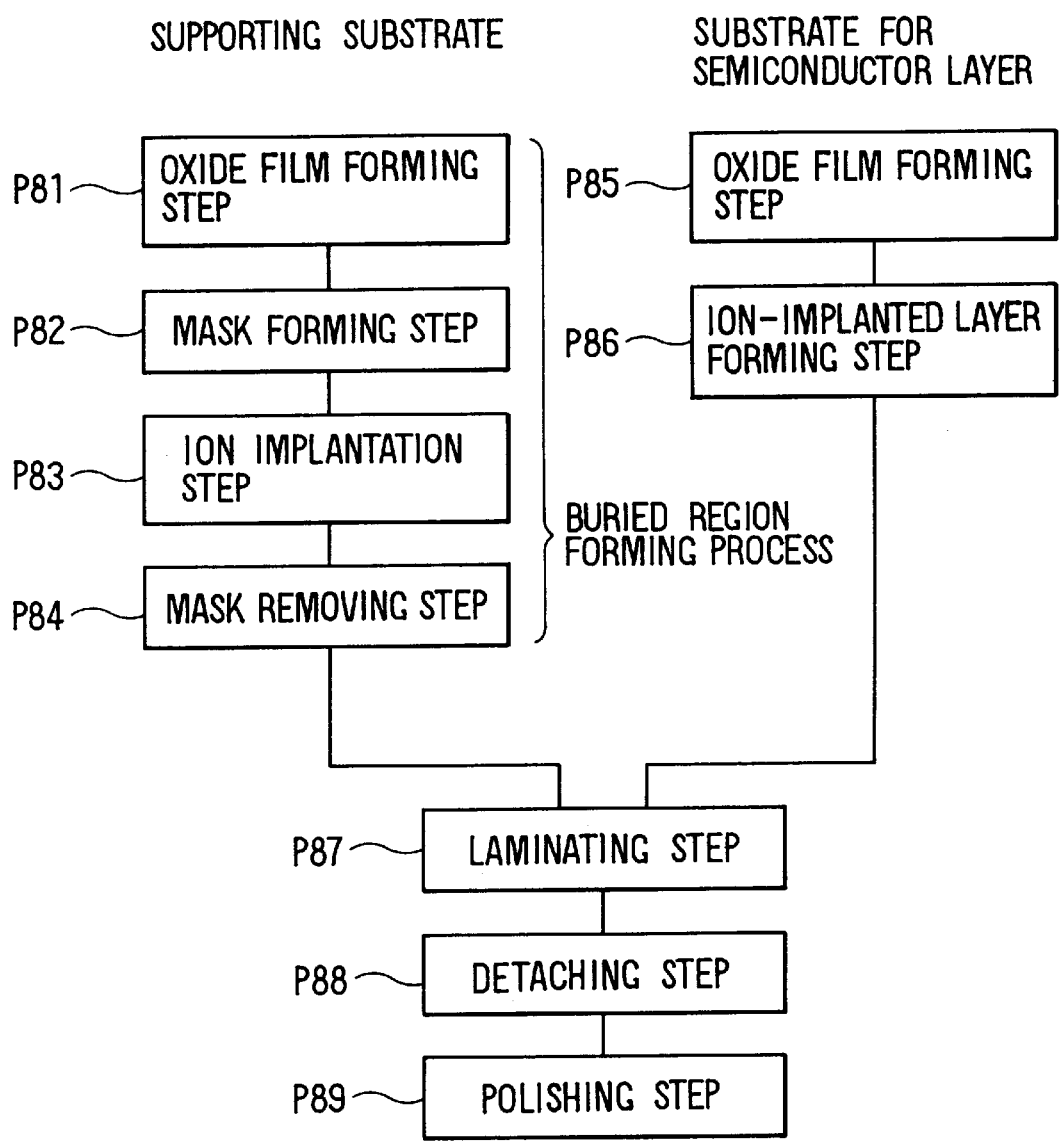
FIG. 93 is a block diagram of a SOI substrate manufacturing process according to a thirty-sixth preferred embodiment.

A method for manufacturing a SOI substrate 701 will now be described with reference to FIG. 93 through FIGS. 95A to 95C. FIG. 93 is a block diagram of a process for manufacturing the SOI substrate 701, and this manufacturing process will be explained in the description below.

First, four steps provided as a buried region forming process, namely an oxide film forming step P81, a mask forming step P82, an impurity ion implantation step P83 and a mask removing step P84 are carried out on a monocrystalline silicon substrate 702 serving as a supporting substrate. Then, an oxide film forming step P85 and an ion-implanted layer forming step P86 are carried out on a monocrystalline silicon substrate 714 serving as a substrate for forming a semiconductor layer. After that, a laminating step P87, a detaching step P88 and a polishing step P89 are carried out on the monocrystalline silicon substrate 702 and the monocrystalline silicon substrate 714 to obtain a SOI semiconductor substrate 701.

The monocrystalline silicon substrate 702 is one into which a p-type impurity has been introduced as described above, and at least the face thereof on which an oxide film 704 is to be formed has a mirror finish. In the buried region forming process, first, in the oxide film forming step P81, heat treatment is carried out on this monocrystalline silicon substrate 702 to form an oxide film 704 of a predetermined film thickness (for example in a range of 10 nm to 100 nm) (see FIG. 94A). This oxide film 704 functions as a film for preventing contamination by heavy metals during the implantation of impurity ions in a later step.

Figure 94A:
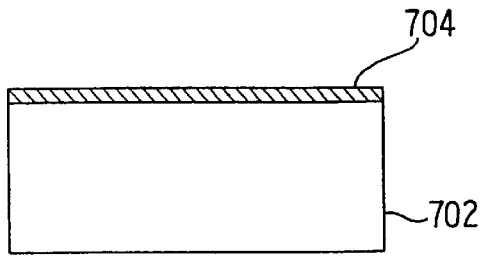
FIGS. 94A through 94D are schematic sectional views illustrating manufacturing steps of the thirty-six preferred embodiment.
Figure 94B:
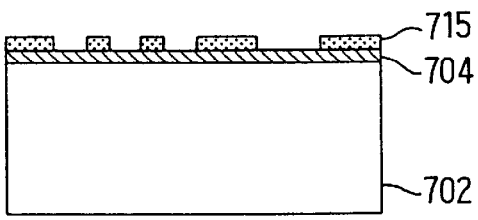

Then, in the mask forming step P82, by photolithography, a photoresist film 715 is patterned on the surface of the monocrystalline silicon substrate 702 on which the oxide film 704 is formed. The pattern of this photoresist film 715 is set to a thickness such that it functions as a mask in the impurity ion implantation step P83 to follow (FIG. 94B).

Figure 94C:
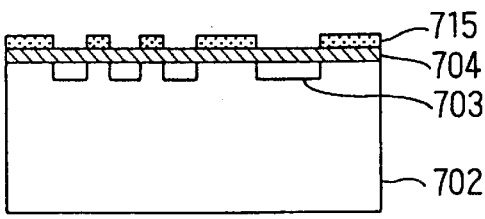

Then, in the impurity ion implantation step P83, with the photoresist film 715 as a mask, As (arsenic) ions constituting an impurity are accelerated with a predetermined energy and implanted at a predetermined dose into the monocrystalline silicon substrate 702. Because these As ions act on silicon as an n-type impurity, the region of the substrate into which they are implanted is formed as an n-type region. In this way, a buried electrode pattern 703 constituting a buried region is formed at the surface of the monocrystalline silicon substrate 702 immediately below the oxide film 704 (FIG. 94C).

The implanted impurity ion type is not limited to As. When the ions are to function as an n-type impurity, phosphorus (P) ions can also be used. When the substrate is n-type, boron (B) ions constituting a p-type impurity can be used. Other ion types can also be used as necessary.

Figure 94D:
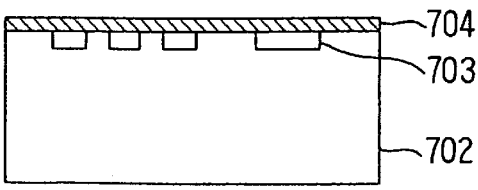

At this point in time, the lattice arrangement of the silicon in the buried electrode pattern 703 part has been disturbed by the implanted As ions, and recrystallization is carried out in a subsequent heat treatment. Next, in the mask removing step P84, the photoresist film 715 used as a mask is removed by a known method (FIG. 94D). The process then proceeds to the laminating step P87 with the oxide film 704 left as it is.

For the monocrystalline silicon substrate 714, which is the substrate for forming a semiconductor layer, a substrate matched to the characteristics of the monocrystalline silicon thin film 705, which is the semiconductor layer that it is to be formed, is used. At least the face of the monocrystalline silicon substrate 714 on the side thereof on which an oxide film 716 is to be formed has a mirror finish.

First, in the oxide film forming step P85, an oxide film 716 is formed by thermal oxidation on the surface of the monocrystalline silicon substrate 714. This oxide film 716 is provided with the object of preventing contamination caused by the entry of heavy metals into the substrate and reducing damage to the substrate in the ion-implanted layer forming step P86 to follow.

In the ion-implanted layer forming step P86, hydrogen ions (protons) or ions of a noble gas are implanted (FIG. 95A). In this case, the dose is set over, for example, $1 \times 10^{16}$ atoms/cm$^2$ and preferably over $5 \times 10^{16}$ atoms/cm$^2$, and a high-concentration ion-implanted layer 717 is thereby formed. The implantation depth at this time is adjusted by control of the ion acceleration voltage to a depth corresponding to the film thickness of the monocrystalline silicon thin film 705 to be formed. Specifically, the acceleration voltage is set so that the implantation depth is in a range of 0.1 μm to 2 μm.

After that, a surface layer portion of the oxide film 716 is removed by wet etching (for example using a fluoric acid etching liquid) or dry etching. At this time, it is also possible to etch the whole of the oxide film 716, but here etching is carried out so as to leave part of it. It is also possible for the oxide film 716 to be left without being etched at all.

Then, the laminating step P87 is carried out on the two monocrystalline silicon substrates 702 and 714 prepared as described above. First, hydrophilicizing treatment is carried out on each of the monocrystalline silicon substrates 702 and 714. In this hydrophilicizing treatment, the substrates are washed in a solution made by mixing for example sulfuric acid ($H_2SO_4$) and hydrogen peroxide water ($H_2O_2$) in the ratio 4:1 held at 90° C. to 120° C. and then washed with pure water, after which the amounts of water adsorbed on the substrate surfaces are controlled by spin drying.

After that, the face of the monocrystalline silicon substrate 702 on the buried electrode pattern 703 side thereof and the face of the monocrystalline silicon substrate 714 on the ion-implanted layer 717 side thereof are laminated together in intimate contact with each other (FIG. 95B). As a result, the two monocrystalline silicon substrates 702 and 714 are directly bonded together by hydrogen bonding of silanol radicals formed on their surfaces and water molecules adsorbed onto their surfaces.

After that, the detaching step P88 is carried out. In the detaching step P88, heat treatment is carried out divided into two stages. These are a first heat treatment for making a detachment phenomenon occur at the high-concentration ion-implanted layer 717 and a second heat treatment carried out to raise the strength with which the bonding interface are bonded together. In the first heat treatment, on the ion-implanted layer 717 implanted with hydrogen ions, the heat treatment is carried out at a temperature in a range of 400° C. to 600° C. and preferably at about 500° C. By this means, a detachment phenomenon is made to occur at the ion-implanted layer 717 and the monocrystalline silicon substrate 714 detaches from the monocrystalline silicon substrate 702, leaving on the monocrystalline silicon substrate 702 side a monocrystalline silicon thin film 705 to serve as a semiconductor layer, whereby a SOI structure is obtained. In this state, minute steps (roughness) of from a few nanometers to several tens of nanometers in size have formed at the detachment face and a defective region created in the ion implantation step remains at the surface.

Next, in the second heat treatment, a high-temperature heat treatment is carried out in a nitrogen atmosphere at, for example, 1000° C. to 1300° C. and preferably 1100° C. and the bond strength of the bonding interface is thereby raised. As a result of this, a dehydration and condensation reaction occurs at the bond face part, and the faces become bonded in a firmer state. Also, in this heat treatment, crystal disturbances in the buried electrode pattern 703 formed by ion implantation in the monocrystalline silicon substrate 702 can be rearranged and epitaxial growth induced so that the buried electrode pattern 703 region becomes monocrystalline.

Also, in the second heat treatment, by heat treatment being carried out for a predetermined time in an oxidizing atmosphere (for example in an oxygen atmosphere) changed from the nitrogen atmosphere, the surface side of the monocrystalline silicon thin film 705 and the interface side thereof with the oxide film 704 are thermally oxidized to form thin oxide films. By this means, on the surface side of the monocrystalline silicon thin film 705, an oxide film is formed so that the minute steps caused by the detachment are moderated. On the interface side of the monocrystalline silicon thin film 705 with the oxide film 704, the interface between silicon and an oxide film having been the bonding interface at the time of the lamination becomes an interface between an oxide film formed by thermal oxidation of the monocrystalline silicon thin film 705 and silicon part thereof. As a result, the characteristics of the interface can be improved. When necessary, this second heat treatment can be carried out entirely in an oxidizing atmosphere.

After that, the oxide film formed on the surface of the monocrystalline silicon thin film 705 is removed by wet etching using an etching solvent such as fluoric acid. Then, in the polishing step P89, polishing is carried out so that minute steps remaining on the detachment face are eliminated and the film thickness of the monocrystalline silicon thin film 705 is flattened to a predetermined film thickness. Therefore, a final finished surface is formed and a SOI substrate 701 is obtained (FIG. 95C). With this method wherein an oxide film is formed on the surface of the monocrystalline silicon thin film 705 and then removed by etching before polishing is carried out, compared to when the detachment face is flattened by polishing alone, the amount of cut of the polishing can be reduced and the uniformity of the film thickness of the monocrystalline silicon thin film 705 can thereby be raised.

In the course of forming a SOI substrate 701 as described above, when the buried electrode pattern 703 is formed as the buried region, its dimensions must be set according to the dimensions finally required with some variation being anticipated. In other words, for example, after an impurity is introduced into the monocrystalline silicon substrate 702 by ion implantation, because thermal diffusion in the depth direction and the cross direction proceeds as the various heat treatments are carried out, the buried electrode pattern 703 may be formed larger than the dimensions of the mask. Therefore, when this variation is of a level such that it cannot be ignored in its relationship with integration density and so on in device formation it must be taken into account.

Also, the selection of the resistivity of the monocrystalline silicon substrate 702 and the dimensions of the buried electrode pattern 703 must be set taking into account the width of a depletion layer which spreads when a bias voltage is impressed on the buried electrode pattern 703. That is, when the resistivity of the monocrystalline silicon substrate 702 is high, i.e. when its impurity concentration is low, because the depletion layer tends to spread around the buried electrode pattern 703, this point must be considered when setting the pattern width. Conversely, when the resistivity of the monocrystalline silicon substrate 702 can be set low, because the width of spread of the depletion layer of the buried electrode pattern 703 is narrow, the design freedom increases and it is possible to raise the integration density.

With this preferred embodiment, because a buried electrode pattern 703 is formed as an impurity-diffused region at the surface of a monocrystalline silicon substrate 702 serving as a supporting substrate, a construction wherein a buried region is provided in the structure of a semiconductor substrate having a SOI structure can be formed simply and cheaply.

Also, in the case described above, because the buried electrode pattern 703 is formed by ion implantation of an impurity and recrystallization is performed in the heat treatment of the subsequent detaching step P88, the buried electrode pattern 703 can be formed after the oxide film 704 is formed and can be formed without a heat treatment step being newly added.

Also, in the heat treatment of this detaching step P88, thermal oxidation treatment is carried out for a predetermined time in an oxidizing atmosphere so that a part of the monocrystalline silicon thin film 705 formed is thermally oxidized into a thermal oxide film. As a result, the interface between the silicon and the oxide film can be shifted from a mere lamination face and its quality thereby made good.

(Thirty-seventh Preferred Embodiment)

FIGS. 97A through 97D show a thirty-seventh preferred embodiment of the invention. This preferred embodiment differs from the thirty-sixth preferred embodiment described above in that a well region is formed in the monocrystalline silicon substrate 702 serving as a supporting substrate in which a buried region is to be formed and the buried region is formed in this well region. This is effective, for example, when both a region doped with an n-type impurity and a region doped with a p-type impurity are to be formed as a buried electrode pattern.

Figure 97A:
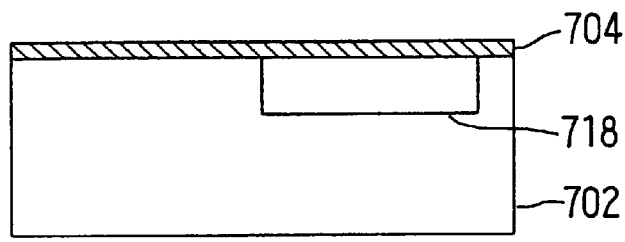
FIGS. 97A through 97D are schematic sectional views illustrating manufacturing steps according to a thirty-seventh preferred embodiment.
Figure 97B:
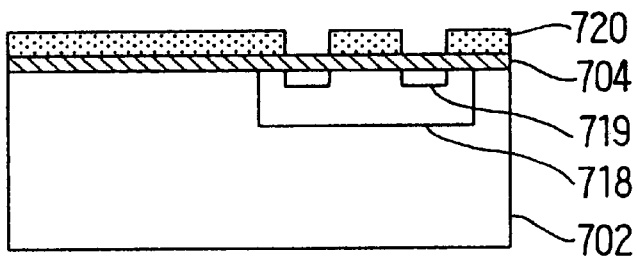

That is, in a monocrystalline silicon substrate 702 as in the thirty-sixth preferred embodiment, an n-type well region 718 formed by impurity diffusion is provided in advance (see FIG. 97A). In this case, the n-type well region 718 may be formed by introducing an n-type impurity by ion implantation with an oxide film 704 already formed on the monocrystalline silicon substrate 702 or the oxide film 704 may be formed after an n-type impurity is introduced by thermal diffusion to form the n-type well region 718.

Next, to introduce a p-type impurity by ion implantation into a buried electrode pattern 719 formed in the n-type well region 718 as a buried region, a photoresist film 720 is patterned to form a mask with an opening of a predetermined shape over the n-type well region 718. Then, a p-type impurity such as boron (B) is introduced by ion implantation to form the buried electrode pattern 719 (FIG. 97B), after which the photoresist film 720 is removed.

Figure 97C:
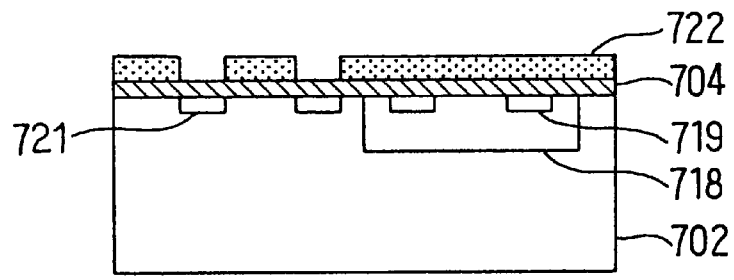
Figure 97D:
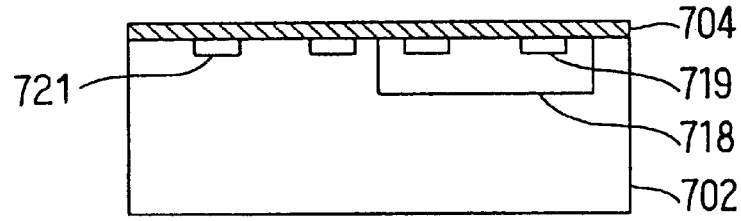

In the same way, to introduce an n-type impurity by ion implantation into a buried electrode pattern 721 to constitute a buried region formed in a part of the monocrystalline silicon substrate 702 other than the n-type well region 718, a photoresist film 722 is newly patterned to form a mask having an opening of a predetermined shape over a part other than the n-type well region 718 (FIG. 97C). Then, an n-type impurity such as arsenic or phosphorus is introduced by ion implantation to form a buried electrode pattern 721, after which the photoresist film 722 is removed (FIG. 97D).

When the buried electrode patterns 719, 721 have thus been formed, thereafter, in the same way as in the thirty-sixth preferred embodiment an ion-implanted layer 717 is formed in a monocrystalline silicon substrate 714 serving as a substrate for a forming semiconductor layer. Then, a semiconductor substrate is obtained by carrying out the laminating step P87, the detaching step P88 and the polishing step P89.

With this thirty-seventh preferred embodiment, by preforming in a monocrystalline silicon substrate 702 a well region 718 of a different conductive type from that of the substrate, it is possible to form a p-type buried electrode pattern 719 in addition to a buried electrode pattern 721 constituting a buried region. In this way the buried electrode patterns 719, 721 can be formed by going through a simple manufacturing process and it is possible to increase design freedom and expand the range of applications to which the device can be applied.

The aspect of the invention illustrated in the thirty-sixth and thirty-seventh preferred embodiments described above is not limited to these preferred embodiments, and for example the following modifications and extensions are possible.

Although the buried electrode pattern 703 was formed by an impurity being introduced into the monocrystalline silicon substrate 702 serving as a supporting substrate by ion implantation, instead of this, for example the impurity can be introduced by a method such as thermal diffusion.

To improve the state of the interface between the monocrystalline silicon thin film 705 and the oxide film 704, for example the following steps may be carried out. First, after the ion-implanted layer 717 is formed in the monocrystalline silicon substrate 714 as the semiconductor substrate for a semiconductor layer, the oxide film 716 formed on the surface is removed. Then, thermal oxidation is carried out again at a temperature low enough not to cause detachment at the ion-implanted layer 717, whereby a good quality thin silicon oxide film of several tens of nanometers in thickness is formed.

Or, instead of the above, before or after the formation of the ion-implanted layer 717, oxygen ions are implanted into the monocrystalline silicon substrate 714 or it is treated by being exposed to oxygen plasma. Then, after the laminating step P87, by means of the second heat treatment carried out at a high temperature in the detaching step P88, the bond between the monocrystalline silicon thin film 705 formed by lamination and the substrate side is strengthened and part of the monocrystalline silicon thin film 705 is made into an oxide film and the quality of the interface is thereby made good.

Next, thirty-eighth through forty-second preferred embodiments of the invention will be described. Before the description of these preferred embodiments, an aspect of the invention illustrated in them will first be briefly explained. After that, the preferred embodiments will be described in detail.

It is an object of the aspect of the invention illustrated in the thirty-eighth through forty-second preferred embodiments to provide a semiconductor substrate and a method for manufacturing the same with which it is possible in a construction wherein a semiconductor layer is provided on a supporting substrate in an insulated state to provide a conductive layer as a buried electrode pattern by going through a relatively simple process and with which the controllability of the film thickness of the semiconductor layer formed thereon can be raised.

According to this aspect of the invention, at least one conductive layer is formed between a supporting substrate and a semiconductor layer for device formation formed in an insulated state on the supporting substrate, the conductive layer being insulated from the supporting substrate and the semiconductor layer. When a conductive layer is provided over the whole surface of the supporting substrate in this way, irregularities of the kind that are created when a pattern is formed do not arise. Therefore, the controllability of the film thickness of a semiconductor layer formed thereon can be raised. Also, the conductive layer can be used as a buried electrode capable of having an electrical action on the semiconductor layer. As a result, a semiconductor component of a construction wherein semiconductor devices formed in a semiconductor layer are controlled by buried electrodes can be formed simply.

The conductive layer can be formed as multiple thin layer made up of a conductive film with insulating films above and below it. By this means, even when the supporting substrate has conductivity, the conductive layer can be formed insulated from the supporting substrate. The conductive layer can also be formed insulated from the semiconductor layer.

The conductive layer can be formed using a polycrystalline silicon film layer. In this case, the resistance of the conductive layer can be set to a required value by an impurity being introduced into the polycrystalline silicon film layer. Also, by using a silicon substrate as the supporting substrate it is possible to form a semiconductor device of a construction wherein the adverse influence of thermal stresses is reduced.

The semiconductor layer or the semiconductor layer and the conductive layer may be formed divided up into predetermined regions on the supporting substrate as islands. In this case, at the time of device formation the semiconductor devices can each be formed on a separated region. Also, by using the conductive layers provided below the semiconductor layer as buried electrodes, it is possible for the threshold voltages of the semiconductor devices to be controlled by means of the buried electrodes.

When the semiconductor layer or the semiconductor layer and the conductive layer are divided up into island-like regions, an insulating material can be buried between those regions. When this is done, it is not necessary for a process for separating devices to be carried out separately. If separation of the device formation regions of the semiconductor layer is effected by means of a selective oxide film, it is possible to make the device formation region insulation/separation characteristics good and the devices are insulated and separated from each other without a step for separation region formation using a diffusion layer being necessary.

The conductive layer may be formed divided up into regions larger than device formation regions of the semiconductor layer separated from each other by a selective oxide film. When this is done, for example a uniform electrical action can be exerted over the whole of each device formation region of the semiconductor layer. Further, by the conductive layer being divided up so that each conductive layer region corresponds with a plurality of device formation regions of the semiconductor layer, a construction wherein an electrical action is exerted upon a plurality of device formation regions by a single conductive layer region can be obtained.

By forming a film structure including a conductive layer on a supporting substrate in a film forming step and forming an ion-implanted layer for detachment in a substrate for forming a semiconductor layer in an ion-implanted layer forming step and laminating together the supporting substrate on which the film structure is formed and the substrate for a semiconductor layer in which the ion-implanted layer is formed in a laminating step and then carrying out heat treatment on the two substrates thus laminated together in a detaching step to induce a detachment phenomenon at the ion-implanted layer, it is possible to form a semiconductor layer on the surface of the side of the supporting substrate on which the conductive layer was formed. By this means, it is possible to obtain a semiconductor substrate of a structure wherein a conductive layer is formed on the supporting substrate in an insulated state and a semiconductor layer is provided in an insulating state on that. In this case, since the conductive layer was provided without being patterned to a predetermined shape, the lamination step can be carried out using a face having no irregularities caused by a pattern.

Consequently, a semiconductor layer formed on that face can be formed with an accurate film thickness.

It is also possible to form a film structure including a conductive layer in a film forming step on a substrate for forming a semiconductor layer, form an ion-implanted layer for detachment use in an ion-implanted layer forming step, then laminate together the substrate for forming a semiconductor layer and a supporting substrate in a laminating step and carry out heat treatment in a detaching step to induce a detachment phenomenon at the ion-implanted layer and thereby form a film structure and a semiconductor layer on the supporting substrate.

By this means, it is possible to obtain a semiconductor substrate of a structure wherein a conductive layer is formed in an insulated state on the supporting substrate. A semiconductor layer is provided in an insulated state on the conductive layer. Also, in this case, since the film structure and the ion-implanted layer are formed on the substrate for forming a semiconductor layer, the supporting substrate need only have the function of supporting the film structure and the semiconductor layer. Consequently, it is not necessary to use a high-quality substrate for the supporting substrate and the semiconductor substrate can be made low-cost.

In the film forming process, a film structure can be formed by forming atbase insulating film in an insulating film forming step and forming a conductive layer in a conductive layer forming step and forming an upper insulating film in an insulating film forming step. In this case, the film structure can be formed by forming oxide films as the base insulating film and the upper insulating film and forming a polycrystalline silicon layer as the conductive layer.

In the film forming process, the insulating film formed on the substrate for forming a semiconductor layer may be formed by thermal oxidation. A film structure including a conductive layer is then formed. Thereafter, an ion-implanted layer is formed and the layer below the thermal oxide film, i.e. the part positioned at the surface of the substrate for forming a semiconductor layer, is detached in a detaching step. When this is done, when the semiconductor layer has been formed by detachment on the supporting substrate with the film structure therebetween, there is a thermal oxide film between the conductive layer in the film structure and the semiconductor layer. When the conductive layer is used as a buried electrode, the thermal oxide film can be used as a gate oxide film and electrically excellent characteristics can be obtained.

In a trench etching process, a semiconductor layer formed over the entire surface of the supporting substrate can be partially etched by trench etching to form island regions therein. In this case, the semiconductor layer can be divided up into device formation regions. The trench etching step can be carried out by performing dry etching with a nitride film as a mask.

Alternatively, in a film forming step, a film structure including a conductive layer may be formed on a supporting substrate, and this film structure may be divided up into island regions by etching in a trench etching step. An ion-implanted layer for detachment use is then formed in a substrate for forming a semiconductor layer in an ion-implanted layer forming step. In a laminating step these two substrates are laminated together and in a detaching step the substrates are heat treated to effect detachment at the ion-implanted layer. By means of this kind of manufacturing method, it is possible to selectively form a semiconductor layer on parts of a film structure formed as island regions on the supporting substrate.

If an insulating material is buried between semiconductor layer island regions formed on a supporting substrate in a burying step, island regions of a semiconductor layer formed as device formation regions can be made insulated by being separated from each other well electrically also.

This kind of burying step can be carried out by thermally oxidizing the parts between the semiconductor layer island regions to form an oxide film and burying an oxide film deposited by CVD as an insulating film in a gap therebetween and then carrying out flattening to expose the surface of the semiconductor layer. That is, separating grooves between semiconductor layer regions exposed at the surface can be filled with the insulating material. In this case, the flattening can be carried out by polishing or etching back.

In a selective oxidation step, a semiconductor layer formed on a supporting substrate can be selectively oxidized and thereby divided up into device formation regions. By this means, it is possible for the semiconductor layer to be divided up into device formation regions separately from the conductive layer.

By forming a trench in a trench forming step in a selective oxide film part formed so as to divide up a semiconductor layer on a supporting substrate and thereby dividing up the conductive layer and then in a conductive layer etching step carrying out wet etching so as to selectively etch the conductive layer and reduce the area of the conductive layer, it is possible to divide up the conductive layer into regions smaller than the regions of the semiconductor layer. By this means, the freedom of structure design for device formation can be increased and the universality of the semiconductor substrate raised.

By depositing an insulating material for burying on the surface of the supporting substrate after the conductive layer etching step and thermally fluidizing the insulating material for burying by a heat treatment step to make it fill the etched region of the conductive layer so that no voids can remain and then polishing the insulating material for burying in a polishing step so that the surface of the semiconductor layer becomes exposed, it is possible to prevent the occurrence of problems of deterioration in reliability caused by defective insulation of the device separating regions and extended use and deterioration in characteristics caused by segregation of contaminants and so on.

By carrying out heat treatment in an oxidizing atmosphere in a step subsequent to the detaching step, the semiconductor layer side of the interface between the semiconductor layer and the oxide film may be oxidized. When this is done, the interface between semiconductor and oxide film formed at the time of lamination becomes an interface of silicon with oxide film formed by thermal oxidation of the semiconductor layer. As a result, when a conductive layer provided interposing this oxide film is used as a buried electrode, an improvement in its electrical characteristics can be achieved.

(Thirty-eighth Preferred Embodiment)

A thirty-eighth preferred embodiment of the invention will be described with reference to FIG. 98 through FIGS. 103A to 103C.

Figure 100A:
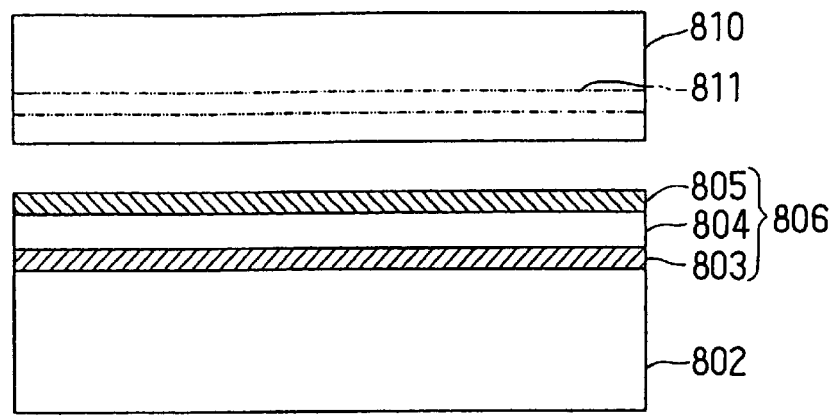
FIGS. 100A through 100D are schematic sectional views illustrating steps for manufacturing the SOI substrate continuing from FIG. 99D.
Figure 100B:
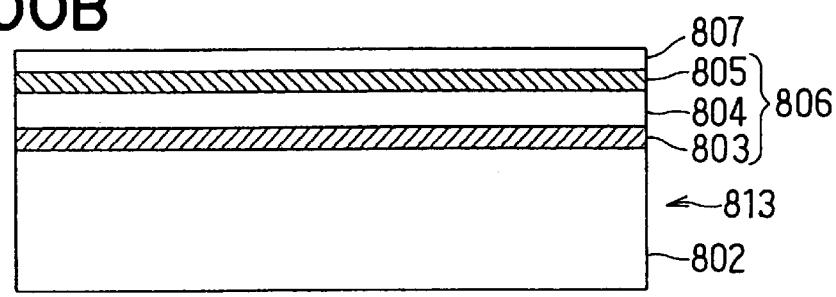
Figure 100C:
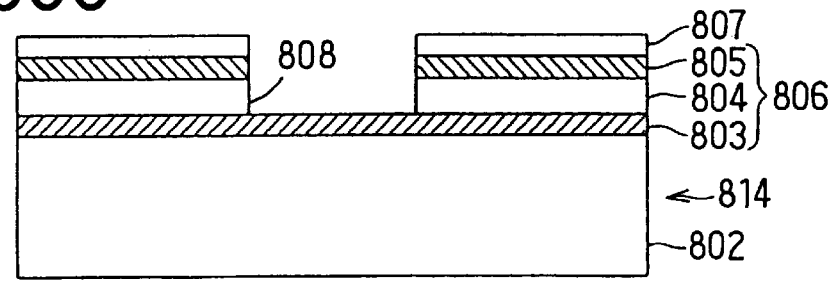
Figure 100D:
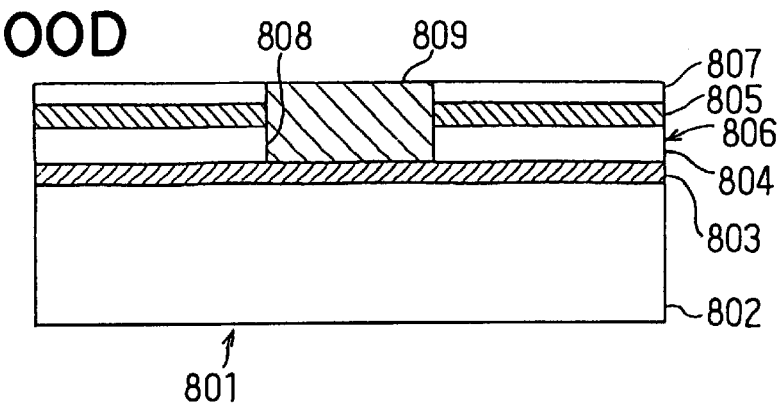

FIG. 100D is a schematic sectional view of a SOI substrate 801. This SOI substrate 801 has a construction wherein a film structure 806 made up of an oxide film 803, a polysilicon film 804 and an oxide film 805 is provided on a monocrystalline silicon substrate 802 serving as a supporting substrate and a monocrystalline silicon thin film 807 serving as a semiconductor layer is formed on this film structure 806.

For the monocrystalline silicon substrate 802, for example a P-type substrate whose plane orientation is <100> and whose resistivity is 5 Ω.cm to 10 Ω.cm is used. The oxide film 803 of the film structure 806 is a thermal oxide film, a PVD (Physical Vapor Deposition) oxide film or a CVD (Chemical Vapor Deposition) oxide film. The polysilicon film 804 serving as a conductive layer is made by LPCVD and is doped with a P-type or N-type impurity as necessary so as to have a predetermined resistivity and is formed to a film thickness of about 100 nm to 500 nm. The other oxide film 805 of the film structure 806 is formed to a film thickness of for example 100 nm and provided as a gate oxide film on the basis that the polysilicon film 804 will be utilized as a buried electrode.

The monocrystalline silicon thin film 807 constituting a semiconductor layer is formed on the film structure 806 by a process of lamination and detachment, as will be further discussed later. It is formed to a film thickness suited to the intended application of the SOI substrate 801, and for example in a general application the film thickness is set in a range of from about 0.05 μm to several micrometers.

As shown in FIG. 100D, the monocrystalline silicon thin film 807 and the part of the film structure 806 down to the conductive layer 804 are divided up by a trench 808 and the monocrystalline silicon thin film 807 and the conductive layer 804 therebelow are split into islands. A silicon oxide 809, which is an insulating material, is formed in this trench 808, as will be further discussed later. The SOI substrate 801 thus formed is equivalent to the semiconductor substrate referred to in the invention.

Figure 98:
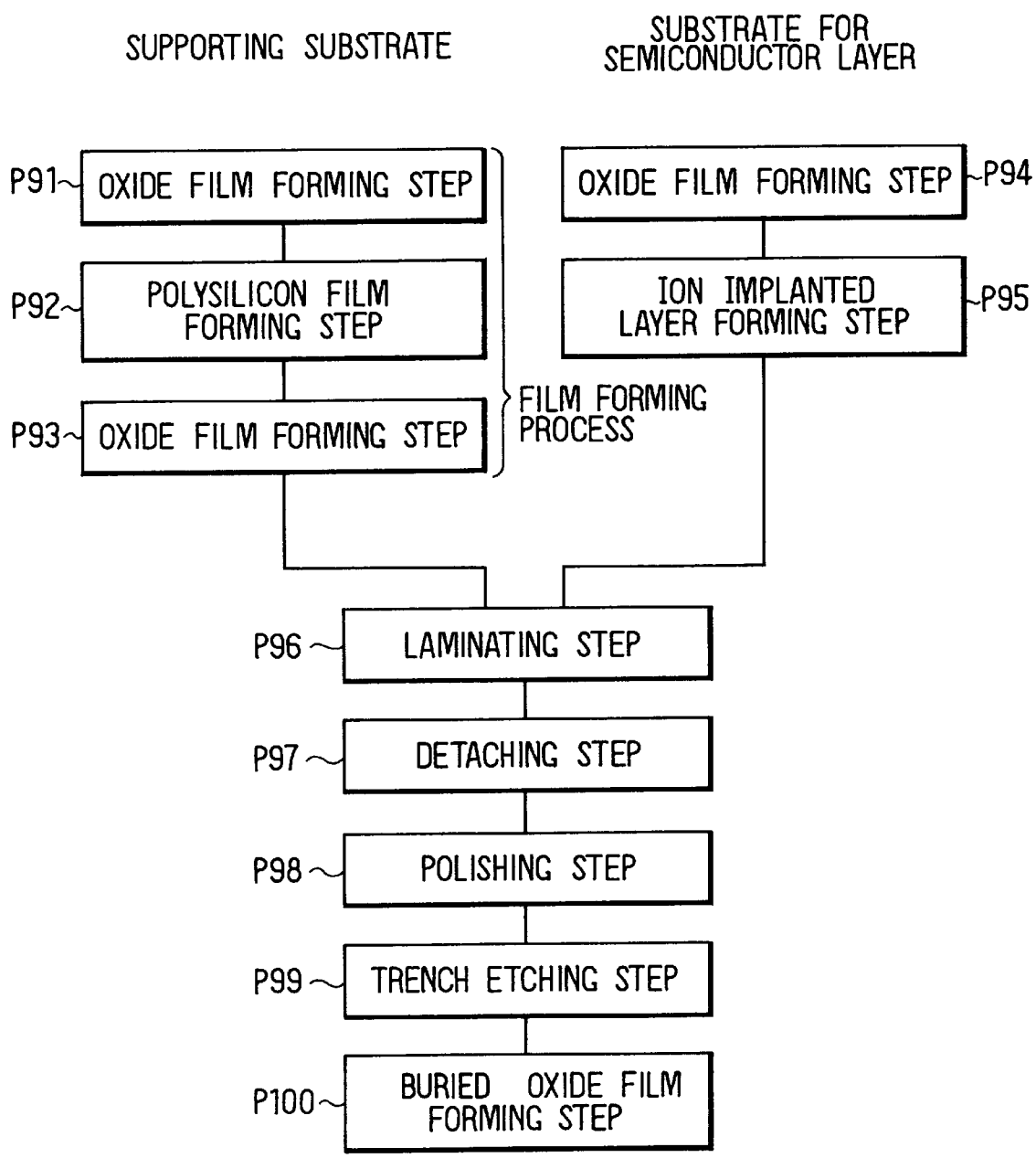
FIG. 98 is a block diagram of a manufacturing process according to a thirty-eighth preferred embodiment.

A method for manufacturing the SOI substrate 801 described above will now be described. FIG. 98 is a block diagram showing in outline the overall flow of a process for manufacturing the SOI substrate 801, and the manufacturing process will now be described with reference to this FIG. 98 and to FIGS. 99A through 99D and FIGS. 100A through 100D, which are schematic sectional views illustrating different steps in the process.

A film-forming process for forming a film structure 806 on a monocrystalline silicon substrate 802 serving as a supporting substrate is made up of an oxide film forming step P91, a polysilicon film forming step P92 and an oxide film forming step P93. In the oxide film forming step P91, an oxide film 803 is formed to a predetermined film thickness by thermal oxidation or CVD or the like on the monocrystalline silicon substrate 802 (see FIG. 99A).

Figure 99A:
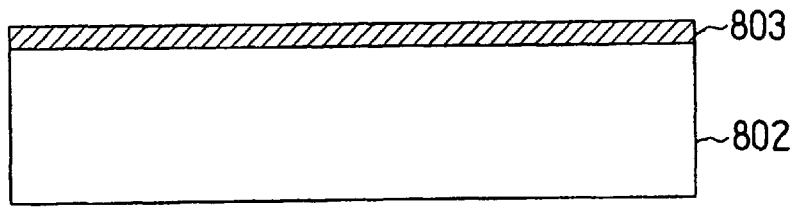
FIGS. 99A through 99D are schematic sectional views illustrating steps for manufacturing a SOI substrate according to the thirty-eighth preferred embodiment.
Figure 99B:
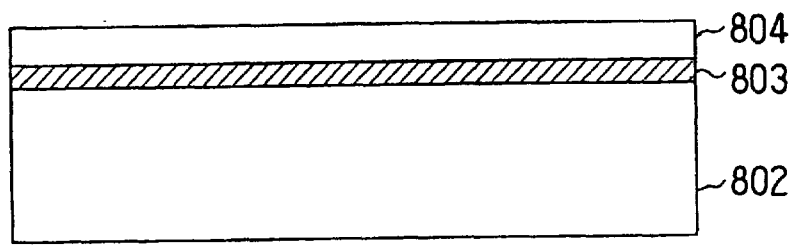

In the polysilicon film forming step P92, a polysilicon film 804 is deposited by LPCVD or the like on the oxide film 803 (FIG. 99B). At this time, the polysilicon film 804 is formed taking into account loss of size in later steps to a thickness such that its film thickness at the stage after the final step has been completed will be a predetermined film thickness (for example in a range of about 100 nm to 500 nm). This also relates to the oxide film forming step P93 which follows.

The polysilicon film 804 can be formed in a state such that it includes an impurity of a predetermined conductive type by being formed in an atmosphere containing an impurity, or it can be doped with an impurity by a method such as ion implantation or thermal diffusion of an impurity after being formed as a non-doped film. This is to reduce the electrical resistance of the polysilicon film 804 when it is used as a buried electrode (a back gate electrode).

Figure 99C:
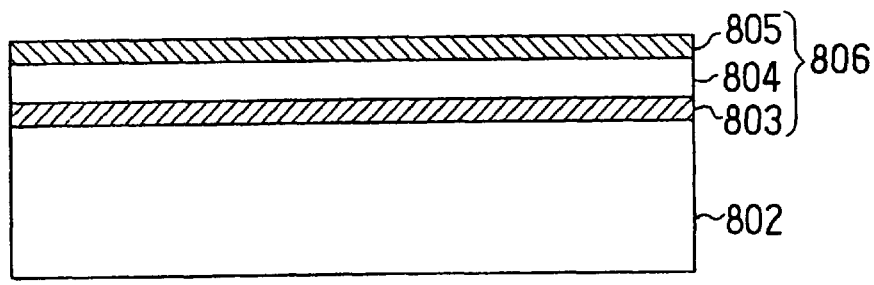

Next, in the oxide film forming step P93, an oxide film 805 is formed by thermal oxidation or PVD or CVD or the like (FIG. 99C). At this time, by thermal oxidation, the surface of the polysilicon film 804 is thermally oxidized to form the oxide film 805. Since the polysilicon film 804 then decreases in thickness by an amount corresponding to the oxide film 805 formed in this way, the polysilicon film 804 must be preformed to a film thickness allowing for this. When the oxide film 805 is formed by CVD or the like, there is no such consumption of the polysilicon film 804 here.

In this case, the oxide film 805 is formed to a film thickness of, for example, 100 nm. Here, when the polysilicon film 804 is to be used as a buried electrode, that is, as a back gate electrode, the oxide film 805 functions as a gate oxide film. Therefore, in its making it is necessary for its film thickness to be set taking into account its characteristics as such, and its film quality in terms of electrical characteristics must also be considered.

Next, in an oxide film forming step P94, an oxide film 811 is formed on a monocrystalline silicon substrate 810 serving as a substrate for forming a semiconductor layer. This is provided to prevent damage to the surface portion of the monocrystalline silicon substrate 810 or contamination by heavy metals or the like in an ion implantation step carried out in a following ion-implanted layer forming step P95.

Figure 99D:
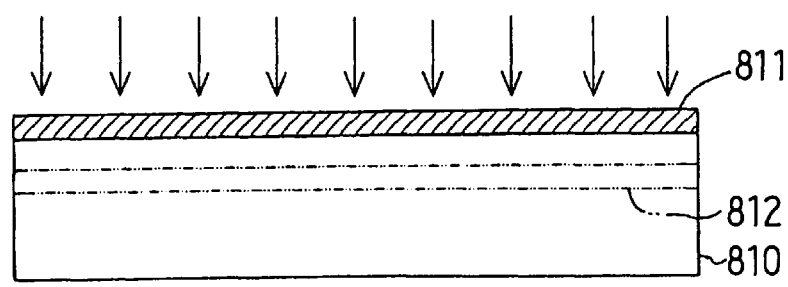

In the ion-implanted layer forming step P95, hydrogen or noble gas or halogen ions are implanted to a predetermined depth into the monocrystalline silicon substrate 810 through the face on which the oxide film 811 is formed. As a result, ion-implanted layer 812 of an high impurity concentration is formed in the monocrystalline silicon substrate 810 (FIG. 99D). In this case, the depth at which the ion-implanted layer 812 is formed is set to correspond with the film thickness of the semiconductor layer to be formed, i.e. the monocrystalline silicon thin film 807, and is adjusted by way of the acceleration voltage. The dose of ions implanted is for example over $1\times10^{16}$ atoms/cm$^2$ and preferably about $5\times10^{16}$ atoms/cm$^2$.

After that, with respect to the monocrystalline silicon substrate 810 with the ion-implanted layer 812 formed therein, three processing methods, namely proceeding to the next step with the oxide film 811 left as it is, entirely removing the oxide film 811 by etching, and removing a surface layer portion of it by etching but leaving an oxide film on the surface of the monocrystalline silicon substrate 810, are conceivable. Any of these can be selected and carried out as necessary.

In this preferred embodiment, processing wherein the oxide film 811 is completely removed by etching is employed. This is in consideration of the point that contamination and damage suffered in the ion implantation step can be removed and the point that there is an oxide film 805 on the surface of the monocrystalline silicon substrate 802 to which the substrate is to be laminated in the next step.

In the laminating step P96 that follows, the monocrystalline silicon substrates 802 and 810 obtained as described above are laminated together. Before this, hydrophilicizing treatment is carried out. In this hydrophilicizing treatment, the substrates are washed in a solution made by mixing, for example, sulfuric acid ($H_2SO_4$) and hydrogen peroxide water ($H_2O_2$) in the ratio 4:1 held in a temperature range of 90° C. to 120° C. and then washed with pure water, after which the amounts of water adsorbed on the substrate surfaces are controlled by spin drying. The face of the monocrystalline silicon substrate 802 on the side on which the film structure 806 is formed and the face of the monocrystalline silicon substrate 810 on the side from which the ion-implanted layer 812 is formed are then laminated together in intimate contact (FIG. 100A). By this means, the two substrates are directly bonded together by hydrogen bonding of silanol radicals formed on their surfaces and water adsorbed onto their surfaces.

After that, in a detaching step P97, heat treatment divided into two stages is carried out on the monocrystalline silicon substrates 802 and 810 thus laminated together. That is, in a first heat treatment, when the ion-implanted layer 812 was formed by implantation of hydrogen ions, heat treatment is carried out at a temperature in a range of 400° C. to 600° C. and for example at about 500° C. As a result, at the ion-implanted layer 812 formed in the monocrystalline silicon substrate 810, i.e. at the hydrogen high-concentration layer, defects are formed in concentration and the monocrystalline silicon substrate 810 detaches at the ion-implanted layer 812 leaving a surface layer portion on the monocrystalline silicon substrate 802 side. As a result, a monocrystalline silicon thin film 807 is provided on the film structure 806 on the surface of the monocrystalline silicon substrate 802.

Simultaneously, at the lamination interface, a dehydration and condensation reaction occurs and the bond strength between the two, namely the film structure 806 and the monocrystalline silicon thin film 807 is thereby raised. By this means, it is possible to bond the monocrystalline silicon thin film 807 to the monocrystalline silicon substrate 802 side and obtain the basic structure of a SOI substrate 801.

Next, in a second heat treatment, to further increase the intimacy of the contact between the monocrystalline silicon thin film 807 and the oxide film 805 of the film structure 806, heat treatment is carried out at a temperature in a range of 1000° C. to 1300° C. and preferably at about 1100° C. Consequently, at the bonding interface, the above-mentioned dehydration and condensation reaction proceeds further and the intimacy of the two rises.

In the course of this second heat treatment, by the substrates being exposed under suitable conditions to an oxidizing atmosphere, thin oxide films are formed at the surface part of the monocrystalline silicon thin film 807 and at its interface with the oxide film 805. At the surface part of the monocrystalline silicon thin film 807, an oxide film (not shown) is formed so as to reduce irregularities (for example in size a range of a few nanometers to several tens of nanometers) of the detachment face arising from the detachment, and flattening is improved by the oxide film being removed by etching. In this way, the amount of polishing required in a polishing step P98 which follows can be reduced.

At the interface with the monocrystalline silicon thin film 807 because an oxide film due to thermal oxidation is formed integrally with the oxide film 805 of the film structure 806, the monocrystalline silicon thin film 807 becomes thinner by a corresponding amount. However, by this means, the interface between the monocrystalline silicon thin film 807 and the oxide film 805 can be formed to a position different from that of the actual lamination interface. As a result of this, an interface level improvement can be carried out and an improvement in electrical characteristics can be achieved.

When the detaching step P97 is finished, the oxide film thinly formed on the surface of the monocrystalline silicon thin film 807 is removed by means of a fluoric acid etching liquid. After that, in the polishing step P98, to eliminate steps of irregularities in the detachment face and to remove a defective layer remaining from the ion-implanted layer forming step P95 and also to bring the monocrystalline silicon thin film 807 to a finally required film thickness, polishing is carried out. In this polishing step, the detachment face is finished by, for example, CMP (Chemical Mechanical Polishing).

In this way, a semiconductor substrate 813 of a construction wherein on a monocrystalline silicon substrate 802 serving as a supporting substrate a film structure 806 is formed and a monocrystalline silicon thin film 807 serving as a semiconductor layer for device formation is provided is obtained (FIG. 100B). This semiconductor substrate 813 is equivalent to the semiconductor substrate referred to in the invention.

Then, in a trench etching step P99, to divide up the part extending from the monocrystalline silicon thin film 807 to the oxide film 805 and the polysilicon film 804 of the film structure 806 into islands to constitute device formation regions, etching is carried out to form a trench 808. By this means, a semiconductor substrate 814 of a construction wherein the monocrystalline silicon thin film 807 and the polysilicon film 804 of the semiconductor substrate 813 mentioned above are divided into islands is obtained (FIG. 100C).

After that, in a buried oxide film forming step P100, a buried oxide film 809 serving as a separating insulating material is formed in the trench 808 to insulate and separate the device forming regions mentioned above. By this means, a SOI substrate 801 constituting a semiconductor substrate is formed (FIG. 100D).

Figure 101:
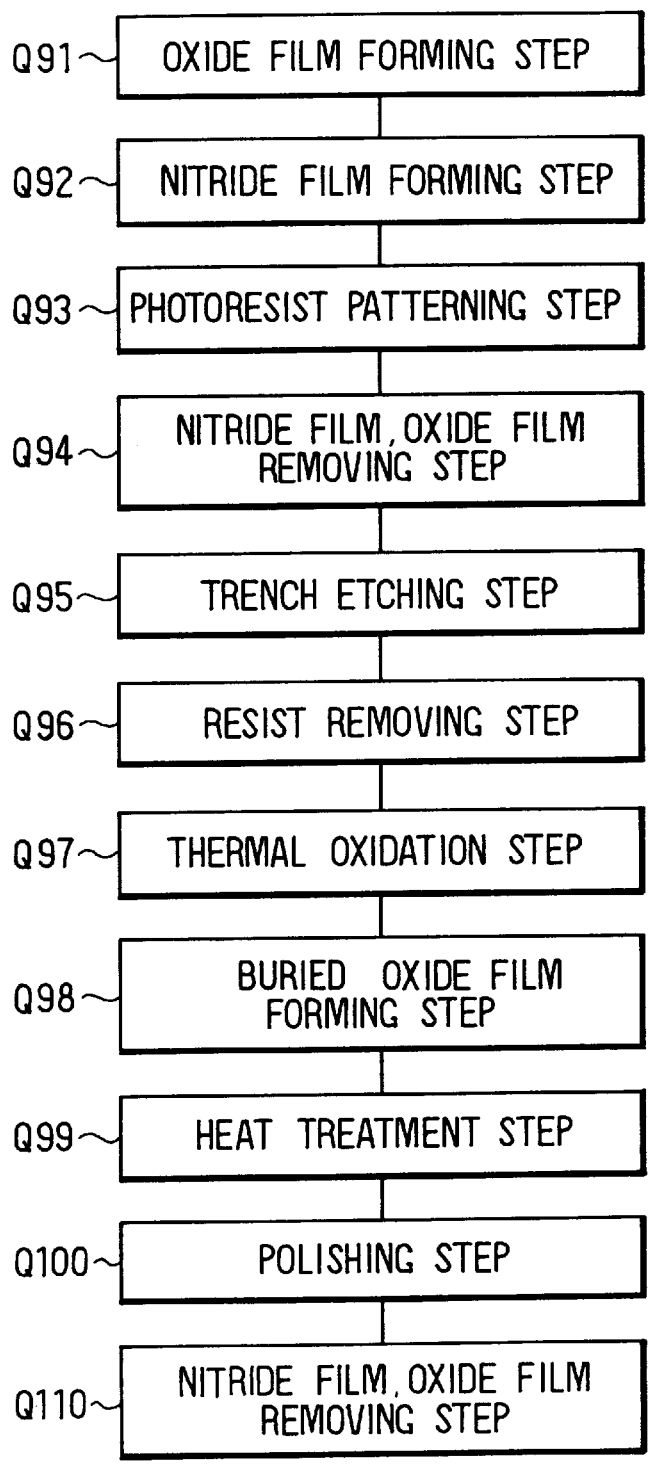
FIG. 101 is a block diagram of a manufacturing process for forming a trench and a silicon oxide.

The trench etching step P99 and the buried oxide film forming step P100 mentioned above will now be described in detail with reference to FIG. 101 through FIGS. 103A to 103C. FIG. 101 is a block diagram showing this manufacturing process in outline, and FIGS. 102A through 102C and 103A through 103C are schematic sectional views illustrating different steps in the process.

Figure 102A:
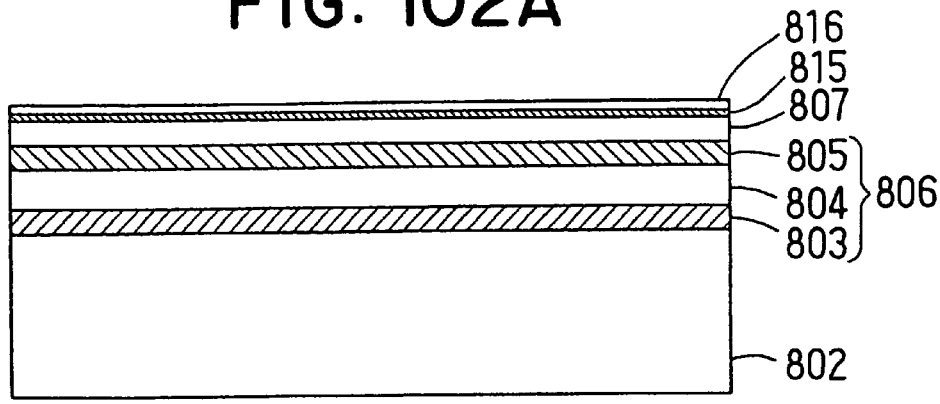
FIGS. 102A through 102C are schematic sectional views illustrating a trench and silicon oxide manufacturing process.

First, in an oxide film forming step Q91, an oxide film 815 is formed on the surface of the semiconductor substrate 813 in the state shown in FIG. 100B. The film thickness of the oxide film 815 is for example 10 nm to 50 nm. The film is formed by thermal oxidation or CVD or the like. Then, in a nitride film forming step Q92, a nitride film 816 is formed on the oxide film 815. The film thickness of the nitride film 816 is for example 100 nm to 300 nm, and the film is formed by LPCVD (FIG. 102A). This nitride film 816 also functions as a polishing stopper in a polishing step Q100 to be further discussed later, while the oxide film 815 is for moderating stresses arising when this nitride film 816 is formed.

Figure 102B:
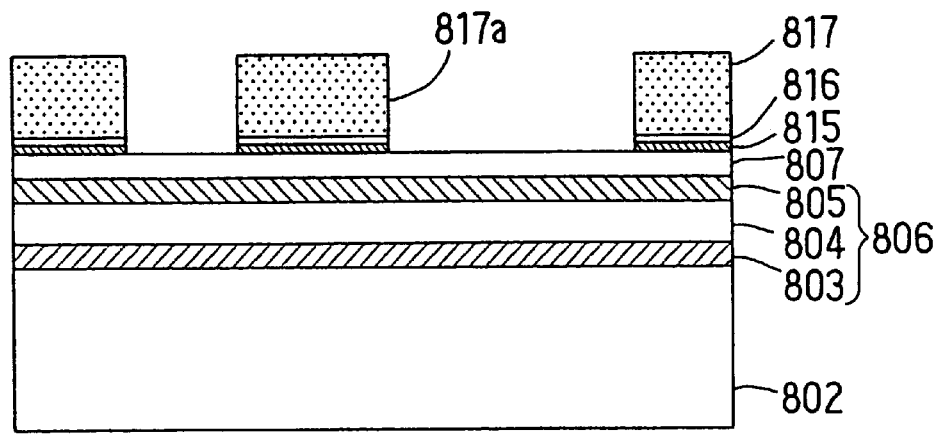

Next, in a photoresist patterning step Q93, an etching mask for carrying out dry etching is formed using photoresist. That is, by photolithography a photoresist is coated, exposed, and developed to form a photoresist pattern 817. After that, in a nitride film and oxide film removing step Q94, the nitride film 816 and the oxide film 815 exposed in an opening 817a of the photoresist pattern 817 are removed by etching to expose the face of the monocrystalline silicon thin film 807 therebelow (FIG. 102B).

Figure 102C:
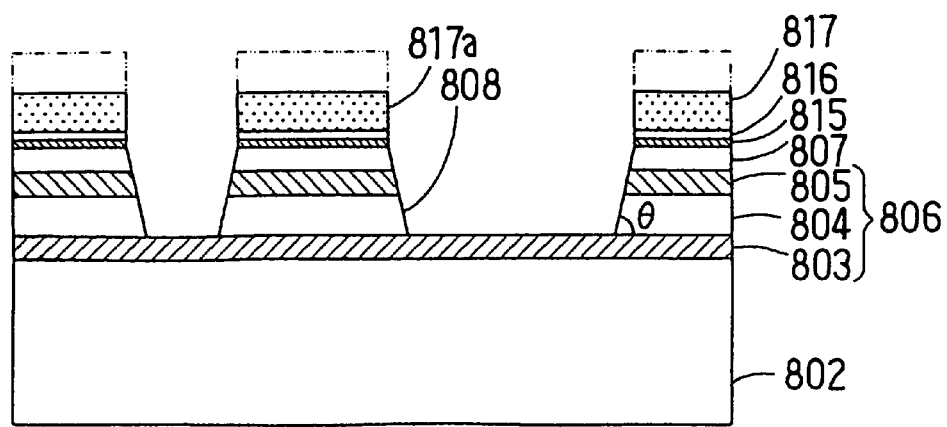

In a trench etching step Q95, the monocrystalline silicon thin film 807 the oxide film 805 and the polysilicon film 804 of the film structure 806 exposed at the opening 817a are successively etched by dry etching and a trench 808 is thereby so formed that it exposes the surface of the oxide film 803 (FIG. 102C).

At this time, as etching conditions, in consideration of later steps, it is necessary for the gas conditions and so on to be set so that the taper angle (angle to the horizontal) θ of the side wall is 90° or less. The gas used for the dry etching is HBr (hydrogen bromide), $Cl_2$ (chlorine), $He/O_2$ (helium/oxygen) gas or the like, as in conditions for ordinary trench etching by dry etching. The etching depth is generally in a range of 0.3 μm to 1.0 μm. Along with the progress of the etching, because the photoresist pattern 817 also is etched and removed to some extent and decreases in thickness, the film thickness of the photoresist pattern 817 must be set with this taken into account.

Figure 103A:
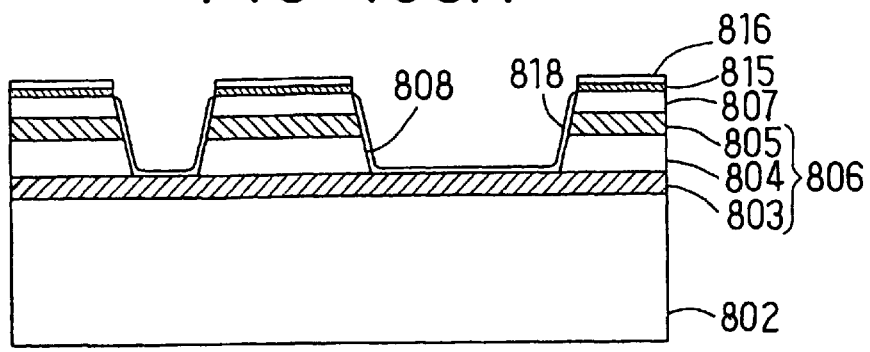
FIGS. 103A through 103C are further schematic sectional views illustrating a trench and silicon oxide manufacturing process.

Next, in a resist removing step Q96, the photoresist pattern 817 is removed and surface treatment is carried out by an ordinary method. Thereafter, in a thermal oxidation step Q97, thermal oxidation (at a thermal oxidation temperature of for example 1000° C. or more) is carried out to form a thermal oxide film 818 to a predetermined thickness (for example 10 nm to 100 nm) on the bottom and the side wall of the trench 808 (FIG. 103A). At this time, because the nitride film 816 still remains on the surface of the monocrystalline silicon thin film 807, no oxide film is formed there by the thermal oxidation. As a result of the thermal oxide film 818 being formed, damage remaining on the surface when the trench 808 is formed is removed and the trench corners can be rounded into a smooth state (for example to a radius of curvature of 50 nm or more).

Figure 103B:
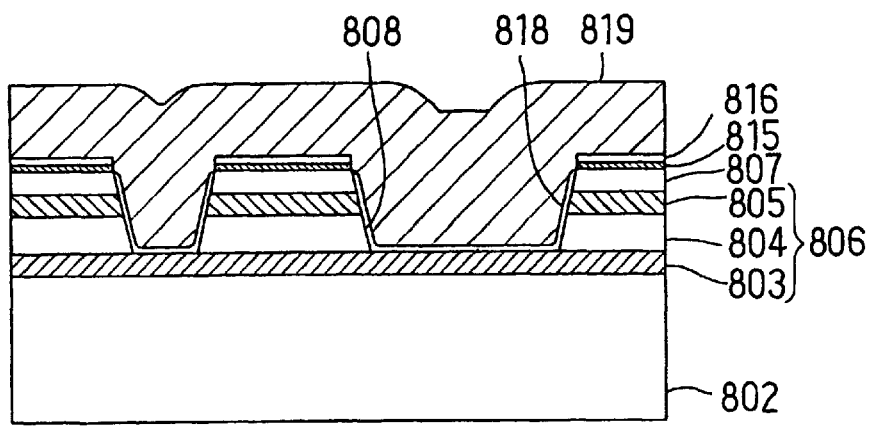

Then, in a buried oxide film forming step Q98, to carry out flattening, for example an oxide film 819 is deposited by CVD. At this time, the film thickness of the oxide film 819 is thicker than the depth of the trench 808 and the oxide film 819 is formed so as to fill the trench 808 completely (FIG. 103B).

Instead of the oxide film 819, as a flattening process film, a TEOS film or the like may be formed, or a PSG or BPSG film can be formed. After that, in a heat treatment step Q99, heat treatment is carried out at a temperature of about 1000° C., and using thermal fluidity of the oxide film 819, the oxide film 819 is made to fill the inside of the trench 808 without there being any gaps.

Figure 103C:
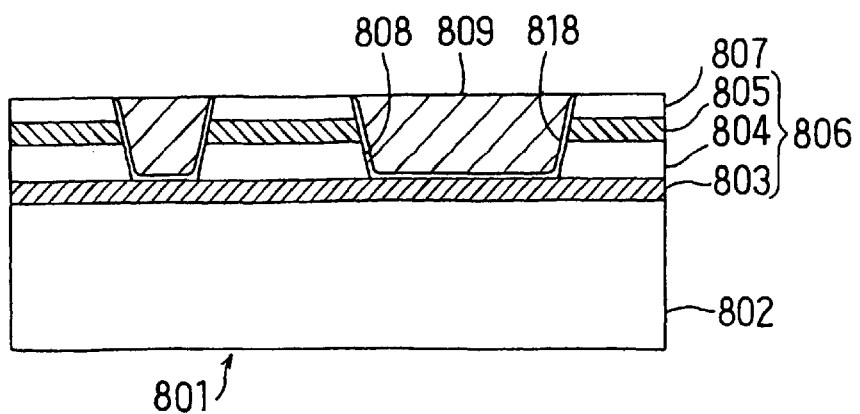
Figure 104:
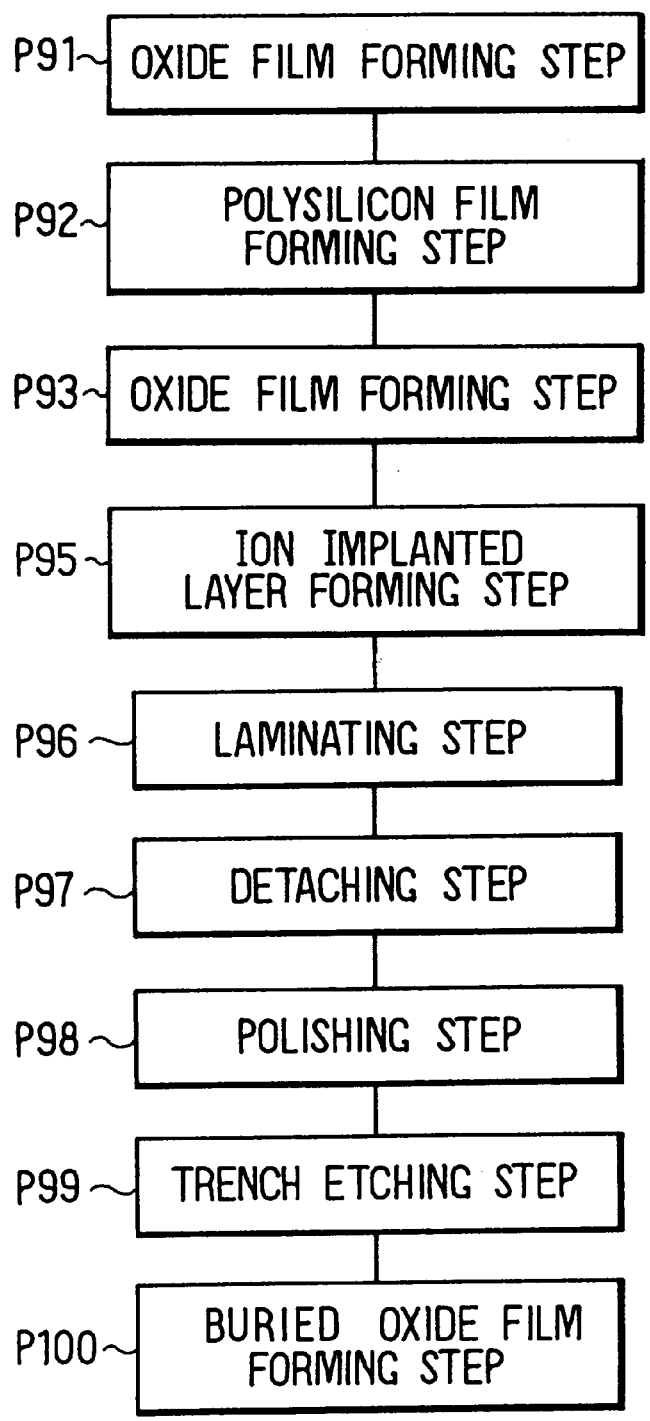
FIG. 104 is a block diagram of a manufacturing process according to a thirty-ninth preferred embodiment.

Next, in a polishing step Q100, polishing is carried out from the face of the oxide film 819 by CMP. At this time, the polishing is selective polishing with the nitride film 816 formed previously as a stopper, and utilizing the fact that the nitride film 816 has a slower polishing rate than the oxide film 819, the polishing is stopped when the nitride film 816 becomes exposed. By this means, it is possible to form a silicon oxide film 809 buried in the trench 808. After that, in a nitride film and oxide film removing step Q110, the nitride film 816 and the oxide film 815 are removed by etching to obtain a SOI substrate 801 constituting a semiconductor substrate (FIG. 103C).

With this preferred embodiment, the following effects can be obtained.

Firstly, a monocrystalline silicon thin film 807 serving as a semiconductor layer is formed by lamination and detachment on a film structure 806 including a polysilicon film 804 constituting a conductive layer which is formed over the entire surface. That is, because films formed on the monocrystalline silicon substrate 802 cover the whole face thereof, it is possible to form them homogeneously and the monocrystalline silicon thin film 807 can be formed accurately. Further, even when the monocrystalline silicon thin film 817 is to be formed thin, it can be formed with reduced dispersion.

Secondly, because the monocrystalline silicon thin film 807 is divided into device formation regions by a trench 808 being formed in a semiconductor substrate 813 and the polysilicon film 804 is also divided up, even when the polysilicon film 804 is used as a back gate electrode, it is possible to form device separation regions easily.

Thirdly, by the trench 808 being filled with a silicon oxide film 809, the device separation effected by the trench 808 can be made certain and the SOI substrate 801 can be formed into a desired shape.

Fourthly, because in the detachment process P97 the interface between the monocrystalline silicon thin film 807 and the oxide film 805 is shifted from the lamination face to a different position by heat treatment being carried out in an oxidizing atmosphere, the electrical characteristics of this interface can be improved.

In the preferred embodiment described above, the oxide film 819 deposited in the buried oxide film forming step Q98 was flattened by chemical mechanical polishing in a polishing step Q100 after the heat treatment step Q99. However, instead of this the same flattening process can be carried out by etching the oxide film 819.

(Thirty-ninth Preferred Embodiment)

FIG. 104 and FIGS. 105A through 105D show a thirty-ninth preferred embodiment of the invention. This preferred embodiment differs from the thirty-eighth preferred embodiment in the manufacturing process leading up to the state of the semiconductor substrate 813. In this preferred embodiment a film structure 806 is formed on the monocrystalline silicon substrate 810 serving as the substrate for forming a semiconductor layer. The parts of this preferred embodiment which are different from the thirty-eighth preferred embodiment will now be described briefly with reference to the process diagram of FIG. 104.

As mentioned above, the film structure 806 is formed on the monocrystalline silicon substrate 810 that is the substrate for forming a semiconductor layer. In the same way as in the thirty-eighth preferred embodiment, an oxide film forming step R91, a polysilicon film forming step R92, and an oxide film forming step R93 are carried out on this monocrystalline silicon substrate 810 to provide a film structure 806 by successively forming an oxide film 803, a polysilicon film 804 serving as a conductive layer, and an oxide film 805 (see FIG. 105A).

In this preferred embodiment, the oxide film 803 of the film structure 806 thus formed performs the function of a gate oxide film for the polysilicon film 804 serving as a conductive layer. Therefore, when, for example, in an oxide film forming step R91 the oxide film 803 is formed by thermally oxidizing the monocrystalline silicon substrate 810, better electrical characteristics can be obtained than when it is deposited by CVD.

Figure 105A:
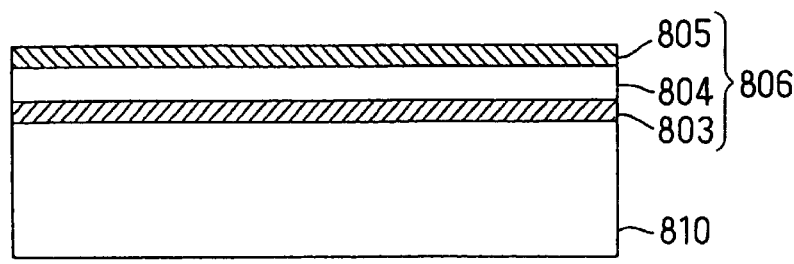
FIGS. 105A through 105D are schematic sectional views illustrating steps for manufacturing a SOI substrate according to the thirty-ninth preferred embodiment.
Figure 105B:
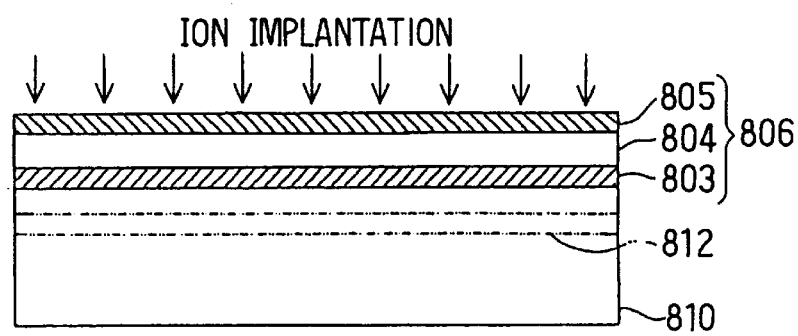

After that, in an ion-implanted layer forming step R95, ion implantation is carried out from the side of the monocrystalline silicon substrate 810 on which the film structure 806 is formed to form an ion-implanted layer 812 (FIG. 105B). In the ion implantation, in the same way as described above, ions of hydrogen or a noble gas or a halogen are implanted to a high concentration at a predetermined depth to form the ion-implanted layer 812 for detachment use. In this case, because the ion-implanted layer 812 is formed through the film structure 806, the acceleration voltage must be adjusted to implant ions to a correspondingly deeper position.

Figure 105C:
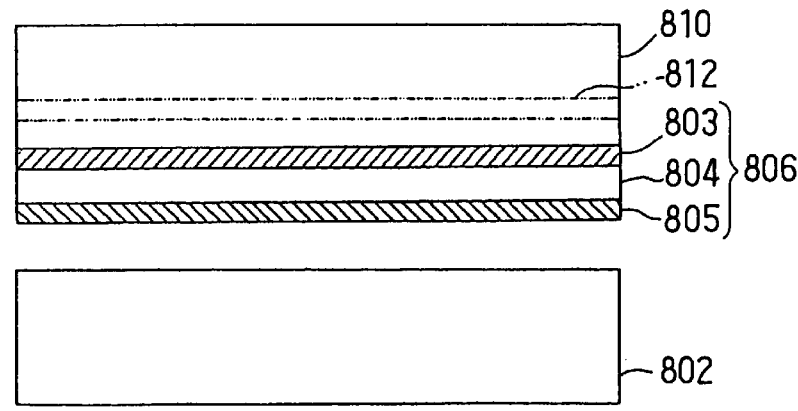

Next, in a laminating step R96, after a pretreatment of washing and so on is carried out in the same way as that described above, the monocrystalline silicon substrate 810 with the ion-implanted layer 812 formed therein is laminated to the monocrystalline silicon substrate 802 serving as a supporting substrate (FIG. 105C). In this case, the monocrystalline silicon substrate 802 may be used as the supporting substrate, or alternatively another supporting substrate may be used instead of this.

Figure 105D:
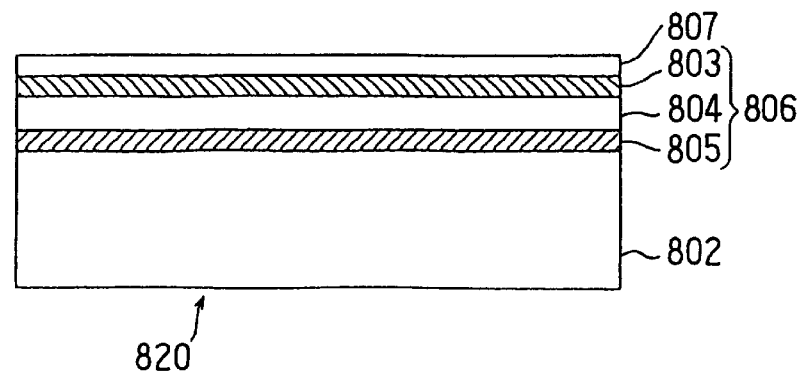
Figure 106:
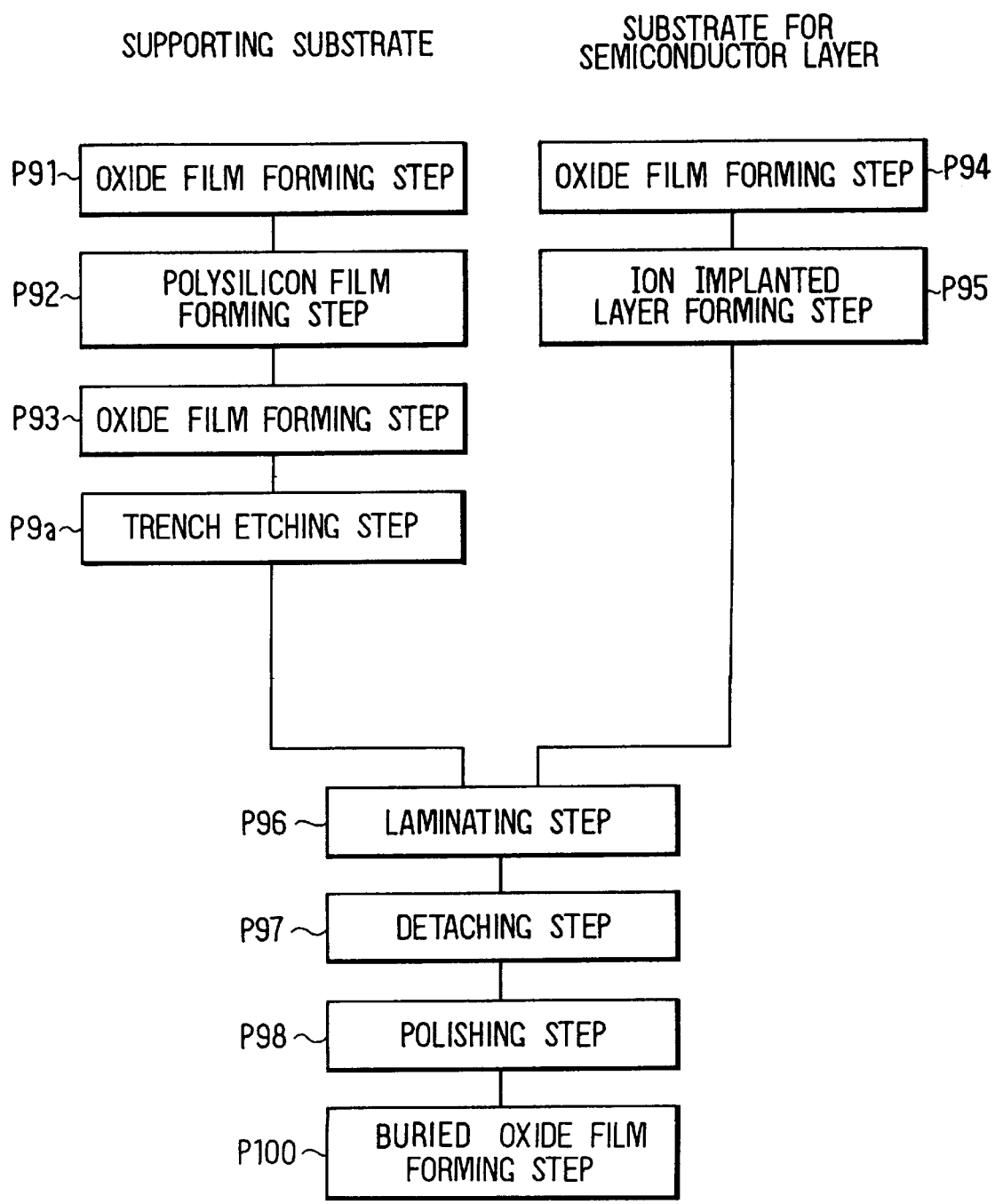
FIG. 106 is a block diagram of a manufacturing process according to a fortieth preferred embodiment.

Then, when detachment is effected in a detaching step R97, a semiconductor substrate 820 is obtained with a film structure 806 and a monocrystalline silicon thin film 807 serving as a semiconductor layer deposited on a monocrystalline silicon substrate 802, equivalent to the semiconductor substrate 813 in the thirty-eighth preferred embodiment (FIG. 105D).

After that, in the same way as in the thirty-eighth preferred embodiment, the detachment face of the monocrystalline silicon thin film 807 is polished in a polishing step R98 and irregularities in it are thereby flattened. Then, by successively carrying out a dry etching step R99 and a buried oxide film forming step R100, it is possible to obtain a SOI substrate the same as the SOI substrate 801 in the thirty-eighth preferred embodiment.

With this thirty-ninth preferred embodiment, because in the structure of the semiconductor substrate 820 the monocrystalline silicon thin film 807 is formed on the polysilicon film 804 serving as a conductive layer with an oxide film 803 formed by thermal oxidation therebetween, when the polysilicon film 804 is used as a back gate electrode, good electrical characteristics can be obtained.

Also, because the monocrystalline silicon substrate 802 need only perform the function of supporting the film structure 806 and the monocrystalline silicon thin film 807, the quality of its crystallinity and restrictions on its electrical characteristics and so on can be reduced and manufacturing cost reductions can thereby be achieved.

(Fortieth Preferred Embodiment)

FIG. 106 and FIGS. 107A through 107D show a fortieth preferred embodiment of the invention. This preferred embodiment differs from the thirty-eighth preferred embodiment in that it employs a manufacturing process for forming a semiconductor substrate equivalent to the monocrystalline silicon substrate 814 on the completion of the detaching step by carrying out dry etching before the laminating step. The parts of this preferred embodiment that differ from the thirty-eighth preferred embodiment will now be described briefly with reference to the process diagram of FIG. 106.

Figure 107A:
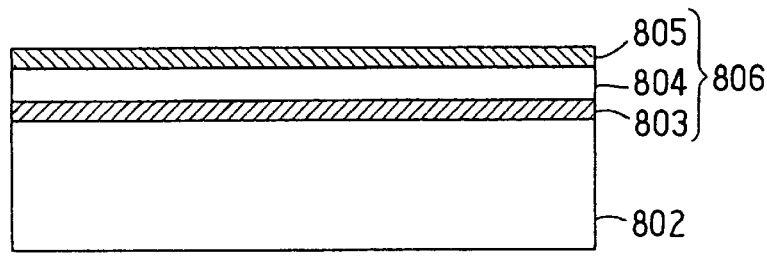
FIGS. 107A through 107D are schematic sectional views illustrating steps for manufacturing a SOI substrate.
Figure 107B:
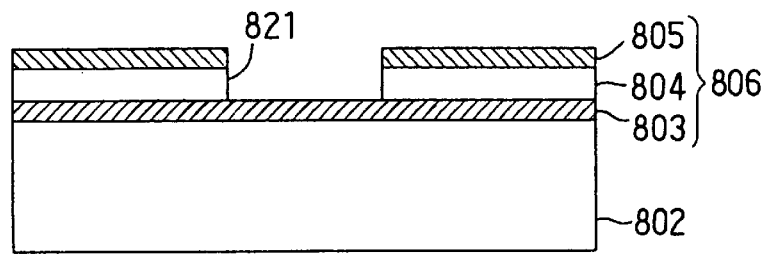
Figure 107C:
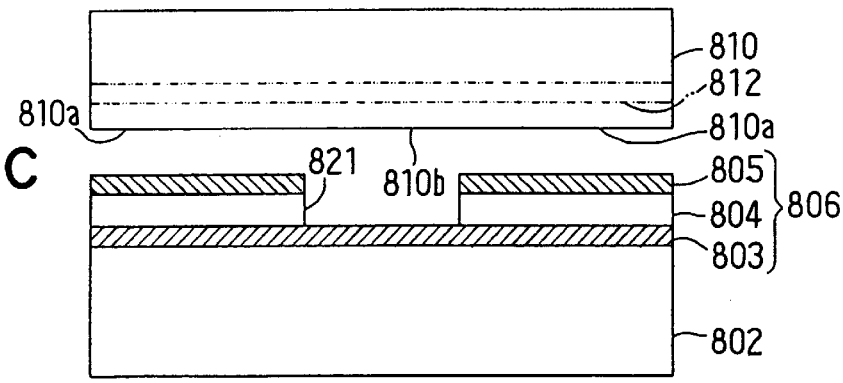

As described above, by carrying out an oxide film forming step P91, a polysilicon film forming step P92 and an oxide film forming step P93, a film structure 806 is formed by successively forming an oxide film 803, a polysilicon film 804 and an oxide film 805 on a monocrystalline silicon substrate 802 serving as a supporting substrate (FIG. 107A). The process up to this point is the same as that of the thirty-eighth preferred embodiment.

Then, in a trench etching step P9a, a trench 821 is formed in this monocrystalline silicon substrate 802. Here, for example photoresist is patterned on the surface of the oxide film 805 to form a mask and dry etching is carried out through an opening in the mask pattern to form a trench 821 etched to where the oxide film 803 becomes exposed. After that, the photoresist mask is removed.

Next, an oxide film forming step P94 and an ion-implanted layer forming step P95 are carried out on the monocrystalline silicon substrate 810 serving as a substrate for forming a semiconductor layer to form an ion-implanted layer 812 at a predetermined depth thereof. After that, in a laminating step P96, the monocrystalline silicon substrate 802 having the trench 821 formed in the film structure 806 and the monocrystalline silicon substrate 810 with the ion-implanted layer 812 formed therein are put through the same hydrophilicizing treatment as that described above and then laminated together in intimate contact.

Then, in the same way as that described above, in a detaching step P97, heat treatment is carried out to effect detachment. However, at this time, although the part 810a of the surface of the monocrystalline silicon substrate 810 in which the ion-implanted layer 812 is formed, which faces the oxide film 805 at the surface of the monocrystalline silicon substrate 802, is in intimate contact with the oxide film 805, the part 810b corresponding to the part of the monocrystalline silicon substrate 802 where the trench 821 is formed and the oxide film 803 is exposed is merely facing the oxide film 803 across an empty space.

Figure 107D:
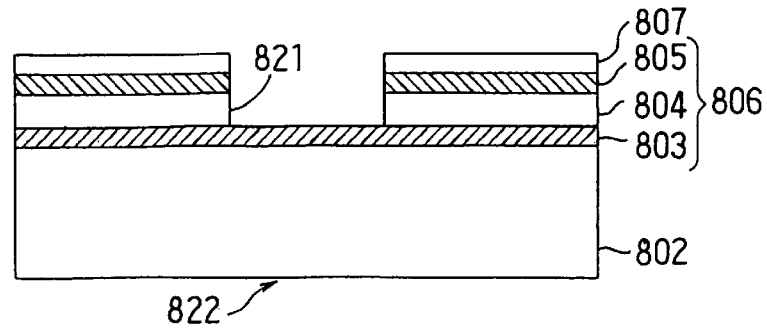
Figure 108:
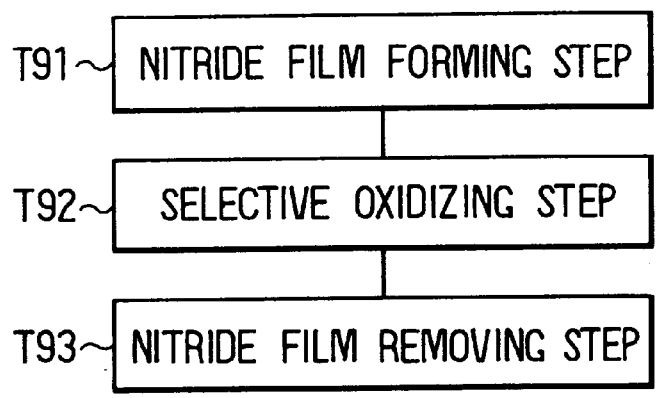
FIG. 108 is a block diagram of a manufacturing process providing device separation according to a forty-first preferred embodiment.

Therefore, even if detachment occurs at the ion-implanted layer 812 in the detaching step P97, as the monocrystalline silicon thin film 807 only the surface part 810a of the monocrystalline silicon substrate 810 becomes detached from the monocrystalline silicon substrate 810 and in intimate contact with the oxide film 805. The surface part 810b either remains as it is on the monocrystalline silicon substrate 810 side or detaches from the monocrystalline silicon substrate 810 without bonding to the monocrystalline silicon substrate 802 side. As a result, the monocrystalline silicon thin film 807 is formed in a state wherein it is selectively bonded to the surface of the oxide film 805 only (FIG. 107D). By this means, a semiconductor substrate 822 the same as the monocrystalline silicon substrate 814 in the thirty-eighth preferred embodiment is formed.

Thereafter, in the same way as that described above, the detachment face is flattened in a polishing step P98, and then without trench etching being carried out, a buried oxide film forming step P100 is performed and a SOI substrate 801 is thereby obtained. In the buried oxide film forming step P100, by the steps shown in FIG. 101 being carried out except for the step relating to dry etching, a buried oxide film 809 is filled into the trench 821.

With this fortieth preferred embodiment, as well as it being possible to obtain the same effects as those of the thirty-eighth preferred embodiment, since the dry etching step P9a is carried out early, the film thickness to be removed by the etching is reduced by an amount corresponding to the monocrystalline silicon thin film 807 and the monocrystalline silicon thin film 807 can be selectively adhered.

(Forty-first Preferred Embodiment)

FIG. 108 through FIGS. 110A to 110D show a forty-first preferred embodiment of the invention. In this preferred embodiment, by carrying out further processing on the SOI substrate 801 formed in the thirty-eighth through fortieth preferred embodiments described above, a device formation region is formed separated in the monocrystalline silicon thin film 807.

Figure 109:
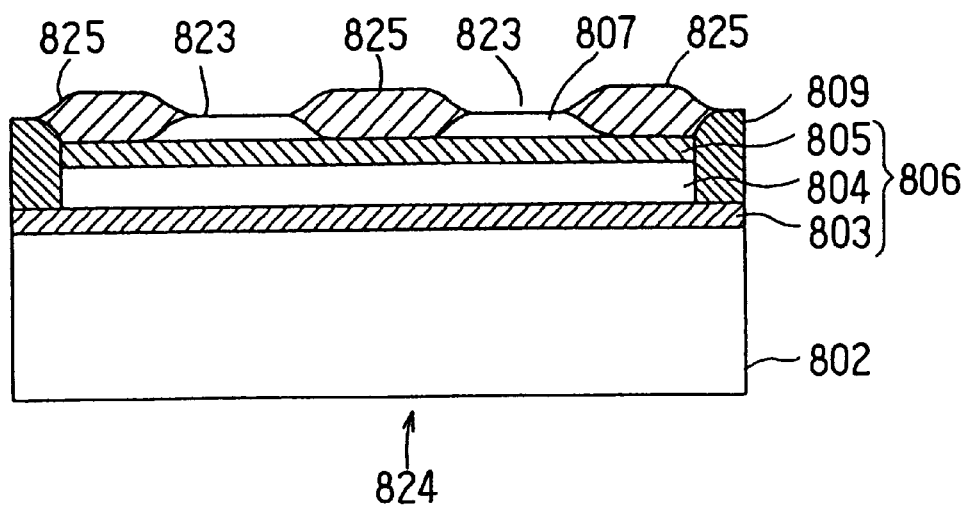
FIG. 109 is a schematic sectional view of a SOI substrate provided with device separation.

FIG. 109 shows a SOI substrate 824 of a construction wherein device formation regions 823 are provided in the monocrystalline silicon thin film 807 of a SOI substrate 801. In this case, with respect to a region of the polysilicon film 804 (conductive layer) separated by the trench 808 (821) described above, the device formation region 823 is divided into a smaller region by a selective oxide film 825. Further, two-isolated device formation regions 823 are provided for a single conductive layer 804.

This SOI substrate 824, for example, is suitable for cases such as when, in device formation regions 823, 823 having the common polysilicon film 804 as a back gate electrode, an n-channel and a p-channel FET are to be formed to form a CMOS circuit. By varying the threshold voltage of the FETs by impressing a voltage on both of them from the common back gate electrode, the characteristics of the device can be controlled.

Figure 110A:
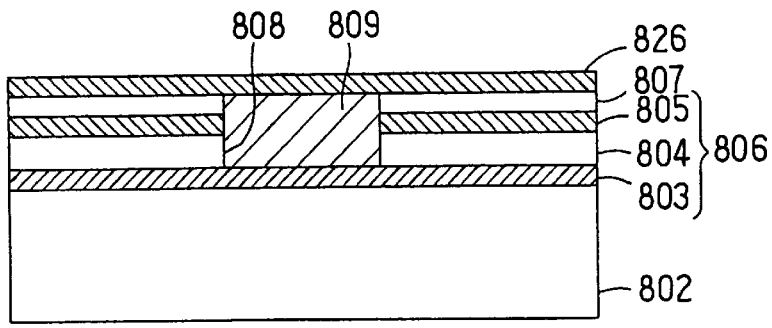
FIGS. 110A through 110D are schematic sectional views illustrating a manufacturing process providing device separation.
Figure 110B:
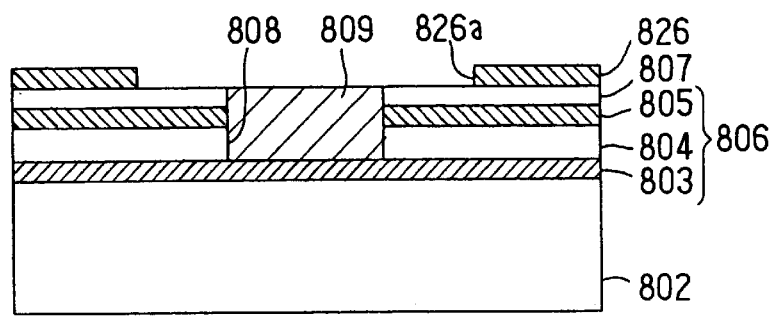
Figure 110C:
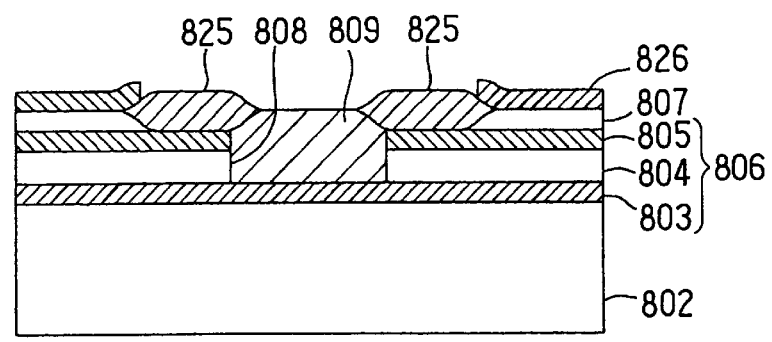
Figure 110D:
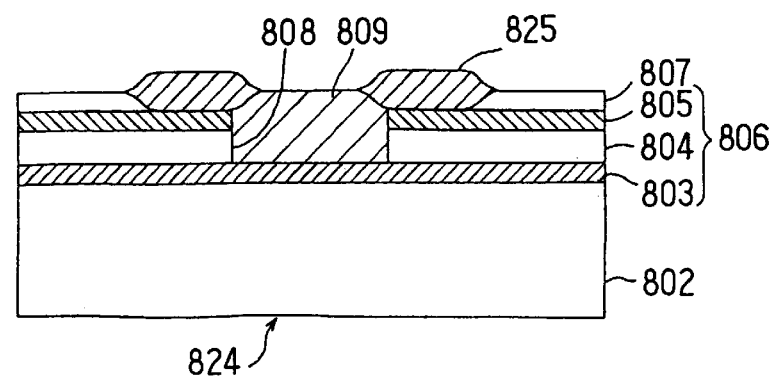

Next, a method for manufacturing the SOI substrate 824 will be described briefly with reference to the manufacturing process diagram of FIG. 108 and FIGS. 110A through 110D, which are sectional views illustrating steps in the process. In a nitride film forming step T91, a nitride film 826 is formed over the entire surface of an SOI substrate 801 of the kind formed in the thirty-eighth preferred embodiment (see FIG. 110A). After that, by photolithography an opening 826a is formed in a predetermined part of the nitride film 826. In this case, for example the opening 826a is formed so as to open at a region including the buried oxide film 809 formed in a trench 808 (821) (FIG. 110B).

Then, in a selective oxidizing step T92, by thermally oxidizing the substrate, the monocrystalline silicon thin film 807 exposed at the opening 826a of the nitride film 826 is selectively oxidized and made into a thermal oxide film 825 through its whole film thickness. This is the so-called LOCOS (Local Oxidation of Silicon) oxidation method, which uses the principle that because oxygen is blocked from penetrating to the inside of the part covered by the nitride film 826, only the part at the opening 826a is selectively oxidized.

After that, in a nitride film removing step T93, the nitride film 826 remaining at the surface is removed by an ordinary method to obtain a final SOI substrate 824. In the description of the manufacturing method, a case wherein the selective oxide film 825 is formed only where a trench 808 (821) is formed was shown. However, as shown in the construction of FIG. 109, by forming an opening 826a and forming a thermal oxide film 825 at parts where there is no trench 808 (821), it is possible to obtain the kind of structure illustrated by the SOI substrate 824 FIG. 109.

With this forty-first preferred embodiment, even when, as in the SOI substrate 801, the region of a monocrystalline silicon thin film 807 and the region of a polysilicon film 804 serving as a conductive layer are both formed in the same shape as the same region, by dividing the region of the monocrystalline silicon thin film 807 into suitable device formation regions 823 it is possible to provide device formation regions 823 smaller than the polysilicon film 804 region. Therefore, it is possible to obtain a SOI substrate 824 which is highly usable even from the device formation point of view.

(Forty-second Preferred Embodiment)

FIG. 111 through FIGS. 114A to 114C show a forty-second preferred embodiment of the invention. This preferred embodiment differs from the forty-first preferred embodiment in that with respect to device formation regions formed by dividing up a monocrystalline silicon thin film 807, a polysilicon film 804 serving as a conductive film is divided into smaller regions.

Figure 112:
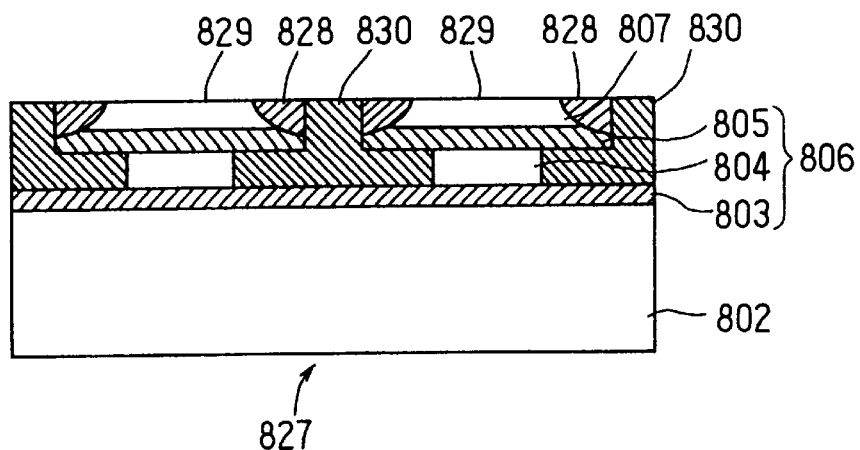
FIG. 112 is a schematic sectional view of a SOI substrate provided with device separation.

FIG. 112 is a sectional view of a SOI substrate 827. An oxide film 803, a polysilicon film 804 and an oxide film 805 constituting a film structure 806 are formed on a monocrystalline silicon substrate 802. With respect to an oxide film 805 divided into predetermined regions, the polysilicon film 804 is formed as still smaller regions. The monocrystalline silicon thin film 807 disposed above the oxide film 805 is formed as device formation regions 829 narrowed by selective oxide films 828. A silicon oxide 830 serving as a buried oxide film is filled between adjacent device formation regions 829, 829.

Figure 111:
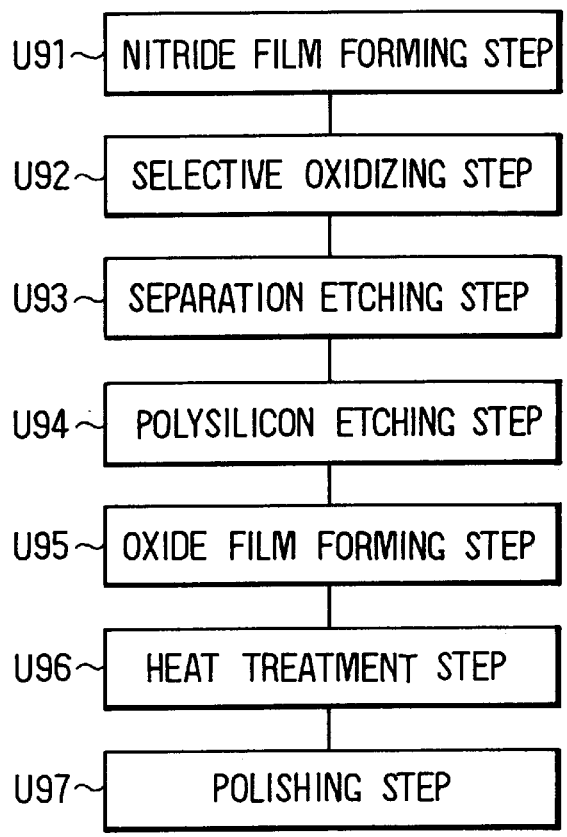
FIG. 111 is a block diagram of a manufacturing process according to a forty-second preferred embodiment.
Figure 113A:
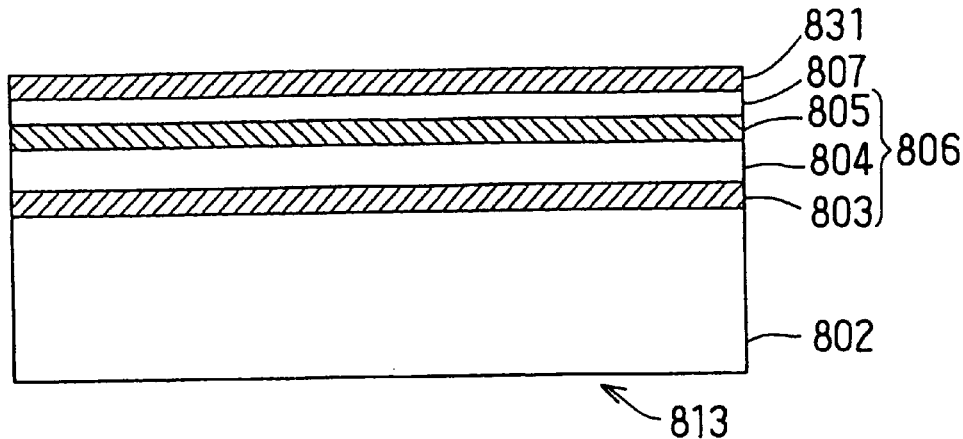
FIGS. 113A through 113C are schematic sectional views illustrating a manufacturing process providing device separation.
Figure 113B:
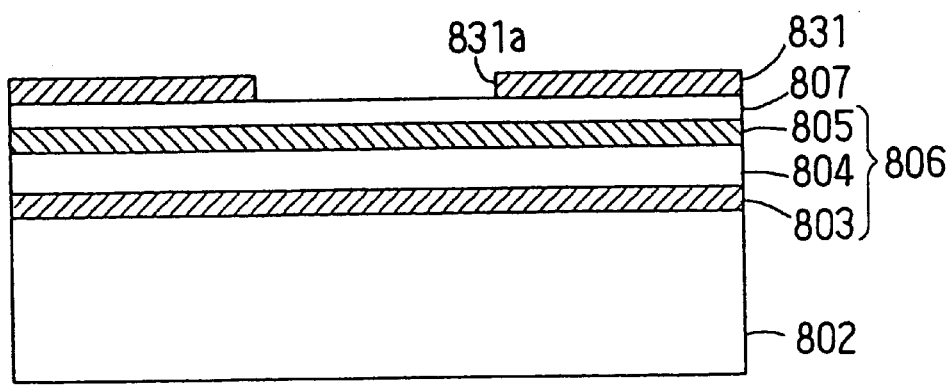

Next, a method for manufacturing this SOI substrate 827 will be described with reference to the process diagram of FIG. 111 and to FIGS. 113A through 113C and FIGS. 114A through 114C. First, in a nitride film forming step U91, a nitride film 831 of a predetermined film thickness is formed on the surface of a semiconductor substrate 813 of the kind obtained in the thirty-eighth preferred embodiment (see FIG. 113A). An opening 831a is then formed in a predetermined region of this nitride film 831 by photolithography and etching (FIG. 113B).

Figure 113C:
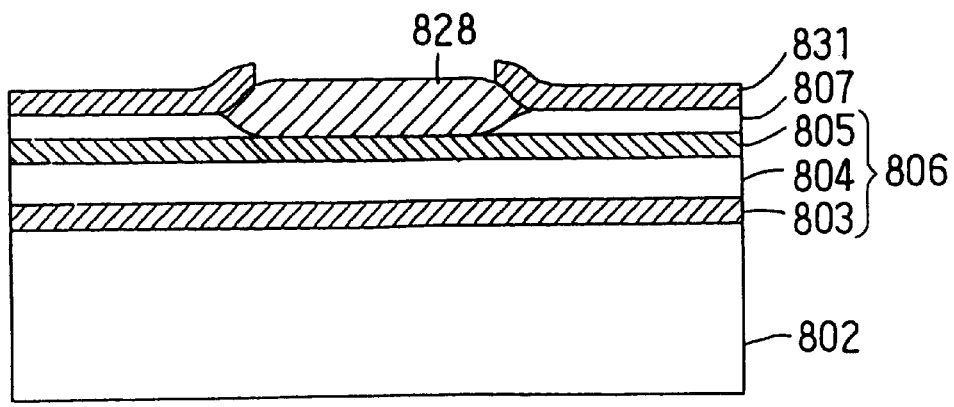
Figure 114A:
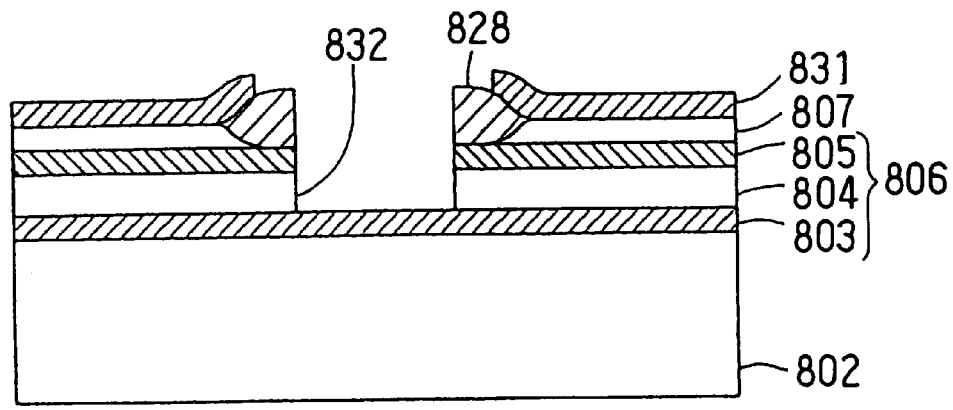
FIGS. 114A through 114C are further schematic sectional views illustrating a manufacturing process providing device separation following to the manufacturing process of FIGS. 113A through 113C.

In a selective oxidizing step U92 which follows, by heat treatment being carried out, the monocrystalline silicon thin film 807 exposed at the opening 831a of the nitride film 831 is selectively thermally oxidized to form a selective oxidation film 828 (FIG. 113C). After that, in a separation etching step U93, trench etching is carried out so as to form a trench 832 opening at the selective oxidation film 828 (FIG. 114A). In this case, the trench etching is carried out in the same way as described above by a method such as patterning photoresist excluding the part to be etched and performing dry etching so that the selective oxidation film 828, the oxide film 805 and the polysilicon film 804 are successively etched until the surface of the oxide film 803 becomes exposed.

Figure 114B:
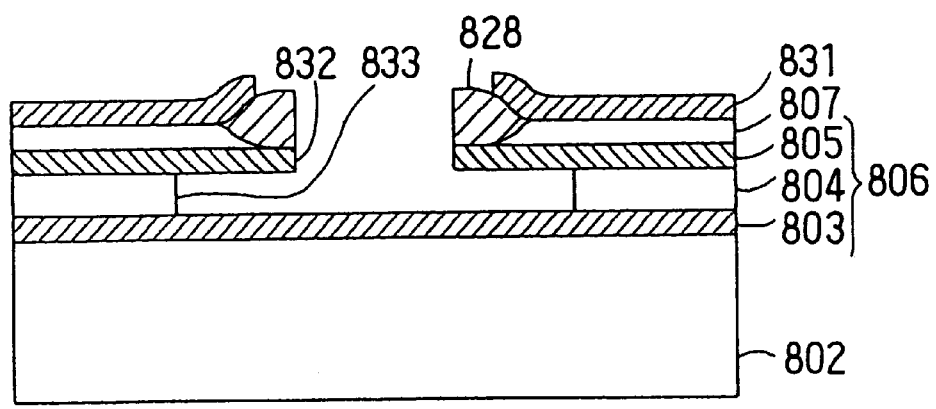
Figure 114C:
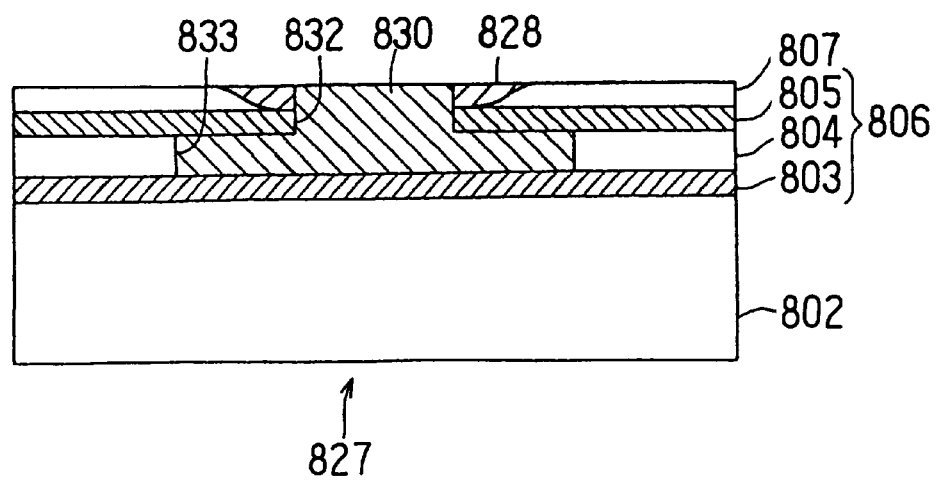

Next, in a polysilicon etching step U94, the end faces of the polysilicon film 804 exposed at the bottom of the trench 832 are etched inward to form an opening 833 wider than the trench 832. This is carried out by, for example, wet etching, and is carried out by using an etching liquid which selectively etches the polysilicon film 804 until the etching reaches a predetermined distance inward (FIG. 114B).

After that, in an oxide film forming step U95, an oxide film 830 is deposited on the surface by CVD or the like. In this case, the oxide film 830 deposited is provided to an ample film thickness and made to completely fill the inside of the trench 832, as described above. Then, a heat treatment step U96 is carried out to make the oxide film 830 fluid and ensure that the oxide film 830 completely fills the inside of the opening 833. The heat treatment conditions at this time are determined according to the relationship in dimension between the trench 832 and the opening 833.

The oxide film 830 deposited in the trench 832 and on the surface of the nitride film 831 is removed by polishing in a polishing step U97 which follows. At this time, by the nitride film 831 being used as a polishing stopper, the polishing can be stopped at the correct time. After that, when the nitride film 831 is removed, a SOI substrate 827 wherein the monocrystalline silicon thin film 807 is divided into device formation regions 829 is obtained.

With this forty-second preferred embodiment, with respect to device formation regions 829 formed by dividing up a monocrystalline silicon thin film 807 it is possible to obtain a polysilicon film 804 formed into regions smaller than these. By this means, it is possible to process a semiconductor substrate of a construction using a polysilicon film 804 serving as a back gate electrode into a desired shape and design freedom increases.

The aspect of the invention illustrated in the thirty-eighth through forty-second preferred embodiments described above is not limited to these preferred embodiments, and for example the following modifications and extensions can be made.

As the silicon substrate in which the ion-implanted layer is formed, one made by forming a monocrystalline thin film layer on a supporting substrate by epitaxial growth or one made by forming a monocrystalline thin film layer by epitaxial growth on porosified silicon can be used. In these, an ion-implanted layer for detachment use can be formed by ion implantation being carried out into the epitaxial film or the porous film in an ion implantation step.

Although a case wherein the polysilicon film 804 serving as a conductive layer was provided as a single layer only was described, a construction may be adopted wherein a plurality of conductive layers are provided and insulated by being sandwiched between insulating films such as oxide films. Also, the conductive layer can be used for uses other than the back gate electrode, and for example can be used as interconnections.

The conductive layer does not have to be polysilicon, and other semiconductor materials may be used and amorphous instead of polycrystalline materials may be used. Also, besides semiconductor materials the conductive layer can be made of metal materials, and for example metals having high melting points such as tungsten (W) and titanium (Ti) and metals such as aluminum (Al) and copper (Cu) may be used.

Next, forty-third through fifty-third preferred embodiments of the invention will be described. These preferred embodiments illustrate an example of an application of a semiconductor substrate according to the invention wherein such a semiconductor substrate is used to construct a pressure sensor. Before the description of these preferred embodiments the background to an aspect of the invention illustrated in them will be briefly explained. The preferred embodiments will then be described in detail.

Among semiconductor pressure sensors for detecting a pressure acting on a diaphragm, there are those which have provided inside them a pressure reference chamber. The pressure reference chamber has its internal pressure reduced almost to a vacuum, and thereby fluctuations in the internal pressure caused by temperature variations and so on are suppressed and the precision with which the sensor can detect a pressure acting on the diaphragm is increased.

Further, among semiconductor substrates used to manufacture semiconductor pressure sensors of this kind, there are those preformed with a part equivalent to the pressure reference chamber described above. In those semiconductor substrates, two monocrystalline silicon substrates are used to form a pressure reference chamber and a diaphragm by means of lamination technology.

That is, first, a concavity for use as a pressure reference chamber is formed by a method such as etching in a silicon substrate to serve as a supporting substrate. Then, this silicon substrate and a separately prepared silicon substrate to be used to form a diaphragm are laminated together using lamination technology. Next, the silicon substrate for diaphragm formation is ground and polished and its thickness is thereby adjusted to the thickness of the diaphragm required. In this way, it is possible to provide a pressure reference chamber in the silicon substrate serving as the supporting substrate and also to form a diaphragm covering this.

However, with a method wherein as described above the substrate for diaphragm formation is ground and polished after lamination is carried out, polishing must be carried out until the silicon substrate for diaphragm formation reaches the required diaphragm thickness. Also, the method is uneconomic in that most of a silicon substrate is removed by grinding and polishing. Furthermore, the process of polishing so as to leave a part of a thin film thickness like a diaphragm is itself technologically difficult from the point of view of controllability.

In the control of film thickness by polishing, because it is difficult to carry out polishing while directly measuring the film thickness of the remaining silicon substrate, control is carried out by, for example, a method wherein the polishing rate is measured and polishing is time-controlled to leave the required thickness, or a method wherein a polishing stopper is provided in advance in the silicon substrate to be polished is used.

With the method of providing a polishing stopper, for example a groove of a predetermined depth is formed in the silicon substrate by which a diaphragm is to be formed and a silicon oxide is filled into the groove. Then, when during polishing the position at which the bottom of the silicon oxide becomes exposed is reached, because the oxide film has a lower polishing rate than silicon the polishing of the silicon is automatically stopped.

However, even when using these various technologies polishing is carried out precisely, as long as a method based on polishing is employed, there remains the problem that during polishing distortion tends to occur at the part where the concavity used as a pressure reference chamber is formed and it is difficult to form the diaphragm to a uniform thickness. Furthermore, it is also difficult to make the thicknesses of a plurality of diaphragms formed in a substrate the same.

It is therefore an object of the aspect of the invention illustrated in the forty-third through fifty-third preferred embodiments described below to provide a method for manufacturing a semiconductor substrate for use in a pressure sensor with which it is possible to form a diaphragm uniformly and accurately to a required thickness.

According to this aspect of the invention, for a pressure sensor of a structure wherein a pressure acting on a diaphragm is electrically detected on the basis of a stress in the diaphragm arising due to a pressure difference between an outside pressure acting on the diaphragm and the pressure inside a pressure reference chamber, in an ion-implanted layer forming step an ion-implanted layer for detachment use is formed to a predetermined depth in a first semiconductor substrate to be used to form a diaphragm, in a concavity forming step a concavity for use as a pressure reference chamber is formed in a second substrate to form a pressure reference chamber, in a laminating step the first and second substrates are laminated together, and in a detaching step the first substrate is detached at the ion-implanted layer to form a semiconductor layer on the surface of the second substrate, and a diaphragm and a pressure reference chamber are thereby formed. By this means, it is possible to form a diaphragm of a required thickness dimension accurately by controlling the depth of the ion-implanted layer. Also, since processing by methods such as grinding and polishing is unnecessary the diaphragm can be made simply and in a short time. Also, it becomes possible to reuse the first substrate and cost reductions can be made.

In the concavity forming step, the concavity can be formed by etching the surface of the second substrate.

Since the semiconductor layer for forming the diaphragm is provided by going through a laminating step and a detaching step, by an oxide film being provided between the second substrate and the semiconductor layer at that time, it is possible for the semiconductor layer to be formed in an insulated state from the second substrate. When this is done, the region of the semiconductor layer that is not the diaphragm part becomes a so-called SOI (Silicon On Insulator) part. Circuit devices for signal processing can be formed in this region. For example, a MOS-type device and a bipolar device can be integrated on the same chip.

In the concavity forming step, preferably, a pillar part of the same length as the depth dimension of the concavity for pressure reference chamber and removable by selective etching is formed on the bottom face of the inside of the concavity. Then, in the laminating step, using this pillar part the first substrate can be directly bonded to the ends of the pillar part in the region of the concavity so that in the detaching step a semiconductor layer for forming a diaphragm can be detached surely at the ion-implanted layer.

In particular, when, to make the diaphragm thin, the ion-implanted layer is formed at a shallow position in the first substrate, the semiconductor layer to be detached is also thin. Therefore, considering the strength of the diaphragm at the time of the detachment, compared to a construction wherein there is no such pillar part the diaphragm can be formed more surely. Also, even in cases such as when in the ion-implanted layer forming step the dose of the ion-implanted layer formed was deficient, it is possible to effect a detachment and thereby form the semiconductor layer.

In the concavity forming step, the pillar part formed inside the concavity is preferably made up of a plurality of pillars. By this means, it is possible to make the bonding force between the pillar part and the first substrate higher and when forming a thin diaphragm it is possible for a semiconductor layer to be formed by detachment surely.

In the concavity forming step, preferably, at the time of an etching process for forming the concavity in the second substrate, a pattern for forming the pillar part is provided and etching is carried out with this pattern as a mask to form the pillar part. Thereafter, the pillar part may be oxidized by a heat treatment step being carried out. When this is done, the pillar part alone can be removed in a later selective etching step. Therefore, at the time of lamination of the second substrate to the first substrate the lamination can be carried out with the surface of the second substrate and the pillar part provided in the concavity bonded together. After the semiconductor layer is formed by detachment in the detaching step the pillar part remaining on the diaphragm part can be removed by selective etching with aqueous fluoric acid or the like to form the diaphragm.

The concavity for use as a pressure reference chamber formed in the second substrate can be provided by forming an oxide film on the surface of the second substrate in an oxide film forming step and then forming an opening in this oxide film in a concavity forming step. For example, in the case of a construction wherein a shallow concavity is to be provided, the concavity for use as a pressure reference chamber can be formed by employing a simplified etching process and it is possible to form a concavity having no depth variation due to etching.

By removing a predetermined region of the semiconductor layer formed on the surface of the second substrate other than the diaphragm part thereof in a semiconductor layer removing step carried out after the detaching step, it is possible to expose a region for device formation at the surface of the second substrate. When this is done, when it is not possible to conduct device formation with the film thickness of the semiconductor layer for forming the diaphragm, because device formation can be conducted on the second substrate it is possible to reduce restrictions for device formation and raise design freedom. Also, it is possible to raise heat dissipation from the devices formed.

Preferably, a connecting part for exhaustion use connecting the concavity for use as a pressure reference chamber with the outside is formed in the concavity forming step. In an exhausting and sealing step carried out after the detaching step, the inside of the pressure reference chamber may be exhausted through an exhaustion passage formed by the connecting part and then be sealed. In this way, a construction for bringing the inside of the pressure reference chamber to a reduced pressure or a vacuum to leave as little gas contained inside it as possible and thereby suppress pressure fluctuations inside the pressure reference chamber caused by temperature variations and so on and effect a more exact pressure detecting operation can be formed simply and with good controllability.

In the concavity forming step, the connecting part for exhaustion can be formed as a channel running along a surface part of the second substrate and the exhaustion passage can be formed by the surface part being covered with a semiconductor layer formed after the detaching step. In this way, it is possible to form the exhaustion passage by utilizing a step for forming the diaphragm and the method can thereby be carried out easily without adding a special step.

In the concavity forming step, the depth of the connecting part for exhaustion can be made the same as the depth of the concavity. In this case, because both the connecting part for exhaustion and the concavity can be formed with a single etching process, the number of steps can be reduced and the connecting part for exhaustion can be made easily.

In the concavity forming step, the exhaustion passage can be formed as an opening connecting with the rear side of the second substrate. Then, in the exhaustion and sealing step, the inside of the pressure reference chamber is exhausted from the rear side of the second substrate through the opening and the opening is sealed, whereby a device having the same characteristics can be obtained.

In the exhausting and sealing step, preferably, a film is formed by CVD so as to seal the opening of the exhaustion passage in a reduced-pressure atmosphere. By this means, it is possible to perform the exhausting and sealing step without employing a special process. When a protective film or the like is to be formed on the final surface, the exhausting and sealing step can be carried out at the same time as a step for forming the protective film is carried out. In this case, it is not necessary for a special step for sealing to be added to the process.

Preferably, before the laminating step, in a noncrystalline film forming step a noncrystalline film made from the same element as the first substrate is formed at the surface of the first substrate. When this is done, compared to when the laminating step and the detaching step are carried out with the surface of the first substrate still monocrystalline, the mechanical strength of the semiconductor layer formed by the detachment can be increased.

In the noncrystalline film forming step, the noncrystalline film may be formed by carrying out ion implantation into the first substrate to uncrystallize a surface layer thereof on the shallow side of the ion-implanted layer. By this means, it is possible to increase the strength of the semiconductor layer for forming the diaphragm without reducing the controllability of the film thickness of the semiconductor layer set by the formation of the ion-implanted layer for detachment.

In the noncrystalline film forming step, the above-mentioned noncrystalline film can also be formed by a noncrystalline film being deposited on the first substrate. By this means, it is possible to achieve an increase in the strength of the semiconductor layer and provide a good detachment state easily without employing a special process.

In the detaching step, the noncrystalline film is preferably recrystallized by heat treatment being carried out. When this is done, while the mechanical strength of the semiconductor layer in the laminating step and the detaching step is increased, the semiconductor substrate finally obtained is the same as when no noncrystalline film is provided.

As the first substrate, a semiconductor substrate whose concentration of included oxygen is over $1 \times 10^{18}$ atoms/cm$^3$ is preferably used. In this case, the mechanical strength of the substrate is greater than that of a semiconductor substrate for ordinary use and the performance of the substrate in handling during processing steps is better.

(Forty-third Preferred Embodiment)

A forty-third preferred embodiment of the invention will now be described with reference to FIG. 115 through FIGS. 118A to 118E.

Figure 118A:
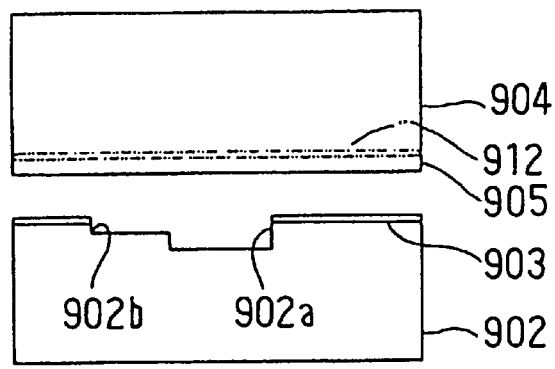
FIGS. 118A through 118E are schematic sectional views of steps following a laminating step.
Figure 118B:
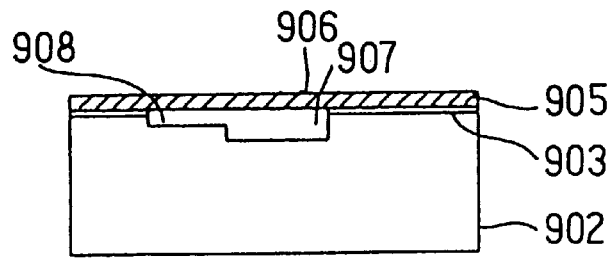
Figure 118C:
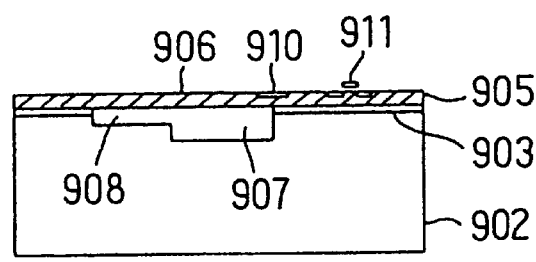
Figure 118D:
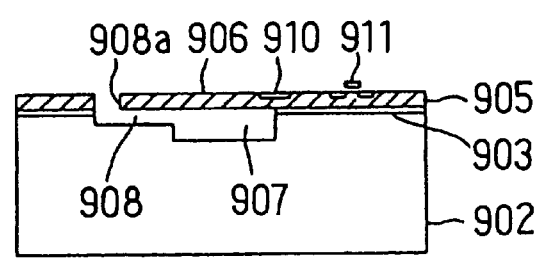
Figure 118E:
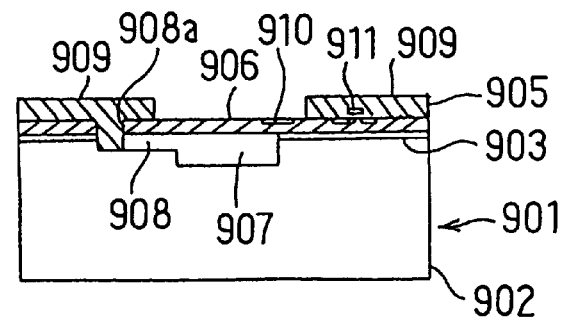

FIG. 118E is a schematic sectional view of a sensor chip 901 constituting a semiconductor substrate for use in a pressure sensor. This sensor chip 901 has a structure wherein a monosilicon film 905 constituting a semiconductor layer formed as will be further discussed later using a monosilicon substrate 904 serving as a first substrate for forming a diaphragm (see FIG. 116) is formed to a predetermined film thickness on a silicon oxide film 903, whereby a diaphragm 906 is provided. The silicon oxide film 903 is formed on a monosilicon substrate 902 serving as a second substrate constituting a supporting substrate.

A pressure reference chamber 907 is provided in the middle of the sensor chip 901 and has its interior exhausted to a near-vacuum state. An exhaustion passage 908 connecting with the pressure reference chamber 907 and opening to outside the sensor chip 901 is formed at a side of the pressure reference chamber 907. As will be further discussed later, the pressure reference chamber 907 is brought to an exhausted state by the inside of the pressure reference chamber being exhausted through this exhaustion passage 908 and the opening 908a then being sealed with a protective film 909.

A resistor 910 having a piezoresistance effect for pressure detection is formed on the diaphragm 906. Various circuit devices 911 such as MOS transistors constituting a circuit for signal processing are formed in the monosilicon film 905 positioned around the diaphragm 906. Such a circuit carries out amplification and signal processing of a pressure detection signal outputted by the resistor 910 to produce a detection output.

With this construction, when the diaphragm 906 is subjected to a pressure from outside, a force corresponding to the difference between that pressure and the pressure inside the pressure reference chamber 907 acts on the diaphragm 906 and it distorts. The resistance value of the resistor 910 formed in the diaphragm 906 changes with this distortion due to the piezoresistance effect. This change in resistance value is detected by a bridge-connected circuit as a change in voltage and outputted by a signal processing circuit as a detection signal corresponding to the outside pressure.

In this case, because the inside of the pressure reference chamber 907 has been exhausted to a near-vacuum state, unlike when a gas is present, internal pressure fluctuations due to temperature changes of the measuring environment do not occur and therefore a highly precise pressure detecting operation can be carried out at all times. Also, in the construction described above, because the diaphragm 906 is made from a monosilicon film 905 formed using a monosilicon substrate 904 serving as a first substrate as will be further discussed later, a thin film diaphragm 906 can be formed uniformly and accurately. By this means, it is possible to increase the stability and precision of the pressure detection.

Figure 115:
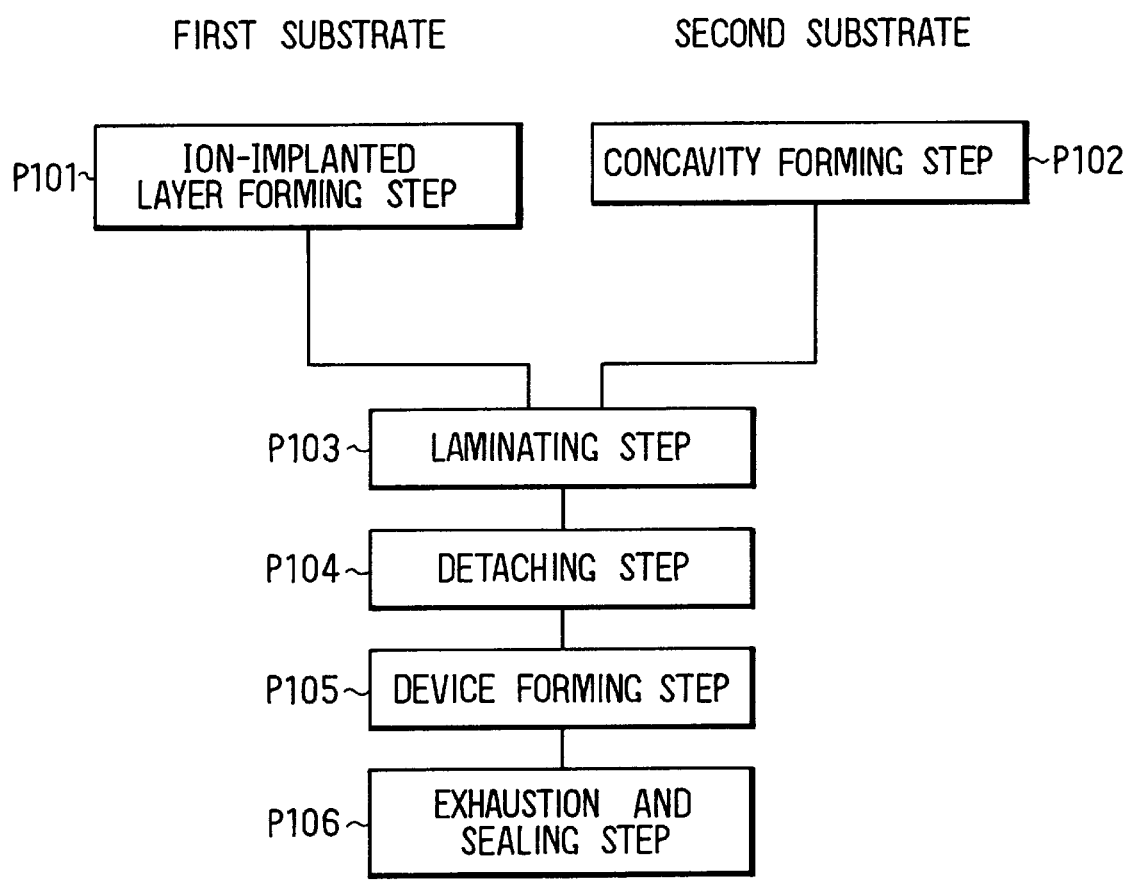
FIG. 115 is a block diagram of a manufacturing process according to a forty-third preferred embodiment.

Next, a process for manufacturing the pressure sensor described above will be described. FIG. 115 is a block diagram showing the flow of the process, and the process will be described using this process diagram and the process step illustrations of FIGS. 118A through 118E.

(1) ion-implanted layer forming step (P101)

Figure 116:
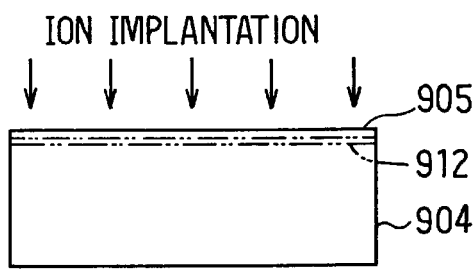
FIG. 116 is a schematic sectional view of a first substrate after an ion-implanted layer forming step.
Figure 117A:
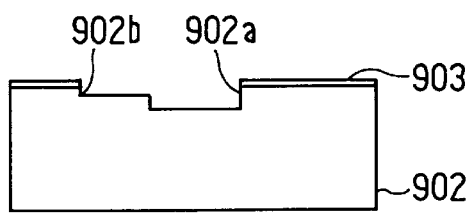
FIGS. 117A and 117B are a schematic sectional view and a plan view of a second substrate after a concavity forming step.
Figure 117B:
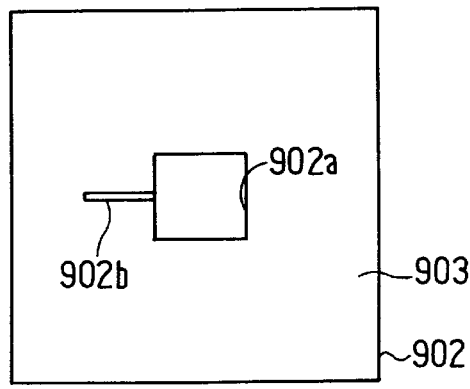

First, a monosilicon substrate 904 to serve as a first substrate is prepared with at least one face thereof polished to a mirror finish. Then, by ion implantation, for example hydrogen ions (protons) are implanted into this side polished to a mirror finish to form a high-concentration ion-implanted layer 912 (FIG. 116). Here, for the monosilicon substrate 904, a substrate having an included oxygen concentration of over $1 \times 10^{18}$ atoms/cm$^3$ and preferably about $5 \times 10^{18}$ atoms/cm$^3$, higher than that of a substrate used in an ordinary device, is used. By this means, its mechanical strength is increased. An included oxygen concentration in the range of $1 \times 10^{18}$ to $1 \times 10^{20}$ atoms/cm$^3$ and preferably in the range of $1 \times 10^{18}$ to $1 \times 10^{19}$ atoms/cm$^3$ is suitable.

Since the depth at which the ion-implanted layer 912 is formed changes depending on the acceleration voltage and the dose, the acceleration voltage and the dose are adjusted in correspondence with the thickness of the diaphragm 906 to be formed. The dose of the ion-implanted layer 912 is set to above $1 \times 10^{16}$ atoms/cm$^2$, and for example to $5 \times 10^{16}$ atoms/cm$^2$. The larger this dose is, the better the detachability in the detaching step P104 is. By an oxide film being formed on the face through which the ion implantation is to be carried out, damage to the surface caused by the ion implantation can be moderated and impurity contamination can be reduced.

(2) concavity forming step (P102)

Next, a monosilicon substrate 902 to serve as a second substrate is prepared with at least one face thereof polished to a mirror finish. Then, a concavity 902a for use as a pressure reference chamber 907 and a channel 902b to serve as a connecting part for exhaustion are formed in the mirror-finished side of the substrate by a method such as dry etching or wet etching using KOH (potassium hydroxide solution).

In this case, the concavity 902a for use as a pressure reference chamber 907 is formed to suitable dimensions in accordance with the range and size of the pressures to be measured. For example, the concavity is made a square of side length in a range of about 10 μm to 1000 μm and for example 100 μm and its depth is suitably set in a range of 1 μm to 10 μm. The channel 902b for example has a width in a range of 1 μm to 100 μm and, for instance about 10 μm, and its length is set in a range of 10 μm to 1000 μm and for example to a few hundred micrometers.

An oxide film 903 is formed on the surface of the monosilicon substrate 902 by a method such as thermal oxidation or CVD. This oxide film 903 may also be formed at the same time on the side walls and the bottom of the concavity 902a and the channel 902b of the monosilicon substrate 902.

(3) laminating step (P103)

Next, the face of the monosilicon substrate 904 on the side on which the ion-implanted layer 912 is formed is laminated onto the face of the monosilicon substrate 902 on the side on which the concavity 902a is formed (FIG. 118A). For this lamination, as a hydrophilicizing treatment, the two monosilicon substrates 902, 904 are each washed with a treating solvent made by mixing for example $H_2SO_4$ and $H_2O_2$ in the ratio 4 to 1 and washed with pure water and then the amounts of water adsorbed onto their surfaces are controlled by spin drying. In this state, the two substrates are laminated together. By this means, the monosilicon substrates 902, 904 are directly bonded together by hydrogen bonding of silanol radicals formed on their surfaces and water molecules adsorbed onto their surfaces.

(4) detaching step (P104)

After that, the monosilicon substrates 902, 904 thus directly bonded together are heat treated in a nitrogen atmosphere or an oxygen atmosphere. For this heat treatment, there is the method of successively conducting a first heat treatment carried out in a range of 400° C. to 600° C. and for example at about 500° C., and a second heat treatment carried out at over 1000° C. and for example at 1100° C. There is also the method of conducting a single heat treatment with the temperature being continuously increased.

As a result of this heat treatment being carried out, a dehydration and condensation reaction occurs at the bonding interface of the two substrates 902, 904 and the strength of bonding is made high. Also, in the hydrogen ion-implanted layer 912, the heat treatment causes defects to concentrate locally and bubbles form and consequently a detachment occurs at that plane (FIG. 118B).

As a result, a monosilicon film 905 of film thickness for example about 2 $\mu$m (a range of for example 1 $\mu$m to 10 $\mu$m being preferable) of the surface portion of the monosilicon substrate 904 remains directly bonded to the monosilicon substrate 902 side. By this means, a pressure reference chamber 907 and a diaphragm 906 can be formed. After that, the smoothness of the surface of the detached monosilicon film 905 is improved by its surface roughness being reduced by a method such as polishing. When a device forming step is not to be carried out, this polishing process is not always necessary.

(5) device forming step (P105)

In the state described above, because the monosilicon film 905 is formed on the monosilicon substrate 902 serving as a second substrate with the oxide film 903 therebetween, the substrate structure is a SOI (Silicon On Insulator) structure. On this monosilicon film 905, a resistor 910 having a piezoresistance effect for pressure detection is formed and various devices 911 such as MOS transistors constituting a circuit for signal processing are formed (FIG. 118C). The resistor 910 is connected by an interconnection pattern to make a bridge circuit, and the input and output terminals thereof are connected to the signal processing circuit.

(6) exhaustion and sealing step (P106)

Next, an opening 908a is formed in the monosilicon film 905 at the opposite end of the exhaustion passage 908 formed by the channel 902b and the monosilicon film 905 from the pressure reference chamber 907 (FIG. 118D). In this case, the opening 908a is formed by etching or the like from the front surface side of the monosilicon film 905.

After that, by a CVD reactor or the like being used to form a protective film 909 on the surface of the monosilicon film 905 thus formed, the opening 908a is sealed. That is, the work is placed in a CVD reactor and the pressure inside the reactor is reduced to expose the work to a vacuum atmosphere and evacuate the inside of the pressure reference chamber 907 through the exhaustion passage 908. Then, with the pressure reference chamber 907 thus exhausted, a protective film 909 such as a silicon nitride film or a silicon oxide film is deposited over the entire surface of the work. By this means the opening 908a is simultaneously sealed. After that, the protective film 909 on the diaphragm 906 is removed by photolithography and the sensor chip 901 is thereby completed.

With this forty-third preferred embodiment, a diaphragm 906 having on its inner side a pressure reference chamber 907 is formed by laminating a monosilicon substrate 904 in which an ion-implanted layer 912 has been formed to a monosilicon substrate 902 and then performing heat treatment to effect a detachment. Consequently, compared to a conventional method wherein the film thickness of the diaphragm is controlled to a set dimension by polishing after the lamination, it is possible to form a uniform and thin diaphragm 906 with good reproducability. Therefore, it is possible to provide a pressure sensor having a high detecting precision.

Also, with this forty-third preferred embodiment, because, by means of the exhausting and sealing step P106, the pressure reference chamber 907 can be formed in a near-vacuum state, setting of the pressure inside the pressure reference chamber 907 can be carried out accurately. In this way, it is possible to prevent to the utmost pressure fluctuations in the pressure reference chamber 907 caused by changes in environment temperature and provide a pressure sensor capable of performing a highly accurate pressure detecting operation.

In the preferred embodiment described above, a sensor chip 901 of a construction wherein an oxide film 903 is interposed between the monosilicon substrate 902 and the monosilicon substrate 904 was described. However, instead of this for example a construction wherein the oxide film 903 is not provided can be adopted. In other words, even with a construction wherein the monosilicon substrates 902 and 904 are directly bonded together, which is not a SOI structure, circuit devices 911 can be formed on the monosilicon film 905.

Also, when the diaphragm 906 is made thick, bipolar devices can be formed. And when this kind of construction wherein there is no oxide film 903 is adopted, because heat produced by the signal processing circuit is readily transmitted to the monosilicon substrate 902 side constituting the second substrate, heat dissipation from the rear side of the device increases and the operating characteristics improve.

(Forty-fourth Preferred Embodiment)

Figure 119A:
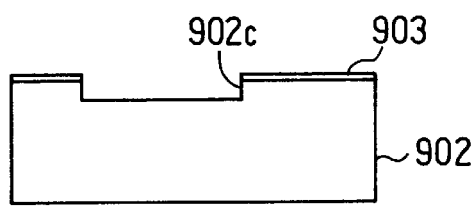
Figure 119B:
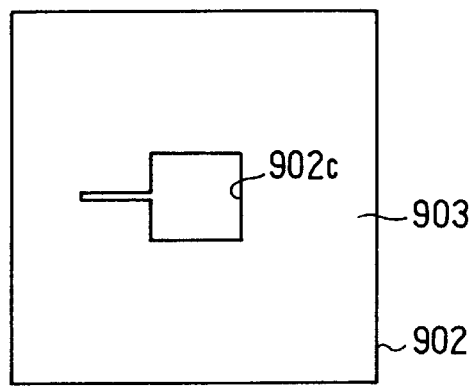

FIGS. 119A and 119B show a forty-fourth preferred embodiment of the invention. This preferred embodiment differs from the forty-third preferred embodiment described above in that the depths of the concavity 902a and the channel 902b formed in the surface of the monosilicon substrate 902 serving as the second substrate are set to the same dimension. That is, in the concavity forming step P102, a photoresist pattern of the kind shown in FIG. 119B is formed in the surface of the monosilicon substrate 902 and etching is carried out to form a concavity 902c made up of a concavity 902a and a channel 902b integrated at the same depth.

As in this preferred embodiment, when in the pressure measurement conditions and so on there are no structural restrictions, the concavity 902a and the channel 902b in the forty-third preferred embodiment can be formed with a single photolithography process as the integrated concavity 902c. As a result, there is the merit that the number of steps decreases.

(Forty-fifth Preferred Embodiment)

FIG. 120 through FIGS. 122A, 122B show a forty-fifth preferred embodiment of the invention. This preferred embodiment differs from the forty-third preferred embodiment described above in that, after the detaching step P104, a semiconductor layer removing step Q101 is provided to remove the part of the monosilicon film 905 positioned around the diaphragm 906 where the MOS circuit devices 911 for signal processing circuit were formed.

That is, because in the forty-third preferred embodiment MOS circuit devices 911 (formable in a region of 2 $\mu$m to 3

μm in depth) such as MOS transistors were formed as devices for signal processing circuit, these devices can be formed even when the film thickness of the monosilicon film 905 used as the diaphragm 906 is relatively thin.

However, when for example bipolar devices 913 (see FIG. 121E) such as bipolar transistors, which are often used in signal processing devices of sensors, are to be formed, in an ordinary construction a depth of up to about 10 μm is necessary for a device formation layer. When the diaphragm 906 is made thin the restriction becomes great particularly on depth and it sometimes becomes difficult to form a circuit construction.

In this connection, in this forty-fifth preferred embodiment, a sensor chip 914 having a structure wherein the restriction due to the film thickness of the monosilicon film 905 forming the diaphragm 906 is not suffered is provided. In this construction, bipolar circuit devices 913 such as bipolar transistors are formed on an exposed part of the surface 915 of the monosilicon substrate 902 serving as the second substrate.

Figure 120:
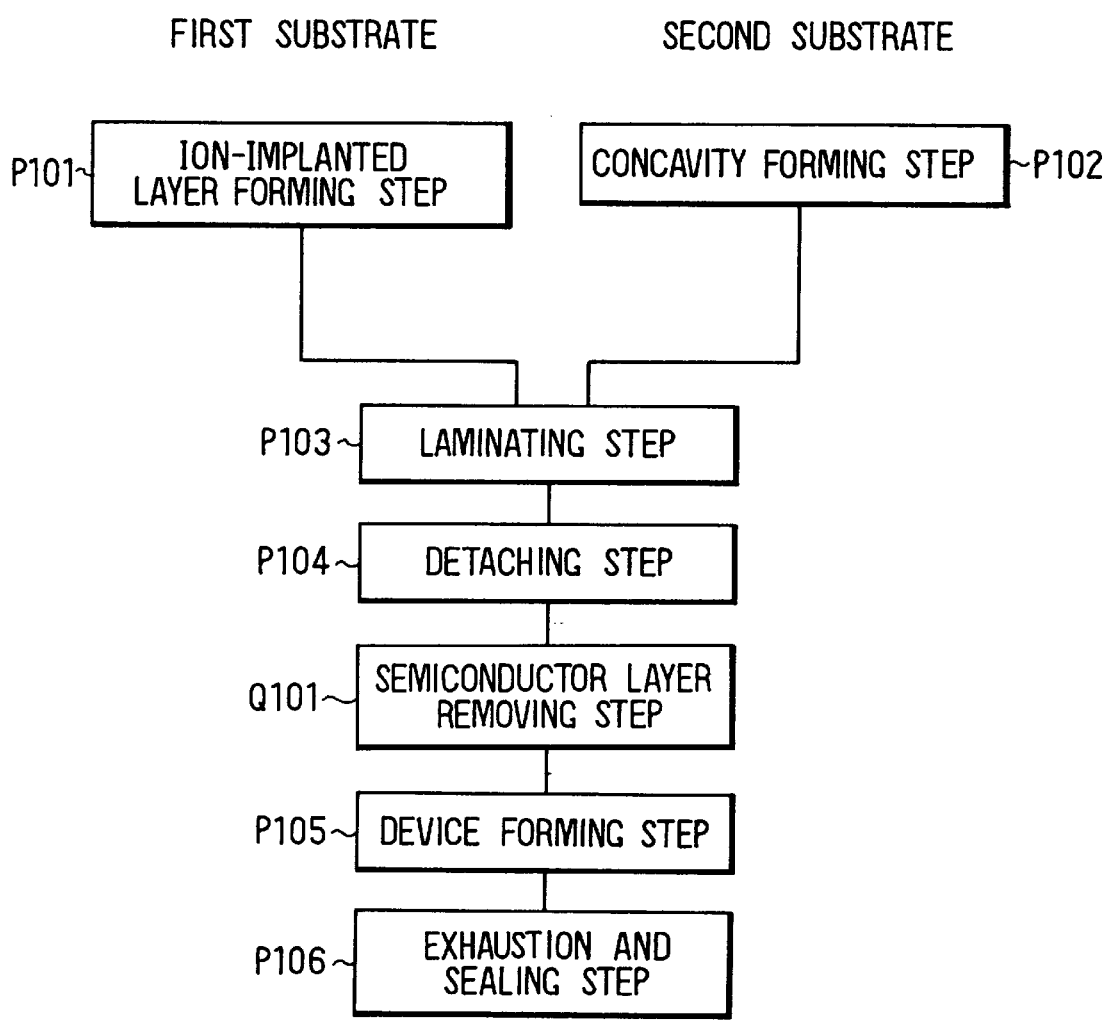
Figure 121A:
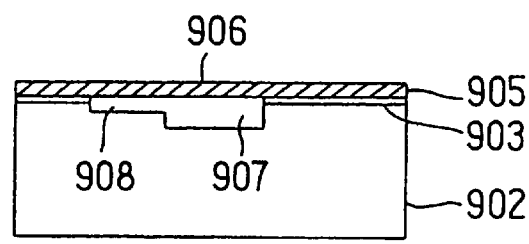
Figure 121B:
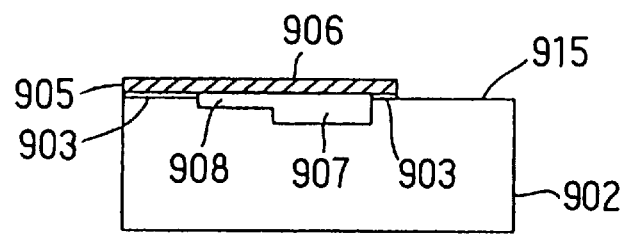

Next, a method for manufacturing a sensor chip 914 of this construction above will be described (see FIG. 120). An ion-implanted layer forming step P101, a concavity forming step P102, a laminating step P103 and a detaching step P104 are carried out in the same way as in the forty-third preferred embodiment to obtain the construction shown in FIG. 121A. Then, in a semiconductor layer removing step Q101, to remove a part of the monosilicon film 905 excluding the diaphragm 906 region, resist is patterned by photolithography into the kind of shape shown in FIG. 122B. Then, etching is carried out with the oxide film 903 formed below the monosilicon film 905 as an etching stopper. Thereafter, the exposed oxide film 903 is similarly removed by etching. Consequently, the surface 915 of the monosilicon substrate 902 is partially exposed (FIG. 121B).

Figure 121C:
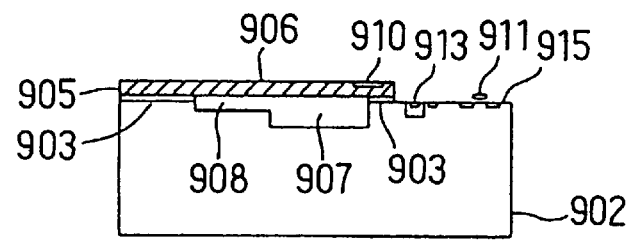

Next, in a device forming step P105, a resistor 910 is formed on the diaphragm 906 part in the same way as that described above and MOS circuit devices 911 and bipolar circuit devices 913 for a signal processing circuit are formed on the surface 915 of the monosilicon substrate 902 exposed in the previous step (FIG. 121C).

Figure 121D:
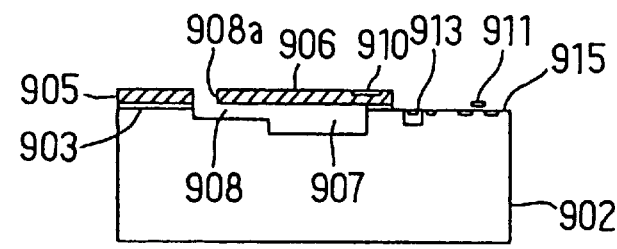
Figure 121E:
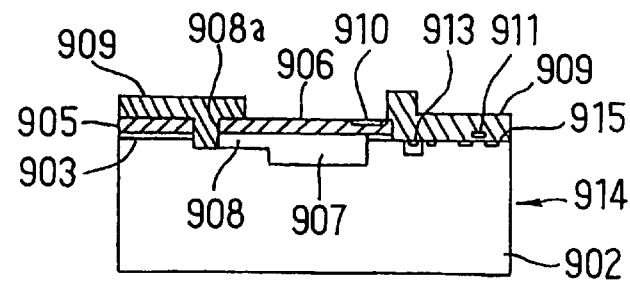
Figure 122A:
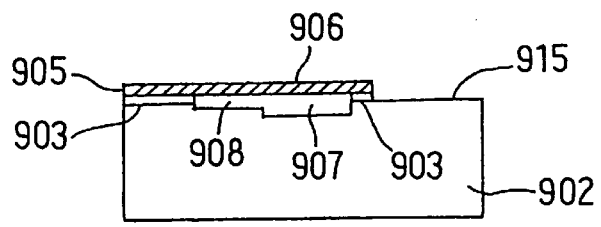
Figure 122B:
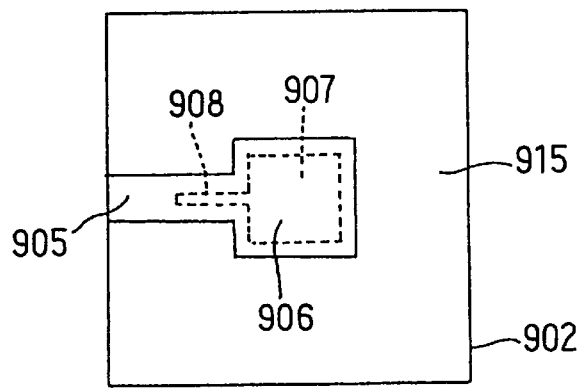

After that, an exhausting and sealing step P106 is carried out in the same way as in the forty-third preferred embodiment, whereby an opening 908a is formed in the monosilicon film 905 at the end of the exhaustion passage 908 (FIG. 121D). By CVD, the inside of the pressure reference chamber 907 is exhausted to a near-vacuum. A protective film 909 is formed over the entire surface of the work to seal the opening 908a. After that, the protective film 909 on the diaphragm 906 part is removed and a sensor chip 914 is thereby obtained.

With this forty-fifth preferred embodiment, by a semiconductor layer removing step Q101 being carried out, the monosilicon film 905 around the diaphragm 906 is removed to expose the surface 915 of the monosilicon substrate 902. In this part, a signal processing circuit made up of MOS circuit devices 911 and bipolar circuit devices 913 and so on is then formed. By this means, it becomes possible to form the circuit devices 911, 913 without suffering a restriction from the film thickness of the monosilicon film 905. Also, because the circuit devices 911, 913 are formed directly on the monosilicon substrate 902 like this, heat-sinking of heat produced by the circuit improves.

In the forty-fifth preferred embodiment described above also, the sensor chip 914 can be formed without the oxide film 903. In this case, when the monosilicon film 905 is etched in the semiconductor layer removing step Q101, because there is no oxide film 903 serving as an etching stopper, after the film thickness of the monosilicon film 905 is removed by etching, a part where defects have arisen in the vicinity of the bond between the monosilicon film 905 and the monosilicon substrate 902 is preferably removed by further etching before the circuit devices 911, 913 are formed.

Also, in the preferred embodiment described above, a construction may alternatively be adopted wherein the MOS circuit devices 911 are formed in the monosilicon film 905 (in a SOI structure region) and the bipolar circuit devices 913 are formed in a surface 915 of the monosilicon substrate 902 exposed by the monosilicon film 905 and the oxide film 903 being removed only in a region where the bipolar circuit devices 913 are to be formed.

(Forty-sixth Preferred Embodiment)

Figure 124A:
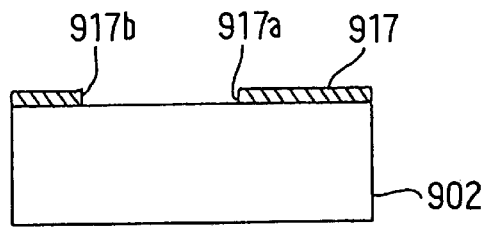
Figure 124B:
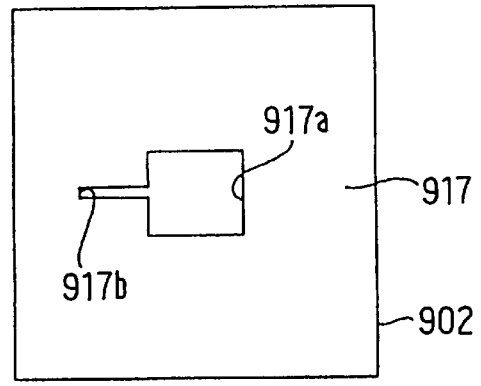
Figure 123:
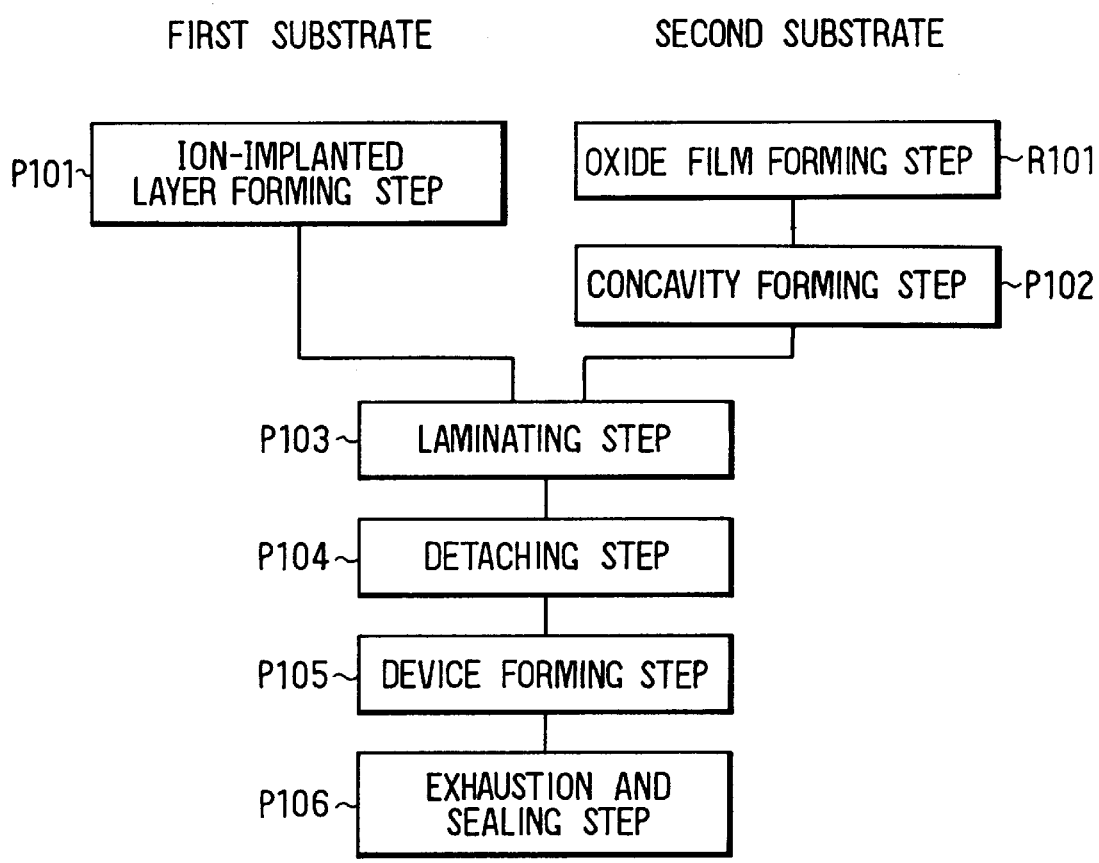
Figure 125A:
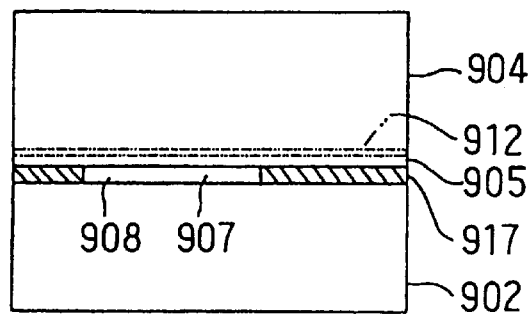
Figure 125B:
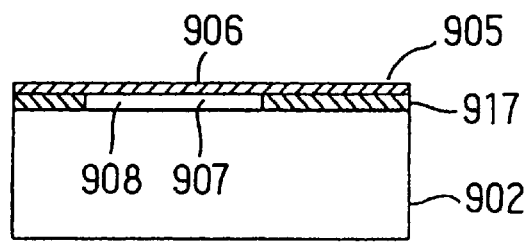
Figure 125C:
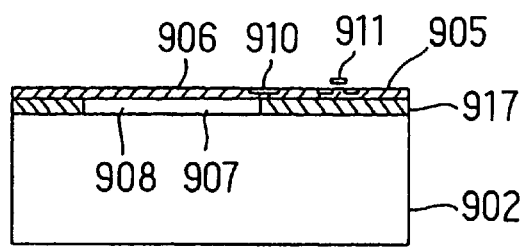
Figure 125D:
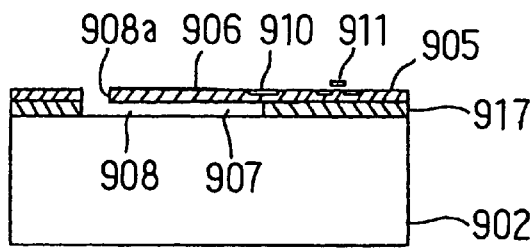
Figure 125E:
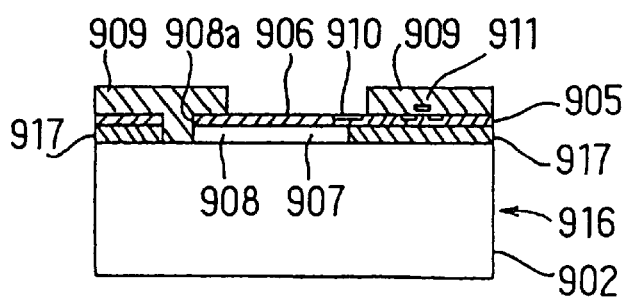
Figure 126:
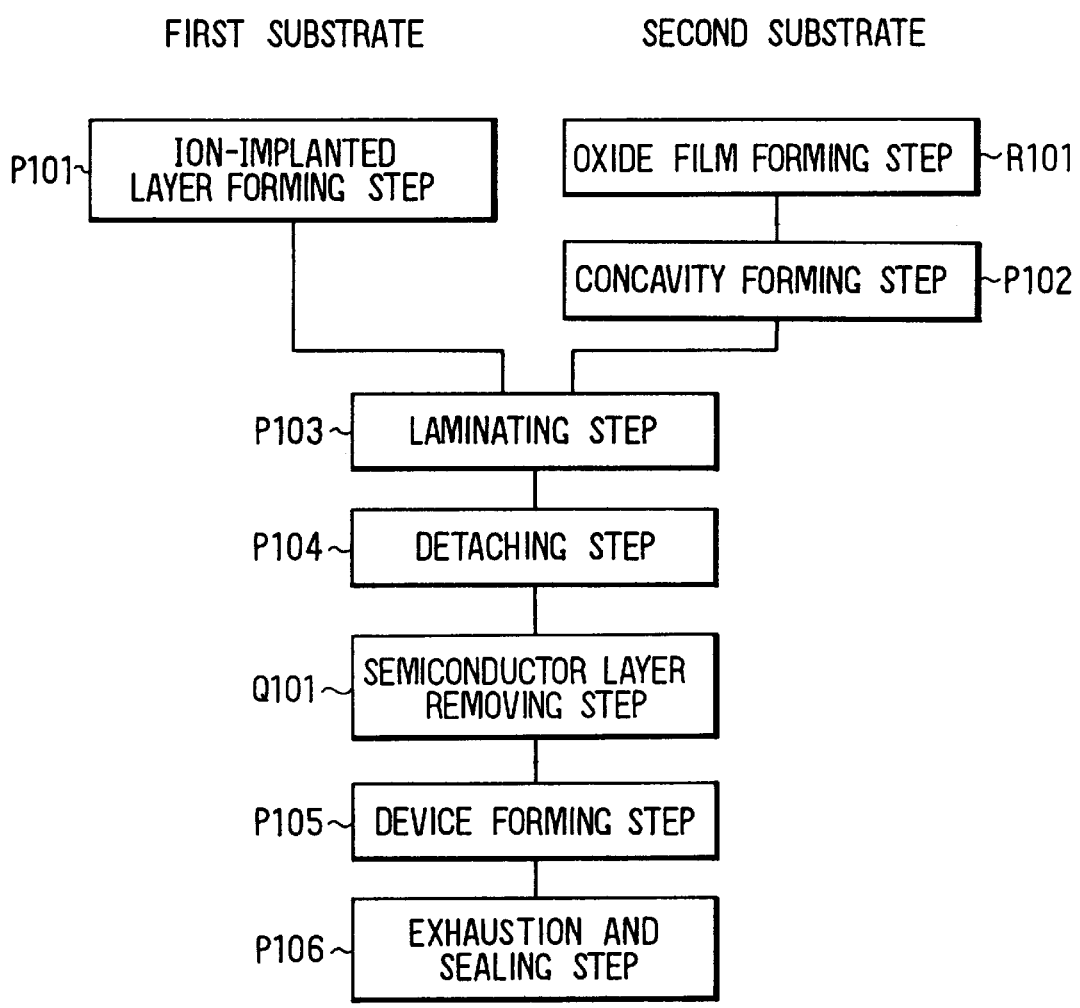

FIG. 123 through FIGS. 125A to 125E show a forty-sixth preferred embodiment of the invention. This preferred embodiment differs from the forty-third preferred embodiment described above in the method by which a concavity to be used as the pressure reference chamber 907 and a channel to be used as the exhaustion passage 908 are formed in the sensor chip 916 of this preferred embodiment. That is, as shown in FIG. 125E, in the sensor chip 916, a silicon oxide film 917 of a predetermined film thickness is provided on a monosilicon substrate 902 and a part of the silicon oxide film 917 is then removed by etching to form a concavity 917a and a channel 917b. A monosilicon film 905 is then formed on this in the same way as that described above to provide a diaphragm 906 a pressure reference chamber 907.

Next, a method for manufacturing this sensor chip 916 (FIG. 123) will be described. First, an ion-implanted layer forming step P101 is carried out in the same way as in the forty-third preferred embodiment. Then, before a concavity forming step P102, an oxide film forming step R101 is carried out on a monosilicon substrate 902 serving as a second substrate. An oxide film 917 of a predetermined film thickness is formed by a method such as thermal oxidation or CVD on the surface of the monosilicon substrate 902. In this case, since the film thickness of the oxide film 917 is a maximum of about 2 μm with thermal oxidation and is a maximum of 5 μm with CVD, the method is selected according to necessity.

Next, in a concavity forming step P102, differently from in the case of the forty-third preferred embodiment, openings 917a, 917b to constitute a concavity and a channel are formed by etching in the oxide film 917 (FIGS. 124A, 124B). Thereafter, in the same way as that described above, a laminating step P103 (FIG. 125A), a detaching step P104 (FIG. 125B), a device forming step P105 (FIG. 125C) and an exhausting and sealing step P106 (FIGS. 125D, 125E) are successively carried out.

In this way, a diaphragm 906 and a pressure reference chamber 907 are formed by means of a monosilicon film 905 constituting a semiconductor layer. After that, a resistor 910 and circuit devices 911 are formed after which an opening 908a is formed and then by CVD the inside of the pressure reference chamber 907 is exhausted through the opening 908a and the exhaustion passage 908 to a near-vacuum and a protective film 909 is formed. Finally, the protective film 909 on the diaphragm 906 is removed to complete the sensor chip 916.

With this forty-sixth preferred embodiment, because the concavity forming step P102 for forming a concavity 917a for use as a pressure reference chamber 907 and a channel 917b for use as an exhaustion passage 908 can be carried out by forming an oxide film 917 and then forming windows in this, when the depth dimension of the concavity 917a fits the conditions of this method it is possible to form a sensor chip 916 by going through simple processing steps.

(Forty-seventh Preferred Embodiment)

FIG. 126 and FIGS. 127A through 127E show a forty-seventh preferred embodiment of the invention. This preferred embodiment differs from the forty-sixth preferred embodiment described above in that the semiconductor layer removing step Q101 is carried out after the detaching step P104. That is, the sensor chip 918 of this preferred embodiment, as described in the forty-fifth preferred embodiment, has a construction wherein bipolar circuit devices 913 are provided.

Figure 127A:
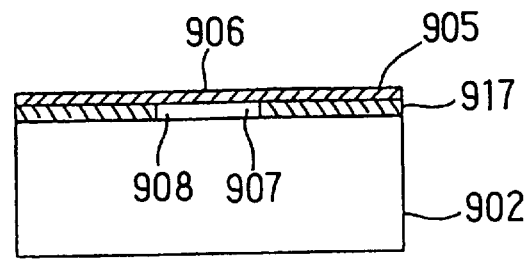
Figure 127B:
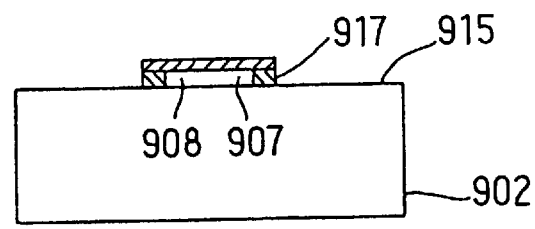

Next, a method for manufacturing this sensor chip 918 (FIG. 126) will be described. First, by a detaching step P104 being carried out in the same way as that described above a monosilicon film 905 is formed and a diaphragm 906 and a pressure reference chamber 907 are formed (FIG. 127A). After that, the semiconductor layer removing step Q101 is carried out and the monosilicon film 905 around the diaphragm 906 is removed and the oxide film 917 is removed to expose a surface 915 of the monosilicon substrate 902 (FIG. 127B).

Figure 127C:
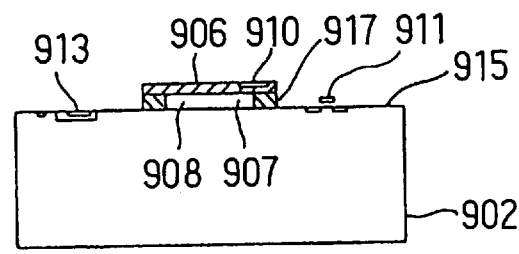
Figure 127D:
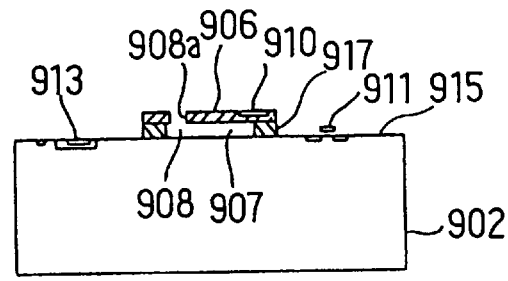
Figure 127E:
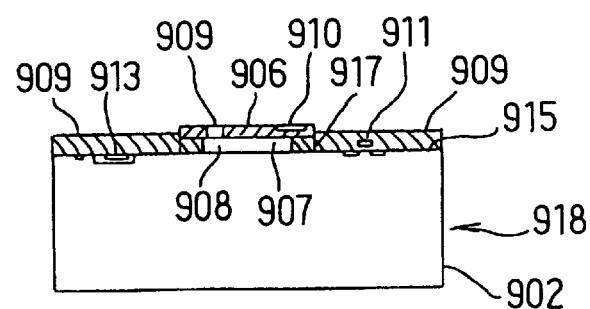
Figure 128:
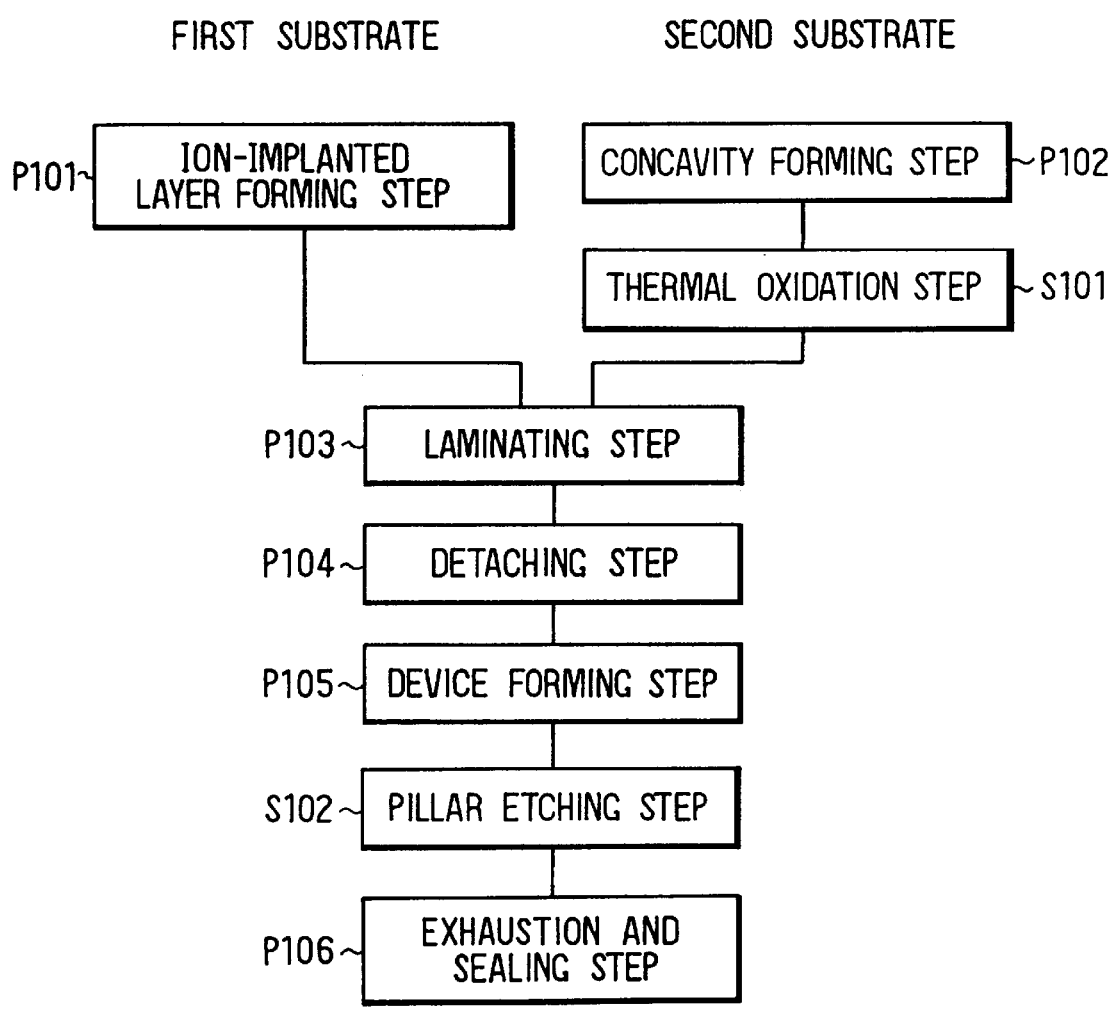

After that, by going through the device forming step P105, MOS circuit devices 911 and bipolar circuit devices 913 are formed on the surface 915 of the monosilicon substrate 902 to provide a signal processing circuit (FIG. 127C). Then, by the exhausting and sealing step P106, an opening 908a is formed in the exhaustion passage 908 (FIG. 127D) and by CVD a protective film 909 is formed and the opening 908a is sealed. The protective film 909 on the diaphragm 906 part is then removed and a sensor chip 918 is obtained.

With this forty-seventh preferred embodiment, while the concavity forming step P102 for obtaining the pressure reference chamber 907 is made simple by the adoption of a construction using the oxide film 917, the signal processing circuit can be formed on the surface 915 of the monosilicon substrate 902 to improve heat-sinking with respect to the circuit devices 911, 913 formed.

(Forty-eighth Preferred Embodiment)

FIG. 128 through FIG. 132 show a forty-eighth preferred embodiment of the invention. Parts of this preferred embodiment differing from the forty-third preferred embodiment will now be described. This preferred embodiment is particularly useful in cases such as when the film thickness of the diaphragm 906 is thin and when the ion dose of the ion-implanted layer 912 is insufficient, because it makes it possible for detachment of the monosilicon substrate 904 to be effected surely in the forming of the monosilicon film 905 by detachment in the detaching step P104.

Figure 129A:
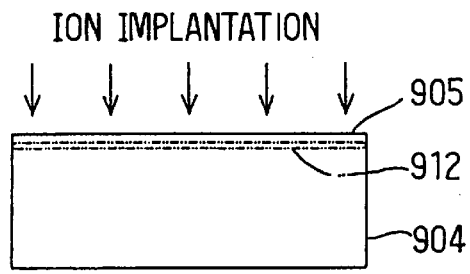

The structure of the completed sensor chip 919 of this preferred embodiment is the same as that of the sensor chip 901 discussed in the forty-third preferred embodiment, but its manufacturing process (see FIG. 128) is somewhat different. That is, first, in the same way as that described above, an ion-implanted layer 912 is formed with predetermined conditions by an ion-implanted layer forming step P101 in a monosilicon substrate 904 serving as a first substrate (FIG. 129A).

Figure 129B:
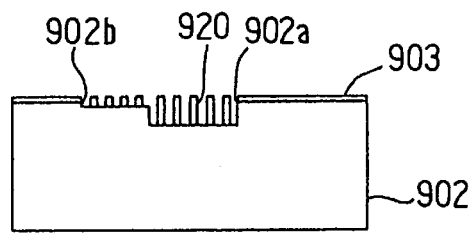

Next, in the concavity forming step P102, differently from in the previous preferred embodiments, when the concavity 902a to constitute the pressure reference chamber 907 and the channel 902b to constitute the exhaustion passage 908 are formed in the monosilicon substrate 902 serving as the second substrate, in the concavity 902a and in the channel 902b, parts where the silicon is not etched are allowed to remain as silicon pillars 920. These silicon pillars 920 are for example formed by patterning a mask and carrying out etching so as to leave square pillars of 0.1 $\mu$m to 3 $\mu$m on the bottom faces of the concavity 902a and the channel 902b (FIG. 129B).

In this case, a channel 902b is formed on each side of the concavity 902a, as shown in FIG. 132, for reasons relating to an etching process in a later step (in FIGS. 129A through 129C and 130A through 130C, to avoid complication, only one of the channels 902b is shown). Multiple silicon pillars 920 are formed in an array in these two channels 902b and in the concavity 902a. Although the silicon pillars 920 are formed as square pillars here, they may alternatively be round or of some other shape.

Figure 129C:
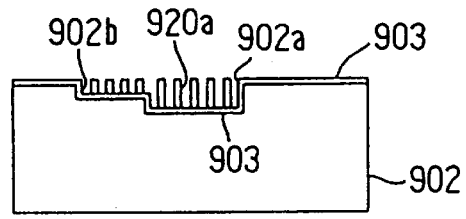

Next, in a thermal oxidation step S101, thermal oxidation is carried out on the monosilicon substrate 902 until the silicon of the silicon pillars 920 has completely become silicon oxide, whereby silicon oxide pillars 920a are formed. At this time, an oxide film 903 is also formed on the bottom faces and side walls of the concavity 902a and the channel 902b (FIG. 129C).

After that, by the laminating step P103 and the detaching step P104, a monosilicon film 905 is formed on the monosilicon substrate 902. At this time, in the laminating step P103 (FIG. 130A), because the ends of the silicon oxide pillars 920a formed in the concavity 902a and the channel 902b of the monosilicon substrate 902 are in the same plane as the substrate surface, the face of the monosilicon substrate 904 comes into intimate contact with the silicon oxide pillars 920a.

When with the two monosilicon substrates 902, 904 thus laminated together the detaching step P104 is then carried out, because the part of the monosilicon film 905 that is to become the diaphragm 906 is in intimate contact with the silicon oxide pillars 920a formed in the concavity 902a and the channel 902b on the monosilicon substrate 902, when detachment occurs at the ion-implanted layer 912 of the monosilicon substrate 904, problems of incomplete detachment wherein this part does not detach properly and splits or stays on the monosilicon substrate 904 side occurring can be avoided. The thinner the monosilicon film 905 whose detachment is being attempted is, the more likely incomplete detachment is to occur. Therefore, this is a useful structure for carrying out the detaching step P104 surely.

When the detaching step P104 has been carried out as described above and the monosilicon film 905 has thus been formed, in the pressure reference chamber 907 and the exhaustion passage 908 the silicon oxide pillars 920a are still present (FIG. 130B). From this state, the device forming step P105 which follows is carried out and a resistor 910 is formed in the diaphragm 906 part of the monosilicon film 905 and MOS circuit devices 911 for a signal processing circuit are formed in the region around the diaphragm 906 (FIG. 130C).

Then, in a pillar etching step S102, the monosilicon film 905 positioned at the ends of the two exhaustion passages 908 is removed by etching to form openings 908a (see FIG. 131A, in which only one opening 908a is shown). A silicon oxide etching liquid such as hydrogen fluoride is then passed through these two openings 908a to selectively etch and remove the silicon oxide pillars 920a and the oxide film 903 (FIG. 131B). In this case, because the openings 908a are formed in two locations, the etching liquid passes through the insides of the exhaustion passages 908 and the pressure reference chamber 907 easily.

Then, in the exhausting and sealing step P106, in the same way as that described above a CVD reactor is used to bring the inside of the oxide film 917 to a near-vacuum state and form a protective film 909 whereby the two openings 908a are covered by the protective film 909 and sealed. After that, the protective film 909 on the diaphragm 906 part is removed and a sensor chip 919 is obtained.

With this forty-eighth preferred embodiment, because silicon oxide pillars 920a are formed in the concavity 902a and the channels 902b before the laminating step P103, in the laminating step P103 the bonding state of the diaphragm 906 part can be made good. Also, in the detaching step P104 problems such as partial detachment are avoided and the monosilicon film 905 can be made to detach surely.

The silicon oxide pillars 920a are formed as a silicon pillar part 920 when the monosilicon substrate 902 is etched simultaneously with the formation of the concavity 902a and the channels 902b and this silicon pillar part 920 is then thermally oxidized in the thermal oxidation step S101. Therefore, the number of steps does not greatly increase. Also, because the silicon oxide pillars 920a are removed by selective etching in the pillar etching step S102 before the exhausting and sealing step P106, they have no affect on the finished sensor chip 919 whatsoever.

(Forty-ninth Preferred Embodiment)

FIG. 133 and FIGS. 134A through 134F show a forty-ninth preferred embodiment of the invention. This preferred embodiment differs from the forty-eighth preferred embodiment in that the semiconductor layer removing step Q101 described above in the forty-fifth preferred embodiment is carried out before the device forming step P105 and circuit devices 911, 913 of a signal processing circuit are thereby formed on the monosilicon substrate 902 serving as the second substrate (for the manufacturing process, see FIG. 133).

Figure 134A:
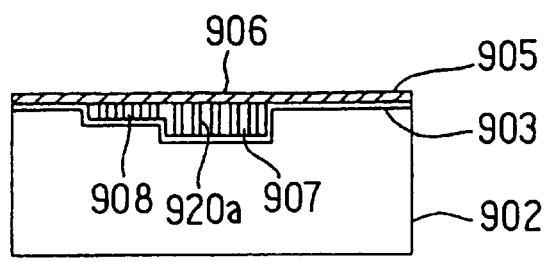
Figure 134B:
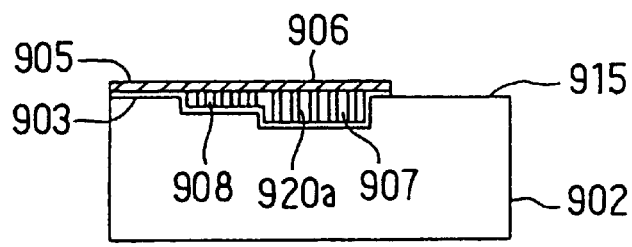

After the ion-implanted layer forming step P101, the concavity forming step P102, the thermal oxidation step S101, the laminating step P103 and the detaching step P104 (FIG. 134A) are carried out in the same way as in the forty-eighth preferred embodiment, the semiconductor layer removing step Q101 is carried out on an the monosilicon film 905 around the diaphragm 906 and the oxide film 903 are removed by etching. Consequently, the surface 915 of the monosilicon substrate 902 serving as the second substrate is exposed (FIG. 134B).

Figure 134C:
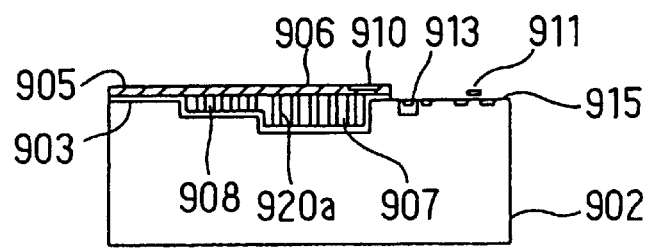
Figure 134D:
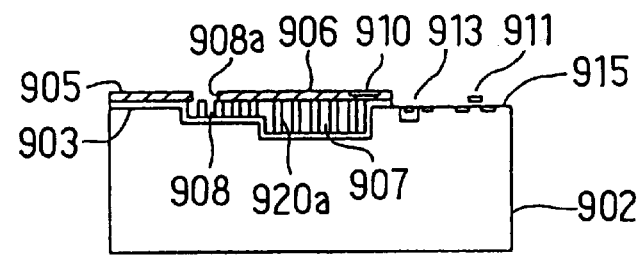

Next, in the device forming step P105, a resistor 910 is formed in the surface of the diaphragm 906, and MOS circuit devices 911 and bipolar circuit devices 913 are formed in the exposed surface 915 of the monosilicon substrate 902 as circuit devices of a signal processing circuit (FIG. 134C).

Figure 134E:
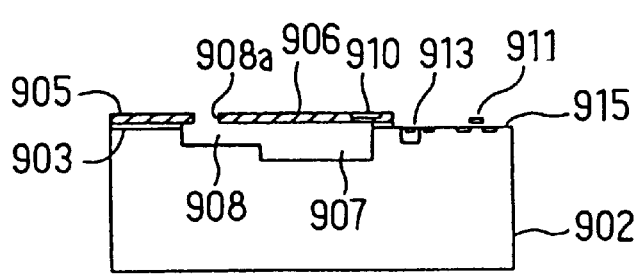
Figure 134F:
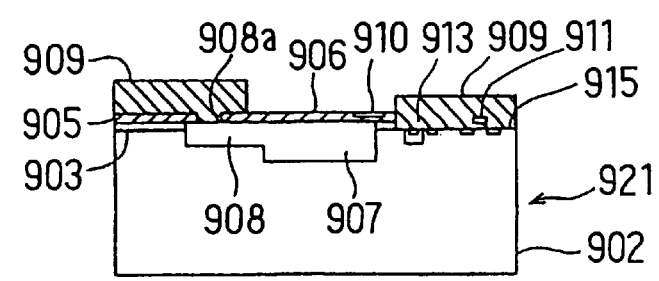

After that, in the same way as that described above, in the pillar etching step S102, after openings 908a are formed in the exhaustion passages 908 (FIG. 134D), the silicon oxide pillars 920a formed inside the concavity 902a and the channels 902b are selectively etched and thereby removed (FIG. 134E). Then, in the exhausting and sealing step P106, the inside of the pressure reference chamber 907 is exhausted and brought to a near-vacuum state and a protective film 909 is formed and the openings 908a thereby sealed. Finally, the protective film 909 on the diaphragm 906 is removed by etching to obtain a sensor chip 921 (FIG. 134F).

With this forty-ninth preferred embodiment, the same effects as those of the forty-eighth preferred embodiment can be obtained, and also it is possible to form bipolar circuit devices 913 without suffering a restriction of the film thickness of the diaphragm 906. Also, heat-sinking of heat produced by the signal processing circuit to the rear side of the monosilicon substrate 902 can be increased.

(Fiftieth Preferred Embodiment)

FIG. 135 through FIGS. 138A to 138C show a fiftieth preferred embodiment of the invention. This preferred embodiment differs from the forty-eighth preferred embodiment in that, to make the structure of a sensor chip 922 one in which no oxide film 903 is provided on the surface of the monosilicon substrate 902 serving as the second substrate in its manufacturing process, a nitride film forming step T101 is provided before the concavity forming step P102 (see FIG. 135).

That is, after the ion-implanted layer forming step P101 is carried out in the same way as that described above (FIG. 136A), in a nitride film forming step T101, a silicon nitride film 923 is formed on the mirror-polished surface of the monosilicon substrate 902 serving as the second substrate. After that, in the concavity forming step P102, part of the silicon nitride film 923 is patterned by photolithography and removed by etching to form a concavity 902c (FIGS. 119A, 119B) consisting of a concavity 902a for a pressure reference chamber 907 and a channel 902b for an exhaustion passage 908 integrated together as described in the forty-fourth preferred embodiment (FIG. 136B).

At this time, in the same way as in the forty-eighth preferred embodiment, a silicon pillar part 920 is formed in the concavity 902c. Then, by carrying out a thermal oxidation step S101, the silicon pillar part 920 is completely turned into silicon oxide to form silicon oxide pillars 920a. At this time, an oxide film 903 is also formed on the bottom faces and side faces of the concavity 902c (FIG. 136C). In this thermal oxidation step S101, because the silicon nitride film 923 formed on the monosilicon substrate 902 functions as a mask, an oxide film is not formed thereon.

After that, after the silicon nitride film 923 has been removed by etching, the laminating step P103 is carried out (FIG. 137A). Thereafter, the detaching step P104 (FIG. 137B) and the device forming step P105 are carried out to form a resistor 910 and MOS circuit devices 911 on the monosilicon film 905 (FIG. 137C). Then, by going through the pillar etching step S102 (FIG. 138A) and the exhausting and sealing step P106 (FIGS. 138B, 138C), a sensor chip 922 can be obtained.

In this case, because the structure of the sensor chip 922 is made one wherein no oxide film 903 is provided on the surface of the monosilicon substrate 902, in the pillar etching step S102, it is not necessary to consider problems caused by over-etching of the oxide film 903 of the kind in the forty-eighth preferred embodiment. Therefore, it is possible to control the etching so as to remove the silicon oxide pillars 920a without fail.

With this fiftieth preferred embodiment, as well as it being possible to obtain the same effects as those of the forty-eighth preferred embodiment, the controllability of the etching process in the pillar etching step S102 can be increased.

In the case described above, an oxide film may be formed on the surface of the monosilicon substrate 902 serving as the second substrate first and the concavity forming step P102 carried out in a state that the silicon nitride film 923 is provided on the oxide film. Or, with photoresist formed on the silicon nitride film 923, the concavity forming step P102 may be carried out with this as a mask.

(Fifty-first Preferred Embodiment)

FIG. 139 and FIG. 140 show a fifty-first preferred embodiment of the invention. This preferred embodiment differs from the forty-third preferred embodiment in that a noncrystalline film forming step U101 (FIG. 139) of uncrystallizing a surface layer part of the monosilicon substrate 904 serving as the first substrate on the side on which the ion-implanted layer 912 is formed is carried out on the monosilicon substrate 904.

That is, in a noncrystalline film forming step U101 carried out after the ion-implanted layer 912 is formed in the monosilicon substrate 904, by ion implantation for example silicon ions or arsenic ions are implanted into a surface layer part of the monosilicon substrate 904 and a silicon amorphous layer 924 constituting a noncrystalline film is thereby formed in a region shallower than the ion-implanted layer 912 (FIG. 140). By this means, it is possible to raise the mechanical strength of the surface layer part of the monosilicon substrate 904 to be detached and prevent the occurrence of partial cracks and tears when this is detached in the detaching step P104.

Also, the silicon amorphous layer 924 formed can be recrystallized with monocrystalline silicon remaining in the detached part as a seed by going through a high-temperature heat treatment in the detaching step P104, and thereby a monosilicon film 905 can be obtained.

With this fifty-first preferred embodiment, because the mechanical strength of the monosilicon film 905 is increased by a noncrystalline film forming step U101 being carried out to prevent cracking and tearing of the monosilicon film 905 in the detaching step P104, the occurrence of cracking is reduced to the utmost and it becomes possible to form the monosilicon film 905 by detachment surely.

The noncrystalline film forming step U101 mentioned above may alternatively be carried out before the ion-implanted layer forming step P101.

(Fifty-second Preferred Embodiment)

FIG. 141 shows a fifty-second preferred embodiment of the invention. This preferred embodiment differs from the fifty-first preferred embodiment in that an amorphous silicon film 925 serving as a noncrystalline film is deposited on the monosilicon substrate 904 serving as the first substrate.

That is, as shown in FIG. 141, before or after the ion-implanted layer forming step P101, by CVD or PVD an amorphous silicon film 925 is formed. By this means, it is possible to obtain the same effects as the fifty-first preferred embodiment. In this case, the same effects can be obtained by forming a polycrystalline silicon film instead of the amorphous silicon film 925. Also, the amorphous silicon film 925 can be recrystallized in the detaching step P104 in the same way as that described above.

(Fifty-third Preferred Embodiment)

FIGS. 142A through 142C and FIGS. 143A through 143C show a fifty-third preferred embodiment of the invention. This preferred embodiment differs from the forty-third preferred embodiment in that, in the structure of a sensor chip 926, the exhaustion passage 908 is formed as an opening 927 leading out to the rear side of the monosilicon substrate 902 serving as the second substrate.

That is, in this preferred embodiment, the manufacturing process is the same as that of the forty-third preferred embodiment (see FIG. 115), and in the same way as that described above the ion-implanted layer forming step P101 (FIG. 142A) and the concavity forming step P102 are carried out and the process then proceeds to the laminating step P103 (FIG. 142B). At this time, in the concavity forming step P102, separately from the concavity 902a for use as a pressure reference chamber 907, an opening 927 is formed by etching so as to connect the bottom of the concavity 902a of the monosilicon substrate 902 with the rear side of the monosilicon substrate 902.

Thereafter, the detaching step P104 (FIG. 142C), the device forming step P105 (FIG. 143A) and the exhausting and sealing step P106 (FIGS. 143B, 143C) are carried out to form a sensor chip 926. In this case, in the exhausting and sealing step P106, the inside of the pressure reference chamber 907 is exhausted to a near-vacuum state through the opening 927, and after that, the opening 927 is sealed with a sealing member 928. Also, separately, a protective film 909 is formed on the surface of the sensor chip 926 excluding the diaphragm 906 part.

With this fifty-third preferred embodiment also, it is possible to obtain the same actions and effects as those mentioned above. In this case, as an example of use of the sensor chip 926, for example when the pressure reference chamber 907 is opened to the atmosphere and a detecting operation based on a pressure acting on the diaphragm 906 is carried out, a construction wherein the sealing member 928 is not provided can also be used.

The aspect of the invention illustrated in the forty-third through fifty-third preferred embodiments described above is not limited to these preferred embodiments, and for example the following modifications and extensions are possible.

Instead of the insulating protective film 909, as a material for sealing the opening 908a, polycrystalline silicon may be formed.

The inside of the pressure reference chamber 907, besides being brought to a vacuum state, may be reduced in pressure to a predetermined pressure level.

The film thickness of the diaphragm 906, the dimensions of the pressure reference chamber 907 and the dimensions of the exhaustion passage 908 can be set to suitable dimensions according to the pressure range to be measured.

Next, fifty-fourth through sixtieth preferred embodiments of the invention will be described. These preferred embodiments illustrate an example of an application of a semiconductor substrate according to the invention wherein such a semiconductor substrate is used to construct a dynamic quantity sensor such as an acceleration sensor. Before the description of these preferred embodiments, the background of the aspect of the invention illustrated in them will be briefly explained. The preferred embodiments will then be described in detail.

For example in a static capacitance type semiconductor acceleration sensor, displacement of a beam member corresponding to the action of an acceleration is extracted as a change in the static capacitance between a movable electrode provided integrally with the beam member and a fixed electrode provided on a substrate. In this kind of semiconductor acceleration sensor, to increase the mechanical reliability of the beam member and obtain good output characteristics, the beam member is preferably made from a monocrystalline semiconductor having stable physical properties. To this end, using SOI (Silicon On Insulator) substrate formation technology and surface micromachining technology to manufacture a semiconductor acceleration sensor having a beam member made from monocrystalline silicon has been being tried.

In forming SOI substrates, the so-called lamination method has been used. In this case, first, a first monocrystalline silicon substrate eventually to constitute a beam member and fixed electrodes and so on is prepared. Then, a support layer including a semiconductor film (for example a polysilicon film) for making anchor parts for supporting the beam member and the fixed electrodes, a sacrificial layer thin film (for example a silicon oxide film) disposed around the regions to become anchor parts, an etching stopper film (for example a silicon nitride film) of the sacrificial layer thin film, and an insulating thin film (for example a silicon oxide film) necessary for the SOI substrate, and so on, are formed on the first monocrystalline silicon substrate. Then, this first monocrystalline silicon substrate and a second monocrystalline silicon substrate are laminated together with the support layer therebetween to form a SOI structure.

Mechanical polishing (lapping, and polishing as necessary) or the like is then carried out on the first monocrystalline silicon substrate to bring it to a film thickness corresponding to the thickness of the beam member. After that, the first monocrystalline silicon substrate thus brought to the required film thickness is processed into a predetermined shape by photolithography and etching or the like. Also, by going through steps such as removing the sacrificial layer thin film by wet etching, fixed electrodes and a beam member having movable electrodes are formed on the first monocrystalline silicon substrate.

In the case of the construction described above, the thicknesses of the fixed electrodes and the beam member including the movable electrodes depend on the precision of the mechanical polishing carried out on the first monocrystalline silicon substrate (the part constituting the Si region of the SOI structure) after the laminating step. However, because the kind of mechanical polishing mentioned above requires extended lapping, it is difficult to obtain an adequate film thickness controllability. Consequently, when the target film thickness is 10 $\mu$m to 20 $\mu$m, an error of about 2 $\mu$m to 3 $\mu$m (film thickness dispersion) arising cannot be avoided. To maintain a fixed operating characteristic of the sensor, however, the film thickness dispersion must be controlled to below about a few tens of nanometers to 100 nm. As a result, when the kind of manufacturing method described above is employed, the problem that the output characteristics of the semiconductor acceleration sensor are unstable and that yield is also unsatisfactory emerges.

In this connection, it is an object of the present aspect of the invention to provide a semiconductor dynamic quantity sensor manufacturing method with which it is possible to strictly control the thickness of a beam member provided for detecting a dynamic quantity and it is possible to realize stabilization of sensor output characteristics and increased yield.

In a manufacturing method provided by this aspect of the invention, in a film forming step, a layer including anchor parts (1003a, 1003b, 1003c, 1003d) and a sacrificial layer thin film (1035) disposed around these anchor parts is formed on a supporting substrate (1001, 1031). Then, in an ion implantation step, ion implantation is carried out on a semiconductor substrate (1039) prepared separately from the supporting substrate to form an ion-implanted layer (1041, 1041', 1041"). This ion-implanted layer is formed distributed parallel with the surface of the semiconductor substrate (1039).

After that, in a laminating step, the face of this semiconductor substrate on the side thereof on which the ion-implanted layer has been formed and the face of the supporting substrate on the side thereof on which the sacrificial layer thin film and so on have been formed are laminated together. Then, in a detaching step, heat treatment is carried out and microbubbles coalesce at a defective layer region formed by the ion-implanted layer in the semiconductor substrate and form macrobubbles and consequently a detachment occurs along this defective layer region. As a result, a SOI structure wherein a thin film semiconductor layer is laminated onto a supporting substrate in such a state that it is insulated therefrom is formed.

After that, in a shaping step, the semiconductor layer thus formed onto the supporting substrate is processed into a predetermined shape and the sacrificial layer thin film is removed by wet etching, whereby a beam member (1002, 1002') supported by the above-mentioned anchor parts is formed and the basic structure of a semiconductor dynamic quantity sensor is completed.

With the manufacturing method described above, the thickness of the beam member is determined by the film thickness of the thin film semiconductor layer formed in the detaching step. To control this film thickness it is not necessary to carry out mechanical polishing by lapping over extended period as in the related art method described above, and the film thickness can be controlled with high accuracy. As a result, the thickness of the beam member can be controlled exactly and it is possible to realize stabilization of sensor output characteristics and increased yield.

In this case, in the ion implantation step, the ion-implanted layer (1041) is formed by ion implantation being carried out into the semiconductor substrate (1039) to a depth corresponding to the thickness dimension of the beam member (1002, 1002'). The film thickness of the thin film semiconductor layer formed in the detaching step depends on this ion implantation depth, and consequently the thin film can be formed with very high accuracy. Specifically, with this manufacturing method, the film thickness dispersion of the above-mentioned thin film semiconductor layer can be reduced to the order of a few nanometers. By this means, it is possible to control the thickness dimension of the beam member exactly and surely and thereby realize stabilization of sensor output characteristics and increased yield.

In the ion implantation step, ion implantation may be carried out into the semiconductor substrate (1039) to a depth shallower than the thickness dimension of the beam member (1002, 1002'). In a growing step, a semiconductor layer (1049) may be formed on the semiconductor substrate taking into account the required thickness of the beam member. When this is done, it becomes unnecessary for the ion implantation energy to be made large. As a result, a large ion implantation apparatus is not needed and there is no danger of an increase in the scale of manufacturing equipment resulting. In this manufacturing method, the thickness of the beam member depends on the film thickness of the semiconductor layer formed in the growing step. However, since this film thickness can be controlled to an amply high accuracy, the thickness dimension of the beam member can be controlled exactly.

When a semiconductor material is used as the material of the supporting substrate (1001, 1031), thermal stresses arising between the supporting substrate and the semiconductor layer (1039a) laminated to it can be reduced. In this way, it is possible to suppress distortion in the beam member caused by such thermal stresses and deterioration of the output characteristics of the sensor can be prevented.

A method for manufacturing a static capacitance type semiconductor substrate dynamic quantity sensor wherein a displacement of a beam member (1002, 1002') made of a semiconductor material on which a dynamic quantity is acting is extracted as a sensor output corresponding to a change in the static capacitance between movable electrodes integral with the beam member and fixed electrodes made of a semiconductor material may be as follows.

That is, in a first film forming step, a first conducting layer thin film (1033) for forming an interconnection pattern (1019, 1020, 1021, 1022) is formed on a supporting substrate (1001, 1031) in such a state that it is electrically insulated from the supporting substrate. Then, in a second film forming step, a sacrificial layer thin film (1035) is formed on the first conducting layer thin film. In an opening forming step, a plurality of openings (1036) over regions of the first conducting layer thin film where anchor parts (1003a, 1003b, 1003c, 1003d) and fixed electrodes (1008, 1008', 1009, 1009', 1010, 1010', 1011) are to be formed are then formed in the sacrificial layer thin film. Then, in a third film forming step, a second conductive thin film (1037) is formed on a predetermined region of the sacrificial layer thin film including the openings in such a state that it is electrically connected to the first conducting layer thin film through the openings.

In an ion implantation step, ion implantation is carried out to a predetermined depth on a semiconductor substrate (1039) prepared separately from the above-mentioned supporting substrate to from an ion-implanted layer (1041, 1041', 1041"). This ion-implanted layer is distributed parallel with the surface of this semiconductor substrate.

After that, in a laminating step, the face of the semiconductor substrate from which ion implantation has been carried out and the face of the supporting substrate having gone through the third film forming step on which the second conductive thin film has been formed are laminated together. Then, in a detaching step, heat treatment is carried out and microbubbles coalesce at a defective layer region formed by the ion-implanted layer in the semiconductor substrate and form macrobubbles and consequently a detachment occurs along this defective layer region. As a result, a SOI structure wherein a thin film semiconductor layer is laminated onto a supporting substrate in such a state that it is insulated therefrom is formed.

After that, in a shaping step, processing such as forming a channel pattern (1042) defining the beam member (1002, 1002') and the fixed electrodes is carried out on the semiconductor layer thus laminated to the supporting substrate. Then, by the sacrificial layer thin film being removed by wet etching, a beam member supported by the anchor parts (1003a, 1003b, 1003c, 1003d) and fixed electrodes are formed. In this way, the basic structure of a semiconductor dynamic quantity sensor is completed.

In the ion implantation step, preferably, a resist layer (1051) of a shape matching regions other than parts eventually to become the beam member (1002, 1002') and the fixed electrodes (1008, 1008', 1009, 1009', 1010, 1010', 1011) is formed on the ion implantation side face of the semiconductor substrate (1039). In this state, ion implantation is carried out to a depth corresponding to the thickness of the beam member to form an ion-implanted layer (1041"). When this is done, the shape of the ion-implanted layer has a shape such that it is missing in regions corresponding to the resist layer. In other words, it matches the shape of the regions in the semiconductor substrate other than the parts thereof eventually to become the beam member and the fixed electrodes.

After an ion implantation step is carried out, when the laminating step and the detaching step have been successively carried out, parts of the semiconductor substrate corresponding to the missing regions of the ion-implanted layer have been released from their bonding to the supporting substrate and remain on the semiconductor substrate side. Thus, a channel pattern the same as the channel pattern (1042) for defining the beam member and the fixed electrodes is formed by the semiconductor layer laminated to the supporting substrate.

After a third film forming step of forming a second conductive thin film (1037) on a predetermined region of the sacrificial layer thin film (1035) including the openings (1036) in such a state that it is electrically connected to the first conducting layer thin film (1033) through the openings (1036) and also forming a thin film for lamination (1038) to cover the second conductive thin film is carried out, it is also possible to execute a step of forming openings (1038a) in the thin film for lamination (1038) by removing parts thereof corresponding to regions other than the parts eventually to become the beam member and the fixed electrodes.

When this is done, in the detaching step executed after the laminating step, the parts of the semiconductor substrate (1039) corresponding to the openings (1038a) do not bond to the thin film for lamination and consequently remain on the semiconductor substrate side. Thus, a channel pattern the same as the above-mentioned channel pattern (1042) for defining the beam member and the fixed electrodes is formed by the semiconductor layer laminated to the supporting substrate (1003, 1031).

(Fifty-fourth Preferred Embodiment)

FIGS. 144A to 144E through FIG. 148 show a fifty-fourth preferred embodiment of the invention. FIG. 147 is a plan view of main parts of a semiconductor acceleration sensor and FIG. 148 is a sectional view on the line A—A in FIG. 147.

Referring to FIG. 147 and FIG. 148, a beam member 1002 made of monocrystalline silicon (a semiconductor material) doped with an impurity such as phosphorus is disposed on a supporting substrate 1001. This beam member 1002 is supported by four anchor parts 1003a, 1003b, 1003c, 1003d projecting from the supporting substrate 1001 so that there is a gap of a predetermined size between the beam member 1002 and the supporting substrate 1001. The anchor parts 1003a, 1003b, 1003c, 1003d consist of a polysilicon thin film doped with an impurity such as phosphorus.

In the beam member 1002, two parallel beam parts 1004 and 1005 span between the anchor parts 1003a and 1003b and the anchor parts 1003c and 1003d. In the middle of these beam parts 1004 and 1005, a rectangular mass part 1006 is provided integrally with the beam parts 1004 and 1005 at a right angle thereto. From either side face of this mass part 1006, for example four equally spaced movable electrodes 1007a, 1007b are formed integrally with the mass part 1006 and projecting therefrom so as to point in a direction parallel with the beam parts 1004 and 1005. The movable electrodes 1007a and 1007b are formed in the shape of cross-sectionally rectangular bars. The mass part 1006 is also provided with a set of through holes 1006a for facilitating the penetration of etching solvent in a sacrificial layer etching step.

On the supporting substrate 1001, four each of first fixed electrodes 1008 and 1009 having one end supported by the anchor parts 1008a and 1009a are disposed in parallel with and a predetermined gap away from side faces of the movable electrodes 1007a and 1007b respectively. Also, four each of second fixed electrodes 1010 and 1011 having one end supported by the other anchor parts 1010a and 1011*a* are disposed in parallel with and a predetermined gap away from the other side faces of the movable electrodes 1007*a* and 1007*b*. These first fixed electrodes 1008, 1009 and second fixed electrodes 1010, 1011 are formed in the shape of cross-sectionally rectangular bars from monocrystalline silicon doped with an impurity such as phosphorus.

On the supporting substrate 1001, a total of four electrode takeoff parts 1012, 1013, 1014, 1015 made of monocrystalline silicon doped with an impurity such as phosphorus are provided. These are respectively supported by anchor parts 1012*a*, 1013*a*, 1014*a*, 1015*a* projecting from the supporting substrate 1001. The anchor parts 1012*a* through 1015*a* are made from a polysilicon thin film doped with an impurity such as phosphorus.

The supporting substrate 1001 is made of monocrystalline silicon (a semiconductor material), and as shown in FIG. 148 has formed thereon a lower side insulating thin film 1016, a conducting thin film 1017 and an upper side insulating thin film 1018 in this order. Here, the lower side insulating thin film 1016 is a silicon oxide film and the upper side insulating thin film 1018 is a silicon nitride film. The conducting thin film 1017 is a polysilicon thin film doped with an impurity such as phosphorus.

By means of the conducting thin film 1017, the four interconnection patterns 1019, 1020, 1021 and 1022 shown in FIG. 147 are formed and a lower electrode 1023 for canceling out electrostatic forces is formed. Here, the interconnection patterns 1019 and 1020 are interconnections for the first fixed electrodes 1008 and 1009 respectively and the interconnection patterns 1021 and 1022 are for the second fixed electrodes 1010 and 1011 respectively. The lower electrode 1023 is formed in a region facing the beam member 1002 and the fixed electrodes 1008 through 1011 from below and is kept at the same potential as the beam member 1002 to cancel out electrostatic forces arising between the beam member 1002 and the supporting substrate 1001.

In the upper side insulating thin film 1018, openings 1018*a* (of which only some are shown in FIG. 148) are formed in positions corresponding to the above-mentioned anchor parts 1003*a* through 1003*d* and 1008*a* through 1015*a*. Thus, the anchor parts 1003*a* through 1003*d* and 1008*a* through 1015*a* made from impurity-doped polysilicon and the conducting thin film 1017 are connected through the openings 1018*a*.

The first fixed electrodes 1008 are electrically connected to the electrode takeoff part 1012 through the anchor part 1008*a*, the interconnection pattern 1019 and the anchor part 1012*a*. The first fixed electrodes 1009 are electrically connected to the electrode takeoff part 1013 through the anchor part 1009*a*, the interconnection pattern 1020 and the anchor part 1013*a*. The second fixed electrodes 1010 are electrically connected to the electrode takeoff part 1014 through the anchor part 1010*a*, the interconnection pattern 1021 and the anchor part 1014*a*, and the second fixed electrodes 1011 are electrically connected to the electrode takeoff part 1015 through the anchor part 1011*a*, the interconnection pattern 1022 and the anchor part 1015*a*.

An electrode (a bonding pad) 1024 consisting of an aluminum thin film is provided on the beam member 1002 in a position above the anchor part 1003*a*. Also, electrodes (bonding pads) 1025, 1026, 1027, 1028 consisting of aluminum thin films are provided on the electrode takeoff parts 1012, 1013, 1014, 1015 respectively.

By means of this construction, a first capacitor is formed between the movable electrodes 1007*a* and 1007*b* of the beam member 1002 and the first fixed electrodes 1008 and 1009. Also, a second capacitor is formed between the movable electrodes 1007*a* and 1007*b* of the beam member 1002 and the second fixed electrodes 1010 and 1011. The static capacitances of these first and second capacitors vary with displacement of the movable electrodes 1007*a* and 1007*b* occurring when an acceleration acts on the beam member 1002. This variation in static capacitance is extracted through the electrode 1024 provided on the beam member 1002 at the anchor part 1003*a* and the electrodes 1125 through 1028 provided on the electrode takeoff parts 1012, 1013, 1014, 1015, and the acceleration is thereby detected.

FIGS. 144A to 144E through FIGS. 146A to 146C show an example of a process for manufacturing this kind of semiconductor acceleration sensor, and this process will be described below. FIGS. 144A to 144E through FIGS. 146A to 146C are schematic sectional views illustrating manufacturing steps on the same section as FIG. 148.

Figure 144A:
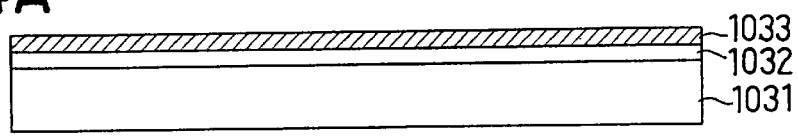

First, in a first film forming step shown in FIG. 144A, a silicon oxide film 1032 to become a lower side insulating thin film 1016 is formed by thermal oxidation or CVD or the like on a monosilicon substrate 1031 to become a supporting substrate 1001. Then, a polysilicon thin film 1033 (equivalent to the first conducting layer thin film referred to in the present invention) to become a conducting thin film 1017 is formed on this silicon oxide film 1032 by CVD or the like, after which an impurity is introduced into it by, for example, phosphorus diffusion.

Figure 144B:
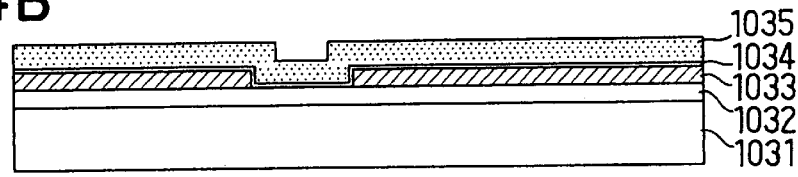

In a second film forming step shown in FIG. 144B, the polysilicon thin film 1033 is patterned using photolithography to form a region eventually to become interconnection patterns 1019 through 1022 and a lower electrode 1023. After that, by CVD or the like a silicon nitride film 1034 to become an upper side insulating thin film 1018 and a silicon oxide film 1035 (equivalent to the sacrificial layer thin film referred to in the invention) are formed. The silicon nitride film 1034 functions as an etching stopper film at the time of etching of the silicon oxide film 1035 serving as the sacrificial layer.

Figure 144C:
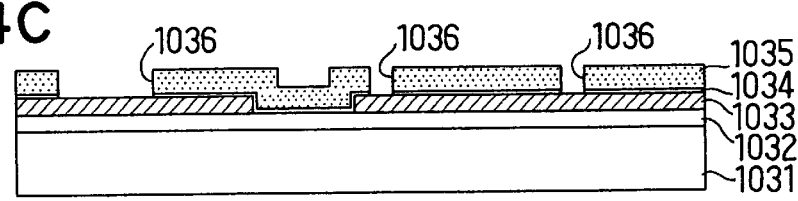

In an opening forming step illustrated in FIG. 144C, by photolithography and etching being carried out on the silicon oxide film 1035 and the silicon nitride film 1034, openings 1036 are formed in regions where anchor parts 1003*a* through 1003*d* and 1008*a* through 1015*a* are to be formed.

Figure 144D:
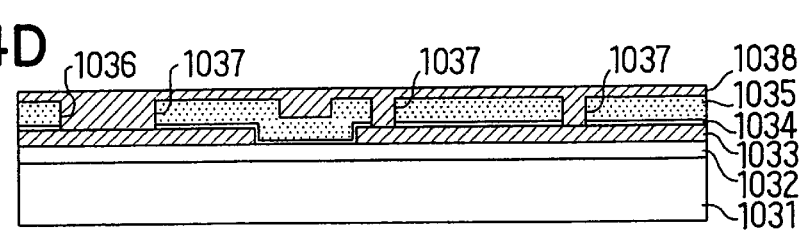

In a third film forming step illustrated in FIG. 144D, a polysilicon thin film 1037 (equivalent to the second conductive thin film referred to in the invention) is filled into the openings 1036, after which an impurity is introduced into it by, for example, phosphorus diffusion. A polysilicon thin film 1038 to serve as a thin film for lamination is then further formed on the polysilicon thin film 1037 and the silicon nitride film 1034 and flattened by mechanical polishing. By this means, the polysilicon thin film 1037 is electrically connected through the openings 1036 to the polysilicon thin film 1033 to become the conducting thin film 1017. Since diffusion of impurity into the polysilicon thin film 1038 from the polysilicon thin film 1037 side along with subsequent heat treatment can be expected, a step for introducing an impurity into this polysilicon thin film 1038 need only be carried out when necessary.

Figure 144E:
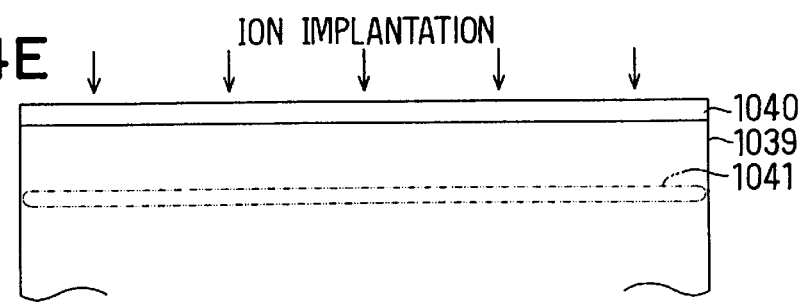

In an ion implantation step illustrated in FIG. 144E, a silicon oxide film 1040 to function as contamination protection film is preformed to a uniform film thickness (for example about 0.1 $\mu$m) by thermal oxidation or CVD or the like on one face of a monosilicon substrate 1039 (equivalent to the monocrystalline silicon substrate referred to in the invention) prepared separately from the monosilicon substrate 1031. After that, as shown with arrows in the figure, hydrogen ions or noble gas ions are implanted to a predetermined depth through this silicon oxide film 1040 to form an ion-implanted layer 1041 distributed parallel with the surface of the monosilicon substrate 1039.

Here, the monosilicon substrate 1039 is for eventually forming a beam member 1002 and first and second fixed electrodes 1008, 1009 and 1010, 1011 and so on. Therefore, the ion implantation is carried out to a depth corresponding to the thickness dimension of this beam member 1002 and the first and second fixed electrodes 1008, 1009 and 1010, 1011.

The dose in this ion implantation step, in the case of hydrogen ions, is set to over $1 \times 10^{16}$ atoms/cm$^2$ and preferably about $5 \times 10^{16}$ atoms/cm$^2$ to $1 \times 10^{17}$ atoms/cm$^2$. And when for example the thickness dimension of the beam member 1002 and the first and second fixed electrodes 1008, 1009 and 1010, 1011 is to be 10 μm, the ion implantation energy of the hydrogen ions is set to a value exceeding 1 MeV.

In a laminating step illustrated in FIG. 145A, the silicon oxide film 1040 on the monosilicon substrate 1039 is removed by for example chemical etching using aqueous fluoric acid and then a hydrophilicizing treatment is carried out on the surface of the monosilicon substrate 1039. The hydrophilicizing treatment is also carried out on the polysilicon thin film 1038 side face of the monosilicon substrate 1031. The hydrophilicized faces of the two substrates are then laminated together in intimate contact.

Although in this preferred embodiment, the silicon oxide film 1040 is completely removed, this silicon oxide film 1040 may alternatively be left as it is or a just surface layer portion of the silicon oxide film 1040 may be removed by a predetermined film thickness to leave a certain film thickness remaining.

In a detaching step illustrated in FIG. 145B, by heat treatment being carried out on the monosilicon substrates 1031 and 1039 thus laminated together, the monosilicon substrate 1039 is detached at a defective layer region formed by the ion-implanted layer 1041. In this way, a SOI structure wherein a monosilicon thin film 1039a is formed on a silicon oxide film 1032 on a monosilicon substrate 1031 is formed.

In this case, when the ion-implanted layer 1041 was formed with hydrogen ions, the heat treatment is preferably carried out at about 400° C. to 600° C. In response to this heat treatment, at the defective layer region formed by the ion-implanted layer 1041, microbubbles coalesce and form macrobubbles and consequently a detachment occurs along this defective layer region. After the heat treatment for detaching the monosilicon thin film 1039a from the monosilicon substrate 1039 is carried out, by further heat treatment being carried out at a higher temperature (preferably about 1000° C. to 1300° C.), the bond strength at the direct bonding interface between the polysilicon thin film 1038 and the monosilicon thin film 1039a is increased.

At the detachment face of this monosilicon thin film 1039a, the defective layer formed along with the ion implantation remains and minute steps of a few nanometers to several tens of nanometers in size arise (in FIG. 145B, these minute steps are not shown). For this reason, in this preferred embodiment, a step of removing and smoothing the defective layer and minute steps arisen on the monosilicon thin film 1039a by mechanical polishing is carried out after the detaching step. However, this kind of removing and smoothing of the defective layer and minute steps need only be carried out according to necessity.

After that, a shaping step illustrated in FIG. 145C and FIGS. 146A to 146C is carried out.

That is, first, as shown in FIG. 145C, photolithography and trench etching are carried out on the monosilicon thin film 1039a thus made part of a SOI structure, and a channel pattern 1042 defining a beam member 1002, first fixed electrodes 1008 and 1009, second fixed electrodes 1010 and 1011 and electrode takeoff parts 1012, 1013, 1014 and 1015 is thereby formed. In this case, the trench etching is carried out to a depth such that the channel pattern 1042 reaches the silicon oxide film 1035 for use as a sacrificial layer. Also, at this stage, to give the monosilicon thin film 1039a conductivity for it to function as an electrode, an impurity is introduced into the monosilicon thin film 1039a by, for example, phosphorus diffusion.

Then, as shown in FIG. 146A, a silicon oxide film 1043 is formed by CVD or the like and etched back, for example, by dry etching to flatten the substrate surface.

Also, as shown in FIG. 146B, an interlayer insulating film 1044 is formed and a contact hole 1045 is formed therein by photolithography and dry etching or the like and a silicon nitride film 1046 is formed on a predetermined region of the interlayer insulating film 1044.

After that, as shown in FIG. 146C, an aluminum thin film 1047 to become aluminum electrodes 1024 through 1028 (see FIG. 147) is formed by a film forming step and a photolithography step. After that, a passivation film 1048 is formed by a film forming step and a photolithography step.

Then, from the state shown in FIG. 146C, by the silicon oxide films 1035 and 1043 being removed with a fluoric acid etching liquid, as shown in FIG. 148, the beam member 1002 having the movable electrodes 1007a and 1007b and so on is made into a movable structure. That is, by the shaping step described above being carried out (FIG. 145C and FIGS. 146A through 146C) a movable beam member 1002 supported by the anchor parts 1003a through 1003d and first fixed electrodes 1008 and 1009 and second fixed electrodes 1010 and 1011 supported by the anchor parts 1008a through 1011a are formed.

At the time of the above-mentioned wet etching of the silicon oxide films 1035 and 1043 with a fluoric acid etching solvent, the silicon nitride film 1034 and the polysilicon thin films 1037, 1038 function as etching stoppers.

With this preferred embodiment, for example the following effects can be achieved.

Because the beam member 1002 is made from monocrystalline silicon having stable physical properties, the mechanical reliability of the beam member 1002 is increased and good sensor output characteristics can be obtained.

In this case, the thickness of the beam member 1002 is determined by the film thickness of the monosilicon thin film 1039a detached from the monosilicon substrate 1039 in the detaching step, that is, the ion implantation depth in the ion implantation step. Therefore, it is not necessary to carry out mechanical polishing using lapping over a long period to control this thickness as it is in related art constructions, and the film thickness can be controlled with high accuracy (such that the film thickness dispersion is less than a few nanometers). As a result, the thickness of the beam member 1002 can be controlled exactly and it is possible to realize stabilization of sensor output characteristics and increased yield surely.

Although in this preferred embodiment mechanical polishing is carried out on the detachment face of the monosilicon thin film 1039*a,* this mechanical polishing is only carried out to flatten minute steps of a few nanometers to a few tens of nanometers arisen in the detachment face and does not have an adverse influence on the film thickness precision.

Because the supporting substrate 1001 is made from a monosilicon substrate 1031 having the same physical properties as the monosilicon substrate 1039 constituting the beam member 1002 and the fixed electrodes 1008 through 1011 and so on, thermal stresses arising between the supporting substrate 1001 and the monosilicon substrate 1039 laminated thereto can be reduced. As a result, the occurrence of distortion in the beam member 1002 caused by such thermal stresses can be suppressed and deterioration of the sensor output characteristics can thereby be prevented.

(Fifty-fifth Preferred Embodiment)

FIGS. 149A through 149D schematically show a process for manufacturing a semiconductor acceleration sensor according to a fifty-fifth preferred embodiment of the invention, and this process will be described below centering on points of difference between this preferred embodiment and the fifty-fourth preferred embodiment described above.

In this fifty-fifth preferred embodiment, the first film forming step (FIG. 144A), the second film forming step (FIG. 144B), the opening forming step (FIG. 144C) and the third film forming step (FIG. 144D) carried out on the monosilicon substrate 1031 are executed in the same way as in the fifty-fourth preferred embodiment.

Figure 149A:
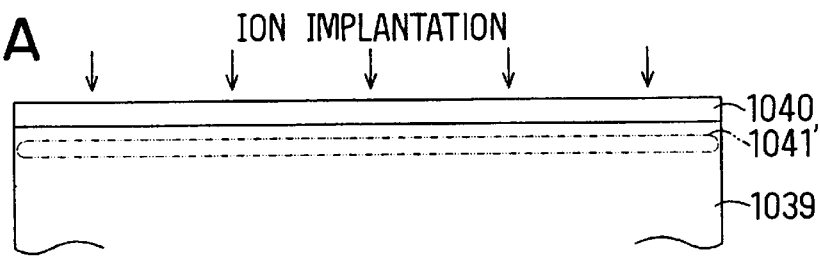

Then, in an ion implantation step shown in FIG. 149A, a silicon oxide film 1040 to function as a contamination protection film is preformed to a uniform film thickness (for example about 0.1 μm) by thermal oxidation or CVD or the like on one face of a monosilicon substrate 1039 prepared separately from the monosilicon substrate 1031. After that, as shown with arrows in the figure, hydrogen ions or noble gas ions are implanted to a predetermined depth (a shallower than the thickness dimension of the beam member 1002, for example a few micrometers or less) through this silicon oxide film 1040 to form an ion-implanted layer 1041'.

The dose in this ion implantation step, in the case of hydrogen ions, as in the fifty-fourth preferred embodiment, is set to over $1 \times 10^{16}$ atoms/cm$^2$ and preferably about $5 \times 10^{16}$ atoms/cm$^2$ to $1 \times 10^{17}$ atoms/cm$^2$. And when for example the ion implantation depth is to be a few nanometers, the ion implantation energy of the hydrogen ions is set to a few hundred KeV.

Figure 149B:
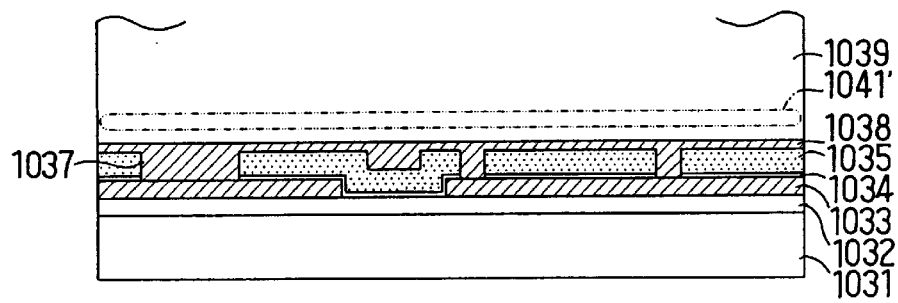

After that, a laminating step illustrated in FIG. 149B is carried out. In this step, by going through a procedure basically the same as the laminating step in the fifty-fourth preferred embodiment (FIG. 145A), the monosilicon substrate 1039 is laminated to the polysilicon thin film 1038 on the monosilicon substrate 1031 side.

Figure 149C:
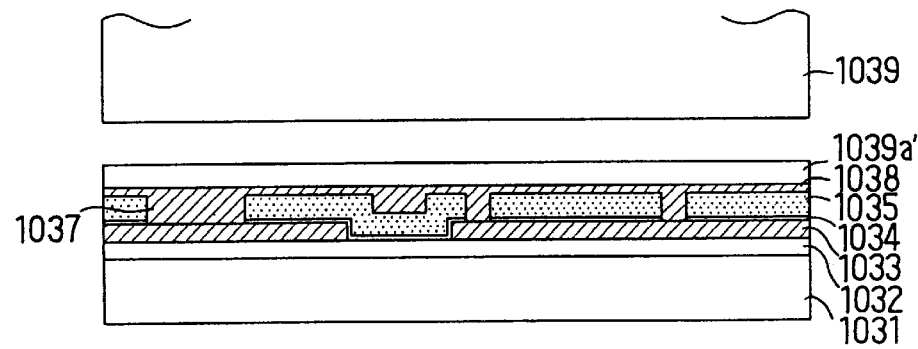

In a detaching step illustrated in FIG. 149C, by the same heat treatment as in the fifty-fourth preferred embodiment being carried out on the monosilicon substrates 1031 and 1039 thus laminated together, the monosilicon substrate 1039 is detached at a defective layer region formed by the ion-implanted layer 1041'. A heat treatment for strengthening the bond strength at the bonding interface is then further carried out. By this means, a SOI structure wherein a monosilicon thin film 1039*a'* is formed on a silicon oxide film 1032 on a monosilicon substrate 1031 is formed.

Figure 149D:
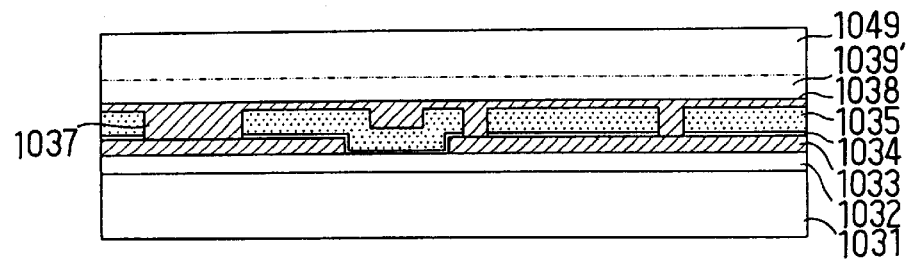

In a growing step shown in FIG. 149D, the defective layer on the monosilicon substrate 1039*a'* is removed by mechanical polishing or by etching after the formation of a silicon oxide film. After that, for example with a silane material as a process material by CVD or the like a monosilicon film is epitaxially grown to form a monosilicon layer 1049 (equivalent to the monocrystalline semiconductor layer referred to in the invention) of a film thickness corresponding to the thickness of the beam member 1002.

After that, by a shaping step the same as in the fifty-fourth preferred embodiment (FIG. 145C and FIGS. 146A through 146C) being carried out, the semiconductor acceleration sensor is completed.

With this preferred embodiment, when in the growing step epitaxial growth has been conducted so that the film thickness of the monosilicon layer 1049 is about 10 μm, the dispersion in this film thickness can be kept to no more than a few hundred nanometers. Therefore, as in the fifty-fourth preferred embodiment, it is possible to control the thickness of the beam member 1002 with amply high accuracy and stabilization of sensor output characteristics and increased yield can be realized.

In particular, with this preferred embodiment, because in the ion implantation step the ion implantation need only be carried out on the monosilicon substrate 1039 to a relatively shallow depth position, it becomes unnecessary to make the ion implantation energy large. As a result, a large ion implantation apparatus is not required and there is no need for an increase in the scale of manufacturing equipment.

(Fifty-sixth Preferred Embodiment)

FIGS. 150A through 150C schematically show a process for manufacturing a semiconductor acceleration sensor according to a fifty-sixth preferred embodiment of the invention, and this process will be described below centering on points of difference between this preferred embodiment and the fifty-fourth and fifty-fifth preferred embodiments described above.

In this fifty-sixth preferred embodiment, the first film forming step (FIG. 144A), the second film forming step (FIG. 144B), the opening forming step (FIG. 144C) and the third film forming step (FIG. 144D) carried out on the monosilicon substrate 1031 are executed in the same way as in the fifty-fourth preferred embodiment. Also, in an ion implantation step shown in FIG. 150A, ion implantation into a monosilicon substrate 1039 prepared separately from the monosilicon substrate 1031 is carried out in the same way as the ion implantation step in the fifty-fifth preferred embodiment (FIG. 149A).

In a growing step shown in FIG. 150B, the silicon oxide film 1040 on the monosilicon substrate 1039 is removed for example by chemical etching using aqueous fluoric acid. After that, by monosilicon being epitaxially grown on the surface of the monosilicon substrate 1039, a monosilicon film 1050 (equivalent to the monocrystalline semiconductor layer referred to in the invention) of a film thickness corresponding to the thickness of the beam member 1002 is formed.

In this case, the monosilicon is for example grown by molecular beam epitaxy, and the growth temperature at this time is for example 400° C. and set lower than the temperature at which detachment occurs at the ion-implanted layer 1041'.

After that, a laminating step illustrated in FIG. 150C is carried out, and in this step, by going through a procedure basically the same as the laminating step in the fifty-fourth preferred embodiment (FIG. 145A), the monosilicon substrate 1039 is laminated to the polysilicon thin film 1038 on the monosilicon substrate 1031 side.

After the completion of this laminating step, by a detaching step (FIG. 145B) and a shaping step (FIG. 145C and FIGS. 146A through 146C) the same as in the fifty-fourth preferred embodiment being carried out, the semiconductor acceleration sensor is completed.

With this preferred embodiment also, the same effects as those of the fifty-fifth preferred embodiment can be achieved. In particular, in this preferred embodiment, after ion implantation into the monosilicon substrate 1039 is executed, a monosilicon film 1050 is formed on the monosilicon substrate 1039 by epitaxial growth of monosilicon. Because of this, after the detaching step, the ion implantation side surface of the monosilicon film 1050 can be removed. Consequently, it becomes possible to remove the part which has suffered damage and contamination caused by ion implantation and there is the merit that a monosilicon film 1050 of excellent quality can be obtained as a result.

(Fifty-seventh Preferred Embodiment)

FIGS. 151A through 151C and FIG. 152 show a fifty-seventh preferred embodiment of the invention, and this preferred embodiment will be described below centering on its points of difference from the fifty-fourth preferred embodiment. FIGS. 151A through 151C schematically show a process for manufacturing a semiconductor acceleration sensor according to this preferred embodiment, and FIG. 152 is a sectional view showing the basic construction of the semiconductor acceleration sensor.

In this fifty-seventh preferred embodiment, the first film forming step (FIG. 144A), the second film forming step (FIG. 144B) and the opening forming step (FIG. 144C) carried out on the monosilicon substrate 1031 are executed in the same way as in the fifty-fourth preferred embodiment, but the third film forming step is carried out as shown in FIG. 151A.

That is, after the openings 1036 are formed in the silicon oxide film 1035 and the silicon nitride film 1034 in the opening forming step, in a third film forming step illustrated in FIG. 151A, a polysilicon thin film 1037 is filled into the openings 1036 and has an impurity introduced into it by phosphorus diffusion or the like.

In this case, in the third film forming step, to flatten the filling steps of the polysilicon thin film 1037, a polysilicon film (non-doped), which is the same material as that of the polysilicon thin film 1037, is deposited on the silicon oxide film 1035 and the polysilicon thin film 1037. Then, flattening by polishing is carried out for the deposited polysilicon film with the silicon oxide film 1035 as a stopper. As a result, the face to be laminated to the monosilicon substrate 1039 is flattened, as shown in FIG. 151A.

After the execution of this third film forming step, a laminating step illustrated in FIG. 151B is carried out. In this laminating step, the silicon oxide film 1040 on the monosilicon substrate 1039 having gone through the same ion implantation step as in the fifty-fourth preferred embodiment (FIG. 144E) is removed by chemical etching using aqueous fluoric acid. After that, hydrophilicizing treatment is carried out on the surface of the monosilicon substrate 1039 and hydrophilicizing treatment is also carried out on the surface of the silicon oxide film 1035 and the polysilicon thin film 1037 on the monosilicon substrate 1031. The two hydrophilicized faces are laminated together in intimate contact.

Then, a detaching step illustrated in FIG. 151C is carried out in the same way as the detaching step in the fifty-fourth preferred embodiment (FIG. 145B), whereby the monosilicon substrate 1039 is detached at the defective layer formed by the ion-implanted layer 1041. After that, mechanical polishing to remove the defective layer and minute steps having arisen on the monosilicon thin film 1039a and flatten the surface is carried out as necessary. By this means, a SOI structure wherein a monosilicon thin film 1039a is formed on a silicon oxide film 1032 on a monosilicon substrate 1031 is formed.

After that, a shaping step the same as in the fifty-fourth preferred embodiment (FIG. 145C and FIGS. 146A through 146C) is carried out to complete a semiconductor acceleration sensor having a beam member 1002' of the sectional structure shown in FIG. 152 (one beam part only being shown, with the reference numeral 1002'), first fixed electrodes (one side only being shown, with the reference numeral 1008') and second fixed electrodes (one side only being shown, with the reference numeral 1010') and so on.

With this fifty-seventh preferred embodiment also, the same effects as those of the fifty-fourth preferred embodiment can be achieved. In particular, in this preferred embodiment, because the whole of the beam member 1002' is made of monocrystalline silicon, the physical properties of this beam member 1002' can be stabilized still more than those of the beam member 1002 of the fifty-fourth preferred embodiment consisting of a two-layer structure of monocrystalline silicon and polysilicon. Therefore, a considerable improvement in sensor output characteristics an be achieved.

(Fifty-eighth Preferred Embodiment)

FIGS. 153A through 153D schematically show a process for manufacturing a semiconductor acceleration sensor according to a fifty-eighth preferred embodiment, and this will now be described centering on its points of difference from the fifty-fourth preferred embodiment.

In this fifty-eighth preferred embodiment, the first film forming step (FIG. 144A), the second film forming step (FIG. 144B), the opening forming step (FIG. 144C) and the third film forming step (FIG. 144D) carried out on the monosilicon substrate 1031 are executed in the same way as in the fifty-fourth preferred embodiment.

Figure 153A:
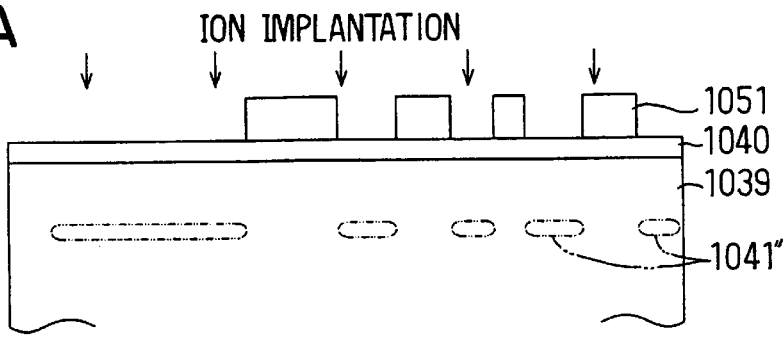

Then, in an ion implantation step illustrated in FIG. 153A, a silicon oxide film 1040 to serve as a contamination protection film is preformed to a uniform film thickness (for example about 0.1 $\mu$m) by thermal oxidation or CVD or the like on one face of a monosilicon substrate 1039 prepared separately from the monosilicon substrate 1031. On this silicon oxide film 1040, photoresist 1051 (equivalent to the resist layer referred to in the invention) of a predetermined shape is formed by patterning using photolithography. From this state, hydrogen ions or noble gas ions are implanted to a predetermined depth (a depth position corresponding to the thickness of the beam member 1002) through the silicon oxide film 1040 to form an ion-implanted layer 1041".

In this case, because the photoresist 1051 is present, the ion-implanted layer 1041" is missing in regions corresponding to the photoresist 1051. The shape of these missing regions (i.e. the shape of the photoresist 1051) matches the shape of the region of the monosilicon substrate 1039 which is other than parts eventually to become the beam member 1002, the first fixed electrodes 1008 and 1009, the second fixed electrodes 1010 and 1011 and the electrode takeoff parts 1012, 1013, 1014, 1015.

Figure 153B:
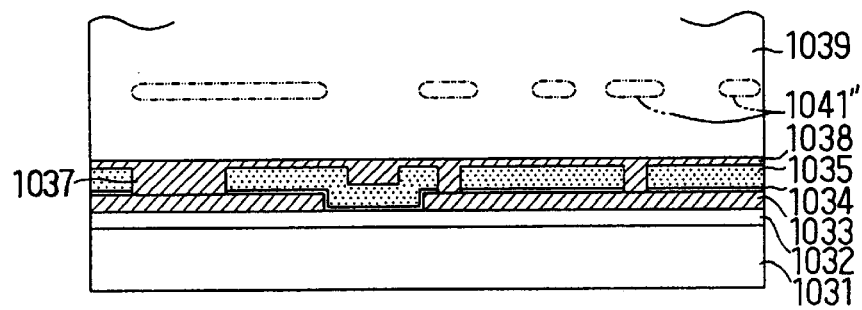

After that, with the photoresist 1051 removed, a laminating step illustrated in FIG. 153B is carried out. In this step, by going through a procedure basically the same as the laminating step in the fifty-fourth preferred embodiment (FIG. 145A), the monosilicon substrate 1039 is laminated to the polysilicon thin film 1038 on the monosilicon substrate 1031 side.

Figure 153C:
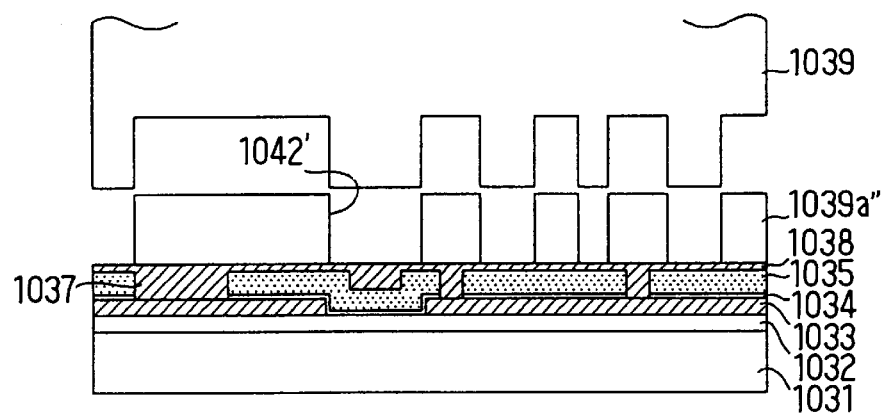

In a detaching step illustrated in FIG. 153C, by heat treatment the same as in the fifty-fourth preferred embodiment being carried out on the monosilicon substrates 1031 and 1039, the monosilicon substrate 1039 is detached at the defective layer region formed by the ion-implanted layer 1041". By this means, a SOI structure wherein a monosilicon thin film 1039a" is formed on a silicon oxide film 1032 on a monosilicon substrate 1031 is completed. However, in this case, parts of the monosilicon substrate 1039 corresponding to the missing regions of the ion-implanted layer 1041" have been released from their bonding to the polysilicon thin film 1038 and remain on the monosilicon thin film 1039 side. Thus a channel pattern 1042' the same as the channel pattern 1042 (FIG. 145C) for defining the beam member 1002, the first fixed electrodes 1008 and 1009, the second fixed electrodes 1010 and 1011 and the electrode takeoff parts 1012, 1013, 1014, 1015 is formed in the monosilicon thin film 1039a" laminated to the supporting substrate side. After the heat treatment for effecting this detachment, heat treatment for strengthening the bond strength at the bonding interface is then carried out and a process of introducing an impurity into the monosilicon thin film 1039a" for constituting the beam member 1002 and so on by phosphorus diffusion or the like is carried out.

Figure 153D:
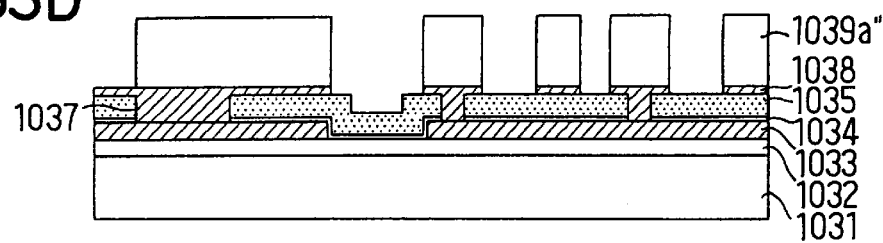

After that, as shown in FIG. 153D, a step of removing the polysilicon thin film 1038 in the channel pattern 1042' by dry etching or the like is carried out and then a shaping step is performed.

In this shaping step, the same step as in the fifty-fourth preferred embodiment (FIG. 145C and FIGS. 146A through 146C) is carried out and the semiconductor acceleration sensor is thereby completed. When it is necessary for removal and flattening of the defective layer and minute steps arisen on the monosilicon thin film 1039a" to be carried out by mechanical polishing, this mechanical polishing can be carried out in the step shown in FIG. 146A, that is, with the silicon oxide film 1043 shown in that figure formed.

With this preferred embodiment, there is the merit that it is not necessary to carry out a step of performing trench etching on a monosilicon thin film 1039a whose film thickness is relatively large, as in the fifty-fourth preferred embodiment, that is, a step that greatly increases the process time.

(Fifty-ninth Preferred Embodiment)

FIGS. 154A through 154C schematically show a process for manufacturing a semiconductor acceleration sensor according to a fifty-ninth preferred embodiment, and this will now be described centering on its points of difference from the fifty-fourth preferred embodiment.

In this fifty-ninth preferred embodiment, the first film forming step (FIG. 144A), the second film forming step (FIG. 144B), the opening forming step (FIG. 144C) and the third film forming step (FIG. 144D) carried out on the monosilicon substrate 1031 are executed in the same way as in the fifty-fourth preferred embodiment.

After the execution of the third film forming step, a step of forming channels 1038a by using dry etching to remove parts of the polysilicon thin film 1038 corresponding to regions to become the channel pattern 1042 (FIG. 145C), i.e. regions which are other than parts eventually to become the beam member 1002, the first fixed electrodes 1008 and 1009, the second fixed electrodes 1010 and 1011 and the electrode takeoff parts 1012, 1013, 1014, 1015, is carried out, as shown in FIG. 154A.

After that, a laminating step shown in FIG. 154B is carried out. In this laminating step, using a monosilicon substrate 1031 having gone through the ion implantation step in the fifty-fourth preferred embodiment (FIG. 144E), by going through a procedure basically the same as the laminating step in the fifty-fourth preferred embodiment (FIG. 145A), the monosilicon substrate 1039 is laminated to the polysilicon thin film 1038 on the monosilicon substrate 1031 side.

Then, in a detaching step illustrated in FIG. 154C, by the same heat treatment as in the fifty-fourth preferred embodiment being carried out on the monosilicon substrates 1031 and 1039, the monosilicon substrate 1039 is detached at the defective layer region formed by the ion-implanted layer 1041. In this way, a SOI structure wherein a monosilicon thin film 1039a" is formed on a silicon oxide film 1032 on a monosilicon substrate 1031 is completed. However, in this case, parts of the monosilicon substrate 1039 corresponding to the channels 1038a are not bonded to the polysilicon thin film 1038 side, and thus a channel pattern 1042' the defining the beam member 1002, the first fixed electrodes 1008 and 1009, the second fixed electrodes 1010 and 1011 and the electrode takeoff parts 1012, 1013, 1014, 1015 is formed in the monosilicon thin film 1039a". After the heat treatment for effecting this detachment, heat treatment for strengthening the bond strength at the bonding interface is then carried out and a process of introducing an impurity into the monosilicon thin film 1039a" for constituting the beam member 1002 and so on by phosphorus diffusion or the like is carried out.

After that, a step the same as the shaping step in the fifty-fourth preferred embodiment (FIGS. 146A through 146C) is carried out and the semiconductor acceleration sensor is thereby completed. When it is necessary for removal and flattening of the defective layer and minute steps arisen on the monosilicon thin film 1039a" to be carried out by mechanical polishing, this mechanical polishing can be carried out in the step shown in FIG. 146A, that is, with the silicon oxide film 1043 shown in that figure formed.

With this preferred embodiment also, there is the merit that it is not necessary to carry out a step of performing trench etching on a monosilicon thin film 1039a whose film thickness is relatively large, that is, a step that greatly increases the process time.

(Sixtieth Preferred Embodiment)

FIGS. 155A through 155E schematically show a process for manufacturing a semiconductor acceleration sensor according to a sixtieth preferred embodiment, and this will now be described centering on its points of difference from the fifty-fourth preferred embodiment.

Figure 155A:
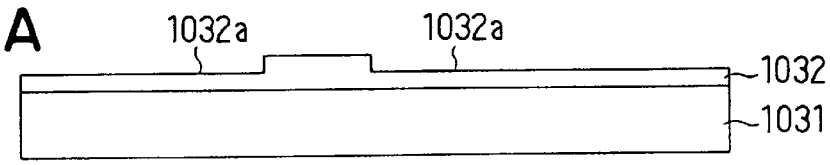
Figure 155B:
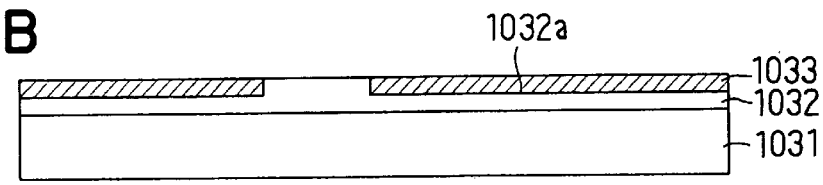

In a first film forming step shown in FIGS. 155A and 155B, a silicon oxide film 1032 to become a lower side insulating thin film 1016 is forme by thermal oxidation or CVD or the like on a monosilicon substrate 1031 to become a supporting substrate 1001. Then, a region to eventually become interconnection patterns 1019 through 1022 and a lower electrode 1023 is removed by dry etching. In this way, a thinned part 1032a thinner than the rest of the silicon oxide film 1032 is formed (FIG. 155A). After that, a polysilicon thin film 1033 to become a conducting thin film 1017 is formed on the silicon oxide film 1032 by for example CVD. Mechanical polishing with the silicon oxide film 1032 as a stopper is then carried out and the surface of this polysilicon thin film 1033 is thereby flattened. Thereafter, an impurity is introduced into the polysilicon thin film 1033 by phosphorus diffusion or the like.

Figure 155C:
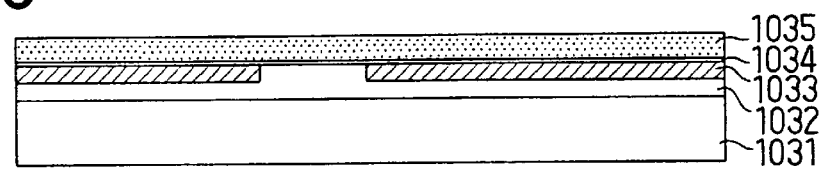

In a second film forming step shown in FIG. 155C, a silicon nitride film 1034 to serve as an upper side insulating thin film 1018 and a silicon oxide film 1035 are formed by CVD or the like on the silicon oxide film 1032 and the polysilicon thin film 1033.

Figure 155D:
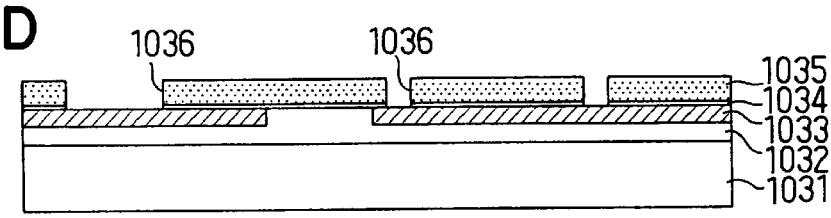
Figure 155E:
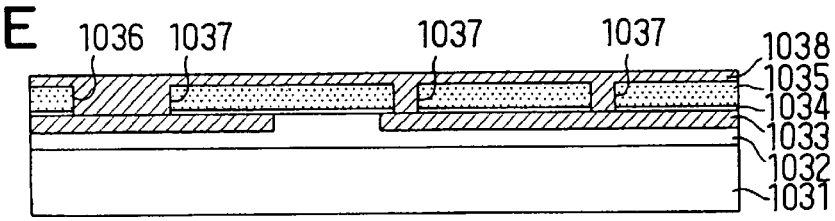

In an opening forming step shown in FIG. 155D, photolithography and etching are carried out on the silicon oxide film 1035 and the silicon nitride film 1034 to form openings 1036 in regions where anchor parts 1003a through 1003d and 1008a through 1015a are to be formed. In a third film forming step shown in FIG. 155E, a polysilicon thin film 1037 is filled into the openings 1036 and has an impurity introduced into it by phosphorus diffusion or the like. Also, a polysilicon thin film 1038 for lamination is formed on the polysilicon thin film 1037 and the silicon nitride film 1034 and flattened by mechanical polishing. In this way, the polysilicon thin film 1037 is electrically connected through the openings 1036 to the polysilicon thin film 1033 to become the conducting thin film 1017.

After that, an ion implantation step (FIG. 144E), a laminating step (FIG. 145A), a detaching step (FIG. 145B) and a shaping step (FIG. 145C and FIGS. 146A through 146C) the same as in the fifty-fourth preferred embodiment are carried out and the semiconductor acceleration sensor is thereby completed.

(Other Preferred Embodiments)

The aspect of the invention illustrated in the fifty-fourth through sixtieth preferred embodiments described above is not limited to these preferred embodiments and for example the following modifications and extensions are possible.

The semiconductor material of the semiconductor substrates and the semiconductor layers formed in the growth steps is not limited to the monocrystalline silicon discussed in these preferred embodiments, and polycrystalline semiconductor substrates and semiconductor substrates on which polycrystalline films have been grown made from other semiconductor materials based on group four elements, for example Ge (germanium), SiC (silicon carbide), SiGe (silicon germanium) and the like, or diamond substrates can be used.

The supporting substrate 1001 does not have to be made from a monosilicon substrate 1031, and other semiconductor substrates or insulating ceramic substrates or glass substrates and so on can alternatively be used. In this case, if the supporting substrate itself is made from insulating material, it becomes unnecessary to carry out a step of forming an insulating thin film (in the preferred embodiments, the silicon oxide film 1032) on the supporting substrate separately.

In the fifty-fifth preferred embodiment, a monosilicon layer 1049 made by epitaxial growth was formed on the surface of the monosilicon substrate 1039 (the monosilicon thin film 1039a') having gone through the detaching step, but alternatively an amorphous layer may be formed on the surface of this monosilicon substrate 1039 and a monosilicon layer formed by heat treating this to induce solid phase growth.

In the fifty-sixth preferred embodiment, a monosilicon film 1050 made by epitaxial growth was formed on the surface of the monosilicon substrate 1039 before the execution of the laminating step, but alternatively the laminating step and the detaching step may be carried out with an amorphous layer formed on the surface of the monosilicon substrate 1039 and then by heat treatment being carried out thereafter the amorphous layer laminated to the monosilicon substrate 1031 side may then be made to undergo solid phase growth to form a monosilicon layer.

Although preferred embodiments of the invention applied to a method for manufacturing a static capacitance type semiconductor acceleration sensor were described, the invention can also be applied to sensors for detecting physical quantities such as yaw rate, vibration and angular velocity. Also, although a semiconductor acceleration sensor having movable electrodes on the beam member was described, the invention can also be applied to a piezoresistance type semiconductor acceleration sensor having a distortion gauge resistance in the beam member.

What is claimed is:

1. A method for manufacturing a semiconductor substrate comprising:

forming a pattern structure formed by pattern members on a supporting substrate in such a state that it is insulated from the supporting substrate, and making its surface flat;

forming an ion-implanted layer in a substrate for forming a monocrystalline semiconductor layer;

laminating the supporting substrate on which the pattern structure has been formed to the substrate in which the ion-implanted layer has been formed;

detaching the substrate from the supporting substrate at an ion-implanted layer part by carrying out heat treatment on the substrate and the supporting substrate laminated in during said laminating, whereby the monocrystalline semiconductor layer is transferred to the supporting substrate; and carrying out surface treatment of a detachment face of the semiconductor layer.

2. A method for manufacturing a semiconductor substrate according to claim 1, wherein the pattern structure is used as a buried electrode pattern and said forming a pattern structure comprises:

forming a buried electrode pattern by a material for a buried electrode being selectively disposed in an insulating film formed on the supporting substrate; and flattening a surface of the supporting substrate on which the buried electrode pattern has been formed.

3. A method for manufacturing a semiconductor substrate according to claim 2, wherein said forming a buried electrode pattern comprises:

forming an oxide film on the supporting substrate;

forming in the oxide film a concavity corresponding to the buried electrode pattern; and filling the concavity with a buried electrode material.

4. A method for manufacturing a semiconductor substrate according to claim 3, wherein said forming an oxide film includes forming the oxide film by one of thermally oxidizing the supporting substrate and depositing with CVD.

5. A method for manufacturing a semiconductor substrate according to claim 3, wherein said forming in the oxide film a concavity includes forming the concavity by etching the oxide film to a depth corresponding to a shape of the buried electrode pattern.

6. A method for manufacturing a semiconductor substrate according to claim 3, wherein concavity including forming the concavity by removing the oxide film once by etching in correspondence with a shape of the buried electrode pattern and then forming an oxide film over an entire surface of the supporting substrate.

7. A method for manufacturing a semiconductor substrate according to claim 3, wherein said filling the concavity with a buried electrode material comprises:

forming a film of a buried electrode material over an entire surface of the oxide film in which the concavity for the buried electrode pattern has been formed; and polishing the buried electrode material film so that the buried electrode material remains only in the concavity in the oxide film.

8. A method for manufacturing a semiconductor substrate according to claim 7, wherein said forming a film of a buried electrode material includes forming a polycrystalline silicon film as the buried electrode material film.

9. A method for manufacturing a semiconductor substrate according to claim 8, wherein said forming a film of a buried electrode material includes forming the polycrystalline silicon film doped with an impurity using CVD.

10. A method for manufacturing a semiconductor substrate according to claim 7, including selecting a film of metal material from tungsten, copper and aluminum as the buried electrode material film.

11. A method for manufacturing a semiconductor substrate according to claim 2, wherein said flattening a surface of the supporting substrate comprises:
forming a fattening process film on the supporting substrate on which the pattern structure has been formed; and
flattening a surface of the flattening process film by polishing.

12. A method for manufacturing a semiconductor substrate according to claim 11, wherein said forming a flattening process film includes forming polycrystalline silicon as the flattening process film, and carrying out thermal oxidation after said polishing so that a flattened polycrystalline silicon film is thermally oxidized and thereby made a silicon oxide film.

13. A method for manufacturing a semiconductor substrate according to claim 11, wherein said forming a flattening process film includes forming a film having thermal fluidity, which is selected from BPSG, PSG, and SOG, as the flattening process film.

14. A method for manufacturing a semiconductor substrate according to claim 2, wherein said flattening a surface of the supporting substrate comprises:
forming a polycrystalline silicon film having insulativity on the supporting substrate on which the pattern structure has been formed;
flattening a surface of the polycrystalline silicon film by polishing; and
thermally oxidizing a surface portion of the polycrystalline silicon film so that a surface portion thereof is made into an oxide film but a part in a polycrystalline silicon film state remains therebelow.

15. A method for manufacturing a semiconductor substrate according to claim 1, wherein said forming a pattern structure comprises:
forming an oxide film on the supporting substrate;
forming in the oxide film a concavity corresponding to the buried electrode pattern;
forming a polycrystalline silicon film serving as a buried electrode material on an entire surface of the oxide film in which the concavity has been formed;
polishing the polycrystalline silicon film to a thickness such that a film thickness thereof from the surface of the oxide film remains; and
thermally oxidizing a surface layer portion of the polycrystalline silicon film so that a buried electrode pattern including a polycrystalline silicon film is formed in the concavity.

16. A method for manufacturing a semiconductor substrate according to claim 15, including forming the polycrystalline silicon film doped with an impurity.

17. A method for manufacturing a semiconductor substrate according to claim 1, wherein said forming a pattern structure comprises:
forming an oxide film on the supporting substrate;
forming a buried electrode pattern on the oxide film;
forming a flattening process film on an entire surface of the buried electrode pattern; and
flattening a surface of the flattening process film by polishing it.

18. A method for manufacturing a semiconductor substrate according to claim 17, wherein said forming a flattening process film includes forming an oxide film as the flattening process film.

19. A method for manufacturing a semiconductor substrate according to claim 1, wherein said detaching includes effecting a first heat treatment in which detachment of the substrate at the ion-implanted layer to forms a semiconductor layer on the supporting substrate by heating in a range of 400° C. to 600° C., and effecting a second heat treatment in which the semiconductor layer firmly bonds to the supporting substrate by heating above 1000 C.

20. A method for manufacturing a semiconductor substrate according to claim 1, wherein said carrying out surface treatment includes grinding and polishing the detachment face of the semiconductor layer.

21. A method for manufacturing a semiconductor substrate according to claim 1, including carrying out said heat treatment in an oxygen atmosphere so that a thermal oxidation film is formed on the detachment face of the semiconductor layer, and said carrying out said surface treatment includes removing the thermal oxidation film formed on the detachment face by etching and polishing the detachment face from which the thermal oxidation film has been removed.

22. A method for manufacturing a semiconductor substrate in which a semiconductor layer is provided on a pattern structure formed on a supporting substrate, the method comprising:
forming a pattern structure on a supporting substrate;
forming an ion-implanted layer in a second substrate for forming a monocrystalline semiconductor layer between a surface of the second substrate and the ion-implanted layer;
laminating the supporting substrate on which the pattern structure has been formed to the second substrate in which the ion-implanted layer has been formed; and
detaching the second substrate from the supporting substrate at an ion-implanted part by heat treating the second substrate and the supporting substrate, thereby forming the monocrystalline semiconductor layer on the pattern structure formed on the supporting substrate.

23. A method for manufacturing a semiconductor substrate according to claim 22, wherein said forming a pattern structure comprises:
forming a buried electrode pattern by selectively disposing buried electrode material in an insulating film formed on the supporting substrate; and
flattening a surface of the supporting substrate at a side on which the buried electrode pattern is formed.

24. A method for manufacturing a semiconductor substrate according to claim 23, wherein the insulating film is an oxide film formed by one of thermally oxidizing the supporting substrate and depositing with CVD.

25. A method according to claim 1, wherein said forming a pattern structure includes:

forming the pattern structure on an auxiliary substrate;

laminating the auxiliary to the supporting substrate with the pattern structure interposed therebetween;

removing the auxiliary substrate from the supporting substrate so that the pattern structure remains on the supporting substrate with a surface thereof; and flattening the surface of the pattern structure.

26. A method according to claim 25, wherein:

said forming a pattern structure further includes implanting ions into the auxiliary substrate through the pattern structure to form an auxiliary ion-implanted layer in the auxiliary substrate, before laminating the auxiliary substrate to the supporting substrate; and detaching the auxiliary substrate at the auxiliary ion-implanted layer for removal from the supporting substrate.

27. A method according to claim 1, wherein the pattern structure forming step includes:

forming an insulating film on an auxiliary substrate;

forming an electrode pattern in a region on the insulating film, for forming a buried electrode;

depositing an insulating material on the insulating film in such a state that the insulating material covers the electrode pattern and the instating film;

depositing a flattening process material on the insulating material in such a state that the flattening process material covers the insulating material;

flattening a surface of the flattening process material;

laminating the auxiliary substrate to the supporting substrate with the flattening process film interposed therebetween; and removing the auxiliary substrate from the supporting substrate so that the pattern structure including the insulating film, the electrode pattern, the insulating material, and the flattening process material remains on the supporting substrate.

28. A method according to claim 27, wherein the insulating film is formed by oxidizing a surface portion of the auxiliary substrate.

29. A method according to claim 27, wherein the electrode pattern is formed by one of a polycrystalline semiconductor material doped with an impurity and a refractory metal material.

30. A method for manufacturing a semiconductor substrate comprising:

forming a pattern structure formed by pattern members on a supporting substrate in such a state that it is insulated from the supporting substrate, and making its surface flat, said pattern forming comprising forming an insulating film on an auxiliary substrate;

forming an electrode pattern in a predetermined region on the insulating film, for forming a buried electrode;

depositing an insulating material on the insulating film in such a state that the insulating material covers the electrode pattern and the insulating film;

depositing a polycrystalline silicon flattening process material on the insulating material in such a state that the flattening process material covers the insulating material;

flattening a surface of the flattening process material;

laminating the auxiliary substrate to the supporting substrate with the flattening process film interposed therebetween; and removing the auxiliary substrate from the supporting substrate so that the pattern structure including the insulating film, the electrode pattern, the insulating material, and the flattening process material remains on the supporting substrate;

forming an ion-implanted layer in a substrate for forming a monocrystalline semiconductor layer;

laminating the supporting substrate on which the pattern structure has been formed to the substrate in which the ion-implanted layer has been formed;

detaching the substrate from the supporting substrate at an ion-implanted layer part by carrying out heat treatment on the substrate and the supporting substrate laminated in during said laminating, whereby the monocrystalline semiconductor layer is transferred to the supporting substrate; and carrying out surface treatment of a detachment face of the semiconductor layer.

31. A method for manufacturing a semiconductor substrate comprising:

forming a pattern structure formed by pattern members on a supporting substrate in such a state that it is insulated from the supporting substrate, and making its surface flat, said pattern forming comprising forming an insulating film on an auxiliary substrate;

forming an electrode pattern in a predetermined region on the insulating film, for forming a buried electrode;

depositing an insulating material on the insulating film in such a state that the insulating material covers the electrode pattern and the insulating film;

depositing a flattening process material on the insulating material in such a state that the flattening process material covers the insulating material;

flattening a surface of the flattening process material;

forming an auxiliary ion-implanted layer in the auxiliary substrate;

laminating the auxiliary substrate to the supporting substrate with the flattening process film interposed therebetween; and removing the auxiliary substrate from the supporting substrate so that the pattern structure including the insulating film, the electrode pattern, the insulating material, and the flattening process material remains on the supporting substrate, said removing of the auxiliary substrate comprising:

performing heat treatment on the auxiliary substrate and the supporting substrate laminated with each other, thereby detaching the auxiliary substrate from the supporting substrate at the auxiliary ion-implanted layer; and removing a part of the auxiliary substrate remaining on the supporting substrate so that a surface of the insulating film is exposed;

forming an ion-implanted layer in a substrate for forming a monocrystalline semiconductor layer;

laminating the supporting substrate on which the pattern structure has been formed to the substrate in which the ion-implanted layer has been formed;

detaching the substrate from the supporting substrate at an ion-implanted layer part by carrying out heat treatment on the substrate and the supporting substrate laminated in during said laminating, whereby the monocrystalline semiconductor layer is transferred to the supporting substrate; and carrying out surface treatment of a detachment face of the semiconductor layer.

32. A method according to claim 31, wherein the auxiliary substrate is detached from the supporting substrate at a defective layer part formed in the auxiliary ion-implanted layer.

33. A method according to claim 31, wherein:
the auxiliary ion-implanted layer is formed by implanting ions through the flattening process material; and
the surface of the flattening process material is flattened after forming the auxiliary ion-implanted layer.

34. A method according to claim 31, wherein the surface of the flattening process material is flattened before and after forming the auxiliary ion-implanted layer in the auxiliary substrate.

35. A method according to claim 31, further comprising forming a contamination protection film on the flattening process material after flattening the surface of the flattening process material,
wherein the auxiliary ion-implanted layer is formed after forming the contamination protection film.

36. A method according to claim 31, wherein the part of the auxiliary substrate remaining on the supporting substrate is removed by selecting polishing with the insulating film functioning as a stopper.

37. A method according to claim 31, wherein the part of the auxiliary substrate remaining on the supporting substrate is removed by selective etching with the insulating film functioning as a stopper.

38. A method according to claim 37, wherein the part of the auxiliary substrate is removed by wet-etching using one of aqueous tetra methyl ammonium hydroxide, aqueous sodium hydroxide, and aqueous potassium hydroxide.

39. A method for manufacturing a semiconductor substrate comprising:
forming a pattern structure formed by pattern members on a supporting substrate in such a state that it is insulated from the supporting substrate, and making its surface flat, said pattern forming comprising forming an insulating film on an auxiliary substrate;
forming an electrode pattern in a predetermined region on the insulating film, for forming a buried electrode;
depositing a insulating material on the insulating film in such a state that the insulating material covers the electrode pattern and the insulating film;
depositing a polycrystalline silicon flattening process material on the insulating material in such a state that the flattening process material covers the insulating material;
flattening a surface of the flattening process material;
laminating the auxiliary substrate to the supporting substrate with the flattening process film interposed therebetween; and
removing the auxiliary substrate from the supporting substrate so that the pattern structure including the insulating film, the electrode pattern, the insulating material, and the flattening process material remains on the supporting substrate, said removing of the auxiliary substrate comprising:
grinding an upper portion of the auxiliary substrate; and
selectively polishing the auxiliary substrate until a surface of the insulating film is exposed;
forming an ion-implanted layer in a substrate for forming a monocrystalline semiconductor layer;
laminating the supporting substrate on which the pattern structure has been formed to the substrate in which the ion-implanted layer has been formed;
detaching the substrate from the supporting substrate at an ion-implanted layer part by carrying out heat treatment on the substrate and the supporting substrate laminated in during said laminating, whereby the monocrystalline semiconductor layer is transferred to the supporting substrate; and
carrying out surface treatment of a detachment face of the semiconductor layer.

40. A method for manufacturing a semiconductor substrate comprising:
forming a pattern structure formed by pattern members on a supporting substrate in such a state that it is insulated from the supporting substrate, and making its surface flat, said pattern forming comprising forming an insulating film on an auxiliary substrate;
forming an electrode pattern in a predetermined region on the insulating film, for forming a buried electrode;
depositing a insulating material on the insulating film in such a state that the insulating material covers the electrode pattern and the insulating film;
depositing a polycrystalline silicon flattening process material on the insulating material in such a state that the flattening process material covers the insulating material;
flattening a surface of the flattening process material;
laminating the auxiliary substrate to the supporting substrate with the flattening process film interposed therebetween; and
removing the auxiliary substrate from the supporting substrate so that the pattern structure including the insulating film, the electrode pattern, the insulating material, and the flattening process material remains on the supporting substrate, said removing of the auxiliary substrate comprising:
grinding an upper portion of the auxiliary substrate; and
etching the auxiliary substrate until a surface of the insulating film is exposed;
forming an ion-implanted layer in a substrate for forming a monocrystalline semiconductor layer;
laminating the supporting substrate on which the pattern structure has been formed to the substrate in which the ion-implanted layer has been formed;
detaching the substrate from the supporting substrate at an ion-implanted layer part by carrying out heat treatment on the substrate and the supporting substrate laminated in during said laminating, whereby the monocrystalline semiconductor layer is transferred to the supporting substrate; and
carrying out surface treatment of a detachment face of the semiconductor layer.

41. A method according to claim 40, wherein the auxiliary substrate is wet-etched using one of aqueous tetra methyl ammonium hydroxide, aqueous sodium hydroxide, and aqueous potassium hydroxide until the surface of the insulating film is exposed.

42. A method according to claim 1, further comprising, after said detaching the substrate from the supporting substrate, carrying out heat treatment at a temperature higher than that of said heat treatment on the substrate increasing the bonding strength of a bonding interface between the pattern structure on the supporting substrate and the semiconductor layer.

43. A method according to claim 42, carrying out the heat treatment for said increasing the bonding strength in an inert gas atmosphere.

44. A method according to claim 1, further comprising, after said detaching the substrate from the supporting substrate, carrying out supplementary heat treatment in an oxidizing atmosphere to form an oxide layer at an interface between the pattern structure on the supporting substrate and the semiconductor layer.

45. A method for manufacturing a semiconductor substrate according to claim 38, wherein the ion-implanted layer is formed in the substrate by carrying out ion-implantation through an insulating layer disposed on the substrate.

46. A method for manufacturing a semiconductor substrate according to claim 45, wherein the insulating layer is an oxide layer.

47. A method for manufacturing a semiconductor substrate according to claim 45, wherein the insulating layer is removed from the substrate before the supporting substrate is laminated to the substrate.

48. A method for manufacturing a semiconductor substrate according to claim 22, wherein the ion-implanted layer is formed in the second substrate by carrying out ion-implantation through an insulating layer disposed on the substrate.

49. A method for manufacturing a semiconductor substrate according to claim 48, wherein the insulating layer is an oxide layer.

50. A method for manufacturing a semiconductor substrate according to claim 48, wherein the insulating layer is removed from the second substrate before the supporting substrate is laminated to the second substrate.

* * * * *

UNITED STATES PATENT AND TRADEMARK OFFICE
CERTIFICATE OF CORRECTION

PATENT NO. : 6,191,007 B1
DATED : February 20, 2001
INVENTOR(S) : Matsui et al.

It is certified that error appears in the above-identified patent and that said Letters Patent is hereby corrected as shown below:

<u>Title page,</u>
Change "[75] Inventors; Masaki Matsui, Nagoya; Shoichi Yamauchi; Hisayoshi Ohshima, both of Obu; ; Kunihiro Onoda, Nagoya; Akiyoshi Asai, Aichi-gun; Takanari Sasaya, Kariya; Takeshi Enya, Nagoya; Jun Sakakibara, Anjo, all of (JP)"

to

-- [75] Inventors: Masaki Matsui, Nagoya; Shoichi Yamauchi, Obu; Jun Sakakibara, Anjo, all of (JP)

Signed and Sealed this

Eighteenth Day of June, 2002

*Attest:*

JAMES E. ROGAN
*Attesting Officer*       *Director of the United States Patent and Trademark Office*